US012034415B2

(12) United States Patent
Seshita et al.

(10) Patent No.: US 12,034,415 B2
(45) Date of Patent: Jul. 9, 2024

(54) SEMICONDUCTOR CIRCUIT

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Toshiki Seshita, Kanagawa (JP); Yasuhiko Kuriyama, Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 667 days.

(21) Appl. No.: 17/201,278

(22) Filed: Mar. 15, 2021

(65) Prior Publication Data

US 2022/0085773 A1 Mar. 17, 2022

(30) Foreign Application Priority Data

Sep. 17, 2020 (JP) ................................ 2020-156192

(51) Int. Cl.

| | |
|---|---|
| ***H03F 1/02*** | (2006.01) |
| ***H03F 3/195*** | (2006.01) |
| ***H03F 3/68*** | (2006.01) |
| ***H03F 3/72*** | (2006.01) |

(Continued)

(52) U.S. Cl.

CPC ........... *H03F 3/195* (2013.01); *H03F 1/0211* (2013.01); *H03F 3/68* (2013.01); *H03F 3/72* (2013.01); *H04B 1/0458* (2013.01); *H04B 1/0483* (2013.01); *H04B 1/44* (2013.01); *H03F 2200/294* (2013.01); *H03F 2200/372* (2013.01); *H03F 2200/451* (2013.01); *H03F 2200/489* (2013.01); *H04B 2001/0416* (2013.01)

(58) Field of Classification Search

CPC . H03F 1/0211; H03F 3/68; H03F 3/72; H04B 1/0458

USPC .......................................................... 330/277

See application file for complete search history.

(56) References Cited

U.S. PATENT DOCUMENTS

| | | | |
|---|---|---|---|
| 9,271,239 | B2 | 2/2016 | Hassan et al. |
| 10,153,803 | B2 | 12/2018 | Sugawara et al. |

(Continued)

FOREIGN PATENT DOCUMENTS

| | | | |
|---|---|---|---|
| JP | 2017-506043 | A | 2/2017 |
| JP | 2018-50129 | A | 3/2018 |
| JP | 2019-208135 | A | 12/2019 |

*Primary Examiner* — Patricia T Nguyen

(74) *Attorney, Agent, or Firm* — Kim & Stewart LLP

(57) ABSTRACT

According to one embodiment, a semiconductor circuit includes: an amplifier including an input terminal; an output circuit including a first node connected to the amplifier, and first and second output terminals, the output circuit performing a first output mode using one of the first and second output terminals or a second output mode using the first and second output terminals; and a bypass circuit between the input terminal and the first node. The output circuit includes a first switch between a second node and the first output terminal, a second switch between a third node and the second output terminal, a third switch between the second and third nodes, a first passive circuit connected to the second node, a second passive circuit connected to the third node, and a third passive circuit between the second and third nodes.

4 Claims, 91 Drawing Sheets

(51) Int. Cl.
*H04B 1/04* (2006.01)
*H04B 1/44* (2006.01)

(56) References Cited

U.S. PATENT DOCUMENTS

| | | | | |
|---|---|---|---|---|
| 2006/0071712 | A1* | 4/2006 | Lee | H03G 1/0088 330/254 |
| 2007/0024377 | A1* | 2/2007 | Wang | H03F 1/42 330/305 |
| 2008/0258818 | A1* | 10/2008 | Ngo | H03F 1/56 330/282 |
| 2018/0358938 | A1* | 12/2018 | Ayranci | H03F 1/223 |
| 2019/0245497 | A1* | 8/2019 | Sanner | H03F 3/72 |
| 2019/0372534 | A1 | 12/2019 | Seshita et al. | |
| 2020/0382080 | A1* | 12/2020 | Seshita | H03G 3/3036 |

* cited by examiner

| Amplification/ bypass mode | Output mode | Active output | VB1 VB2 | Sw1 | Sw2 | Sw3 Sw4 Sw5 | T-Sw1 | T-Sw2 | T-Sw3 | T-Sw4 |
|---|---|---|---|---|---|---|---|---|---|---|
| Amplification | Single output | OUT1 | ON | ON | OFF | OFF | **ON** | OFF | **ON** | OFF |
| | | OUT2 | ON | | | | OFF | **ON** | **ON** | |
| | Split output | OUT1 & OUT2 | ON | | | **ON** | **ON** | **ON** | OFF | |
| Bypass | Single output | OUT1 | OFF | OFF | ON | OFF | **ON** | OFF | **ON** | ON |
| | | OUT2 | OFF | | | | OFF | **ON** | **ON** | |
| | Split output | OUT1 & OUT2 | OFF | | | **ON** | **ON** | **ON** | OFF | |

FIG. 4

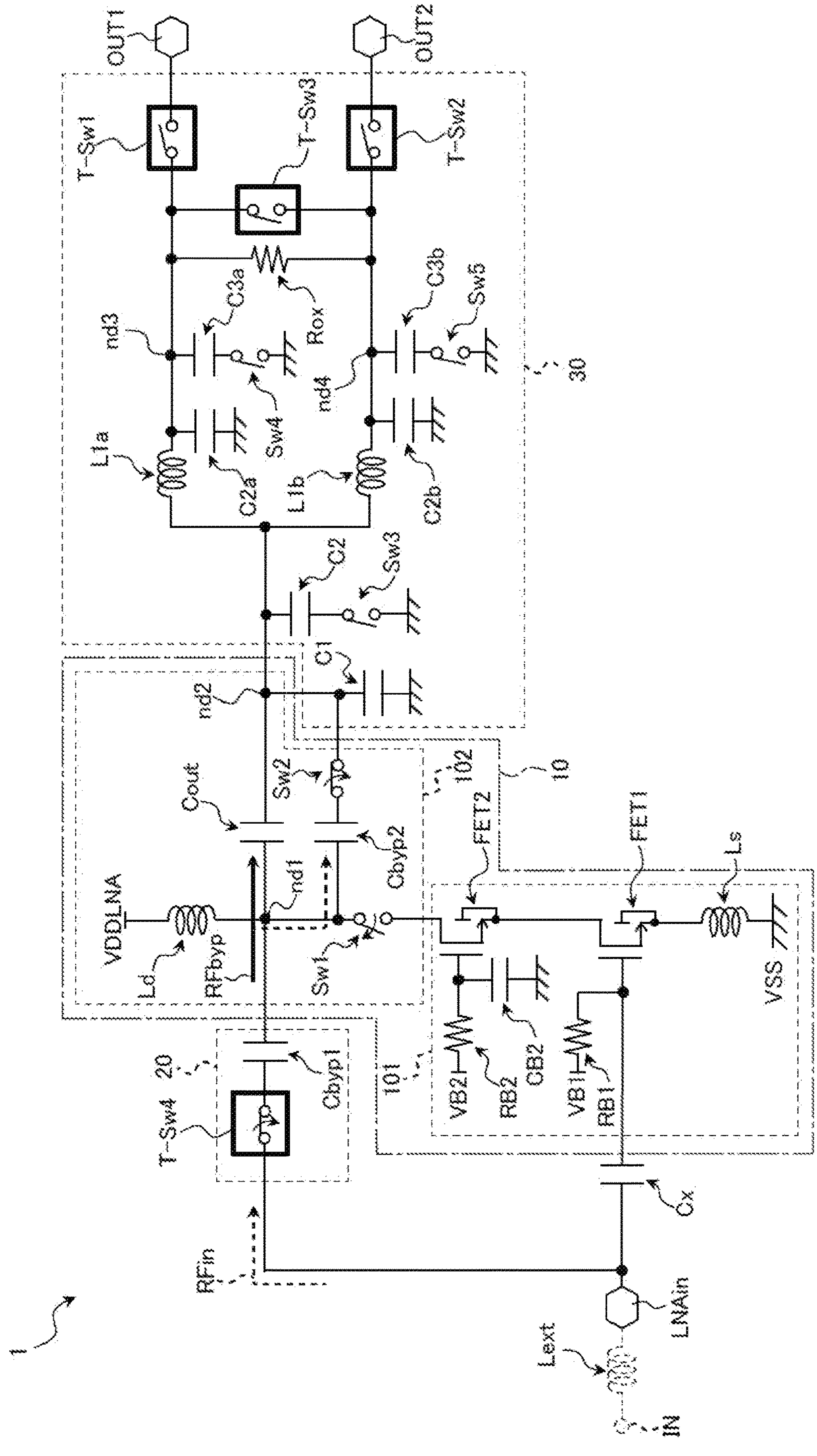
F I G. 6

Band41 (2496 MHz ~ 2690 MHz) VDDLNA=1.2V

| Amplification/ bypass mode | Output mode | Idd_lna (mA) | S21 (dB) Band center | NF (dB) Within band | S11 (dB) Within band | S22 (dB) Within band | S23 (dB) Within band |
|---|---|---|---|---|---|---|---|
| Amplification | Single output | 6.53 | 20.3 | 0.78 | -9.5 | -14.1 | -57.9 |
| | Split output | 12.5 | 17.5 | 0.75 | -8.8 | -18.7 | -29.5 |
| Bypass | Single output | 0 | -2.8 | 2.84 | -9.9 | -14.5 | -58.0 |
| | Split output | 0 | -6.6 | 6.78 | -14.5 | -21.2 | -31.0 |

FIG. 13

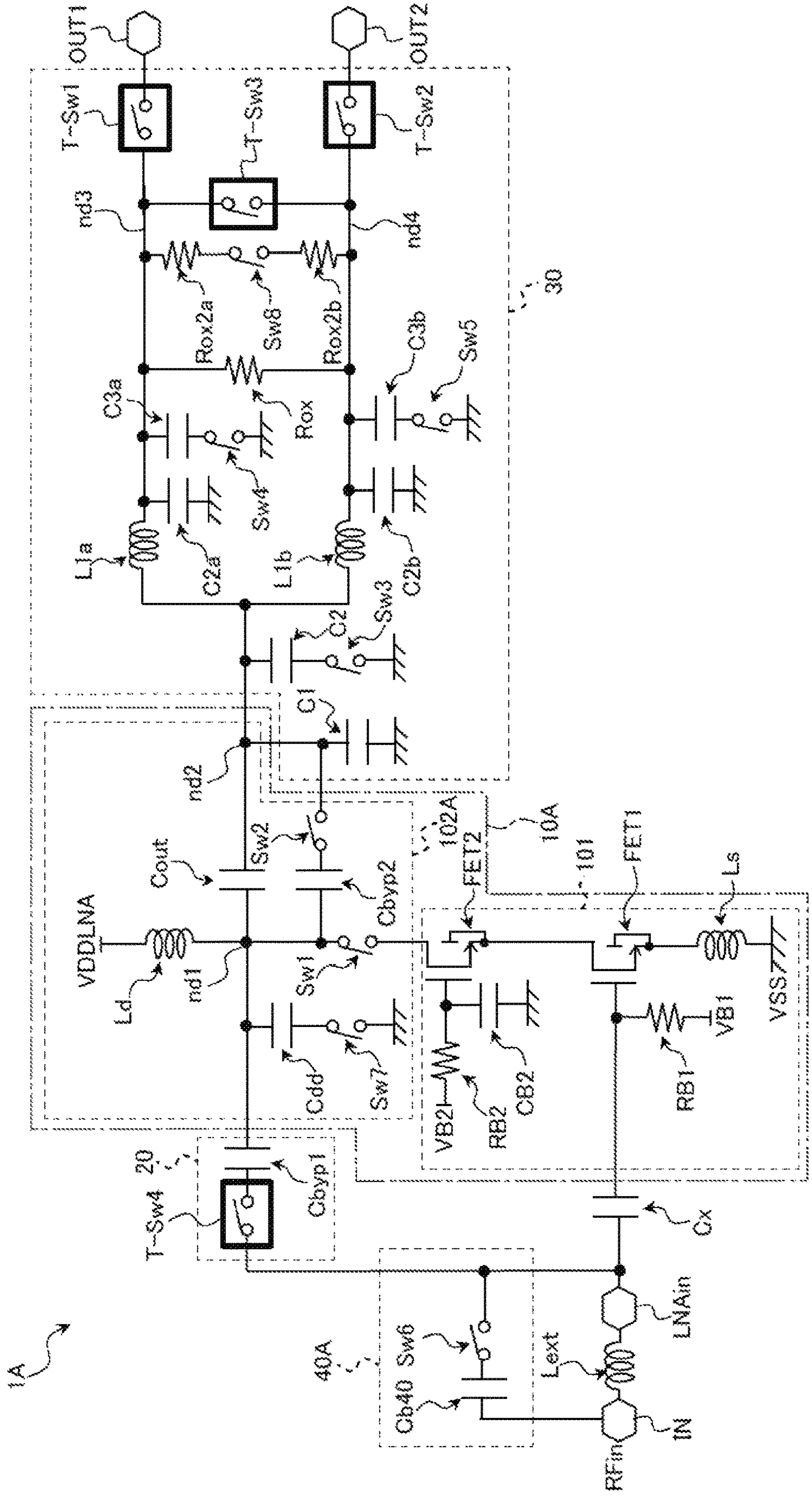
F I G. 14

| Selected band | Amplification/ bypass mode | Output mode | Active output | VB1 VB2 | Sw1 | Sw2 | Sw3 Sw4 Sw5 | Sw6 Sw7 Sw8 | T-Sw1 | T-Sw2 | T-Sw3 | T-Sw4 |
|---|---|---|---|---|---|---|---|---|---|---|---|---|
| Band41 | Amplification | Single output | OUT1 | ON | ON | OFF | OFF | OFF | ON | OFF | ON | OFF |
| | | | OUT2 | ON | | | | | OFF | ON | ON | |
| | | Split output | OUT1 & OUT2 | ON | | | ON | | ON | ON | OFF | |
| | Bypass | Single output | OUT1 | OFF | OFF | ON | OFF | | ON | OFF | ON | ON |
| | | | OUT2 | OFF | | | | | OFF | ON | ON | |
| | | Split output | OUT1 & OUT2 | OFF | | | ON | | ON | ON | OFF | |
| Band40 | Amplification | Single output | OUT1 | ON | ON | OFF | OFF | ON | ON | OFF | ON | OFF |
| | | | OUT2 | ON | | | | | OFF | ON | ON | |
| | | Split output | OUT1 & OUT2 | ON | | | ON | | ON | ON | OFF | |
| | Bypass | Single output | OUT1 | OFF | OFF | ON | OFF | | ON | OFF | ON | ON |
| | | | OUT2 | OFF | | | | | OFF | ON | ON | |
| | | Split output | OUT1 & OUT2 | OFF | | | ON | | ON | ON | OFF | |

FIG. 15

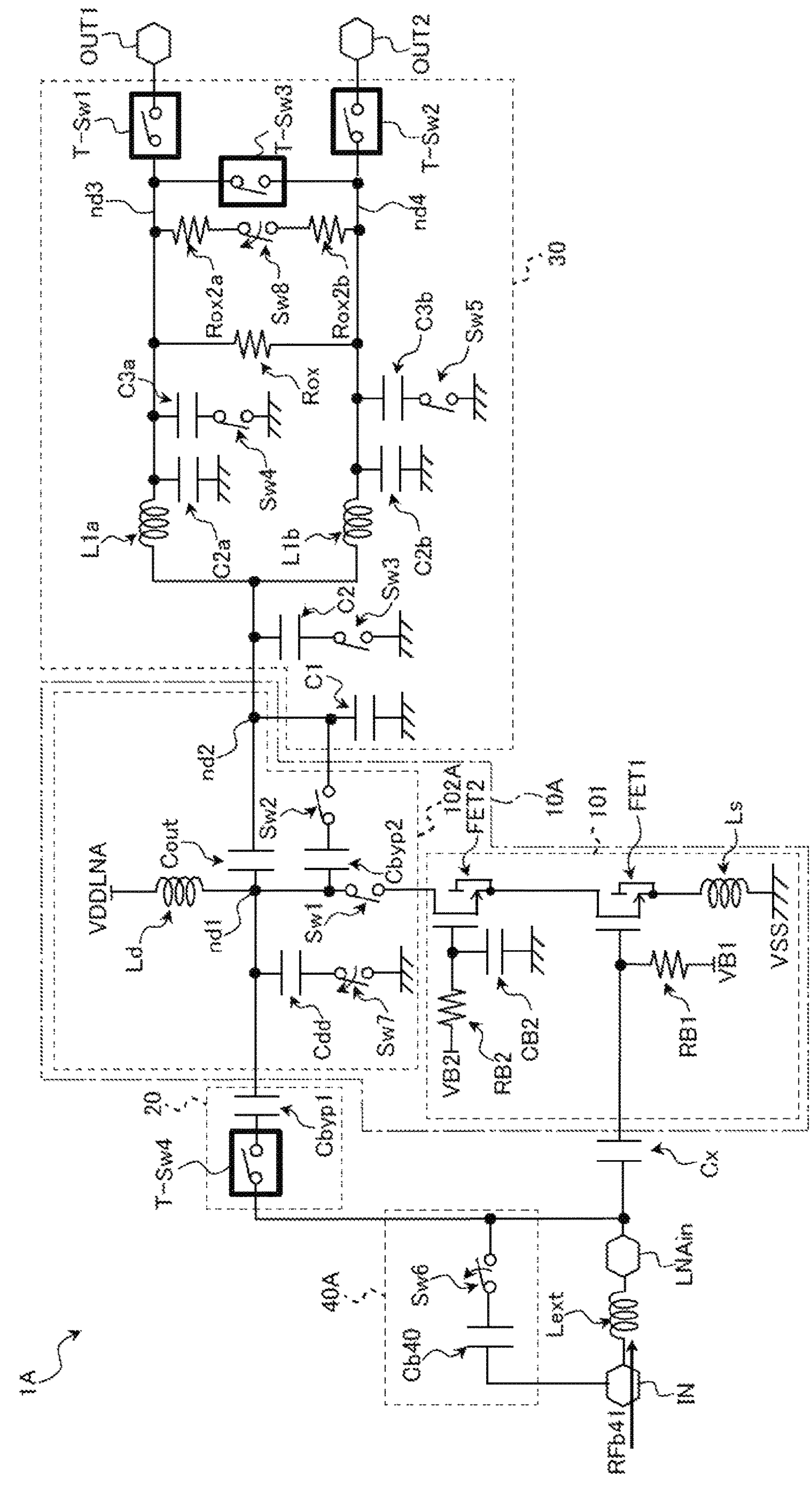
F I G. 17

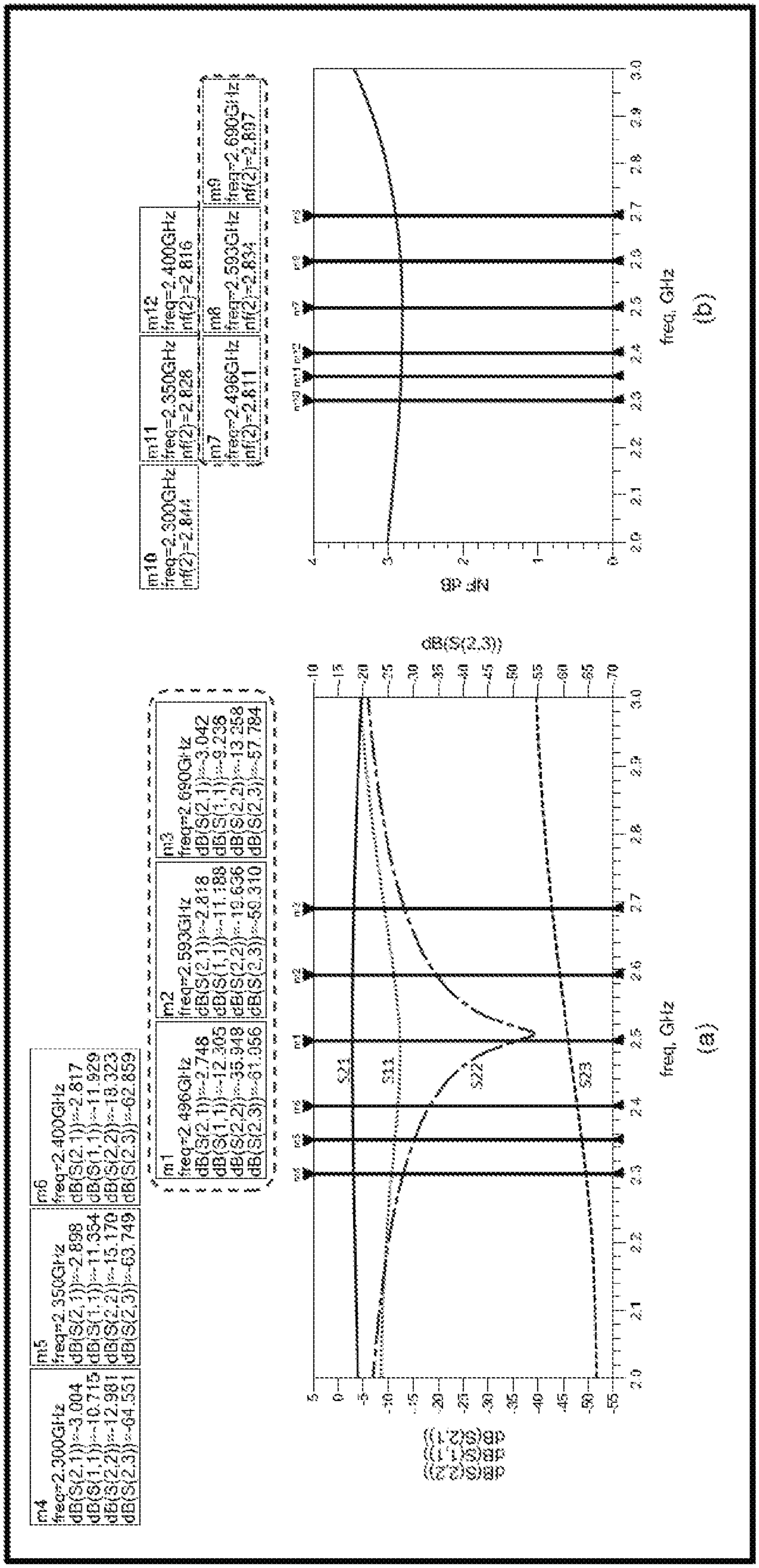
F I G. 20

VDDLNA=1.2V

| Selected band | Amplification/ bypass mode | Output mode | Idd_lna (mA) | S21 (dB) Band center | NF (dB) Within band | S11 (dB) Within band | S22 (dB) Within band | S23 (dB) Within band |
|---|---|---|---|---|---|---|---|---|
| Band41 | Amplification | Single output | 6.53 | 20.3 | 0.79 | -8.9 | -13.3 | -57.8 |
| | | Split output | 12.5 | 17.4 | 0.76 | -8.3 | -21.7 | -29.6 |
| | Bypass | Single output | 0 | -2.8 | 2.90 | -9.2 | -13.3 | -57.8 |
| | | Split output | 0 | -6.6 | 6.86 | -13.8 | -24.3 | -33.0 |
| Band40 | Amplification | Single output | 6.53 | 20.8 | 0.82 | -10.0 | -13.9 | -61.5 |
| | | Split output | 12.5 | 18.1 | 0.78 | -10.2 | -18.4 | -31.2 |
| | Bypass | Single output | 0 | -2.9 | 3.02 | -11.3 | -18.3 | -61.4 |
| | | Split output | 0 | -6.7 | 6.87 | -12.9 | -19.2 | -31.7 |

F I G. 26

| Selected band | Amplification/bypass | Output mode | Sw1G | Sw2G | Sw3G | Sw1S | Sw2S | Sw3S | Sw4S | Sw1B | Sw2B | Sw3B | Sw4B | Sw5S | Sw1a | Sw2a | Sw3a | Sw4a | Sw5a | Sw6a | Sw7a | T-Sw1 | T-Sw2 | T-Sw3 | Cp1 (pF) | Rox (Ω) |
|---|---|---|---|---|---|---|---|---|---|---|---|---|---|---|---|---|---|---|---|---|---|---|---|---|---|---|
| 880~960 MHz | Amplification | Single: OUT1 | ON | OFF | OFF | OFF | ON | ON | OFF | OFF | OFF | OFF | OFF | ON | ON | OFF | OFF | OFF | OFF | ON | OFF | ON | OFF | ON | 2.80 | 119 |
| | | Single: OUT2 | ON | OFF | OFF | OFF | ON | ON | OFF | OFF | OFF | OFF | OFF | ON | ON | OFF | OFF | OFF | OFF | OFF | ON | OFF | ON | ON | | |
| | | Split | ON | OFF | OFF | OFF | ON | ON | OFF | OFF | OFF | OFF | OFF | ON | ON | OFF | OFF | OFF | OFF | ON | ON | ON | ON | OFF | | |
| | Bypass | Single: OUT1 | OFF | OFF | OFF | OFF | ON | ON | ON | ON | OFF | OFF | ON | OFF | OFF | OFF | OFF | — | — | ON | OFF | ON | OFF | ON | 2.43 | 115 |
| | | Single: OUT2 | OFF | OFF | OFF | OFF | ON | ON | ON | ON | OFF | OFF | ON | OFF | OFF | OFF | OFF | — | — | OFF | ON | OFF | ON | ON | | |
| | | Split | OFF | OFF | OFF | OFF | ON | ON | ON | ON | OFF | OFF | ON | OFF | OFF | OFF | OFF | — | — | ON | ON | ON | ON | OFF | | |
| 717~821 MHz | Amplification | Single: OUT1 | OFF | ON | OFF | ON | OFF | ON | OFF | OFF | OFF | OFF | OFF | ON | ON | ON | OFF | ON | OFF | ON | OFF | ON | OFF | ON | 3.30 | 100 |
| | | Single: OUT2 | OFF | ON | OFF | ON | OFF | ON | OFF | OFF | OFF | OFF | OFF | ON | ON | ON | OFF | ON | OFF | OFF | ON | OFF | ON | ON | | |
| | | Split | OFF | ON | OFF | ON | OFF | ON | OFF | OFF | OFF | OFF | OFF | ON | ON | ON | OFF | ON | OFF | ON | ON | ON | ON | OFF | | |
| | Bypass | Single: OUT1 | OFF | OFF | OFF | ON | OFF | ON | ON | OFF | ON | OFF | ON | OFF | OFF | OFF | OFF | — | — | ON | OFF | ON | OFF | ON | 3.55 | 85 |
| | | Single: OUT2 | OFF | OFF | OFF | ON | OFF | ON | ON | OFF | ON | OFF | ON | OFF | OFF | OFF | OFF | — | — | OFF | ON | OFF | ON | ON | | |
| | | Split | OFF | OFF | OFF | ON | OFF | ON | ON | OFF | ON | OFF | ON | OFF | OFF | OFF | OFF | — | — | ON | ON | ON | ON | OFF | | |
| 617~652 MHz | Amplification | Single: OUT1 | OFF | OFF | ON | ON | ON | OFF | OFF | OFF | OFF | OFF | OFF | ON | ON | ON | ON | ON | ON | ON | OFF | ON | OFF | ON | 5.24 | 78 |
| | | Single: OUT2 | OFF | OFF | ON | ON | ON | OFF | OFF | OFF | OFF | OFF | OFF | ON | ON | ON | ON | ON | ON | OFF | ON | OFF | ON | ON | | |
| | | Split | OFF | OFF | ON | ON | ON | OFF | OFF | OFF | OFF | OFF | OFF | ON | ON | ON | ON | ON | ON | ON | ON | ON | ON | OFF | | |
| | Bypass | Single: OUT1 | OFF | OFF | OFF | ON | ON | OFF | ON | OFF | OFF | ON | ON | OFF | OFF | OFF | OFF | — | — | ON | OFF | ON | OFF | ON | 4.88 | 65 |
| | | Single: OUT2 | OFF | OFF | OFF | ON | ON | OFF | ON | OFF | OFF | ON | ON | OFF | OFF | OFF | OFF | — | — | OFF | ON | OFF | ON | ON | | |
| | | Split | OFF | OFF | OFF | ON | ON | OFF | ON | OFF | OFF | ON | ON | OFF | OFF | OFF | OFF | — | — | ON | ON | ON | ON | OFF | | |

"—": Either ON or OFF

FIG. 29

VDDLNA=1.2V IddLNA (Amplification mode) =6.5 mA

| Selected band | Amplification/ bypass | Output mode | S21 (dB) Band center | NF (dB) Within band | S11 (dB) Within band | S22 (dB) Within band | S23 (dB) Within band |
|---|---|---|---|---|---|---|---|
| 859~960 MHz | Amplification | Single | 21.1 | 0.95 | -8.5 | -15.0 | -77.9 |
| | | Split | 18.1 | 0.98 | -8.1 | -18.1 | -25.8 |
| | Bypass | Single | -2.0 | 2.25 | -12.8 | -18.4 | -76.5 |
| | | Split | -5.1 | 5.32 | -12.9 | -20.7 | -26.8 |
| 717~821 MHz | Amplification | Single | 21.3 | 0.73 | -6.6 | -16.0 | -81.6 |
| | | Split | 18.2 | 0.76 | -6.4 | -20.2 | -25.7 |
| | Bypass | Single | -2.4 | 2.59 | -17.3 | -13.3 | -81.9 |
| | | Split | -5.6 | 5.72 | -14.6 | -13.1 | -26.4 |
| 617~652 MHz | Amplification | Single | 21.6 | 0.73 | -8.1 | -12.4 | -86.8 |
| | | Split | 18.5 | 0.76 | -8.0 | -13.8 | -31.8 |
| | Bypass | Single | -3.6 | 3.52 | -9.8 | -10.3 | -86.8 |
| | | Split | -6.9 | 6.84 | -8.4 | -11.1 | -25.8 |

F I G. 46

| Selected band | Amplification/bypass | Output mode | Sw1G | Sw2G | Sw3G | Sw1S | Sw2S | Sw3S | Sw4S | Sw1B | Sw2B | Sw3B | Sw4B | Sw5S | Sw1a | Sw2a | Sw3a | Sw4a | Sw5a | Sw6 | Sw7 | Sw8 | Sw9 | Sw10 |
|---|---|---|---|---|---|---|---|---|---|---|---|---|---|---|---|---|---|---|---|---|---|---|---|---|
| 850~960 MHz | Amplification | Single: OUT1 | ON | OFF | OFF | OFF | ON | ON | OFF | OFF | OFF | OFF | OFF | ON | ON | OFF | OFF | OFF | OFF | ON | OFF | OFF | OFF | ON |
| | | Single: OUT2 | ON | OFF | OFF | OFF | ON | ON | OFF | OFF | OFF | OFF | OFF | ON | ON | OFF | OFF | OFF | OFF | OFF | ON | OFF | OFF | ON |
| | | Split | ON | OFF | OFF | OFF | ON | ON | OFF | OFF | OFF | OFF | OFF | ON | ON | OFF | OFF | OFF | OFF | ON | ON | ON | OFF | ON |
| | Bypass | Single: OUT1 | OFF | OFF | OFF | OFF | ON | ON | ON | ON | OFF | OFF | ON | OFF | OFF | OFF | OFF | — | — | ON | OFF | OFF | OFF | ON |
| | | Single: OUT2 | OFF | OFF | OFF | OFF | ON | ON | ON | ON | OFF | OFF | ON | OFF | OFF | OFF | OFF | — | — | OFF | ON | OFF | OFF | ON |
| | | Split | OFF | OFF | OFF | OFF | ON | ON | ON | ON | OFF | OFF | ON | OFF | OFF | OFF | OFF | — | — | ON | ON | ON | ON | OFF |
| 717~821 MHz | Amplification | Single: OUT1 | OFF | ON | OFF | ON | OFF | ON | OFF | OFF | OFF | OFF | OFF | ON | ON | ON | OFF | ON | OFF | ON | OFF | OFF | OFF | ON |
| | | Single: OUT2 | OFF | ON | OFF | ON | OFF | ON | OFF | OFF | OFF | OFF | OFF | ON | ON | ON | OFF | ON | OFF | OFF | ON | OFF | OFF | ON |
| | | Split | OFF | ON | OFF | ON | OFF | ON | OFF | OFF | OFF | OFF | OFF | ON | ON | ON | OFF | ON | OFF | ON | ON | ON | OFF | ON |
| | Bypass | Single: OUT1 | OFF | OFF | OFF | ON | OFF | ON | ON | OFF | ON | OFF | ON | OFF | OFF | OFF | OFF | — | — | ON | OFF | OFF | OFF | ON |
| | | Single: OUT2 | OFF | OFF | OFF | ON | OFF | ON | ON | OFF | ON | OFF | ON | OFF | OFF | OFF | OFF | — | — | OFF | ON | OFF | OFF | ON |
| | | Split | OFF | OFF | OFF | ON | OFF | ON | ON | OFF | ON | OFF | ON | OFF | OFF | OFF | OFF | — | — | ON | ON | ON | ON | OFF |
| 617~652 MHz | Amplification | Single: OUT1 | OFF | OFF | ON | ON | ON | OFF | OFF | OFF | OFF | OFF | OFF | ON | ON | ON | ON | ON | ON | ON | OFF | OFF | OFF | ON |
| | | Single: OUT2 | OFF | OFF | ON | ON | ON | OFF | OFF | OFF | OFF | OFF | OFF | ON | ON | ON | ON | ON | ON | OFF | ON | OFF | OFF | ON |
| | | Split | OFF | OFF | ON | ON | ON | OFF | OFF | OFF | OFF | OFF | OFF | ON | ON | ON | ON | ON | ON | ON | ON | ON | OFF | ON |
| | Bypass | Single: OUT1 | OFF | OFF | OFF | ON | ON | OFF | ON | OFF | OFF | ON | ON | OFF | OFF | OFF | OFF | — | — | ON | OFF | OFF | OFF | ON |
| | | Single: OUT2 | OFF | OFF | OFF | ON | ON | OFF | ON | OFF | OFF | ON | ON | OFF | OFF | OFF | OFF | — | — | OFF | ON | OFF | OFF | ON |
| | | Split | OFF | OFF | OFF | ON | ON | OFF | ON | OFF | OFF | ON | ON | OFF | OFF | OFF | OFF | — | — | ON | ON | ON | ON | OFF |

"—": Either ON or OFF

FIG. 48

| Frequency band (MHz) | Cmc2 | Cmc3 | Cmcs1 | Cmcs2 |
|---|---|---|---|---|
| 859～960 | **ON** | OFF | OFF | OFF |
| 717～821 | OFF | OFF | **ON** | OFF |
| 617～652 | **ON** | **ON** | **ON** | **ON** |

FIG. 51

| Frequency band (MHz) | Csp2 | Csp3 | Csps1 | Csps2 |
|---|---|---|---|---|
| 859~960 | OFF | OFF | OFF | OFF |
| 717~821 | **ON** | OFF | **ON** | OFF |
| 617~652 | **ON** | **ON** | **ON** | **ON** |

FIG. 53

VDDLNA=1.2V IddLNA(Amplification mode) =6.458 mA

| Selected band | Amplification/ bypass | Output mode | S21 (dB) Band center | NF (dB) Within band | S11 (dB) Within band | S22 (dB) Within band | S23 (dB) Within band |
|---|---|---|---|---|---|---|---|
| 859~960 MHz | Amplification | Single | 21.2 | 0.936 | -9.9 | -12.7 | -38.2 |
| | | Split | 18.5 | 0.965 | -8.3 | -18.4 | -30.0 |
| | Bypass | Single | -2.2 | 2.387 | -10.4 | -21.1 | -36.7 |
| | | Split | -5.8 | 6.115 | -17.1 | -20.3 | -29.1 |
| 717~821 MHz | Amplification | Single | 21.4 | 0.731 | -6.7 | -12.2 | -40.2 |
| | | Split | 18.7 | 0.756 | -6.8 | -16.8 | -29.1 |
| | Bypass | Single | -2.4 | 2.556 | -20.5 | -13.2 | -36.9 |
| | | Split | -6.7 | 7.258 | -15.0 | -18.9 | -29.1 |
| 617~652 MHz | Amplification | Single | 21.8 | 0.730 | -7.3 | -12.7 | -44.5 |
| | | Split | 18.9 | 0.754 | -8.0 | -15.9 | -33.5 |
| | Bypass | Single | -2.9 | 2.914 | -21.1 | -12.7 | -40.5 |
| | | Split | -7.6 | 7.846 | -18.0 | -17.4 | -38.3 |

FIG. 55

| Selected band | Amplification/bypass | Output mode | Sw1G | Sw2G | Sw3G | Sw1S | Sw2S | Sw3S | SwX | SwA...SwB | Sw1a | Sw2a | Sw3a | Sw6 | Sw7 | Sw8 | Sw10a | Sw11a | Sw12a | Sw13 | Sw14 | Sw15 | T-SwA | T-SwB |
|---|---|---|---|---|---|---|---|---|---|---|---|---|---|---|---|---|---|---|---|---|---|---|---|---|
| 859~960 MHz | Amplification | Single: OUT1 | ON | OFF | OFF | OFF | ON | ON | OFF | ON | ON | OFF | OFF | ON | OFF | OFF | OFF | OFF | OFF | OFF | OFF | OFF | OFF | OFF |
| | | Single: OUT2 | ON | OFF | OFF | OFF | ON | ON | OFF | ON | ON | OFF | OFF | OFF | ON | OFF | OFF | OFF | OFF | OFF | OFF | OFF | OFF | OFF |
| | | Split | ON | OFF | OFF | OFF | ON | ON | OFF | ON | ON | OFF | OFF | ON | ON | ON | OFF | OFF | OFF | OFF | OFF | OFF | OFF | OFF |
| | Bypass | Single: OUT1 | ON | OFF | OFF | OFF | ON | ON | ON | OFF | OFF | OFF | OFF | ON | OFF | OFF | OFF | OFF | OFF | ON | OFF | OFF | ON | OFF |
| | | Single: OUT2 | ON | OFF | OFF | OFF | ON | ON | ON | OFF | OFF | OFF | OFF | OFF | ON | OFF | OFF | OFF | OFF | ON | OFF | OFF | ON | OFF |
| | | Split | ON | OFF | OFF | OFF | ON | ON | OFF | OFF | ON | OFF | OFF | ON | ON | ON | OFF | OFF | ON | OFF | OFF | OFF | OFF | ON |
| 737~821 MHz | Amplification | Single: OUT1 | OFF | ON | OFF | ON | OFF | ON | OFF | ON | ON | ON | OFF | ON | OFF | OFF | ON | OFF | OFF | OFF | OFF | OFF | OFF | OFF |
| | | Single: OUT2 | OFF | ON | OFF | ON | OFF | ON | OFF | ON | ON | ON | OFF | OFF | ON | OFF | ON | OFF | OFF | OFF | OFF | OFF | OFF | OFF |
| | | Split | OFF | ON | OFF | ON | OFF | ON | OFF | ON | ON | ON | OFF | ON | ON | ON | ON | OFF | OFF | OFF | OFF | OFF | OFF | OFF |
| | Bypass | Single: OUT1 | OFF | ON | OFF | ON | OFF | ON | ON | OFF | OFF | OFF | OFF | ON | OFF | OFF | OFF | OFF | OFF | OFF | OFF | OFF | ON | OFF |
| | | Single: OUT2 | OFF | ON | OFF | ON | OFF | ON | ON | OFF | OFF | OFF | OFF | OFF | ON | OFF | OFF | OFF | OFF | OFF | OFF | OFF | ON | OFF |
| | | Split | OFF | ON | OFF | ON | OFF | ON | OFF | OFF | ON | ON | OFF | ON | ON | ON | OFF | OFF | ON | OFF | ON | OFF | OFF | ON |
| 617~652 MHz | Amplification | Single: OUT1 | OFF | OFF | ON | ON | ON | OFF | OFF | ON | ON | ON | ON | ON | OFF | OFF | ON | ON | OFF | OFF | OFF | OFF | OFF | OFF |
| | | Single: OUT2 | OFF | OFF | ON | ON | ON | OFF | OFF | ON | ON | ON | ON | OFF | ON | OFF | ON | ON | OFF | OFF | OFF | OFF | OFF | OFF |
| | | Split | OFF | OFF | ON | ON | ON | OFF | OFF | ON | ON | ON | ON | ON | ON | ON | ON | ON | OFF | OFF | OFF | OFF | OFF | OFF |
| | Bypass | Single: OUT1 | OFF | OFF | ON | ON | ON | OFF | ON | OFF | OFF | OFF | OFF | ON | OFF | OFF | OFF | OFF | OFF | OFF | OFF | ON | ON | OFF |
| | | Single: OUT2 | OFF | OFF | ON | ON | ON | OFF | ON | OFF | OFF | OFF | OFF | OFF | ON | OFF | OFF | OFF | OFF | OFF | OFF | ON | ON | OFF |
| | | Split | OFF | OFF | ON | ON | ON | OFF | OFF | OFF | ON | ON | ON | ON | ON | ON | OFF | OFF | ON | OFF | ON | OFF | OFF | ON |

FIG. 57

VDDLNA=1.2V IddLNA(Amplification mode) =6.453 mA

| Selected band | Amplification/ bypass | Output mode | S21 (dB) Band center | NF (dB) Within band | S11 (dB) Within band | S22 (dB) Within band | S23 (dB) Within band |
|---|---|---|---|---|---|---|---|
| 859~960 MHz | Amplification | Single | 21.0 | 0.913 | -8.0 | -12.9 | -38.6 |
| | | Split | 18.4 | 0.943 | -6.8 | -19.3 | -31.8 |
| | Bypass | Single | -2.2 | 2.354 | -12.9 | -16.7 | -36.8 |
| | | Split | -7.5 | 8.573 | -11.9 | -19.8 | -32.3 |
| 717~821 MHz | Amplification | Single | 21.3 | 0.738 | -6.2 | -12.8 | -40.5 |
| | | Split | 18.5 | 0.767 | -6.1 | -17.4 | -29.9 |
| | Bypass | Single | -3.0 | 3.425 | -10.3 | -14.3 | -39.3 |
| | | Split | -8.4 | 9.308 | -7.2 | -16.1 | -27.7 |
| 617~652 MHz | Amplification | Single | 21.7 | 0.741 | -8.2 | -13.3 | -44.7 |
| | | Split | 18.8 | 0.766 | -8.7 | -16.0 | -32.8 |
| | Bypass | Single | -3.7 | 3.651 | -11.7 | -12.2 | -41.9 |
| | | Split | -9.6 | 9.982 | -9.6 | -17.8 | -38.3 |

F I G. 61

| Selected band MHz | Output mode | Active output | T-Sw1 | T-Sw2 | T-Sw3 | Sw21 Sw22a Sw23 | Sw22b |
|---|---|---|---|---|---|---|---|
| 617~652 | Single output | OUT1 | ON | OFF | ON | — | — |
| | | OUT2 | OFF | ON | ON | — | — |
| | Split output | OUT1 OUT2 | ON | ON | OFF | OFF | ON |
| 717~821 | Single output | OUT1 | ON | OFF | ON | — | — |
| | | OUT2 | OFF | ON | ON | — | — |
| | Split output | OUT1 OUT2 | ON | ON | OFF | ON | OFF |
| 859~960 | Single output | OUT1 | ON | OFF | ON | — | — |
| | | OUT2 | OFF | ON | ON | — | — |
| | Split output | OUT1 OUT2 | ON | ON | OFF | ON | OFF |

(a) "—": Either ON or OFF

| Selected band | Output mode | Cdd1,Cdd2 (pF) | Cout1,Cout2 (pF) |
|---|---|---|---|
| 617~652 MHz | Single | 1.5 | 3.0 |
| | Split | 0.3 | |
| 717~821 MHz | Single | 0.6 | 2.5 |
| | Split | 0.0 | |
| 859~960 MHz | Single | 0.3 | 1.6 |
| | Split | 0.0 | |

| Selected band MHz | Output mode | Idd_lna (mA) | S21 (dB) Band center | NF (dB) Within band | S11 (dB) Within band | S22 (dB) Within band | S23 (dB) Within band |
|---|---|---|---|---|---|---|---|
| 859~960 | Single output | 6.5 | 22.0 | 0.93 | -9.7 | -12.8 | -65.1 |
| | Split output | 13.0 | 21.2 | 1.02 | -10.4 | -15.3 | -27.6 |
| 717~821 | Single output | 6.5 | 21.4 | 0.73 | -6.6 | -12.1 | -68.2 |
| | Split output | 13.0 | 21.0 | 0.81 | -8.9 | -18.9 | -28.1 |
| 617~652 | Single output | 6.5 | 21.3 | 0.73 | -6.6 | -19.0 | -72.2 |
| | Split output | 13.0 | 20.9 | 0.87 | -8.5 | -14.3 | -40.0 |

F I G. 72

| Selected band | Amplification/ bypass | Output mode | Sw1G | Sw2G | Sw3G | Sw1S | Sw2S | Sw3S | Sw4S | Sw1B | Sw2B | Sw3B | Sw4B Sw5B | Sw5S Sw1L Sw2L | T-Sw1 | T-Sw2 | T-Sw3 | Ld1 Ld2 (nH) | Cout1 Cout2 (pF) | Rox (Ω) |
|---|---|---|---|---|---|---|---|---|---|---|---|---|---|---|---|---|---|---|---|---|
| 659~960 MHz | Amplification | Single: OUT1 | ON | OFF | OFF | OFF | ON | ON | OFF | OFF | OFF | OFF | OFF | ON | ON | OFF | ON | 20.5 | 1.60 | — |
| | | Single: OUT2 | ON | OFF | OFF | OFF | ON | ON | OFF | OFF | OFF | OFF | OFF | ON | OFF | ON | ON | | | |
| | | Split | ON | OFF | OFF | OFF | ON | ON | OFF | OFF | OFF | OFF | OFF | ON | ON | ON | OFF | 15.0 | 1.82 | 200 |
| | Bypass | Single: OUT1 | OFF | OFF | OFF | OFF | ON | ON | ON | ON | OFF | OFF | ON | OFF | ON | OFF | ON | 20.5 | 3.00 | — |
| | | Single: OUT2 | OFF | OFF | OFF | OFF | ON | ON | ON | ON | OFF | OFF | ON | OFF | OFF | ON | ON | | | |
| | | Split | OFF | OFF | OFF | OFF | ON | ON | ON | ON | OFF | OFF | ON | OFF | ON | ON | OFF | 11.5 | 3.00 | 140 |
| 717~821 MHz | Amplification | Single: OUT1 | OFF | ON | OFF | ON | OFF | ON | OFF | OFF | OFF | OFF | OFF | ON | ON | OFF | ON | 23.5 | 2.10 | — |
| | | Single: OUT2 | OFF | ON | OFF | ON | OFF | ON | OFF | OFF | OFF | OFF | OFF | ON | OFF | ON | ON | | | |
| | | Split | OFF | ON | OFF | ON | OFF | ON | OFF | OFF | OFF | OFF | OFF | ON | ON | ON | OFF | 15.0 | 2.80 | 200 |
| | Bypass | Single: OUT1 | OFF | OFF | OFF | ON | OFF | ON | ON | OFF | ON | OFF | ON | OFF | ON | OFF | ON | 20.5 | 3.40 | — |
| | | Single: OUT2 | OFF | OFF | OFF | ON | OFF | ON | ON | OFF | ON | OFF | ON | OFF | OFF | ON | ON | | | |
| | | Split | OFF | OFF | OFF | ON | OFF | ON | ON | OFF | ON | OFF | ON | OFF | ON | ON | OFF | 15.0 | 3.40 | 140 |
| 617~652 MHz | Amplification | Single: OUT1 | OFF | OFF | ON | ON | ON | OFF | OFF | OFF | OFF | OFF | OFF | ON | ON | OFF | ON | 30.0 | 2.20 | — |
| | | Single: OUT2 | OFF | OFF | ON | ON | ON | OFF | OFF | OFF | OFF | OFF | OFF | ON | OFF | ON | ON | | | |
| | | Split | OFF | OFF | ON | ON | ON | OFF | OFF | OFF | OFF | OFF | OFF | ON | ON | ON | OFF | 20.5 | 3.00 | 300 |
| | Bypass | Single: OUT1 | OFF | OFF | OFF | ON | ON | OFF | ON | OFF | OFF | ON | ON | OFF | ON | OFF | ON | 30.0 | 3.70 | — |
| | | Single: OUT2 | OFF | OFF | OFF | ON | ON | OFF | ON | OFF | OFF | ON | ON | OFF | OFF | ON | ON | | | |
| | | Split | OFF | OFF | OFF | ON | ON | OFF | ON | OFF | OFF | ON | ON | OFF | ON | ON | OFF | 18.0 | 4.5 | 140 |

"—": Any value

FIG. 74

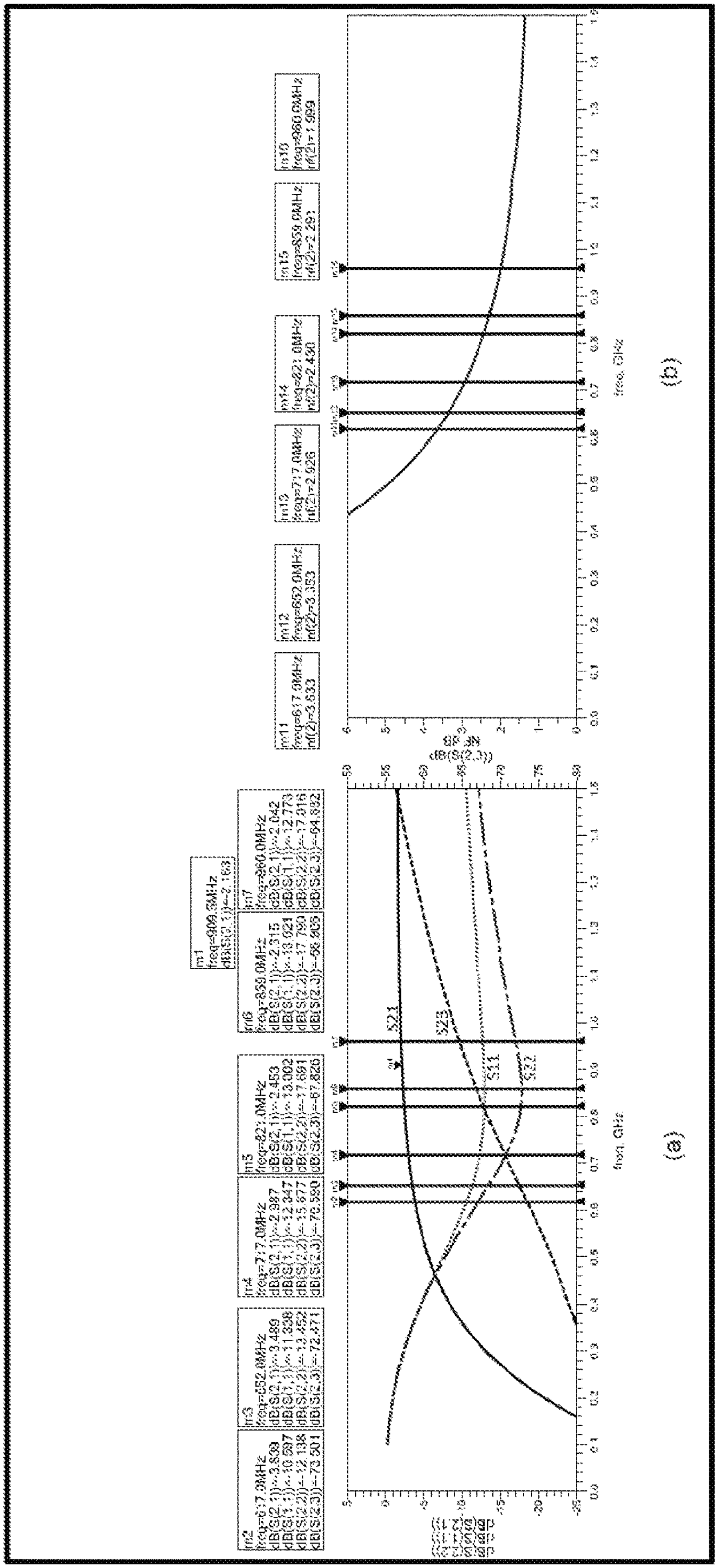
F I G. 81

VDDLNA=1.2V

| Selected band | Amplification/ bypass | Output mode | Idd_lna (mA) | S21 (dB) Band center | NF (dB) Within band | S11 (dB) Within band | S22 (dB) Within band | S23 (dB) Within band |
|---|---|---|---|---|---|---|---|---|
| 859~960 MHz | Amplification | Single | 6.5 | 22.8 | 0.92 | -9.3 | -12.3 | -64.8 |
| 859~960 MHz | Amplification | Split | 13.0 | 20.9 | 1.03 | -11.2 | -19.0 | -27.9 |
| 859~960 MHz | Bypass | Single | 0.0 | -2.2 | 2.29 | -12.8 | -17.0 | -64.7 |
| 859~960 MHz | Bypass | Split | 0.0 | -5.9 | 6.18 | -11.2 | -18.8 | -28.7 |
| 717~821 MHz | Amplification | Single | 6.5 | 22.7 | 0.75 | -6.1 | -13.0 | -67.9 |
| 717~821 MHz | Amplification | Split | 13.0 | 20.7 | 0.85 | -9.2 | -14.8 | -29.7 |
| 717~821 MHz | Bypass | Single | 0.0 | -2.7 | 3.11 | -12.4 | -18.4 | -69.2 |
| 717~821 MHz | Bypass | Split | 0.0 | -6.2 | 6.68 | -10.1 | -20.6 | -28.5 |
| 617~652 MHz | Amplification | Single | 6.5 | 23.5 | 0.76 | -6.6 | -18.1 | -72.2 |
| 617~652 MHz | Amplification | Split | 13.0 | 21.9 | 0.83 | -9.3 | -22.7 | -33.4 |
| 617~652 MHz | Bypass | Single | 0.0 | -2.8 | 2.98 | -13.2 | -21.1 | -72.3 |
| 617~652 MHz | Bypass | Split | 0.0 | -6.7 | 6.96 | -9.5 | -26.1 | -33.0 |

FIG. 91

SEMICONDUCTOR CIRCUIT

CROSS-REFERENCE TO RELATED APPLICATIONS

This application is based upon and claims the benefit of priority from Japanese Patent Application No. 2020-156192, filed Sep. 17, 2020, the entire contents of which are incorporated herein by reference.

FIELD

Embodiments described herein relate generally to a semiconductor circuit.

BACKGROUND

Carrier aggregation is used in wireless communication systems for boosting the wireless communication speed.

BRIEF DESCRIPTION OF THE DRAWINGS

FIGS. 4, 5, 6, 7, and 8 are each a diagram showing an exemplary operation of the LNA according to the first embodiment.

FIGS. 9, 10, 11, 12, and 13 are each a diagram showing characteristics of the LNA according to the first embodiment.

FIG. 14 is a circuit diagram showing an exemplary configuration of an LNA according to a second embodiment.

FIGS. 15, 16, and 17 are each a diagram showing an exemplary operation of the LNA according to the second embodiment.

FIGS. 18, 19, 20, 21, 22, 23, 24, 25, and 26 are each a diagram showing characteristics of the LNA according to the second embodiment.

FIGS. 29, 30, 31, 32, and 33 are each a diagram showing an exemplary operation of the LNA according to the third embodiment.

FIGS. 34, 35, 36, 37, 38, 39, 40, 41, 42, 43, 44, 45, and 46 are each a diagram showing characteristics of the LNA according to the third embodiment.

FIGS. 48, 49, 50, 51, 52, 53, and 54 are each a diagram showing an exemplary operation of the LNA according to the fourth embodiment.

FIG. 55 is a diagram showing characteristics of the LNA according to the fourth embodiment.

FIGS. 57, 58, 59, and 60 are each a diagram showing an exemplary operation of the LNA according to the fifth embodiment.

FIG. 61 is a diagram showing characteristics of the LNA according to the fifth embodiment.

FIGS. 63, 64, and 65 are each a diagram showing an exemplary operation of the LNA according to the sixth embodiment.

FIGS. 66, 67, 68, 69, 70, 71, and 72 are each a diagram showing characteristics of the LNA according to the sixth embodiment.

FIGS. 74, 75, 76, 77, and 78 are each a diagram showing an exemplary operation of the LNA according to the seventh embodiment.

FIGS. 79, 80, 81, 82, 83, 84, 85, 86, 87, 88, 89, 90, and 91 are each a diagram showing characteristics of the LNA according to the seventh embodiment.

DETAILED DESCRIPTION

In general, according to one embodiment, a semiconductor circuit includes: an amplifier circuit including a first transistor and a second transistor connected by cascode, the amplifier circuit configured to amplify a signal supplied via an input terminal to a gate of the first transistor; an output circuit including a first node connected to the amplifier circuit, a first output terminal, and a second output terminal, the output circuit configured to performing an output operation based on a first output mode using one of the first output terminal and the second output terminal or a second output mode using the first output terminal and the second output terminal; and a bypass circuit connected between the input terminal and the first node. The output circuit includes a first switch circuit connected between a second node and the first output terminal, a second switch circuit connected between a third node and the second output terminal, a third switch circuit connected between the second node and the third node, a first passive circuit connected to the second node, a second passive circuit connected to the third node, and at least one third passive circuit connected between the second node and the third node.

Semiconductor circuits according to the embodiments will be described with reference to FIGS. 1 to 91.

For each embodiment, the details will be discussed while the drawings are referred to. The description will use the same reference signs for the features or components having the same or substantially the same functions and/or configurations.

Embodiments

(1) First Embodiment

A semiconductor circuit according to the first embodiment will be described with reference to FIGS. 1 to 13.

(1a) Exemplary Configuration

Figure 1:
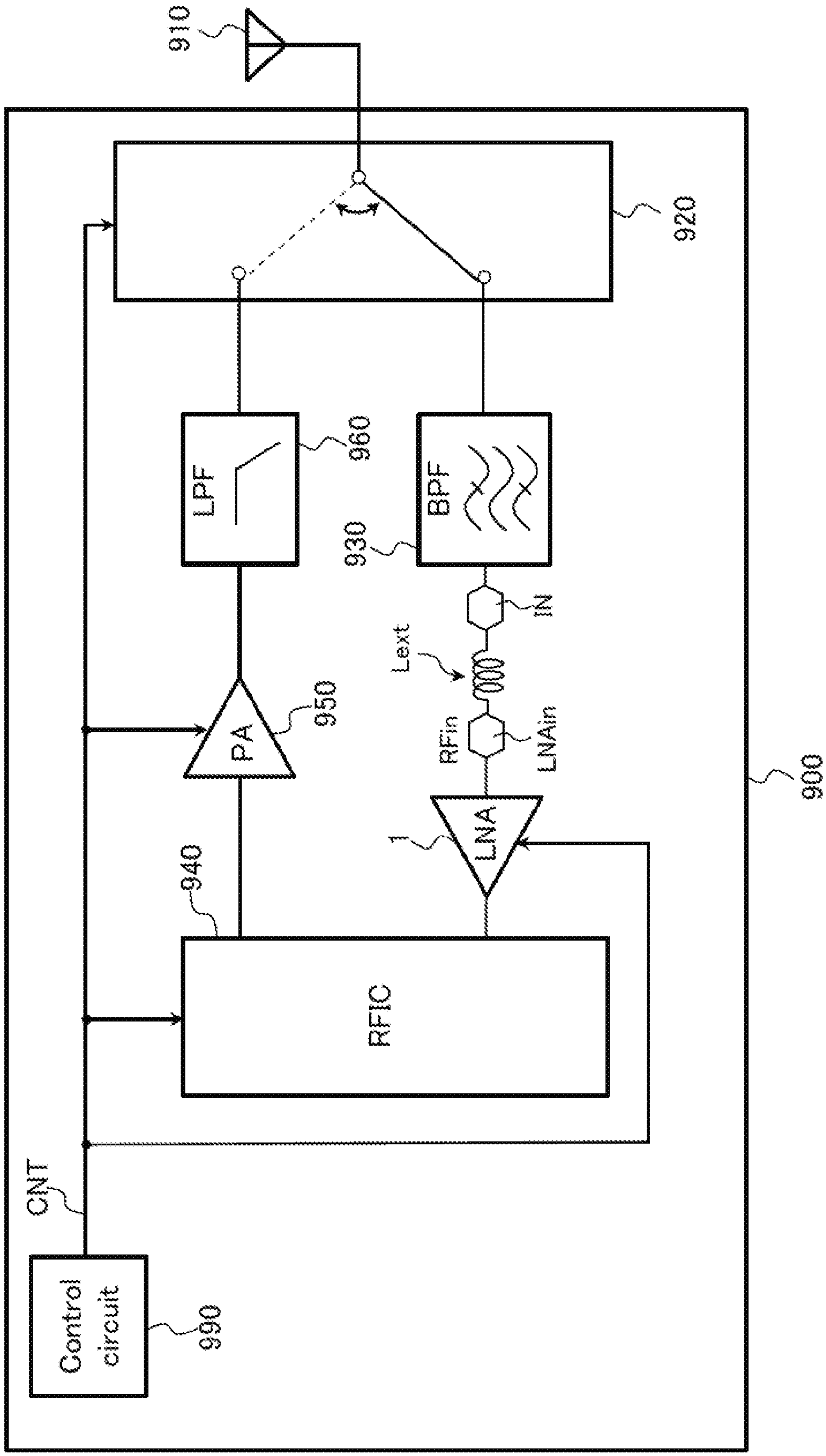
FIG. 1 is a block diagram showing a system that includes a semiconductor circuit according to an embodiment.
Figure 2:
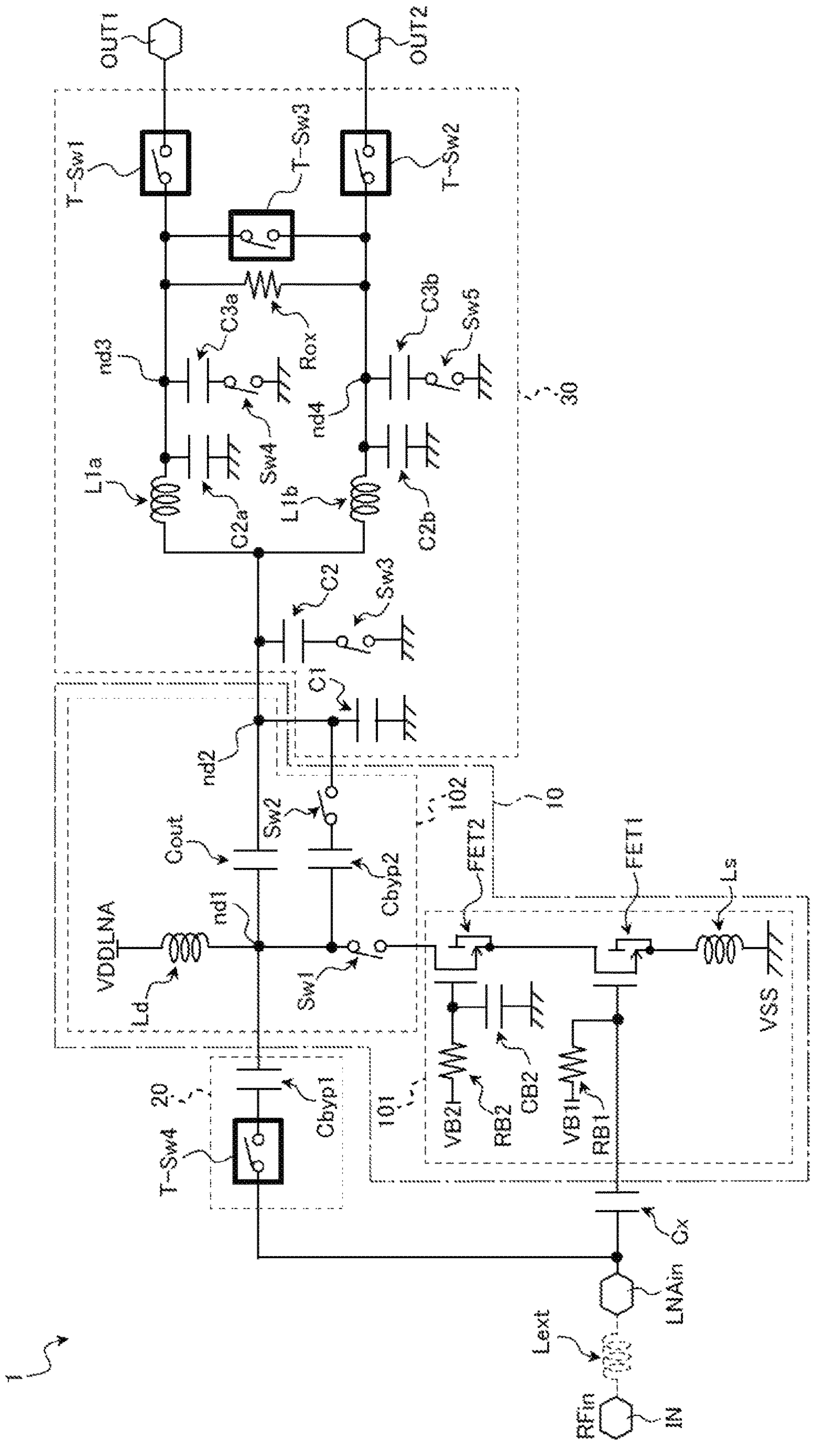
FIG. 2 is an equivalent circuit diagram showing an exemplary configuration of a low-noise amplifier (LNA) according to a first embodiment.

FIGS. 1 and 2 will be referred to for describing exemplary configurations of the semiconductor circuit according to the embodiment.

FIG. 1 is a block diagram showing a wireless communication system according to the embodiment.

The wireless communication system 900 shown in FIG. 1 includes the semiconductor circuit 1 according to the first embodiment. The semiconductor circuit 1 according to the embodiment relates to, or takes the form of, an amplifier circuit (e.g., radio-frequency amplifier circuit). The semiconductor circuit 1 according to the embodiment may be, for example, a radio-frequency (high-frequency) low-noise amplifier (LNA) 1.

As shown in FIG. 1, the wireless communication system 900 includes an antenna 910, an antenna switch 920, a band-pass filter (BPF) 930, the LNA 1, a processing circuit 940, a power amplifier (PA) 950, a low-pass filter (LPF) 960, and so on.

The antenna 910 is adapted to receive radio-frequency signals (for example, a signal having a frequency of 10 kHz or more, more specific example, a signal having a frequency in the range from 100 MHz to 28 GHz) from other devices (e.g., base stations, other wireless communication systems, etc.).

The antenna switch 920 is a switch circuit for the switchover between transmission and reception of signals via the antenna 910. Note that FIG. 1 assumes an instance where the signal path (bus) on the transmitting side and that on the receiving side are each constituted by a single-line system. However, the signal path (bus) on the transmitting side and that on the receiving side may each be constituted by a multiple-line system according to the number of frequency bands that can be employed by the wireless communication system for transmission and reception.

For example, the antenna switch 920 may be arranged on the same substrate (e.g., an SOI substrate) on which the LNA 1 is arranged. The antenna switch 920 and the LNA 1 are provided as a single chip. Arranging the antenna switch 920 and the semiconductor circuit 1 on one SOI substrate allows for reduction of power loss in radio-frequency signals, suppression of power consumption, and/or downsizing of the system/device.

The band-pass filter 930 selectively permits radio-frequency signals that belong to a given frequency band (frequency range) to pass through.

The LNA 1 according to the present embodiment receives signals that have transmitted through the band-pass filter 930. For example, the LNA 1 has its input terminal LNAin connected to a terminal IN via an inductor Lext. The band-pass filter 930 supplies radio-frequency signals of a given frequency band to the terminal IN.

The LNA 1 processes the signals from the band-pass filter 930 in a prescribed manner. The LNA 1 sends the signals to a subsequent circuitry component (for example, the processing circuit 940) in a prescribed operation.

The processing circuit 940 performs a variety of processing on the radio-frequency signals from the LNA 1. Examples of the processing circuit 940 include a radio-frequency integrated circuit (RFIC).

The power amplifier 950 amplifies the signal value (at least one of the voltage value and/or the current value) of the radio-frequency signals from the processing circuit 940 to a predetermined value.

The low-pass filter 960 blocks signals of a frequency higher than a cutoff frequency. The low-pass filter 960 sends signals of a frequency (frequency band) equal to or lower than the cutoff frequency. The signals that have passed through the low-pass filter 960 are routed through the antenna switch 920 and sent out of the wireless communication system 900 via the antenna 910.

The wireless communication system 900 further includes circuitry components such as a control circuit 990.

The control circuit 990 executes a variety of processing actions for received signals, a variety of processing for signal transmission and reception, and a variety of other processing within the wireless communication system 900.

The control circuit 990 is capable of controlling operations of multiple circuits (modules) within the wireless communication system 900. For example, the control circuit 990 can control the operations of the LNA 1 according to the embodiment.

The control circuit 990 supplies various control signals CNT to the LNA 1 and other circuits.

Note that the control circuit 990 may be provided in the processing circuit 940. The processing circuit 940 may be adapted to function as the control circuit 990.

The wireless communication system 900 may be, for example, a personal computer, a smartphone, a future phone, a portable terminal (such as a tablet terminal), a game machine, a router, a base station, etc.

FIG. 2 is an equivalent circuit diagram of the LNA 1 according to the present embodiment.

The description may occasionally refer to components (e.g., passive elements) in the LNA 1 with the adjective "series (serial)" or "parallel". In such instances, a "serial" element can mean an element arranged (or connected) in series on a communication path (transmission path) (e.g., a signal path, an interconnect, or a node) for signals (e.g., radio-frequency signals). A "parallel" element can mean an element arranged (or connected) between a communication path for signals and a reference potential.

<Amplifier Circuit>

The LNA 1 according to the embodiment includes a cascode connection amplifier circuit 10 for amplifying a supplied radio-frequency signal RFin. The cascode connection amplifier circuit 10 includes multiple field-effect transistors FET1 and FET2 having cascode connection. In the following description, the cascode connection amplifier circuit 10 may be simply called an "amplifier circuit".

The cascode connection amplifier circuit 10 includes a core circuit 101 (which may also be called a "cascode connection part") and an output matching circuit 102 (which may also be called a "output matching part").

The core circuit 101 includes the two field-effect transistors FET1 and FET2 (which may be simply called "transistors"), resistors (resistive elements) RB1 and RB2, a capacitor (capacitive element) CB2, and an inductor (inductive element) Ls.

The two transistors FET1 and FET2 are connected by cascode connection. The present embodiment assumes each of the transistors FET1 and FET2 to be an n-channel type MOS transistor. However, the transistors FET1 and FET2 may each be a p-channel type MOS transistor.

One terminal of the transistor FET1 on the current path, e.g., the source of the transistor FET1, is electrically connected to one terminal of the inductor Ls. The other terminal of the inductor Ls is connected to a terminal to which a reference voltage VSS is applied (the terminal may also be called a "reference voltage terminal VSS" or a "ground terminal VSS"). The voltage VSS (which may be called a "ground voltage") has a voltage value 0V. As such, the source of the transistor FET1 is grounded via the inductor Ls.

The other terminal of the transistor FET1 on the current path, e.g., the drain of the transistor FET1, is electrically connected to one terminal of the transistor FET2 on the current path, e.g., the source of the transistor FET2.

The other terminal of the transistor FET2 on the current path, e.g., the drain of the transistor FET2, is connected to a node nd1 (an interconnect or a terminal) via a switch Sw1.

The switch Sw1 controls the electrical connection between the drain of the transistor FET2 and the node nd1. The node nd1 serves as an input node of the output matching circuit 102.

The control terminal of the transistor FET1, i.e., the gate of the transistor FET1, is connected to the input terminal LNAin of the LNA1 via a capacitor Cx. The capacitor Cx blocks the direct current component of signals supplied to the gate of the transistor FET1.

A gate of the transistor FET1 is connected to one terminal of the resistor RB1. The other terminal of the resistor RB1 is connected to a bias generation circuit (not illustrated) within the LNA 1. The bias generation circuit applies a voltage VB1 to the other terminal of the resistor RB1. The voltage VB1 has a positive voltage value.

Note that a capacitor may be connected between the gate of the transistor FET1 and the source of the transistor FET1 according to the frequency band of the radio-frequency signals supplied to the LNA1.

The control terminal of the transistor FET2, i.e., the gate of the transistor FET2, is connected to one terminal of the resistor RB2. The other terminal of the resistor RB2 is connected to the bias generation circuit. The bias generation circuit applies a voltage VB2 to the other terminal of the resistor RB2. The voltage VB2 has a positive voltage value. A gate of the transistor FET2 is connected to one terminal of the capacitor CB2. The other terminal of the capacitor CB2 is connected to a ground terminal.

For example, the resistors RB1 and RB2 are provided to prevent the radio-frequency signals RFin from making an unintended flow toward the bias generation circuit.

In the core circuit 101, the transistor FET1 functions as a source-grounded field-effect transistor that exhibits inductive source degeneration attributable to the inductor Ls (which may also be called a “source inductor”). The transistor FET2 functions as a gate-grounded field-effect transistor that uses the ground capacitor CB2.

The input node for the radio-frequency signals (high-frequency signals) RFin is connected to the input terminal LNAin via the inductor Lext. This input node for the radio-frequency signals RFin is, for example, an input node of a 50Ω system. The inductor Lext (which may also be called an “external inductor”) is located, for example, outside the semiconductor chip that includes the cascode connection amplifier circuit 10. The inductor Lext may be disposed inside the semiconductor chip that includes the cascode connection amplifier circuit 10.

For example, the inductors Lext and Ls and the capacitor Cx constitute an input matching circuit of the cascode connection amplifier circuit 10. This configuration secures the impedance matching that takes into account the gain matching and the noise matching of the amplifying transistors FET1 and FET2.

For example, the core circuit 101 is formed by a process of manufacturing a semiconductor device that employs an SOI process.

Figure 3:
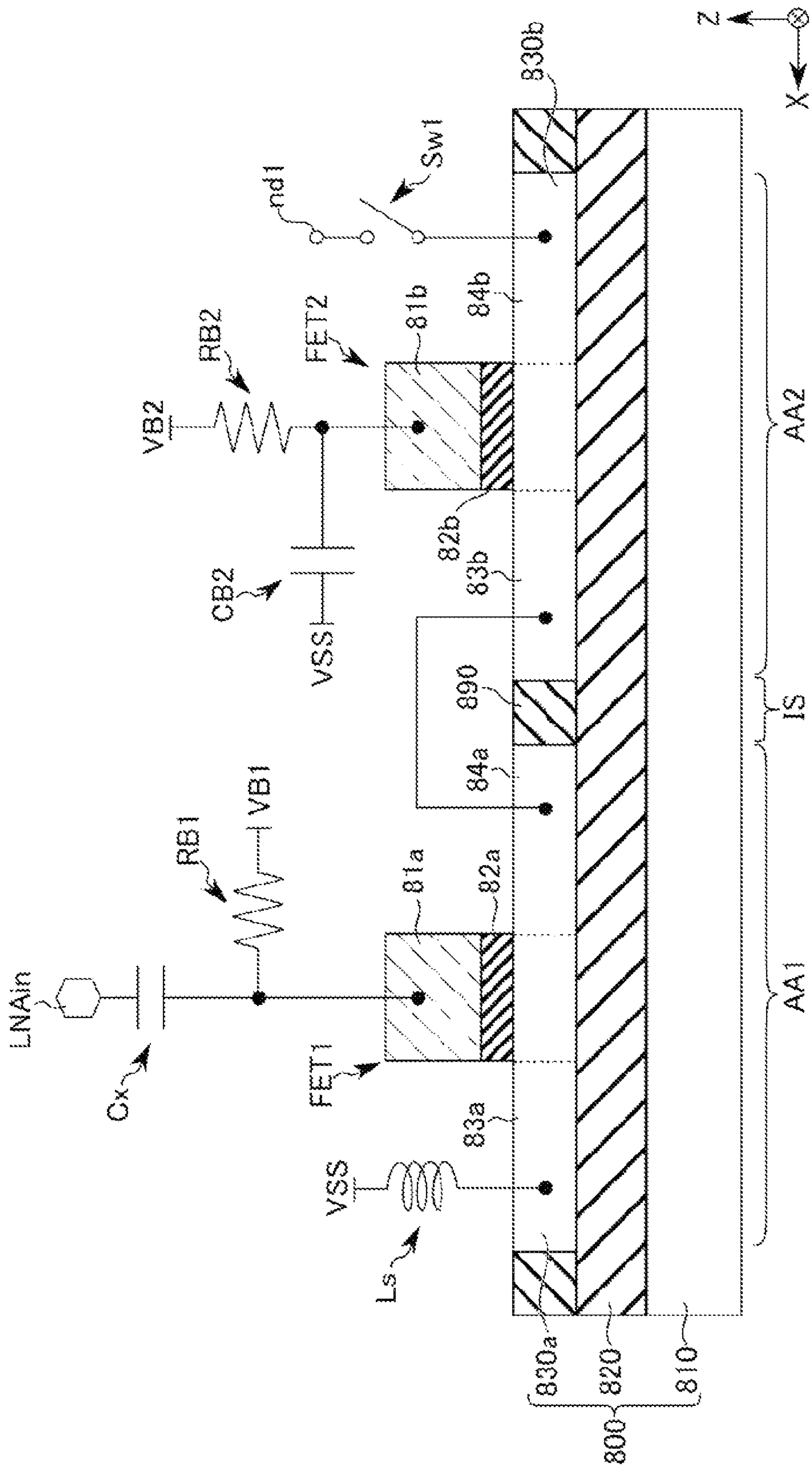
FIG. 3 is a sectional view showing an exemplary structure of the LNA according to the first embodiment.

FIG. 3 is a sectional view schematically showing an exemplary structure of the core circuit of the LNA according to the present embodiment.

As shown in FIG. 3, the transistors FET1 and FET2 are disposed on an SOI substrate 800.

FIG. 3 assumes an instance where the two transistors FET1 and FET2 connected in cascode connection, align in an X direction. However, the transistors FET1 and FET2 on the SOI substrate 800 are not limited to the exemplary layout shown in FIG. 3.

The SOI substrate 800 includes a supporting substrate 810, an insulating layer 820, and a semiconductor layer 830 (830*a*, 830*b*). The semiconductor layer 830 is disposed above the supporting substrate 810. The insulating layer 820 is disposed between the semiconductor layer 830 and the supporting substrate 810. The semiconductor layer 830 is electrically separated from the supporting substrate 810 by the insulating layer 820.

An example of the supporting substrate 810 is a semiconductor substrate (e.g., a silicon substrate). The semiconductor layer 830 is, for example, a silicon layer. The insulating layer 820 is, for example, a silicon oxide layer.

The transistor FET1 is disposed in an active area AA1 of the SOI substrate 800. The active area AA1 is an area partitioned by an element isolation area IS. An insulating layer 890 is provided in the element separation area IS.

A gate electrode 81*a* of transistor FET1 is provided above the semiconductor layer 830*a* in the direction (Z direction) perpendicular to the top of the SOI substrate 800. A gate insulating film 82*a* is disposed between the gate electrode 81*a* and the semiconductor layer 830*a*.

A source 83*a* of the transistor FET1 is provided in the semiconductor layer 830*a*. A drain 84*a* of the transistor FET1 is provided in the semiconductor layer 830*a*. In the semiconductor layer 830*a*, the region between the source 83*a* and the drain 84*a* serves as a channel region for the transistor FET1. A channel of the transistor FET1 is formed in this channel region when the transistor FET1 is in a driving state.

The transistor FET2 is provided in an active area AA2 of the SOI substrate 800. In one example, the active area AA2 for the transistor FET2 is electrically separated from the active area AA1 by the element isolation area IS.

A gate electrode 81*b* of the transistor FET2 is provided above the semiconductor layer 830*b* in the Z direction. A gate insulating film 82*b* is disposed between the gate electrode 81*b* and the semiconductor layer 830*b*.

Both of a source 83*b* and a drain 84*b* of the transistor FET2 is provided in the semiconductor layer 830*b*. In the semiconductor layer 830*b*, the region between the source 83*b* and the drain 84*b* serves as a channel region for the transistor FET2. When the transistor FET2 is in a driving state, a channel of the transistor FET2 is formed in this channel area.

In each of the transistors FET1 and FET2, the respective gate electrode 81 (81*a*, 81*b*) is a conductive layer which may include, for example, a polysilicon layer, a silicide layer, or a metal layer. Each gate electrode 81 may be of a mono-layered structure, or of a multi-layered structure.

In each of the transistors FET1 and FET2, the respective gate insulating film 82 (82*a*, 82*b*) is an insulating layer which may include, for example, a silicon oxide layer, a high-dielectric insulating layer (high-k film), etc. Each gate insulating film 82 may be of a mono-layered structure, or of a multi-layered structure.

As described above, the resistors RB1 and RB2, the capacitors Cx and CB2, and the inductor Ls are connected to the corresponding terminals of the transistors FET1 and FET2 formed on the SOI substrate 800. The transistors FET1 and FET2 are connected to the node nd1 (wiring or a terminal) via the switch Sw1.

One or more of the resistors RB1 and RB2, the capacitors Cx and CB2, and the inductor Ls may be provided on the SOI substrate 800 on which the transistors FET1 and FET2 are disposed.

Forming the transistors FET1 and FET2 of the cascode connection amplifier circuit 10 by the SOI process in the above manner can suppress the parasitic capacitance of the transistors. This allows for the reduction of power loss in radio-frequency signals.

In the present embodiment, field-effect transistors having radio-frequency (high-frequency) switching characteristics are applied to a radio-frequency LNA. This realizes a high-functionality LNA.

In the cascode connection amplifier circuit 10, the radio-frequency signal RFin that has been supplied is routed through the capacitor Cx and applied to the gate of the transistor FET1 among the two transistors FET1 and FET2 arranged in cascode connection. The transistors FET1 and FET2 operate in response to the supply of radio-frequency signals RFin.

The core circuit 101 in the cascode connection amplifier circuit 10 accordingly amplifies the supplied radio-frequency signal RFin.

The output matching circuit 102 includes an inductor Ld, multiple capacitors Cout and Cbyp2, and multiple switches Sw1 and Sw2.

One terminal of the inductor Ld id connected to the node nd1. Via the node nd1 and the switch Sw1, the inductor Ld is connected to the drain of the transistor FET2. The other terminal of the inductor Ld is connected to the bias generation circuit (not illustrated). The bias generation circuit applies a voltage VDDLNA to the other terminal of the inductor Ld. This source voltage VDDLNA has a positive voltage value.

One terminal of the capacitor Cout is connected to the node nd1. The other terminal of the capacitor Cout is connected to a node nd2.

The switch Sw1 is disposed between the node nd1 and the core circuit 101. One terminal of the switch Sw1 is connected to the drain of the transistor FET2. The other terminal of the switch Sw1 is connected to the node nd1.

When the switch Sw1 is off, the drain of the transistor FET2 is electrically separated from the node nd1. This makes the core circuit 101 electrically separate from output terminals OUT1 and OUT2 of the LNA1. As such, output of signals from the core circuit 101 to the output matching circuit 102 is blocked by the off-state switch Sw1.

When the switch Sw1 is on, the drain of the transistor FET2 is electrically connected to the node nd1. This makes the core circuit 101 electrically connected to the output terminals OUT1 and OUT2 of the LNA1. The output signals from the core circuit 101 are accordingly conveyed to the output terminals OUT1 and OUT2 of the LNA1.

In the present embodiment, the output matching circuit 102 includes the capacitor Cbyp2 and the switch Sw2.

One terminal of the capacitor Cbyp2 is connected to the node nd1. The other terminal of the capacitor Cbyp2 is connected to one terminal of the switch Sw2. The other terminal of the switch Sw2 is connected to the node nd2.

The switch Sw2 controls the electrical connection between the capacitor Cbyp2 and the node nd2. When the switch Sw2 is an off state, the capacitor Cbyp2 is electrically separated from the node nd2. When the switch Sw2 is an on state, the capacitor Cbyp2 is electrically connected to the node nd2. With the switch Sw2 being in the on state, the capacitor Cbyp2 is connected in parallel with the capacitor Cout between the two nodes nd1 and nd2.

In this manner, the on-state switch Sw2 sets the capacitor Cbyp2 in the effective state, while the off-state switch Sw2 sets the capacitor Cbyp2 in the ineffective state.

In the cascode connection amplifier circuit 10, the output matching circuit 102 is adapted to secure the impedance matching that takes into account the gain matching of the amplifying transistors FET1 and FET2.

The output matching circuit 102 secures, for example, the impedance matching between the circuit that supplies radio-frequency signals to the output matching circuit 102 (e.g., the core circuit 101 or a later-described bypass circuit 20) and the subsequent circuitry component (e.g., a later-described splitter circuit 30).

The transistor FET2 may have its drain connected to a load resistor (and a switch element) according to the gain of the amplifier circuit 10. This allows for the adjustment of the gain of the amplifier circuit 10 and its operational stabilization.

Note that the output matching circuit 102 may be handed as a discrete element from the components of the cascode connection amplifier circuit 10.

<Bypass Circuit>

The LNA 1 according to the present embodiment includes the bypass circuit 20.

In the embodiment, the bypass circuit 20 is disposed between the input terminal LNAin of the LNA 1 and the node nd1 in the output matching circuit 102.

One terminal of a switch circuit T-Sw4 is connected to the input terminal LNAin of the LNA 1. The other terminal of the switch circuit T-Sw4 is connected to the node nd1 via a capacitor Cbyp1.

The switch circuit T-Sw4 is a T-switch. The T-switch T-Sw4 includes three switch elements. One terminal of the first switch element in the T-switch T-Sw4 is connected to the input terminal (input node) of the T-switch T-Sw4. The second switch element is connected between the other terminal of the first switch element and the output terminal of the T-switch T-Sw4. The third switch element is connected between the point of connection between the first and second switch elements, and a reference voltage terminal (e.g., the ground terminal).

One terminal of the capacitor Cbyp1 is connected to the other terminal of the T-switch T-Sw4. The other terminal of the capacitor Cbyp1 is connected to the node nd1.

Thus, the T-switch T-Sw4 and the capacitor Cbyp1 are connected in series on the signal path (the interconnect connecting the terminal LNAin and the node nd1 together) in the bypass circuit 20. For example, the presence of the capacitor Cbyp1 mitigates the influence of the external inductor Lext by the series resonance effect produced between the capacitor Cbyp1 and the external inductor Lext.

The T-switch T-Sw4 controls the electrical connection between the input terminal LNAin and the node nd1. When the T-switch T-Sw4 is an off state, the input terminal LNAin is electrically separated from the node nd1. When the T-switch T-Sw4 is an on state, the input terminal LNAin is electrically connected to the node nd1 via the capacitor Cbyp1.

In the LNA 1 according to the embodiment, the bypass circuit 20 constitutes a path for transmitting the radio-frequency signals RFin from the input terminal to the later-described splitter circuit 30 of the LNA 1, without having them pass through the core circuit 101 (amplifier circuit 10).

With the bypass circuit 20, the radio-frequency signals RFin can be conveyed to the splitter circuit 30 without being subjected to the amplification by the amplifier circuit 10.

<Splitter Circuit>

The LNA 1 according to the present embodiment includes the splitter circuit 30. The splitter circuit 30 is connected to the node nd2. The node nd2 is an output node of the output matching circuit 102. The node nd2, however, also serves as an input node of the splitter circuit 30.

The splitter circuit 30 includes the multiple output terminals OUT1 and OUT2. The splitter circuit 30 functions as an output circuit of the LNA 1 according to the embodiment.

The splitter circuit 30 is, as will be described, configured with multiple passive elements. The splitter circuit 30 includes multiple capacitors C1 and C2 connected between the node nd2 and the ground terminal.

One terminal of the capacitor C1 is connected to the node nd2. The other terminal of the capacitor C1 is connected to the ground terminal.

One terminal of the capacitor C2 is connected to the node nd2. The other terminal of the capacitor C2 is connected to one terminal of a switch Sw3. The switch Sw3 has its other terminal connected to the ground terminal. The capacitor C2 and the switch Sw3 are connected in series between the node nd2 and the ground terminal.

The switch Sw3 controls the electrical connection between the capacitor C2 and the ground terminal. When the switch Sw3 is an off state, the capacitor C2 is electrically separated from the ground terminal. When the switch Sw3 is an on state, the capacitor C2 is electrically connected to the ground terminal. The capacitor C2 at this time is connected in parallel with the capacitor C1 between the node nd2 and the ground terminal.

In this manner, the on-state switch Sw3 sets the capacitor C2 in the effective state, while the off-state switch Sw3 sets the capacitor C2 in the ineffective state.

The splitter circuit 30 includes an inductor L1*a*. The inductor L1*a* is connected between the node nd2 and a node nd3. The node nd3 is one of multiple output nodes of the splitter circuit 30. The inductor L1*a* is a series inductor for the communication path between the node nd2 and the node nd3.

One terminal of the inductor L1*a* is connected to the node nd2. The other terminal of the inductor L1*a* is connected to the node nd3.

The splitter circuit 30 includes multiple capacitors C2*a* and C3*a* connected with the node nd3. The capacitors C2*a* and C3*a* are connected between the node nd3 and the ground terminal.

One terminal of the capacitor C2*a* is connected to the node nd3. The other terminal of the capacitor C2*a* is connected to the ground terminal. The capacitor C2*a* is a parallel capacitor for the communication path (an interconnect and/or a terminal) between the node nd2 and the node nd3.

One terminal of the capacitor C3*a* is connected to the node nd3. The other terminal of the capacitor C3*a* is connected to one terminal of a switch Sw4. The other terminal of the switch Sw4 is connected to the ground terminal. The capacitor C3*a* and the switch Sw4 are connected in series between the node nd3 and the ground terminal. The capacitor C3*a* is a parallel capacitor for the communication path between the node nd2 and the node nd3.

The switch Sw4 controls the electrical connection between the capacitor C3*a* and the ground terminal. When the switch Sw4 is off, the capacitor C3*a* is electrically separated from the ground terminal. When the switch Sw4 is on, the capacitor C3*a* is electrically connected to the ground terminal. With the switch Sw4 being in the on state, the capacitor C3*a* is connected in parallel with the capacitor C2*a* between the node nd3 and the ground terminal.

In this manner, the on-state switch Sw4 sets the capacitor C3*a* in the effective state, while the off-state switch Sw4 sets the capacitor C3*a* in the ineffective state.

The splitter circuit 30 includes a switch circuit (e.g., a T-switch) T-Sw1 between the node nd3 and the output terminal OUT1.

One terminal of T-switch T-Sw1 is connected to the node nd3. The other terminal of the T-switch T-Sw1 is connected to the first output terminal OUT1 of the LNA 1.

The T-switch T-Sw1 controls the electrical connection between the node nd3 and the output terminal OUT1. When the T-switch T-Sw1 is off, the output terminal OUT1 is electrically separated from the node nd3. When the T-switch T-Sw1 is on, the output terminal OUT1 is electrically connected to the node nd3.

With the T-switch T-Sw1, isolation characteristics between the output terminal OUT1 and other components (e.g., the nodes and other output terminals) can be improved.

The splitter circuit 30 includes an inductor L1*b*. The inductor L1*b* is connected between the node nd2 and a node nd4. The node nd4 is one of multiple output nodes of the splitter circuit 30.

One terminal of the inductor L1*b* is connected to the node nd2. The other terminal of the inductor L1*b* is connected to the node nd4. The inductor L1*b* is a series inductor for the communication path between the node nd2 and the node nd4. Between the node nd2 and the output terminal OUT1 or OUT2 of the splitter circuit 30, the inductor L1*b* located between the node nd2 and the node nd4 is arranged to have a parallel relationship with the inductor L1*a* located between the node nd2 and the node nd3. A set of the inductors L1*a* and L1*b*, each being a series inductor in the splitter circuit 30, may together be called a series inductor pair.

The splitter circuit 30 includes multiple capacitors C2*b* and C3*b* connected with the node nd4. The capacitors C2*b* and C3*b* are connected between the node nd4 and the ground terminal.

One terminal of the capacitor C2*b* is connected to the node nd4. The other terminal of the capacitor C2*b* is connected to the ground terminal. The capacitor C2*b* is a parallel capacitor for the communication path between the node nd2 and the node nd4. The capacitors C2*a* and C2*b*, each being a parallel capacitor in the splitter circuit 30, may together be called a parallel capacitor pair.

One terminal of the capacitor C3*b* is connected to the node nd4. The other terminal of the capacitor C3*b* is connected to one terminal of a switch Sw5. The other terminal of the switch Sw5 is connected to the ground terminal. The capacitor C3*b* and the switch Sw5 are connected in series between the node nd4 and the ground terminal. The capacitor C3*b* is a parallel capacitor for the communication path between the node nd2 and the node nd4.

The switch Sw5 controls the electrical connection between the capacitor C3*b* and the ground terminal. When the switch Sw5 is an off state, the capacitor C3*b* is electrically separated from the ground terminal. When the switch Sw5 is an on state, the capacitor C3*b* is electrically connected to the ground terminal. With the switch Sw5 being in the on state, the capacitor C3*b* is connected in parallel with the capacitor C2*b* between the node nd4 and the ground terminal.

In this manner, the on-state switch Sw5 sets the capacitor C3*b* in the effective state, while the off-state switch Sw5 sets the capacitor C3*b* in the ineffective state.

The splitter circuit 30 includes a switch circuit (e.g., a T-switch) T-Sw2 between the node nd4 and the output terminal OUT2.

One terminal of the T-switch T-Sw2 is connected to the node nd4. The other terminal of the T-switch T-Sw2 is connected to the second output terminal OUT2 of the LNA 1.

The T-switch T-Sw2 controls the electrical connection between the node nd4 and the output terminal OUT2. When the T-switch T-Sw2 is off, the output terminal OUT2 is electrically separated from the node nd4. When the T-switch T-Sw2 is on, the output terminal OUT2 is electrically connected to the node nd4.

The splitter circuit 30 includes a resistor Rox. The resistor Rox is connected between the node nd3 and the node nd4. One terminal of the resistor Rox is connected to the node nd3. The other terminal of the resistor Rox is connected to the node nd4.

The splitter circuit 30 includes a switch circuit (e.g., a T-switch) T-Sw3. The T-switch T-Sw3 is disposed between the node nd3 and the node nd4.

One terminal of the T-switch T-Sw3 is connected to the node nd3. The other terminal of the T-switch T-Sw3 is connected to the node nd4. Between the two nodes nd3 and nd4, the T-switch T-Sw3 is connected in parallel with the resistor Rox.

The T-switch T-Sw3 controls the electrical connection between the node nd3 and the node nd4.

With the above configuration, the LNA 1 according to the embodiment executes multiple operational modes and output modes.

The LNA 1 according to the embodiment can select one of an amplification mode and a bypass mode according to the selection of the core circuit 101 or the bypass circuit 20.

The LNA 1 according to the embodiment can select one of a single output mode and a split output mode according to the selection of the communication path within the splitter circuit 30.

When the radio-frequency signal RFin is supplied to the core circuit 101, the signal RFin is amplified by the transistors FET1 and FET2 in cascode connection, and the signal RFamp obtained by the amplification is output to the splitter circuit 30 via the output matching circuit 102.

The splitter circuit 30 outputs the signal from the amplifier circuit 10 to the outside of the LNA 1 according to one of the single output mode and the split output mode.

When the radio-frequency signal RFin is supplied to the bypass circuit 20, the bypass circuit 20 outputs the supplied signal RFin to the output matching circuit 102 without amplifying the signal. The signal from the bypass circuit 20 is routed through the output matching circuit 102 and output to the splitter circuit 30.

The splitter circuit 30 operates according to the operational mode of the LNA 1. For example, the LNA 1 according to the embodiment can output radio-frequency signals under the single output mode and the split output mode.

When the LNA 1 is in the single output mode, the LNA 1 outputs the radio-frequency signals to the subsequent circuitry component using one output terminal, i.e., the output terminal OUT1 or OUT2.

When the LNA 1 is in the split output mode, the LNA 1 outputs the radio-frequency signals to the subsequent circuitry component using, for example, more than one output terminal OUT of the LNA 1.

One example of carrier aggregation technology is intraband carrier aggregation. An LNA for this technology provides branched or split output signals to the subsequent circuitry component.

Thus, in realizing an LNA to be adopted in the intraband carrier aggregation technology, such an LNA should be formed to be capable of enabling both the single output mode and the split output mode.

In exemplary implementations, output terminals (output ports) of the LNA in the split output mode should have an isolation therebetween of 25 dB or higher.

(1b) Exemplary Operations

Exemplary operations of the LNA according to the embodiment will be described with reference to FIGS. 4 to 8.

FIG. 4 is a diagram for explaining an exemplary operation of the LNA 1 according to the embodiment. FIG. 4 lists the on/off state of each switch element in the LNA 1 for each operational mode.

As shown in FIG. 4, the LNA 1 according to the embodiment can realize multiple operational modes by controlling the on/off states of its switches Sw1, Sw2, . . . , Sw5, T-Sw1, T-Sw2, . . . , and T-Sw5.

The on/off state of each switch element in the LNA 1 (e.g., each of switches Sw1, Sw2, . . . , Sw5, T-Sw1, T-Sw2, . . . , and T-Sw5) may be controlled by, for example, the RFIC, the control circuit 990 in the system 900, or the control circuit (not shown) within the LNA 1.

<Amplification Mode>

Figure 5:
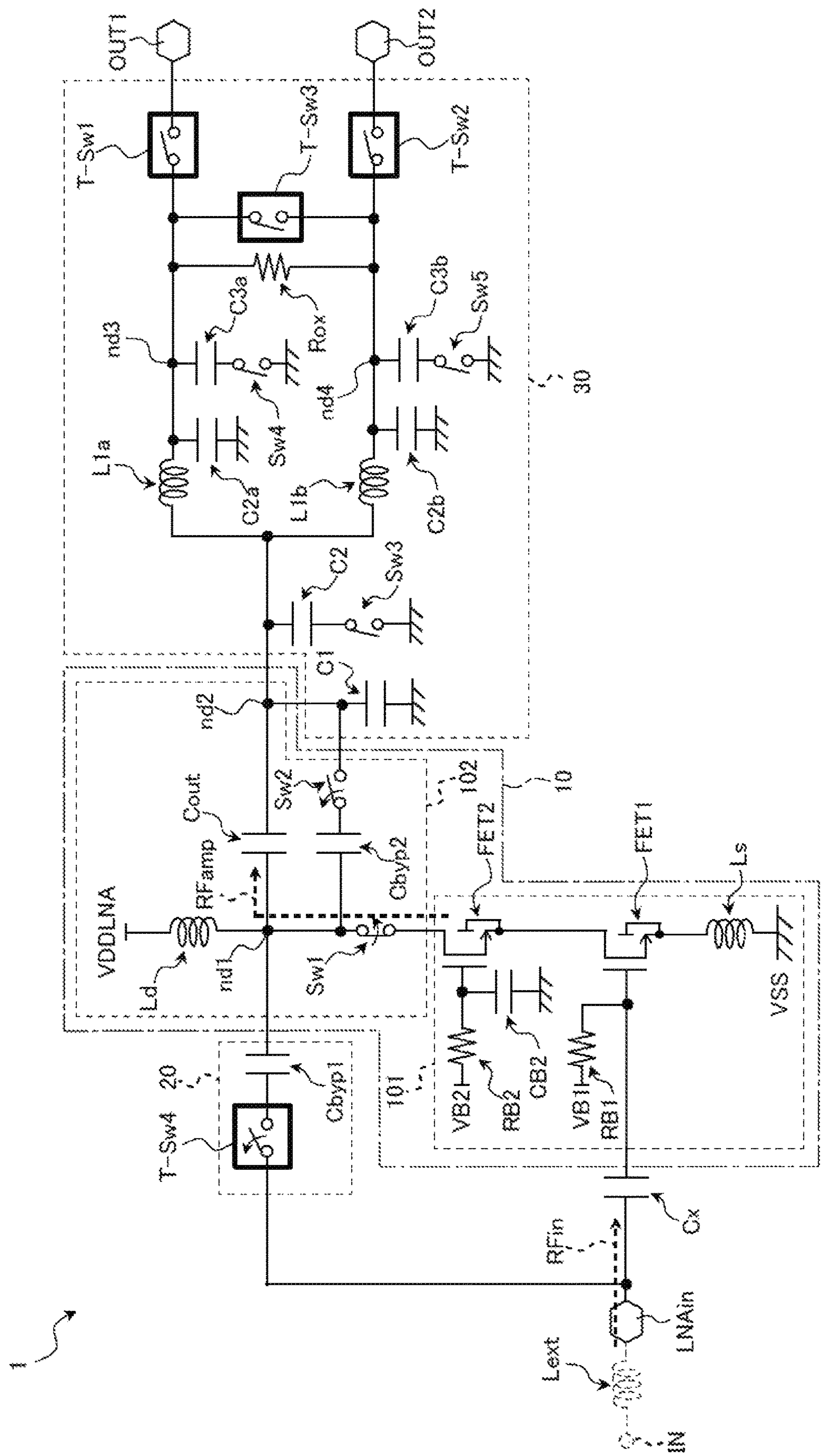

FIG. 5 is a schematic diagram of the LNA 1 according to the embodiment, and shows the communication path for a radio-frequency signal to reach the node nd2 in the LNA 1 when operating under the amplification mode.

As seen from FIGS. 4 and 5, when the LNA 1 according to the embodiment operates under the amplification mode, the switch Sw1 in the output matching circuit 102 turns on and the T-switch T-Sw4 in the bypass circuit 20 turns off.

With the off-state T-switch T-Sw4, the bypass circuit 20 is electrically separated from the input terminal LNAin of the LNA1.

With the on-state switch Sw1, the core circuit 101 is electrically connected to the node nd1 in the output matching circuit 102 in the amplifier circuit 10.

In the amplification mode, the switch Sw2 in the output matching circuit 102 turns off. This sets the capacitor Cbyp2 in the ineffective state.

Within the core circuit 101, the transistors FET1 and FET2 in cascode connection operate according to the appropriately-set gate bias voltages VB1 and VB2.

The core circuit 101 amplifies the supplied radio-frequency signal RFin. The core circuit 101 outputs the amplified radio-frequency signal RFamp to the output matching circuit 102 via the on-state switch Sw1.

The output matching circuit 102 outputs the amplified signal RFamp to the splitter circuit 30 via the capacitor Cout.

The splitter circuit 30 outputs the signal RFamp to the outside of the LNA 1 (e.g., the RFIC) according to the selected output mode.

In this manner, the radio-frequency signal RFin supplied in the amplification mode is amplified by the amplifier circuit 10 and output from the output terminal of the LNA 1 so as to be forwarded to the circuitry component subsequent to the LNA 1.

<Bypass Mode>

FIG. 6 is a schematic diagram of the LNA 1 according to the embodiment, and shows the communication path for a radio-frequency signal to reach the node nd2 in the LNA 1 when operating under the bypass mode.

The bypass mode is an operational mode for sending the supplied radio-frequency signal RFin to the splitter circuit 30 without the amplification of the signal RFin by the amplifier circuit 10.

As seen from FIGS. 4 and 6, when the LNA 1 according to the embodiment operates under the bypass mode, the switch Sw1 in the output matching circuit 102 turns off and the T-switch T-Sw4 in the bypass circuit 20 turns on.

With the off-state switch Sw1, the core circuit 101 is electrically separated from the node nd1 in the output matching circuit 102. For example, the bias generation circuit under the bypass mode stops supplying the voltages VB1 and VB2 to the core circuit 101. The gate potentials of the transistors FET1 and FET2 are each set to the ground voltage. Note that, during the bypass mode, the impedance of the core circuit 101 may influence the impedance of the bypass circuit 20.

In the bypass mode, the switch Sw2 turns on. This sets the capacitor Cbyp2 in the effective state.

With the on-state T-switch T-Sw4, the bypass circuit 20 is electrically connected to the input terminal LNAin of the LNA1.

The supplied radio-frequency signal RFin is routed through the capacitor Cbyp1 in the bypass circuit 20 and output to the output matching circuit 102.

The output matching circuit 102 outputs the signal RFbyp from the bypass circuit 20 to the splitter circuit 30 via the capacitors Cout and Cbyp2.

The splitter circuit 30 outputs the signal RFbyp to the outside of the LNA 1 (e.g., the RFIC) according to the selected output mode.

In this manner, the radio-frequency signal RFin supplied in the bypass mode is routed through the bypass circuit 20 and output from the output terminal of the LNA 1 so that it is forwarded to the circuitry component subsequent to the LNA 1.

<Single Output Mode>

Figure 7:
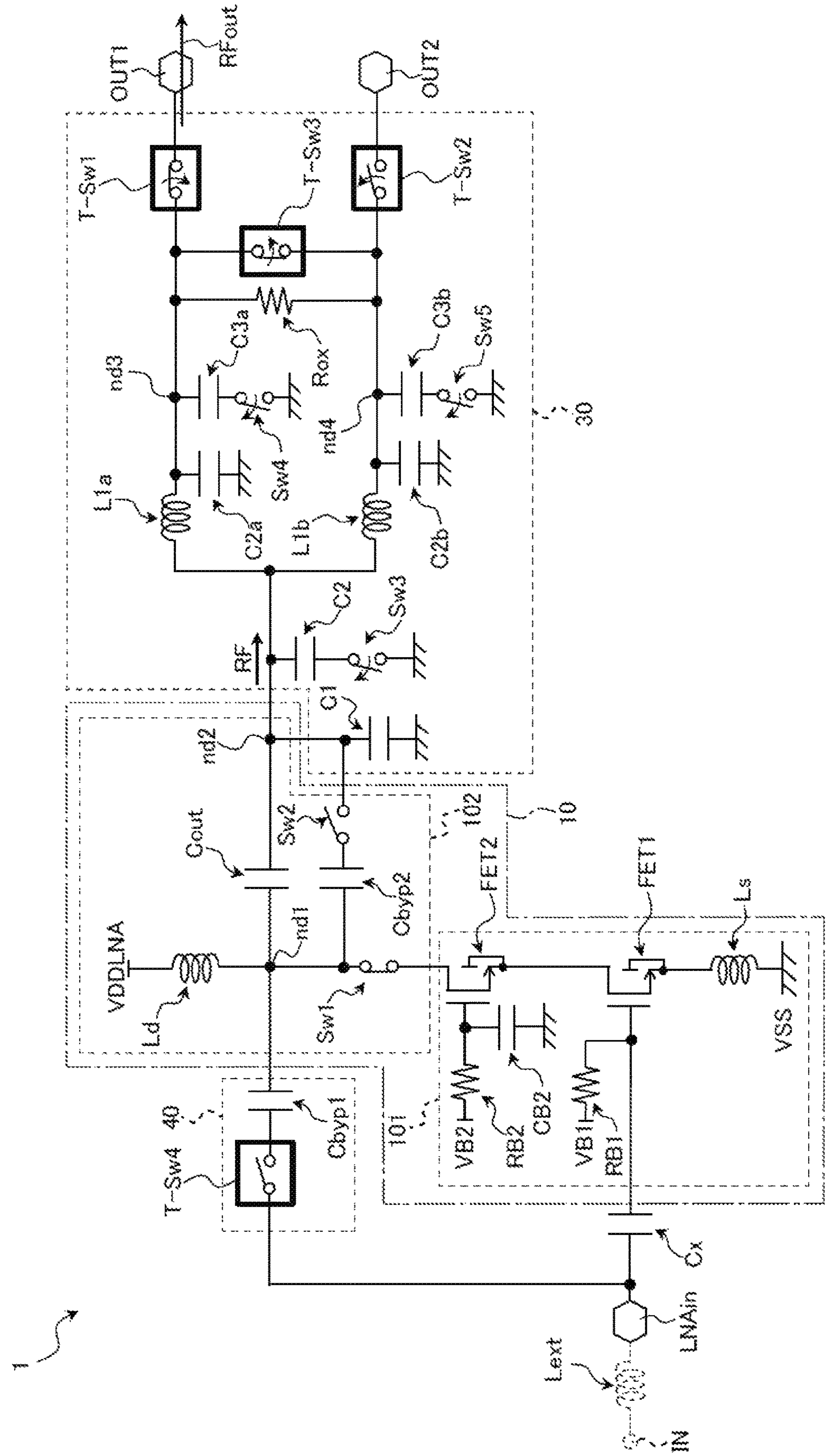

FIG. 7 is a schematic diagram of the LNA 1 according to the embodiment and shows the communication path for the signal to be transmitted from the node nd2 toward the output terminal in the LNA 1 when operating under the single output mode.

As seen from FIGS. 4 and 7, in the single output mode, one of the T-switches T-Sw1 and T-Sw2 in the splitter circuit 30 turns on and the other of the T-switches T-Sw1 and T-Sw2 turns off according to the active state setting for the output terminals OUT1 and OUT2.

For example, when the output terminal OUT1 is set in the active state in the LNA 1, the T-switch T-Sw1 turns on and the T-switch T-Sw2 turns off as shown in FIG. 7. This makes the node nd2 in the output matching circuit 102 electrically connected to the output terminal OUT1. In this case, the output terminal OUT2 is electrically separated from the node nd2.

For example, when the output terminal OUT2 is set in the active state in the LNA 1, the T-switch T-Sw1 turns off and the T-switch T-Sw2 turns on, contrary to the example shown FIG. 7. This makes the node nd2 in the output matching circuit 102 electrically connected to the output terminal OUT2. In this case, the output terminal OUT1 is electrically separated from the node nd2.

In the single output mode, the T-switch T-Sw3 turns on, irrespective of the active state setting for the output terminals OUT1 and OUT2.

In the single output mode, the switches Sw3, Sw4, and Sw5 turn off. This sets the capacitors C2, C3*a*, and C3*b* in the ineffective state. The capacitors C2, C3*a*, and C3*b* do not influence the output impedance of the LNA 1 in the single output mode.

In the single output mode, the signal RFout from the core circuit 101 or the bypass circuit 20 is output to the splitter circuit 30 via the node nd2.

The splitter circuit 30 routes this radio-frequency signal RFout through one of the two T-switches T-Sw1 and T-Sw2 that is in the on state (and also through the on-state T-switch T-Sw3) and outputs the signal to the outside of the LNA 1 (e.g., the RFIC) from the active output terminal.

In this manner, the radio-frequency signal RFout in the single output mode is sent from the selected output terminal in the LNA 1 to the circuitry component subsequent to the LNA 1.

<Split Output Mode>

Figure 8:
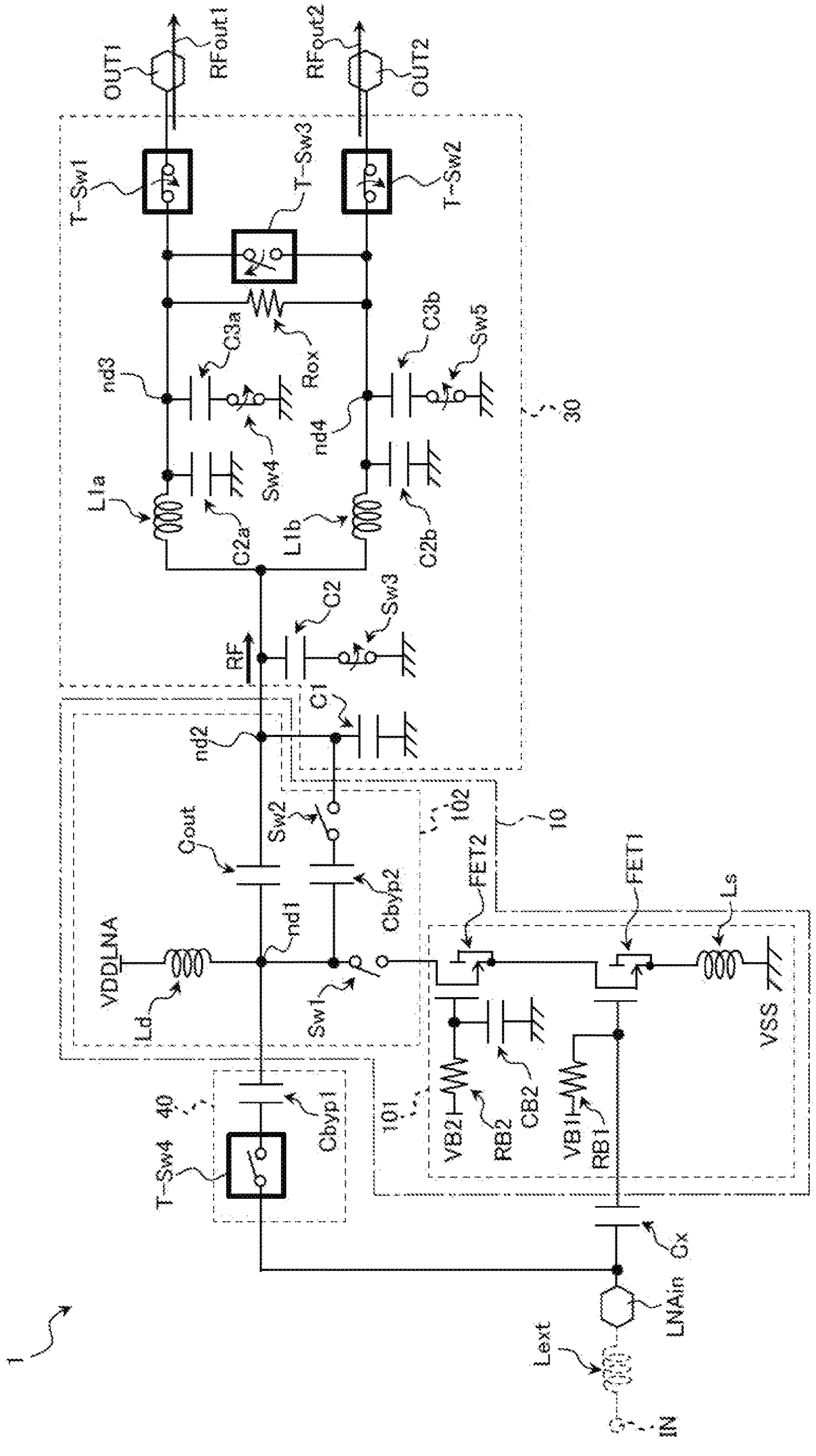

FIG. 8 is a schematic diagram of the LNA 1 according to the embodiment, and shows the communication path for the radio-frequency signal to be transmitted from the node nd2 toward the output terminals in the LNA 1 when operating under the split output mode.

As seen from FIGS. 4 and 8, in the split output mode, all the output terminals OUT1 and OUT2 of the LNA 1 are set in the active state.

In the split output mode, both the T-switches T-Sw1 and T-Sw2 in the splitter circuit 30 turn on. This makes both the output terminals OUT1 and OUT2 electrically connected to the node nd2 in the output matching circuit 102.

In the split output mode, the T-switch T-Sw3 turns off.

In the split output mode, the switches Sw3, Sw4, and Sw5 turn on. This sets the capacitors C2, C3*a*, and C3*b* in the effective state. The capacitors C2*a*, C2*b*, C3*a*, and C3*b* have influence on the output impedance of the LNA 1 in the split output mode.

In the split output mode, the signal RFout from the core circuit 101 or the bypass circuit 20 is output to the splitter circuit 30 via the node nd2. The splitter circuit 30 routes this signal RFout through the two on-state T-switches T-Sw1 and T-Sw2 and outputs the signal to the outside of the LNA 1 (e.g., the RFIC) from each of the active output terminals OUT1 and OUT2.

In this manner, the radio-frequency signal in the split output mode is sent from the multiple output terminals in the LNA 1 to the circuitry component subsequent to the LNA 1.

(1c) Characteristics

FIGS. 9 to 13 will be referred to for describing the characteristics of the LNA according to the embodiment.

FIGS. 9 to 12 show simulation results obtained with the LNA of an exemplary configuration according to the embodiment.

Figure 9:
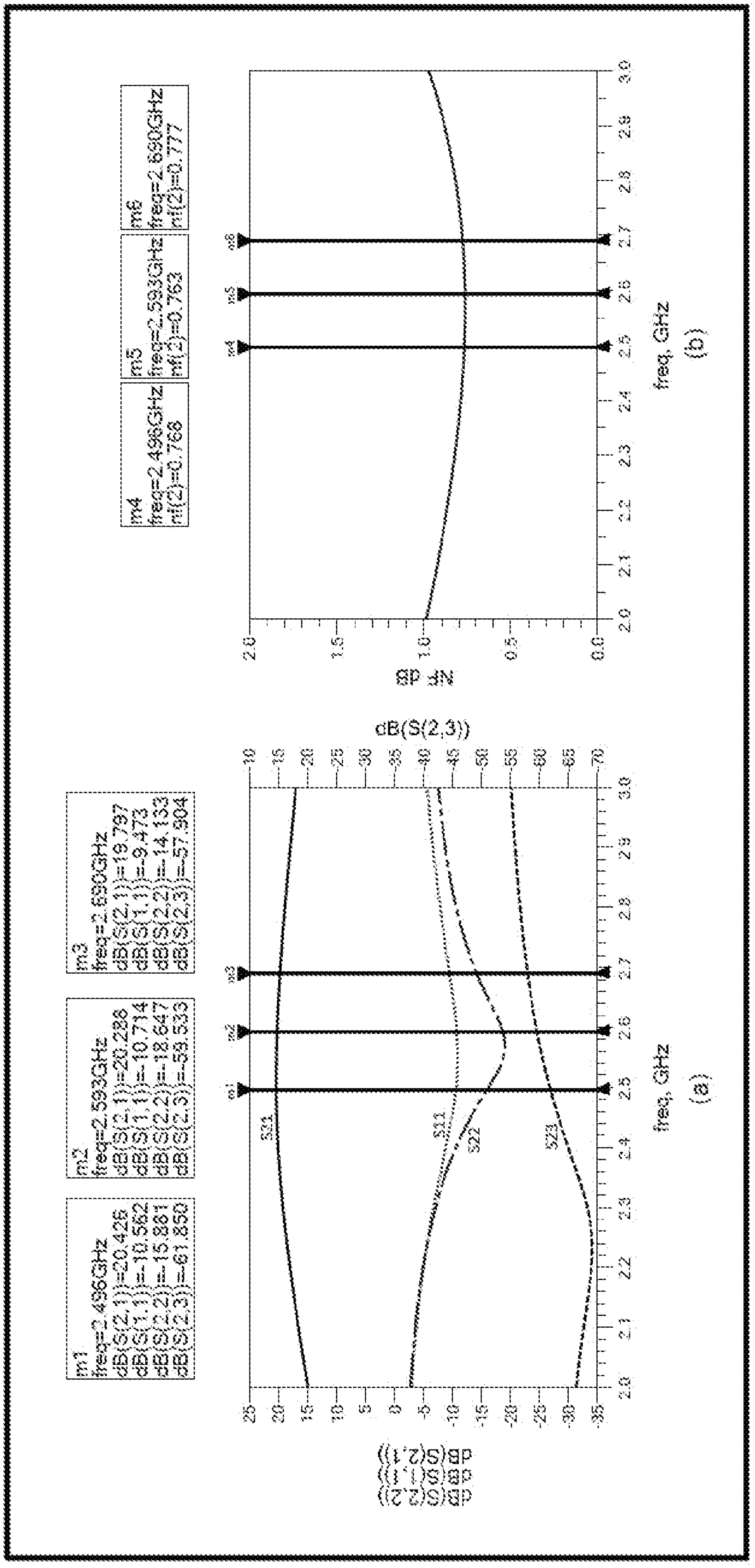
Figure 10:
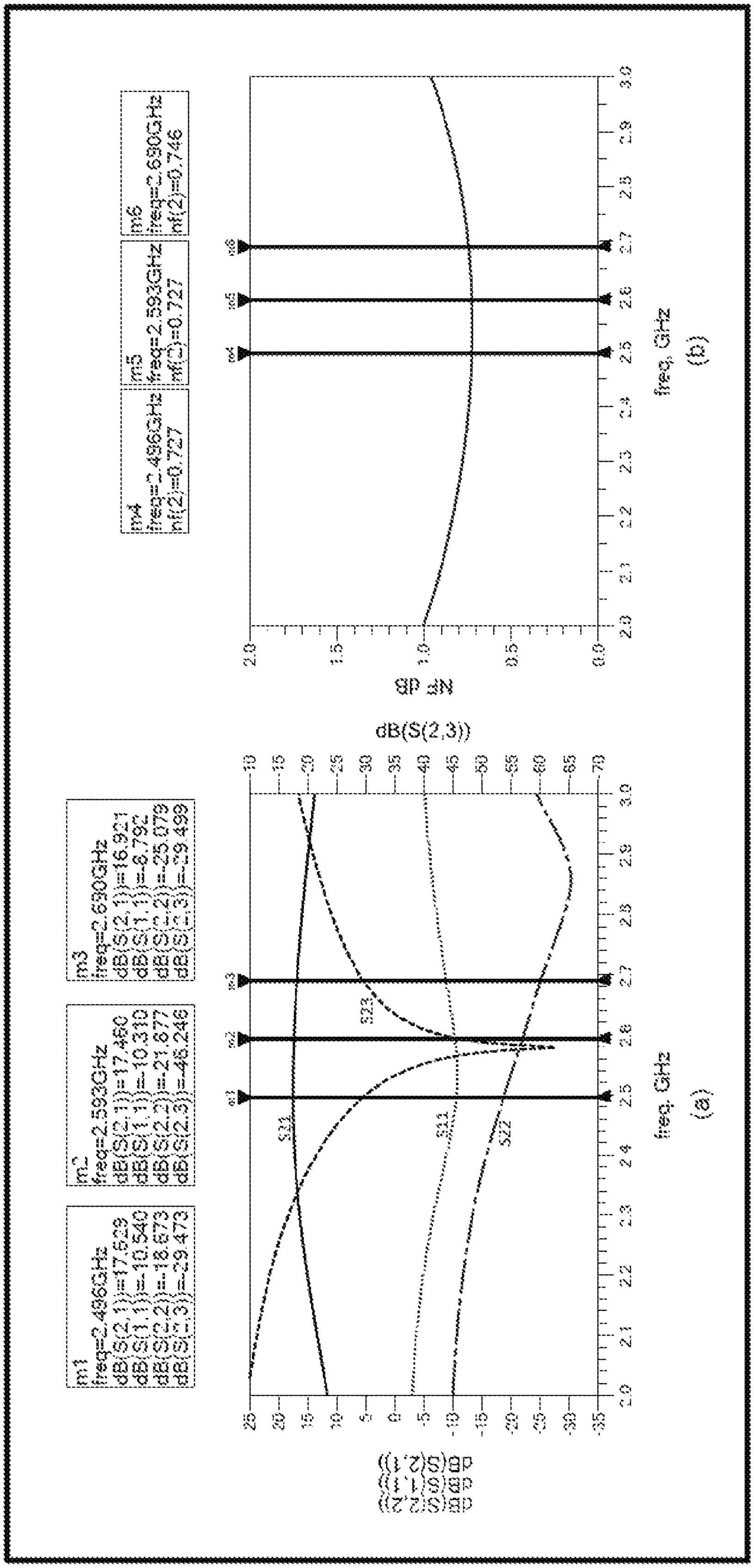
Figure 11:
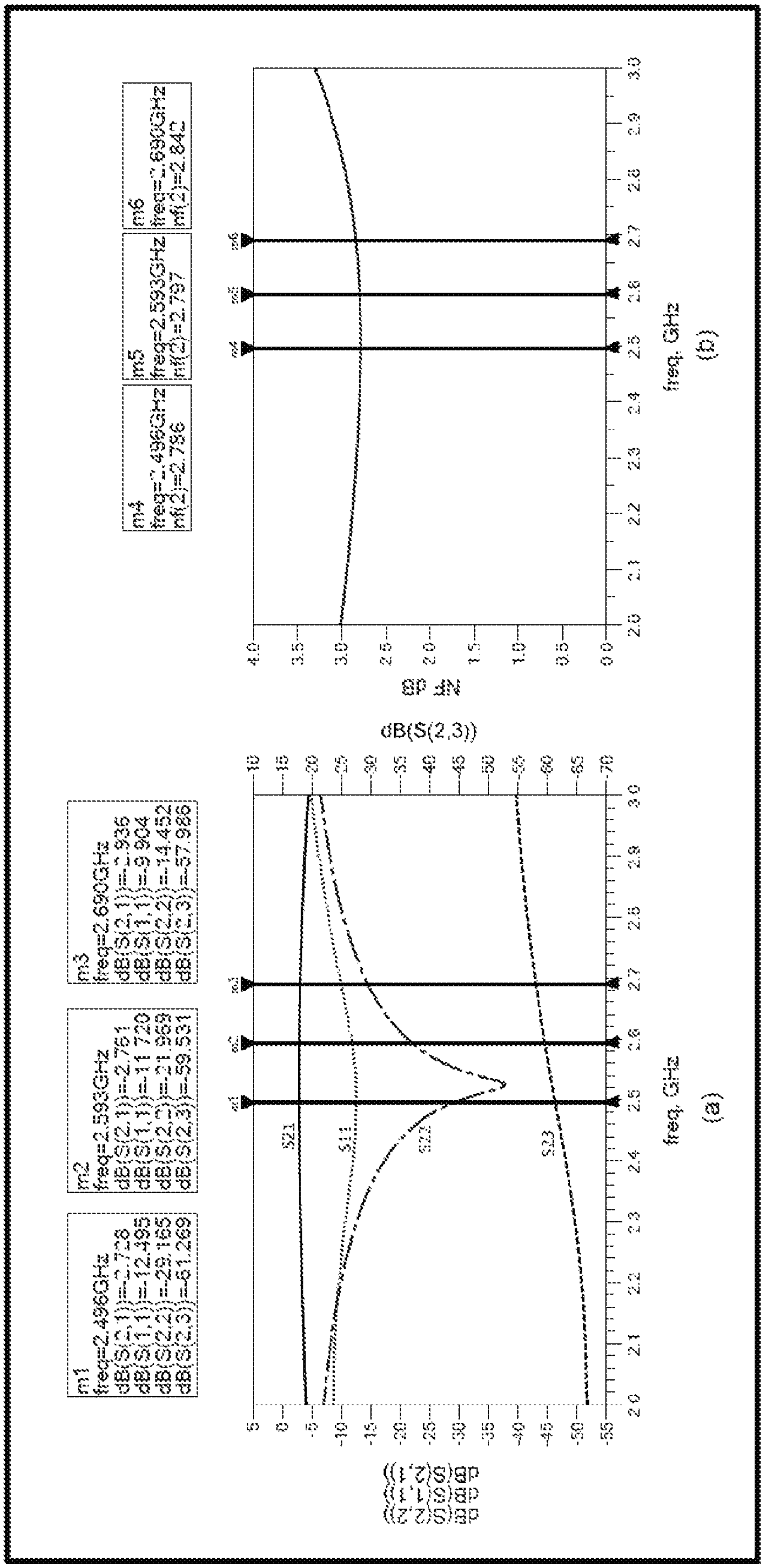
Figure 12:
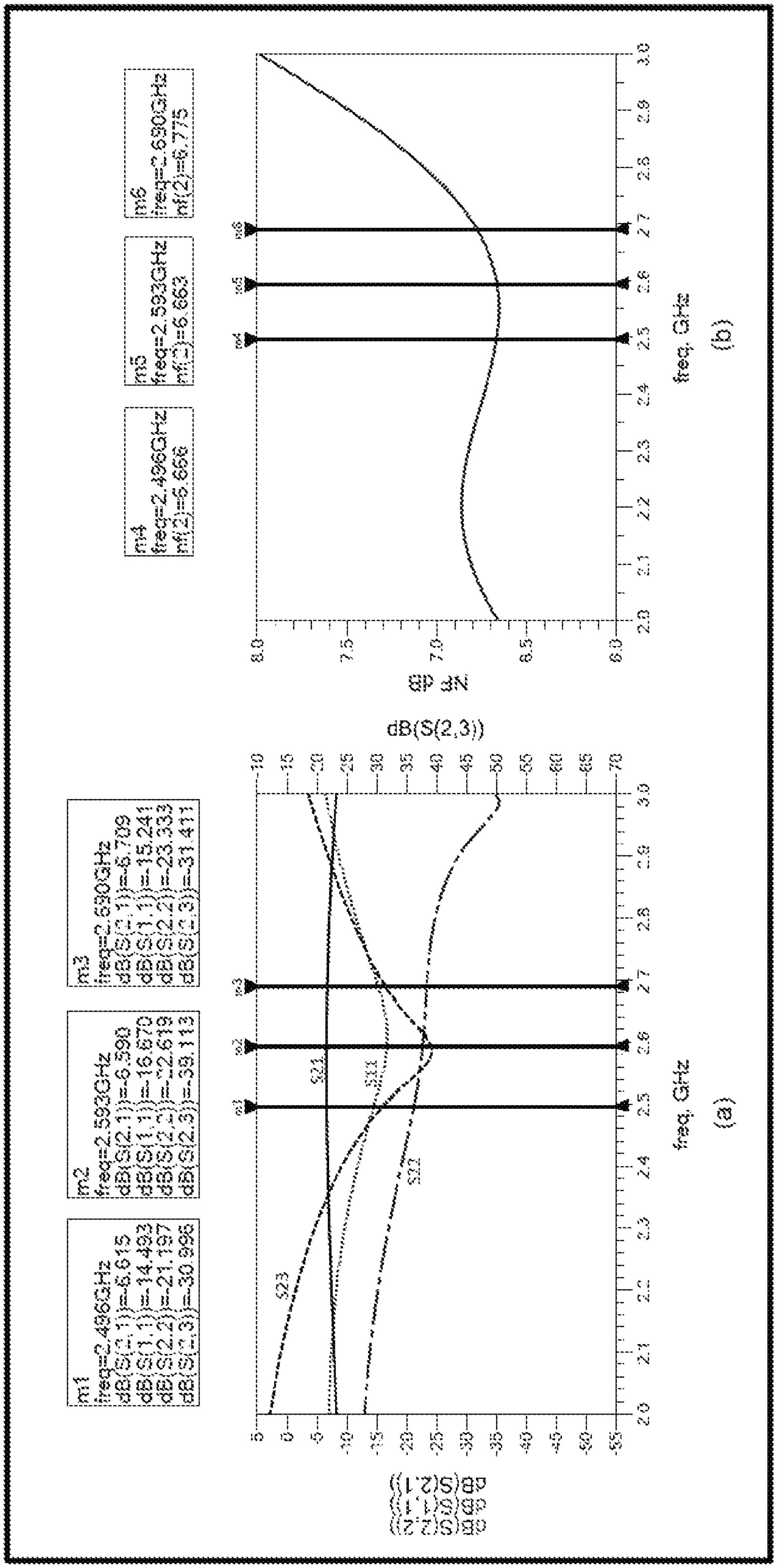

(a) of FIG. 9, (a) of FIG. 10, (a) of FIG. 11, and (a) of FIG. 12 are each a graph showing relationships between frequencies and the S parameters of the LNA 1 according to the embodiment. In these graphs, frequency characteristics for the S parameters S(1,1) (=S11), S(2,2) (=S22), S(2,1) (=S21), and S(2,3) (=S23) are shown. Here, in the S parameters, port “1” refers to the input node IN for radio-frequency signals, port “2” refers to the output terminal OUT1 of the LNA 1, and port “3” refers to the output terminal OUT2 of the LNA 1.

In each graph (a) of FIGS. 9 to 12, the horizontal axis indicates frequencies (unit: GHz) and the vertical axis indicates values of gain or loss (unit: dB).

(b) of FIG. 9, (b) of FIG. 10, (b) of FIG. 11, and (b) of FIG. 12 are each a graph showing relationships between frequencies and the noise figures of the LNA 1 according to the embodiment.

In each graph (b) of FIGS. 9 to 12, the horizontal axis indicates frequencies (unit: GHz) and the vertical axis indicates noise figures (unit: dB).

For the simulations with the LNA according to the embodiment, the frequency band was set to the band (BAND41) ranging from 2496 MHz to 2690 MHz. In these simulations, the voltage VDDLNA supplied to the LNA according to the embodiment was set to 1.2V.

In each graph (a) of FIGS. 9 to 12, the frequency "m2" corresponds to the center frequency of the band. In each graph (b) of FIGS. 9 to 12, the frequency "m5" corresponds to the center frequency of the band.

FIG. 9 is for the small-signal characteristics of the LNA 1 according to the embodiment, given in the combination of the amplification mode and the single output mode.

As shown in (a) of FIG. 9, the band center gain (S21) of the LNA 1 according to the embodiment in the combination of the amplification mode and the single output mode is 20.288 dB. The return losses (S11) are −9.473 dB or less. The return losses (S22) are −14.133 dB or less.

As shown in (b) of FIG. 9, the noise figures (NF) are 0.777 dB or less.

FIG. 10 is for the small-signal characteristics of the LNA 1 according to the embodiment, given in the combination of the amplification mode and the split output mode.

As shown in (a) of FIG. 10, the band center gain (S21) of the LNA 1 according to the embodiment in the combination of the amplification mode and the split output mode is 17.46 dB. The return losses (S11) are −8.792 dB or less. The return losses (S22) are −18.673 dB or less.

As shown in (b) of FIG. 10, the noise figures (NF) are 0.746 dB or less.

FIG. 11 is for the small-signal characteristics of the LNA 1 according to the embodiment, given in the combination of the bypass mode and the single output mode.

As shown in (a) of FIG. 11, the insertion losses (−S21) of the LNA 1 according to the embodiment in the combination of the bypass mode and the single output mode is about 2.8 dB.

FIG. 12 is for the small-signal characteristics of the LNA 1 according to the embodiment, given in the combination of the bypass mode and the split output mode.

As shown in (a) of FIG. 12, the insertion losses (−S21) of the LNA 1 according to the embodiment in the combination of the bypass mode and the split output mode is about 6.6 dB.

FIG. 13 lists, based on FIGS. 9 to 12, the simulation results for the small-signal characteristics of the LNA 1 according to the embodiment. In FIG. 13, the values at the band center are noted for the S parameter "S21". For each of the S parameters "S11", "S22", and "S23" and the noise figure, the worst values within the band are noted.

In addition to these parameters, etc., FIG. 13 lists the bias currents (Idd_lna) of the LNA 1.

As can be seen from FIG. 13, the LNA according to the embodiment exhibits superior characteristics in various parameters as above.

The LNA according to the embodiment is better than general LNAs in the parameter "S23" in the split output mode.

For example, the standard value required of the parameter "S23" of LNAs is about −25 dB.

The LNA according to the embodiment has, in the split output mode, the parameter "S23" of −29.5 dB when the operational mode is the amplification mode, and the parameter "S23" of −31 dB when the operational mode is the bypass mode.

As such, the "S23" parameters of the LNA according to the embodiment can secure a sufficient margin. This allows the LNA according to the embodiment to have improved isolation characteristics between the LNA's output ports.

As described above, the LNA according to the first embodiment can realize both the single output mode and the split output mode while providing improved characteristics.

(2) Second Embodiment

An LNA according to the second embodiment will be described with reference to FIGS. 14 to 26.

(2a) Exemplary Configuration

FIG. 14 is a circuit diagram showing an LNA 1A according to the second embodiment.

The LNA 1A according to the embodiment has a function of selectively receiving signals of one of multiple frequency bands.

The LNA 1A according to the embodiment includes a selector circuit 40A. The selector circuit 40A is capable of selecting frequency bands.

The selector circuit 40A receives radio-frequency signals of a given frequency band from a band-pass filter.

The selector circuit 40A may be connected within the corresponding LNA 1A of multiple LNAs.

As shown in FIG. 14, the LNA 1A according to this embodiment includes a cascode connection amplifier circuit 10A (a core circuit 101 and an output matching circuit 102A) and a bypass circuit 20, which are similar to the first embodiment.

The LNA 1A according to the embodiment further includes the selector circuit 40A.

<Selector Circuit>

The LNA 1A according to the embodiment has a band selection function attributable to the selector circuit 40A.

As one example, the selector circuit 40A of this embodiment controls switchover of signal paths so as to handle two bands, i.e., a first frequency band (e.g., BAND40) and a second frequency band (e.g., BAND41). The BAND40 as the first frequency band corresponds to a range from 2300 MHz to 2400 MHz. The BAND41 as the second frequency band corresponds to a range from 2496 MHz to 2690 MHz.

The selector circuit 40A includes a capacitor Cb40 and a switch Sw6.

One terminals of the capacitor Cb40 is connected to the input terminal IN. The other terminal of the capacitor Cb40 is connected to one terminal of the switch Sw6. The other terminal of the switch Sw6 is connected to the input terminal LNAin.

Between the two terminals IN and LNAin, the capacitor Cb40 is connected in parallel with the inductor Lext.

The switch Sw6 controls the effective/ineffective state of the capacitor Cb40.

The on-state switch Sw6 can electrically connect the capacitor Cb40 to the cascode connection amplifier circuit 10A and the bypass circuit 20. This causes the capacitor Cb40 to effectively influence the input impedance of the LNA 1A. The capacitor Cb40 is set in the effective state by the on-state switch Sw6.

The off-state switch Sw6 can electrically separate the capacitor Cb40 from the cascode connection amplifier circuit 10A and the bypass circuit 20. This makes the influence of the capacitor Cb40 on the input impedance of the LNA 1A ineffective. The capacitor Cb40 is set in the ineffective state by the off-state switch Sw6.

For example, the presence of the capacitor Cb40 allows for the variation in values of effective inductance of the inductor Lext by the parallel resonance effect produced between the capacitor Cb40 and the inductor Lext. For example, the capacitor Cb40 can increase the effective inductance value of the inductor Lext.

The LNA 1A according to the embodiment is therefore formed to be capable of receiving radio-frequency signals of a frequency band selected from multiple frequency bands.

<Output Matching Circuit>

For the present embodiment, the output matching circuit 102A further includes, as an exemplary configuration, a capacitor Cdd and a switch Sw7 according to the connection with the selector circuit 40A (the capacitor Cb40).

One terminal of the capacitor Cdd is connected to the node nd1. The other terminal of the capacitor Cdd is connected to one terminal of the switch Sw7. The other terminal of the switch Sw7 is connected to the ground terminal.

The switch Sw7 controls the effective/ineffective state of the capacitor Cdd according to the frequency band selected by the selector circuit 40A.

The on-state switch Sw7 electrically connects the capacitor Cdd to the ground terminal. This causes the capacitor Cdd to effectively influence the node nd1. The capacitor Cdd is set in the effective state by the on-state switch Sw7.

The off-state switch Sw7 electrically separates the capacitor Cdd from the ground terminal. This makes the influence of the capacitor Cdd on the node nd1 ineffective. The capacitor Cdd is set in the ineffective state by the off-state switch Sw7.

For example, the presence of the capacitor Cdd can increase the value of effective inductance of the inductor Ld by the parallel resonance effect produced between the capacitor Cdd and the inductor Ld.

<Splitter Circuit>

For the present embodiment, the splitter circuit 30 further includes resistors Rox2*a* and Rox2*b* and a switch Sw8 according to the connection with the selector circuit 40A (the capacitor Cb40).

One terminal of the resistor Rox2*a* is connected to the node nd3. The other terminal of the resistor Rox2*a* is connected to one terminal of the switch Sw8. The other terminal of the switch Sw8 is connected to one terminal of the resistor Rox2*b*. The other terminal of the resistor Rox2*b* is connected to the node nd4.

The resistors Rox2*a* and Rox2*b* are connected in series between the node nd3 and the node nd4.

The switch Sw8 controls the effective/ineffective states of the two resistors Rox2*a* and Rox2*b*. The switch Sw8 controls the electrical connection between the two resistors Rox2*a* and Rox2*b*.

When the switch Sw8 is an off state, the resistor Rox2*a* is electrically separated from the resistor Rox2*b*. This renders the influence of the resistors Rox2*a* and Rox2*b* on the nodes nd3 and nd4 ineffective. The resistors Rox2*a* and Rox2*b* are set in the ineffective state by the off-state switch Sw8.

When the switch Sw8 is an on state, the resistor Rox2*a* is electrically connected to the resistor Rox2*b*. This renders the influence of the resistors Rox2*a* and Rox2*b* on the nodes nd3 and nd4 effective. The resistors Rox2*a* and Rox2*b* are set in the effective state by the on-state switch Sw8.

When the resistors Rox2*a* and Rox2*b* are in the effective state, the electrically-connected resistors Rox2*a* and Rox2*b* are connected in parallel with the resistor Rox between the nodes nd3 and nd4.

According to the present embodiment, the passive elements Cb40 and Cdd are placed in the effective/ineffective state for the radio-frequency signal communication paths by controlling the switches Sw6, Sw7, and Sw8, and this can secure the impedance matching between the input side and the output side in the LNA 1A for each instance of receiving the signals of the first frequency band (BAND40) and receiving the signals of the second frequency band (BAND41).

With the control for placing the resistors Rox2*a* and Rox2*b* in the effective/ineffective state, the embodiment improves the S parameter (S23) in the split output operations for each instance of receiving the signals of the first frequency band (BAND40) and receiving the signals of the second frequency band (BAND41).

Note, additionally, that the switches Sw6, Sw7, and Sw8 may be on/off-controlled by an RFIC circuit, or by the control circuit 990 (or the RFIC 940).

(2b) Exemplary Operations

Exemplary operations of the LNA according to the embodiment will be described with reference to FIGS. 15 to 17.

FIG. 15 is a diagram for explaining an exemplary operation of the LNA 1A according to the embodiment.

As shown in FIG. 15, the on/off state of each switch element is controlled according to the operational mode (the amplification mode and the bypass mode) and the output mode (the single output mode and the split output mode) of the LNA 1A, as in the first embodiment.

In the LNA 1A according to the embodiment, the on/off states of the switches Sw6, Sw7, and Sw8 are controlled in concordance with the frequency band of the received radio-frequency signals.

The present embodiment adopts the operations of the LNA 1A in the amplification mode and the bypass mode, which are substantially the same as the operations explained for the first embodiment. Thus, for this embodiment, the description of the LNA's operations in the amplification mode and the bypass mode will basically be omitted.

The present embodiment adopts the operations of the LNA 1A in the single output mode and the split output mode, which are substantially the same as the operations explained for the first embodiment. Thus, for this embodiment, the description of the LNA's operations in the single output mode and the split output mode will basically be omitted.

<BAND40 Selection Mode>

Figure 16:
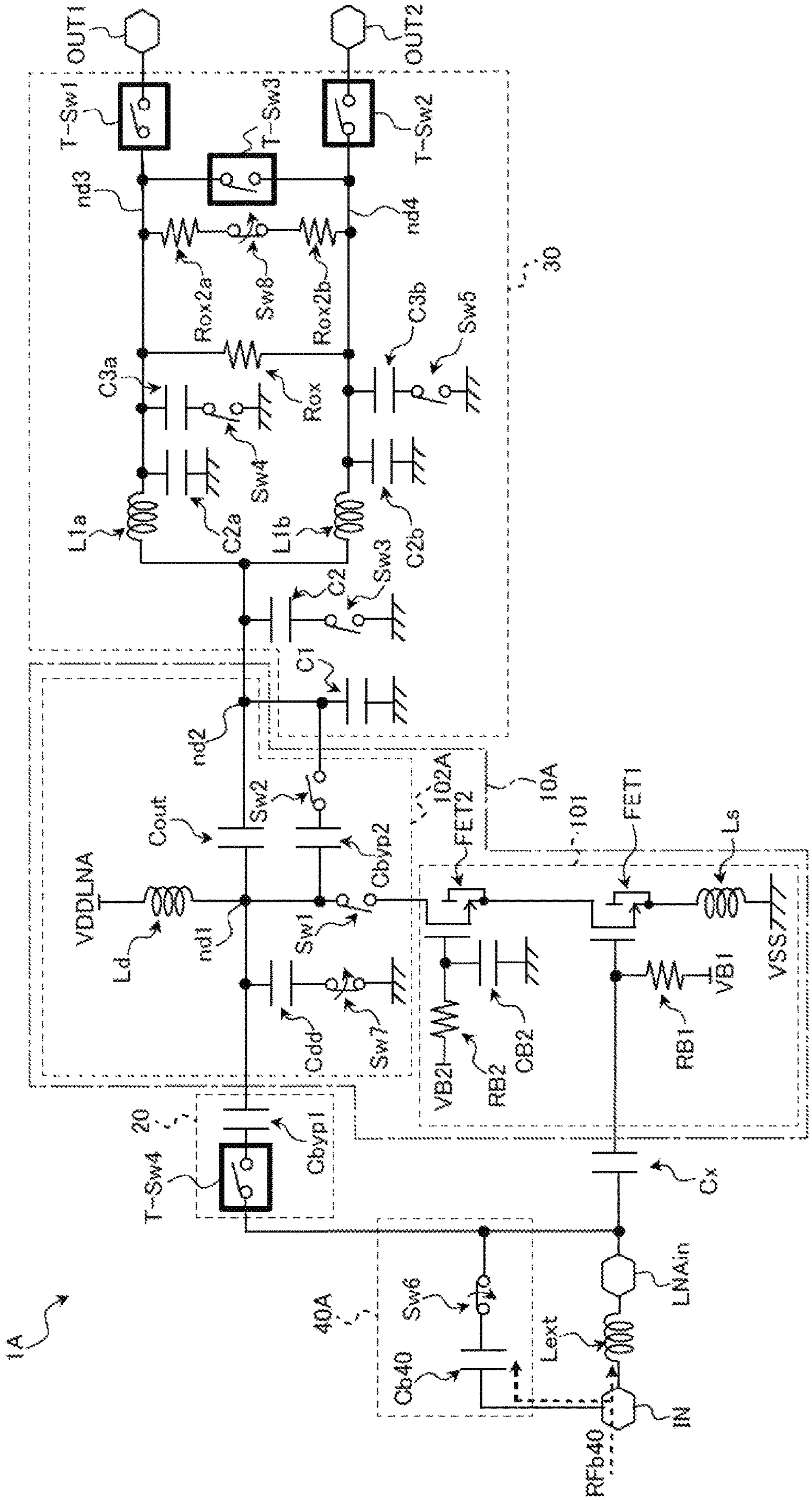

FIG. 16 is a schematic diagram showing the communication path for radio-frequency signals in the selector circuit 40A of the LNA 1A when the BAND40 is selected as the frequency band to be received.

According to the embodiment as shown in FIG. 16, the switches Sw6, Sw7, and Sw8 turn on when the frequency band of BAND40 (from 2300 MHz to 2400 MHz) is selected.

This sets the capacitors Cb40 and Cdd and the resistors Rox2*a* and Rox2*b* in the effective state.

A radio-frequency signal RFb40 of the BAND40 is fed into the cascode connection amplifier circuit 10A or the bypass circuit 20 via the parallelly-connected capacitor Cb40 and external inductor Lext, according to the operational mode of the LNA 1A.

Then, according to the output mode of the LNA 1A, the signal from the cascode connection amplifier circuit 10A or the bypass circuit 20 is output to the outside of the LNA 1A via the output terminal OUT1 and/or the output terminal OUT2.

<BAND41 Selection Mode>

FIG. 17 is a schematic diagram showing the communication path for radio-frequency signals in the selector circuit 40A of the LNA 1A when the BAND41 is selected as the frequency band to be received.

According to the embodiment as shown in FIG. 17, the switches Sw6, Sw7, and Sw8 turn off when the frequency band of BAND41 (from 2496 MHz to 2690 MHz) is selected.

This sets the capacitors Cb40 and Cdd and the resistors Rox2*a* and Rox2*b* in the ineffective state.

A radio-frequency signal RFb41 of the BAND41 is fed into the cascode connection amplifier circuit 10A or the bypass circuit 20 via the external inductor Lext, according to the operational mode of the LNA 1A.

Then, according to the output mode of the LNA 1A, the signal from the cascode connection amplifier circuit 10A or the bypass circuit 20 is output to the outside of the LNA 1A via the output terminal OUT1 and/or the output terminal OUT2.

As understood from FIGS. 16 and 17, the LNA 1A according to the embodiment can select signals of the frequency band to be received from among radio-frequency signals of multiple frequency bands.

The LNA 1 according to the embodiment controls its switch elements so that the passive elements for radio-frequency signals are placed in the effective/ineffective state, and this can match the input impedance and the output impedance and secure the improved parameter "S23" in the split output mode in concordance with the frequency band of the received radio-frequency signals.

(2c) Characteristics

FIGS. 18 to 26 will be referred to for describing the characteristics of the LNA according to the embodiment.

FIGS. 18 to 25 show simulation results obtained with the LNA 1A of an exemplary configuration according to the embodiment.

Figure 18:
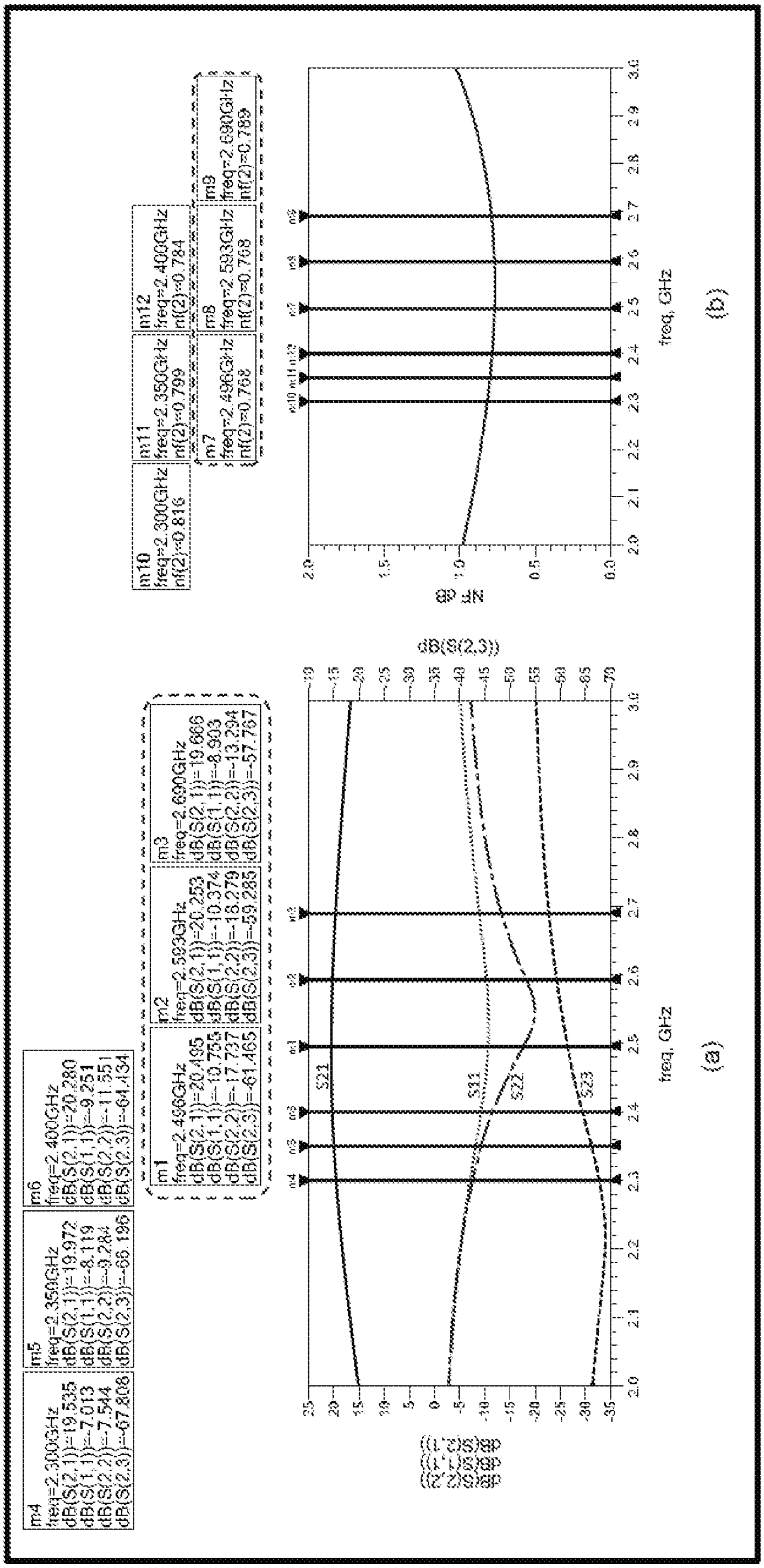
Figure 19:
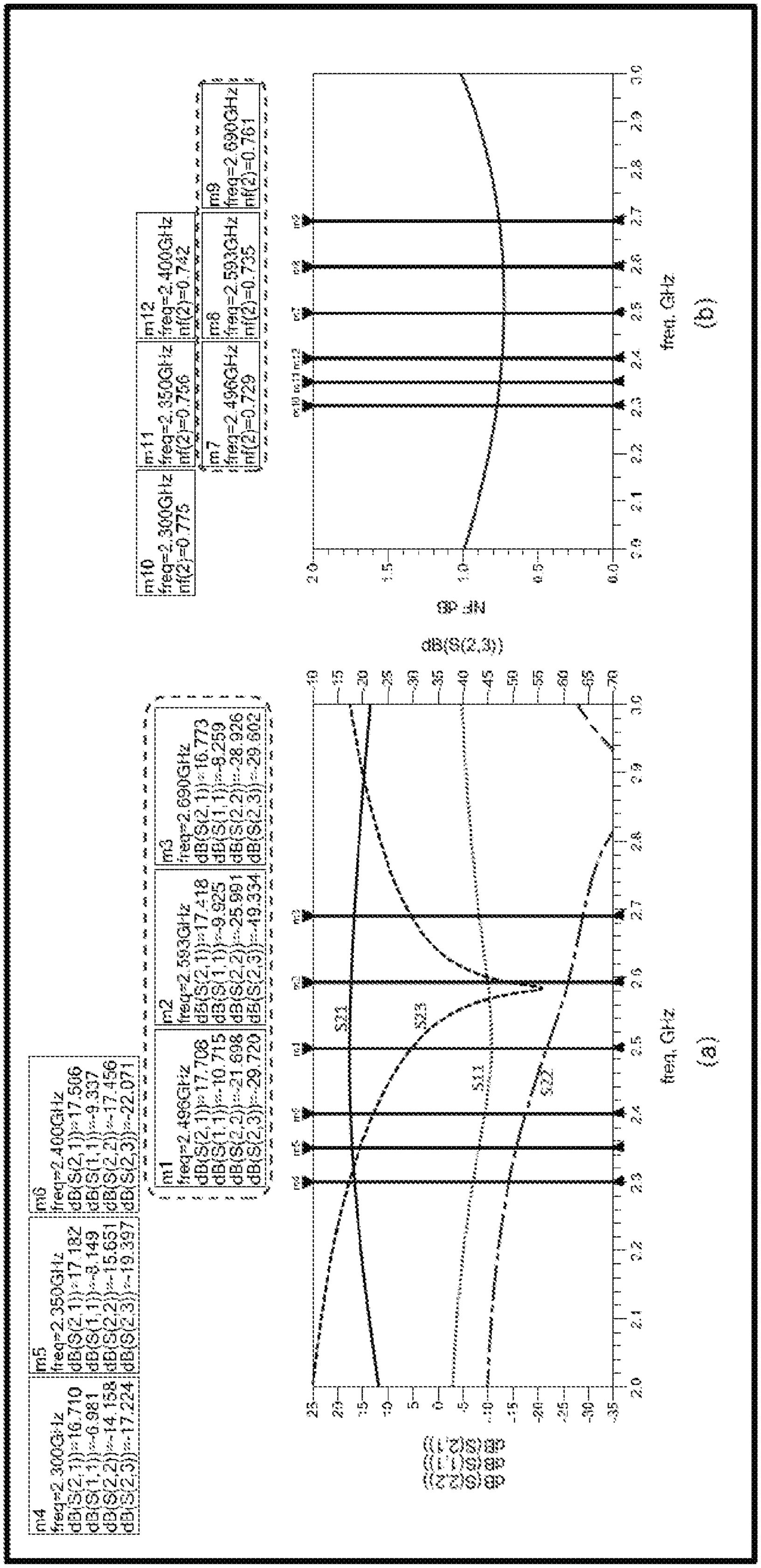
Figure 21:
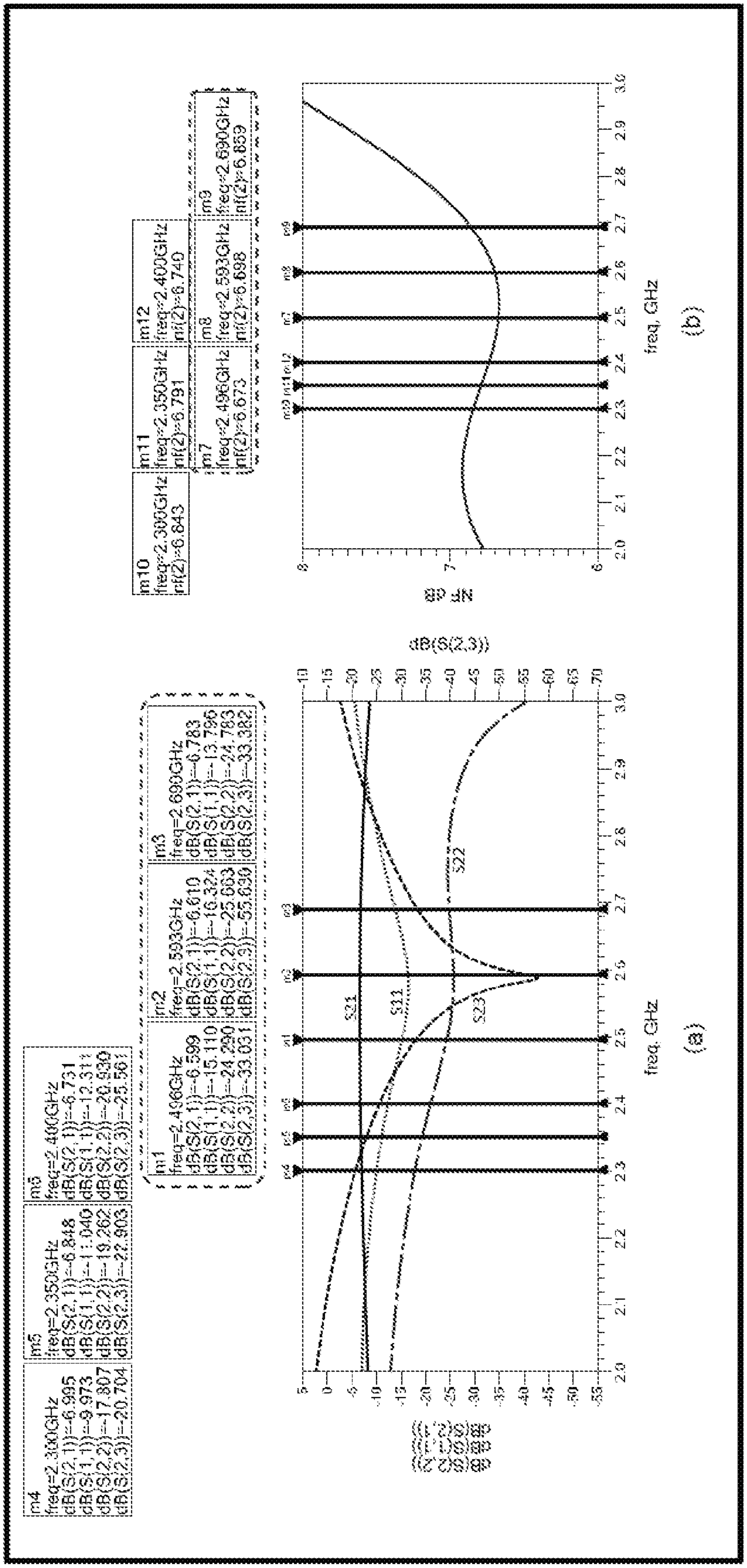
Figure 22:
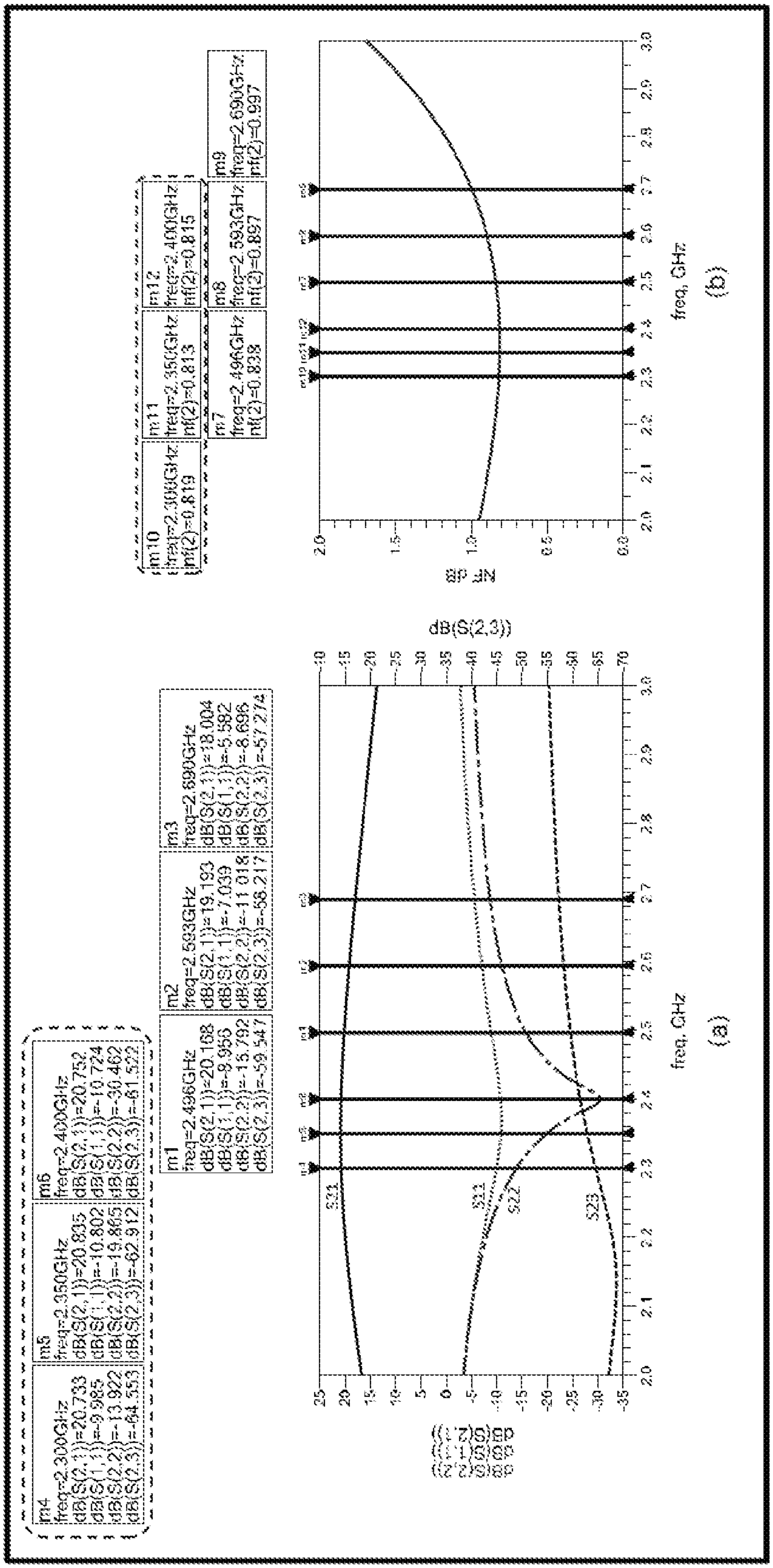
Figure 23:
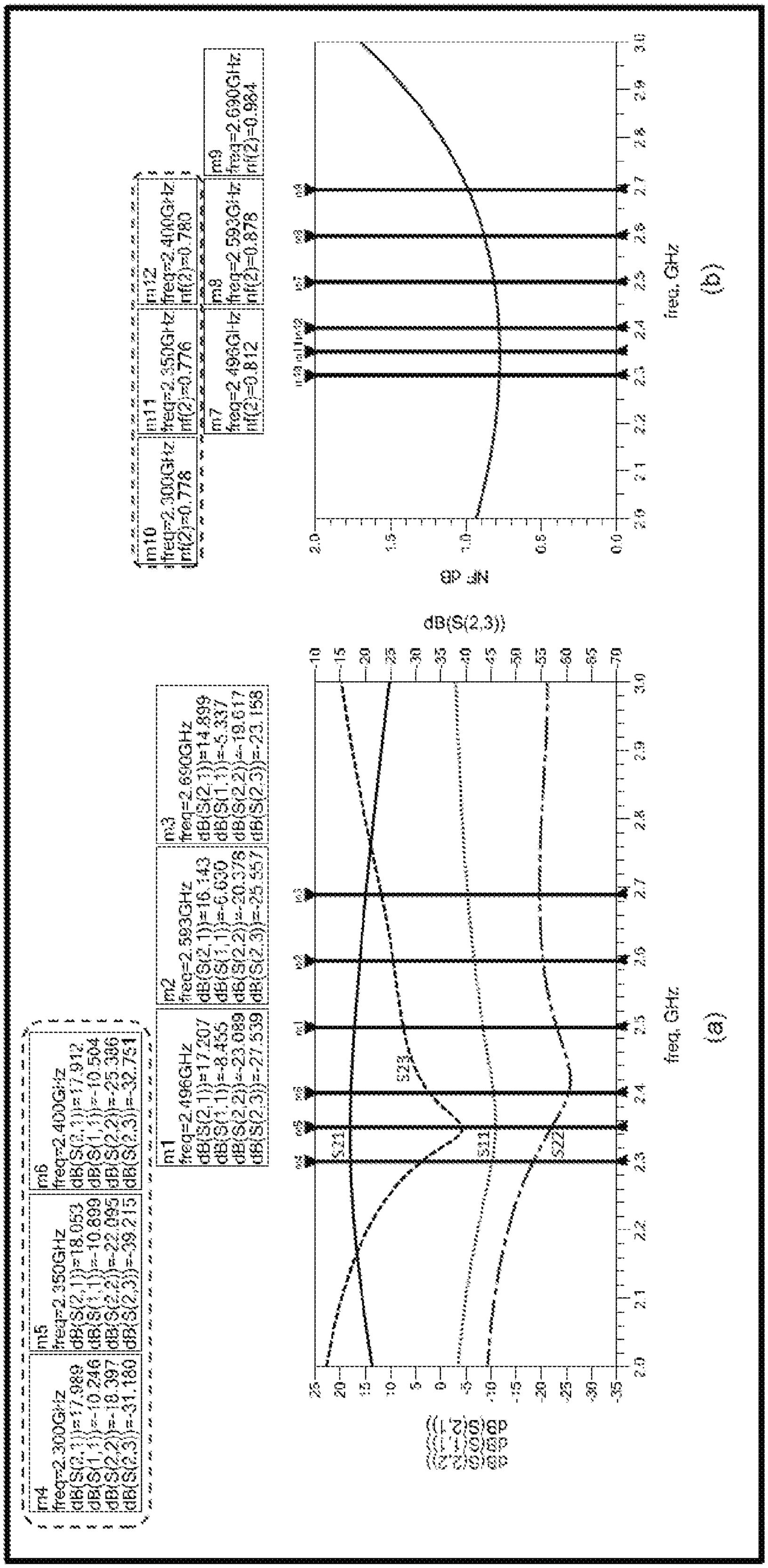
Figure 24:
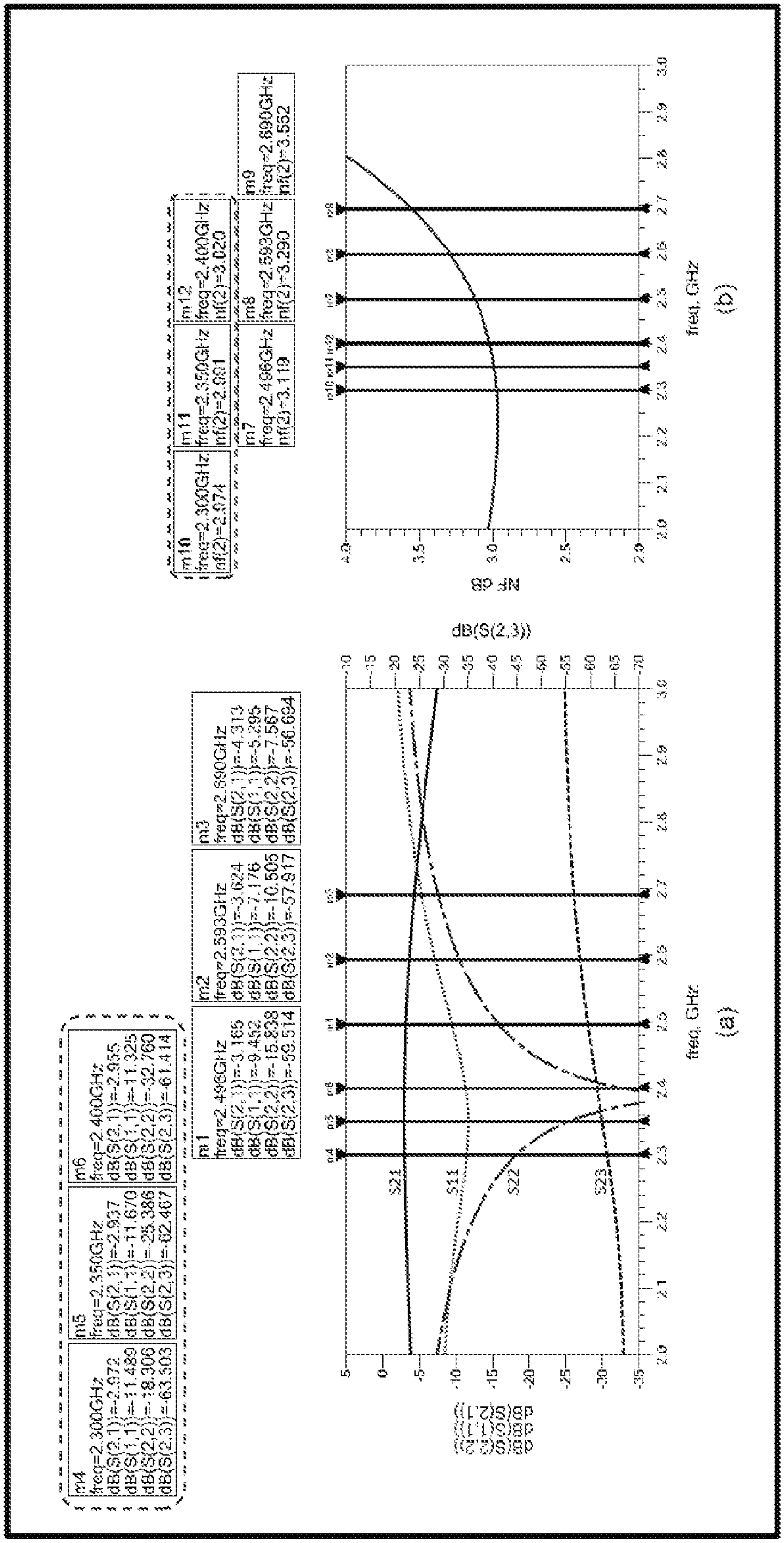
Figure 25:
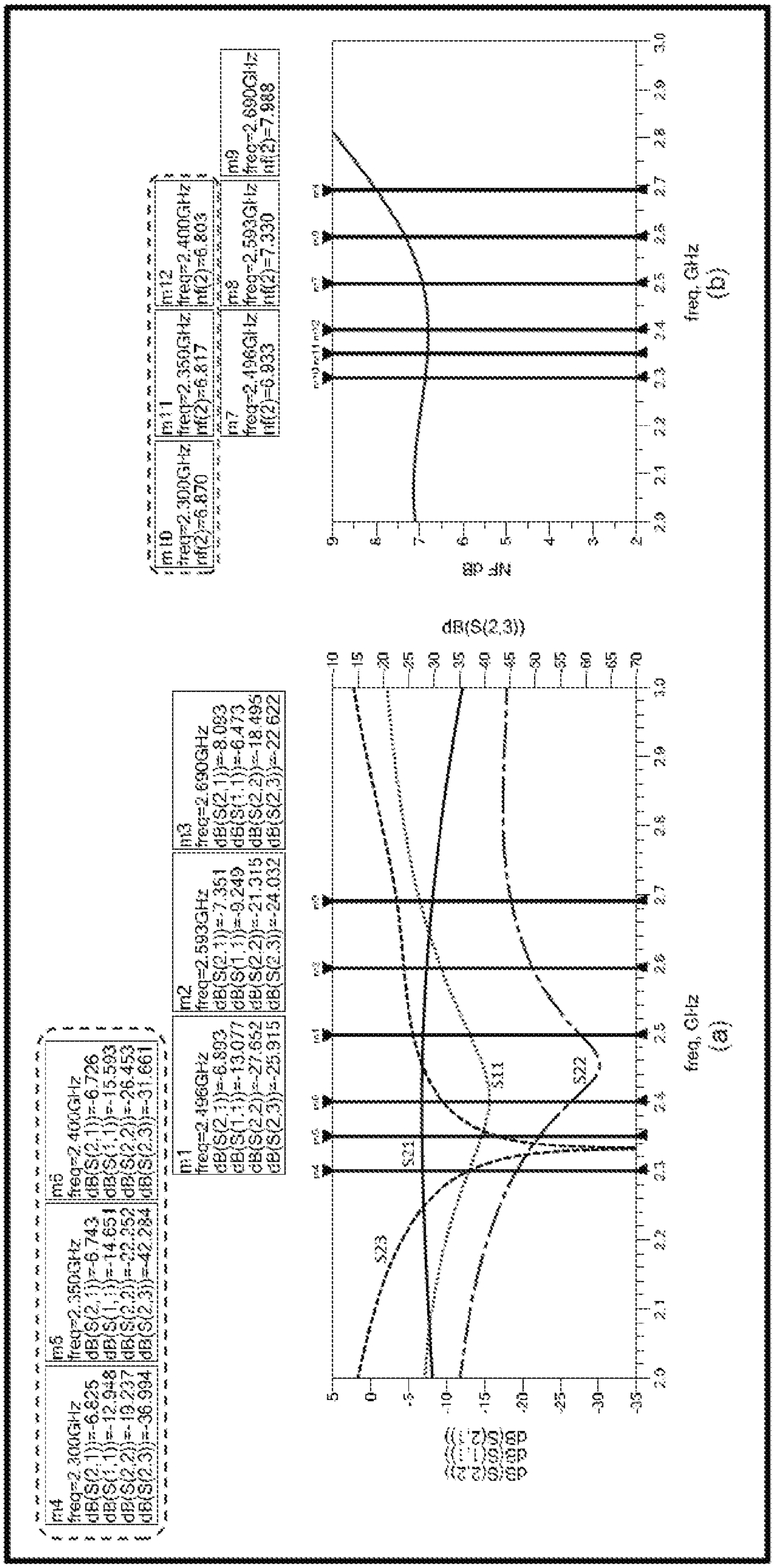

(a) of FIG. 18, (a) of FIG. 19, (a) of FIG. 20, (a) of FIG. 21, (a) of FIG. 22, (a) of FIG. 23, (a) of FIG. 24, and (a) of FIG. 25 are each a graph showing relationships between frequencies and the S parameters of the LNA 1A according to the embodiment.

In each graph (a) of FIGS. 18 to 25, frequency characteristics for the S parameters S(1,1) (=S11), S(2,2) (=S22), S(2,1) (=S21), and S(2,3) (=S23) are shown. Here, in the S parameters, port "1" refers to the input node IN for radio-frequency signals, port "2" refers to the output terminal OUT1 of the LNA 1A, and port "3" refers to the output terminal OUT2 of the LNA 1A.

In each graph (a) of FIGS. 18 to 25, the horizontal axis indicates frequencies (unit: GHz) and the vertical axis indicates values of gain or loss (unit: dB).

(b) of FIG. 18, (b) of FIG. 19, (b) of FIG. 20, (b) of FIG. 21, (b) of FIG. 22, (b) of FIG. 23, (b) of FIG. 24, and (b) of FIG. 25 are each a graph showing relationships between frequencies and the noise figures of the LNA 1A according to the embodiment.

In each graph (b) of FIGS. 18 to 25, the horizontal axis indicates frequencies (unit: GHz) and the vertical axis indicates noise figures (unit: dB).

For the simulations with the LNA 1A according to the embodiment, the frequency band was set to the band (BAND41) ranging from 2496 MHz to 2690 MHz, or the band (BAND40) ranging from 2300 MHz to 2400 MHz. In these simulations, the voltage VDDLNA was set to 1.2V.

FIG. 18 is for the small-signal characteristics of the LNA 1A according to the embodiment, given in the combination of the amplification mode and the single output mode with the BAND41 (from 2496 MHz to 2690 MHz).

FIG. 19 is for the small-signal characteristics of the LNA 1A according to the embodiment, given in the combination of the amplification mode and the split output mode with the BAND41.

FIG. 20 is for the small-signal characteristics of the LNA 1A according to the embodiment, given in the combination of the bypass mode and the single output mode with the BAND41.

FIG. 21 is for the small-signal characteristics of the LNA 1A according to the embodiment, given in the combination of the bypass mode and the split output mode with the BAND41.

As shown in FIGS. 18 to 21, with the BAND41, the S parameters and the noise figures of the LNA 1A according to the embodiment each show a profile according to the frequencies of the supplied radio-frequency signals and the operational mode of the LNA 1A.

It is demonstrated that the characteristics of the LNA 1A according to the embodiment with the BAND41 are substantially comparable with the characteristics of the LNA 1 according to the first embodiment.

FIG. 22 is for the small-signal characteristics of the LNA 1A according to the embodiment, given in the combination of the amplification mode and the single output mode with the BAND40 (from 2300 MHz to 2400 MHz).

FIG. 23 is for the small-signal characteristics of the LNA 1A according to the embodiment, given in the combination of the amplification mode and the split output mode with the BAND40.

FIG. 24 is for the small-signal characteristics of the LNA 1A according to the embodiment, given in the combination of the bypass mode and the single output mode with the BAND40.

FIG. 25 is for the small-signal characteristics of the LNA 1A according to the embodiment, given in the combination of the bypass mode and the split output mode with the BAND40.

As shown in FIGS. 23 to 25, with the BAND40, the S parameters and the noise figures of the LNA 1A according to the embodiment each show a profile according to the frequencies of the supplied radio-frequency signals and the operational mode of the LNA 1A.

It is shown that the characteristics of the LNA 1A according to the embodiment with the BAND40 are substantially comparable with the characteristics of the LNA 1A according to the embodiment with the BAND41.

FIG. 26 shows the simulation results for the characteristics of the LNA 1A according to the embodiment. FIG. 26 lists, based on FIGS. 18 to 25, the simulation results for the small-signal characteristics of the LNA 1A according to the embodiment. In FIG. 26, the values at the band center are noted for the S parameter "S21", and the worst values within the respective band are noted for each of the noise figure NF and the S parameters "S11", "S22", and "S23".

The LNA 1A according to the embodiment exhibits the values of the S parameter "S23" that are −29.6 dB or less in all the possible modes of the LNA 1A.

As such, the "S23" parameter values of the LNA 1A according to the embodiment can secure a sufficient margin from the generally required value (e.g., −25 dB).

Therefore, the embodiment can realize the LNA of superior characteristics, free from characteristic degradation due to the band selection function.

(3) Third Embodiment

An LNA according to the third embodiment will be described with reference to FIGS. 27 to 46.

(3a) Exemplary Configuration

Figure 27:
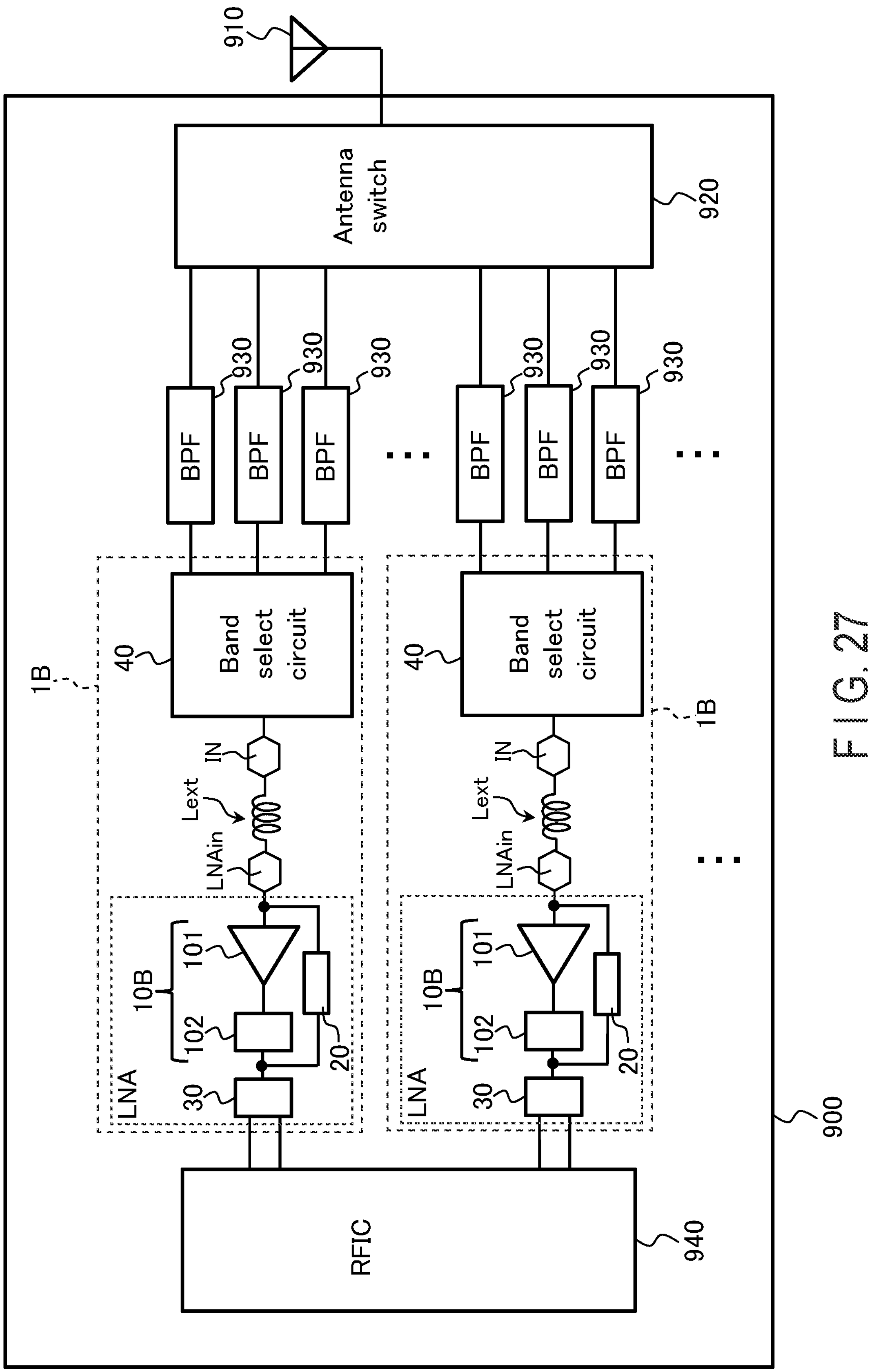
FIG. 27 is a block diagram showing an exemplary configuration of an LNA according to a third embodiment.

FIG. 27 is a block diagram showing a wireless communication system including an LNA 1B according to the embodiment.

FIG. 27 particularly shows, among the internal configuration of the wireless communication system, the configuration of communication paths on the receiving side for radio-frequency signals.

The wireless communication system 900 is adapted to perform wireless communications using the carrier aggregation technology. The wireless communication system 900 thus conducts wireless communications with multiple frequencies (frequency bands).

As shown in FIG. 27, the wireless communication system includes multiple LNAs 1B and multiple band-pass filters in concordance with multiple frequency bands.

The multiple band-pass filters each forward radio-frequency signals of one of the multiple frequency bands which the wireless communication system can receive, to the corresponding, subsequent circuit 1B.

The LNA 1B according to the embodiment has the split output mode, the bypass mode, and a band selection function.

For the present embodiment, each LNA 1B further includes a band select circuit 40 (which may also be called a "band select switch circuit"). The band select circuit 40 is disposed between the band-pass filters 930 and the amplifier circuit 10B.

The band select circuit 40 is capable of exclusively selecting one of the radio-frequency signals of multiple frequency bands. The band select circuit 40 can accordingly take the one selected radio-frequency signal into the LNA 1B in an exclusive manner.

The LNA 1B according to the embodiment has its bypass circuit 20. This bypass circuit 20 outputs the supplied radio-frequency signals RFin to the splitter circuit 30B without having them pass through the cascode connection amplifier circuit 10B.

In exemplary implementations, the LNA 1B according to this embodiment may be an LNA for the frequency bands of 1 GHz or lower. In the disclosure herein, a frequency band of 1 GHz or lower may be called a "low band".

Figure 28:
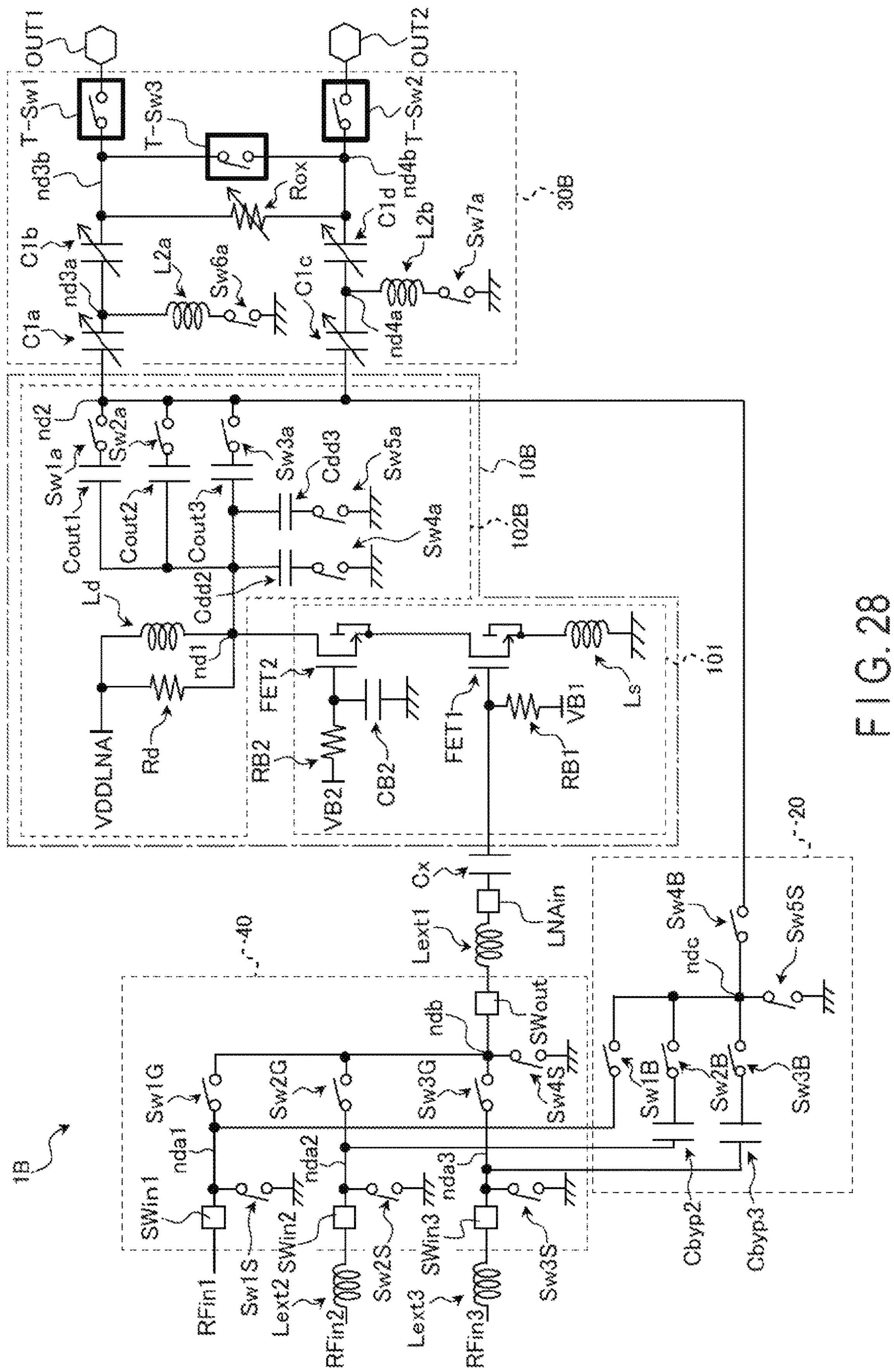
FIG. 28 is a circuit diagram showing an exemplary configuration of the LNA according to the third embodiment.

FIG. 28 is an equivalent circuit diagram showing an exemplary configuration of the LNA 1B according to the embodiment.

<Amplifier Circuit>

In the LNA 1B according to the embodiment, the cascode connection amplifier circuit 10B is connected to the band select circuit 40 via an external inductor Lext1. The input terminal LNAin of the amplifier circuit 10B is connected to one terminal of the external inductor Lext1. The other terminal of the external inductor Lext1 is connected to an output terminal SWout of the band select circuit 40.

In the cascode connection amplifier circuit 10B, the core circuit 101 includes field-effect transistors FET1 and FET2 in cascode connection, as in the foregoing embodiments.

However, in the present embodiment, the drain of the transistor FET2 is connected to the node nd1 of the output matching circuit 102B without an intervening switch element.

According to the embodiment, the output matching circuit 102B includes a resistor Rd, an inductor Ld, multiple capacitors Cout1, Cout2, Cout3, Cdd2, and Cdd3, and multiple switches Sw1*a*, Sw2*a*, Sw3*a*, Sw4*a*, and Sw5*a*.

In the output matching circuit 102B, one terminal of the resistor Rd is connected to the voltage terminal VDDLNA. The other terminal of the resistor Rd is connected to the drain of the transistor FET2. Between the voltage terminal VDDLNA and the drain of the transistor FET2, the resistor Rd is connected in parallel with the inductor Ld. The resistor Rd functions as load resistance for the core circuit 101.

One terminal of the inductor Ld is connected to the voltage terminal VDDLNA. The other terminal of the inductor Ld is connected to the node nd1. The inductor Ld functions as a parallel inductor for the communication path for radio-frequency signals.

One terminal of the capacitor Cout1 is connected to the node nd1. The other terminal of the capacitor Cout1 is connected to one terminal of the switch Sw1*a*. The other terminal of the switch Sw1*a* is connected to the node nd2.

One terminal of the capacitor Cout2 is connected to the node nd1. The other terminal of the capacitor Cout2 is connected to one terminal of the switch Sw2*a*. The other terminal of the switch Sw2*a* is connected to the node nd2.

One terminal of the capacitor Cout3 is connected to the node nd1. The other terminal of the capacitor Cout3 is connected to one terminal of the switch Sw3*a*. The other terminal of the switch Sw3*a* is connected to the node nd2.

The capacitors Cout1, Cout2, and Cout3 are each connected in series on the respective communication path between the node nd1 and the node nd2. The capacitors Cout1, Cout2, and Cout3 each function as a series capacitor on the respective communication path between the node nd1 and the node nd2.

Between the node nd1 and the node nd2, the capacitors Cout1, Cout2, and Cout3 are connected in parallel with one another.

The switches Sw1*a*, Sw2*a*, and Sw3*a* set the respective capacitors Cout1, Cout2, and Cout3 in the effective/ineffective state according to the selected frequency bands.

One terminal of the capacitor Cdd2 is connected to the node nd1. The other terminal of the capacitor Cdd2 is connected to one terminal of the switch Sw4*a*. The other terminal of the switch Sw4*a* is connected to the ground terminal.

One terminal of the capacitor Cdd3 is connected to the node nd1. The other terminal of the capacitor Cdd3 is connected to one terminal of the switch Sw5*a*. The other terminal of the switch Sw5*a* is connected to the ground terminal.

The capacitors Cdd2 and Cdd3 are each connected between the communication path between the nodes nd1 and nd2, and the ground. The capacitors Cdd2 and Cdd3 function as parallel capacitors on the communication path.

The capacitors Cdd2 and Cdd3 effectively change the value of inductance of the inductor Ld.

According to the embodiment, all the switches Sw1*a*, Sw2*a*, Sw3*a*, Sw4*a*, and Sw5*a* turn off in the bypass mode. This causes the cascode connection amplifier circuit 10B to be electrically separated from the splitter circuit 30B and the output terminals OUT1 and OUT2. As such, the signal transmission from the cascode connection amplifier circuit 10B to the splitter circuit 30B is blocked.

In the bypass mode, the output matching circuit 102B is electrically separated from the bypass circuit 20, as will be described.

<Band Select Circuit>

In the LNA 1B according to the embodiment, the band select circuit 40 includes multiple input terminals SWin (SWin1, SWin2, and SWin3) and one output terminal SWout. The multiple input terminals each correspond to one of the multiple frequency bands.

The input terminal SWin1 corresponds to a signal RFin1 of the first frequency band. For example, the input terminal SWin2 corresponds to a signal RFin2 of the second frequency band which is lower than the first frequency band. In an exemplary configuration, the input terminal SWin3 corresponds to a signal RFin3 of the third frequency band which is lower than the second frequency band.

The embodiment assumes, as one example, the first frequency band for the signal RFin1 to be a frequency band ranging from 859 MHz to 960 MHz. In this example, the second frequency band for the signal RFin2 may be a frequency band ranging from 717 MHz to 821 MHz. The third frequency band for the signal RFin3 may be a frequency band ranging from 617 MHz to 652 MHz.

An inductor (external inductor) Lext2 is connected to the input terminal SWin2. An inductor (external inductor) Lext3 is connected to the input terminal SWin3.

The input terminal SWin1 is supplied with the radio-frequency signal RFin1 of the first frequency band (e.g., from 859 MHz to 960 MHz). The input terminal SWin2 is supplied with the radio-frequency signal RFin2 of the second frequency band (e.g., from 717 MHz to 821 MHz), via the external inductor Lext2. The input terminal SWin3 is supplied with the radio-frequency signal RFin3 of the third frequency band (e.g., from 617 MHz to 652 MHz), via the external inductor Lext3.

The output terminal SWout is connected to the external inductor Lext1. The output terminal SWout is connected to the input terminal LNAin of the amplifier circuit 10B via the external inductor Lext1.

The band select circuit 40 includes multiple switches Sw1G, Sw2G, and Sw3G. The switches Sw1G, Sw2G, and Sw3G are each connected between corresponding one of the multiple input terminals SWin and the single output terminal SWout.

One terminal of the switch Sw1G is connected to the input terminal SWin1 via a node nda1. The other terminal of the switch Sw1G is connected to the output terminal SWout via a node ndb.

One terminal of the switch Sw2G is connected to the input terminal SWin2 via a node nda2. The other terminal of the switch Sw2G is connected to the output terminal SWout via the node ndb.

One terminal of the switch Sw3G is connected to the input terminal SWin3 via a node nda3. The other terminal of the switch Sw3G is connected to the output terminal SWout via the node ndb.

The output terminal SWout of the band select circuit 40 is connected to the input terminal LNAin of the amplifier circuit 10B via the external inductor Lext1.

The band select circuit 40 includes multiple switches Sw1S, Sw2S, Sw3S, and Sw4S. The switches Sw1S, Sw2S, Sw3S, and Sw4S are switch elements for grounding non-active nodes. The switches Sw1S, Sw2S, Sw3S, and Sw4S may also be called "shunt switches" below.

One terminal of the shunt switch Sw1S is connected to one terminal of the switch Sw1G (i.e., to the connection node nda1 between the switch Sw1G and the terminal SWin1). The other terminal of the shunt switch Sw1S is connected to the ground terminal.

One terminal of the shunt switch Sw2S is connected to one terminal of the switch Sw2G (i.e., to the connection node nda2 between the switch Sw2G and the terminal SWin2). The other terminal of the shunt switch Sw2S is connected to the ground terminal.

One terminal of the shunt switch Sw3S is connected to one terminal of the switch Sw3G (i.e., to the connection node nda3 between the switch Sw3G and the terminal SWin3).

The other terminal of the shunt switch Sw3S is connected to the ground terminal.

One terminals of the shunt switch Sw4S is connected to the other terminals of the switches Sw1G, Sw2G, and Sw3G and to the output terminal SWout (i.e., to the connection node ndb between the set of switches Sw1G, Sw2G, and Sw3G, and the output terminal SWout). The other terminal of the shunt switch Sw4S is connected to the ground terminal.

When the shunt switches Sw1S, Sw2S, Sw3S, and Sw4S are on, the respectively-connected nodes nda1, nda2, nda3, and ndb connected to the shunt switches are grounded by the on-state shunt switches.

With the above configuration, the band select circuit 40 can exclusively select one of the three radio-frequency signals RFin1, RFin2, and RFin3.

Therefore, among the radio-frequency signals supplied to the input terminals SWin1, SWin2, and SWin3 of the band select circuit 40, the signals corresponding to the on-state one of the multiple switches Sw1G, Sw2G, and Sw3G are permitted to pass through, and thus fed from the output terminal SWout of the band select circuit 40 to the input terminal LNAin of the amplifier circuit 10B.

Note that the present embodiment is not limited to the frequency bands of the above-described values, and the embodiment may adopt other frequency ranges. The band select circuit 40 may be configured so as to deal with two frequency bands, or four or more frequency bands, for the exclusive selection.

In exemplary implementations, the switches Sw1G, Sw2G, Sw3G, Sw1S, Sw2S, Sw3S, and Sw4S may be on/off-controlled by an RFIC circuit, or by the control circuit 990 (or the RFIC 940).

<Bypass Circuit>

In the LNA 1B according to the embodiment, the bypass circuit 20 is disposed between the multiple input terminals SWin of the band select circuit 40 and the output node nd2 of the output matching circuit 102B (that is, the input node of the splitter circuit 30B).

Between the input terminal (input node) of the LNA 1B and the later-described splitter circuit 30B, the bypass circuit 20 is connected in parallel with the amplifier circuit 10B. The communication paths for radio-frequency signals in the bypass circuit 20 are separated from the communication paths for radio-frequency signals in the core circuit 101 of the amplifier circuit 10B.

The bypass circuit 20 includes multiple switches Sw1B, Sw2B, Sw3B, Sw4B, and Sw5S. The bypass circuit 20 includes capacitors Cbyp2 and Cbyp3.

The switches Sw1B, Sw2B, and Sw3B are each disposed between corresponding one of the multiple input terminals SWin of the band select circuit 40 and the output node nd2 of the output matching circuit 102B (that is, the input node of the splitter circuit 30B). The switches Sw1B, Sw2B, and Sw3B are each connected between the corresponding one of the multiple input terminals SWin and a node ndc.

One terminal of the switch Sw1B is connected to the input terminal SWin1 and one terminal of the switch Sw1G (i.e., to the node nda1). The other terminal of the switch Sw1B is connected to the node ndc.

One terminal of the switch Sw2B is connected to the input terminal SWin2 and one terminal of the switch Sw2G (i.e., to the node nda2), via the capacitor Cbyp2. The other terminal of the switch Sw2B is connected to the node ndc.

One terminal of the switch Sw3B is connected to the input terminal SWin3 and one terminal of the switch Sw3G (i.e., to the node nda3), via the capacitor Cbyp3. The other terminal of the switch Sw3B is connected to the node ndc.

One terminal of the switch Sw4B is connected to the node ndc. The other terminal of the switch Sw4B is connected to the node nd2.

One terminal of the switch Sw5S is connected to the node ndc. The other terminal of the switch Sw5S is connected to the ground terminal. The switch Sw5S is a shunt switch for grounding the non-active node.

One terminal of the capacitor Cbyp2 is connected to the input terminal SWin2 (i.e., to the node nda2). The other terminal of the capacitor Cbyp2 is connected to one terminal of the switch Sw2B. The capacitor Cbyp2 is connected in series with the switch Sw2B between the node nda2 and the node ndc. The presence of the capacitor Cbyp2 mitigates the influence of the external inductor Lext2 by the series resonance effect produced between the capacitor Cbyp2 and the external inductor Lext2.

One terminal of the capacitor Cbyp3 is connected to the input terminal SWin3 (i.e., to the node nda3). The other terminal of the capacitor Cbyp3 is connected to one terminal of the switch Sw3B. The capacitor Cbyp3 is connected in series with the switch Sw3B between the node nda3 and the node ndc. The presence of the capacitor Cbyp3 mitigates the influence of the external inductor Lext3 by the series resonance effect produced between the capacitor Cbyp3 and the external inductor Lext3.

In the bypass circuit 20, the multiple switches Sw1B, Sw2B, Sw3B, Sw4B, and Sw5S form a bypass route in the LNA 1B that extends from the input terminals SWin of the band select circuit 40 to the input node of the splitter circuit 30B without passing through the amplifier circuit 10B.

In one example, the switches Sw1B, Sw2B, and Sw3B each function as an input node (together as an input node set) of the bypass circuit 20. In concordance with the radio-frequency signals to be received, one of the switches Sw1B, Sw2B, and Sw3B functions as an effective input node.

When the LNA 1B according to the embodiment is in the bypass mode, selected one of the switches Sw1B, Sw2B, and Sw3B, and the switch Sw4B turn on. The switch Sw5S turns off.

In exemplary implementations, the switches Sw1B, Sw2B, Sw3B, Sw4B, and Sw5S may be on/off-controlled by an RFIC circuit, or by the control circuit 990 (or the RFIC 940).

<Splitter Circuit>

In the LNA 1B according to the present embodiment, the splitter circuit 30B includes multiple variable capacitors C1*a*, C1*b*, C1*c*, and C1*d*, inductors L2*a* and L2*b*, a variable resistor Rox, and switches Sw6*a*, Sw7*a*, T-Sw1, T-Sw2, and T-Sw3.

One terminal of the variable capacitor C1*a* is connected to the node nd2. The other terminal of the variable capacitor C1*a* is connected to one terminal of the variable capacitor C1*b*. The other terminal of the variable capacitor C1*b* is connected to a node nd3*b*.

One terminal of the inductor L2*a* is connected to a connection node nd3*a* between the variable capacitors C1*a* and C1*b* (i.e., to the other terminal of the variable capacitor C1*a* and the one terminal of the variable capacitor C1*b*). The other terminal of the inductor L2*a* is connected to one terminal of the switch Sw6*a*. The other terminal of the switch Sw6*a* is connected to the ground terminal.

The inductor L2*a* is a parallel inductor disposed between the communication path for signals (path between the nodes nd2 and nd3*b*) and the ground terminal. The inductor L2*a* may be a variable inductor.

The inductor L2*a* can be set in the effective state by the on-state switch Sw6*a*. The inductor L2*a* can be set in the ineffective state by the off-state switch Sw6*a*.

One terminal of the variable capacitor C1*c* is connected to the node nd2. The other terminal of the variable capacitor C1*c* is connected to one terminal of the variable capacitor C1*d*. The other terminal of the variable capacitor C1*d* is connected to a node nd4*b*.

One terminal of the inductor L2*b* is connected to a connection node nd4*a* between the variable capacitors C1*c* and C1*d* (i.e., to the other terminal of the variable capacitor C1*c* and the one terminal of the variable capacitor C1*d*). The other terminal of the inductor L2*b* is connected to one terminal of the switch Sw7*a*. The other terminal of the switch Sw7*a* is connected to the ground terminal.

The inductor L2*b* is disposed as a parallel inductor between the communication path for signals (path between the nodes nd2 and nd4*b*) and the ground terminal. The inductor L2*b* may be a variable inductor.

The inductor L2*b* can be set in the effective state by the on-state switch Sw7*a*. The inductor L2*b* can be set in the ineffective state by the off-state switch Sw7*a*.

One terminal of the variable resistor Rox is connected to the node nd3*b*. The other terminal of the variable resistor Rox is connected to the node nd4*b*. The variable resistor Rox can secure the isolation between the output terminals OUT1 and OUT2 in the split output mode.

One terminal of the T-switch T-Sw1 is connected to the node nd3*b*. The other terminal of the T-switch T-Sw1 is connected to the output terminal OUT1 of the LNA 1B. One terminal of the T-switch T-Sw2 is connected to the node nd4*b*. The other terminal of the T-switch T-Sw2 is connected to the output terminal OUT2 of the LNA 1B. One terminal of the T-switch T-Sw3 is connected to the node nd3*b*. The other terminal of the T-switch T-Sw3 is connected to the node nd4*b*.

Of the four variable capacitors C1*a*, C1*b*, C1*c* and C1*d*, two variable capacitors C1*a* and C1*b* form a pair. The variable capacitors C1*a* and C1*b* are connected in series for the communication path between the node nd2 and the output terminal OUT1. The pair of variable capacitors C1*a* and C1*b* may be called a series variable capacitors pair C1*a* and C1*b*.

Of the four variable capacitors C1*a*, C1*b*, C1*c* and C1*d*, two variable capacitors C1*c* and C1*d* form a pair. The variable capacitors C1*c* and C1*d* are connected in series for the communication path between the node nd2 and the output terminal OUT2. The pair of variable capacitors C1*c* and C1*d* may be called a series variable capacitors pair C1*c* and C1*d*.

As in the foregoing embodiments, the splitter circuit 30B operates according to the operational mode of the LNA 1B. For example, the splitter circuit 30B in the LNA 1B according to the embodiment can output radio-frequency signals under the single output mode and the split output mode.

In one example, one of the two switches Sw6*a* and Sw7*a* turns on in the single output mode of the LNA 1B. Accordingly, among the multiple output terminals OUT of the LNA 1B, the output terminal connected with the on-state switch is set in the effective state.

In one example, the two switches Sw6*a* and Sw7*a* both turn on in the split output mode of the LNA 1B. This sets the multiple output terminals OUT in the effective state.

In exemplary implementations, the switches Sw6*a*, Sw7*a*, T-Sw1, T-Sw2, and T-Sw3 may be on/off-controlled by an RFIC circuit, or by the control circuit 990 (or the RFIC 940).

According to the embodiment, the variable capacitors C1*a*, C1*b*, C1*c*, and C1*d* during operations of the LNA 1B are controlled in conjunction with each other so that they each have the same capacitance value (which may be called "Cp1" here) in the respective mode. By setting the capacitance value Cp1 of the variable capacitors C1*a*, C1*b*, C1*c*, and C1*d* to an appropriate value, the splitter circuit 30B functions and operates as a part of the output matching circuit 102B.

This allows the LNA 1B according to the embodiment to attain good output impedance matching.

In one example, the control circuit 990 (or the RFIC 940) controls the variable capacitors so that they each have a predetermined capacitance value according to the selected mode for operation.

Note that, instead of the respective variable capacitors C1*a*, C1*b*, C1*c*, and C1*d*, multiple circuits each constituted by serially-connected switch element and capacitive element (which may be called "serial connection circuits") may be disposed in parallel connection between the nodes. In such a structure, the switch element in each serial connection circuit is on/off-controlled according to the desired capacitance value Cp1. The capacitive element in each serial connection circuit between the nodes is thus controlled for electrical connection.

According to the embodiment, controlling the inductors L2*a* and L2*b* and the variable capacitors C1*a*, C1*b*, C1*c*, and C1*d* in the splitter circuit 30B causes the splitter circuit 30B to function as a part of the output matching circuit 102B in the amplifier circuit 10B. Accordingly, the LNA 1B according to the embodiment can secure good output impedance matching.

With the above configuration, the LNA 1B according to the embodiment is capable of receiving radio-frequency signals that correspond to one of multiple frequency bands, and sending the received radio-frequency signals to another device through one of two paths.

(3b) Exemplary Operations

Exemplary operations of the LNA according to the embodiment will be described with reference to FIGS. 29 to 33.

FIG. 29 is a diagram for explaining an exemplary operation of the LNA 1B according to the embodiment.

As shown in FIG. 29, the LNA 1B according to the embodiment can realize multiple operational modes by controlling the on/off states of its switches.

<Amplification Mode>

Figure 30:
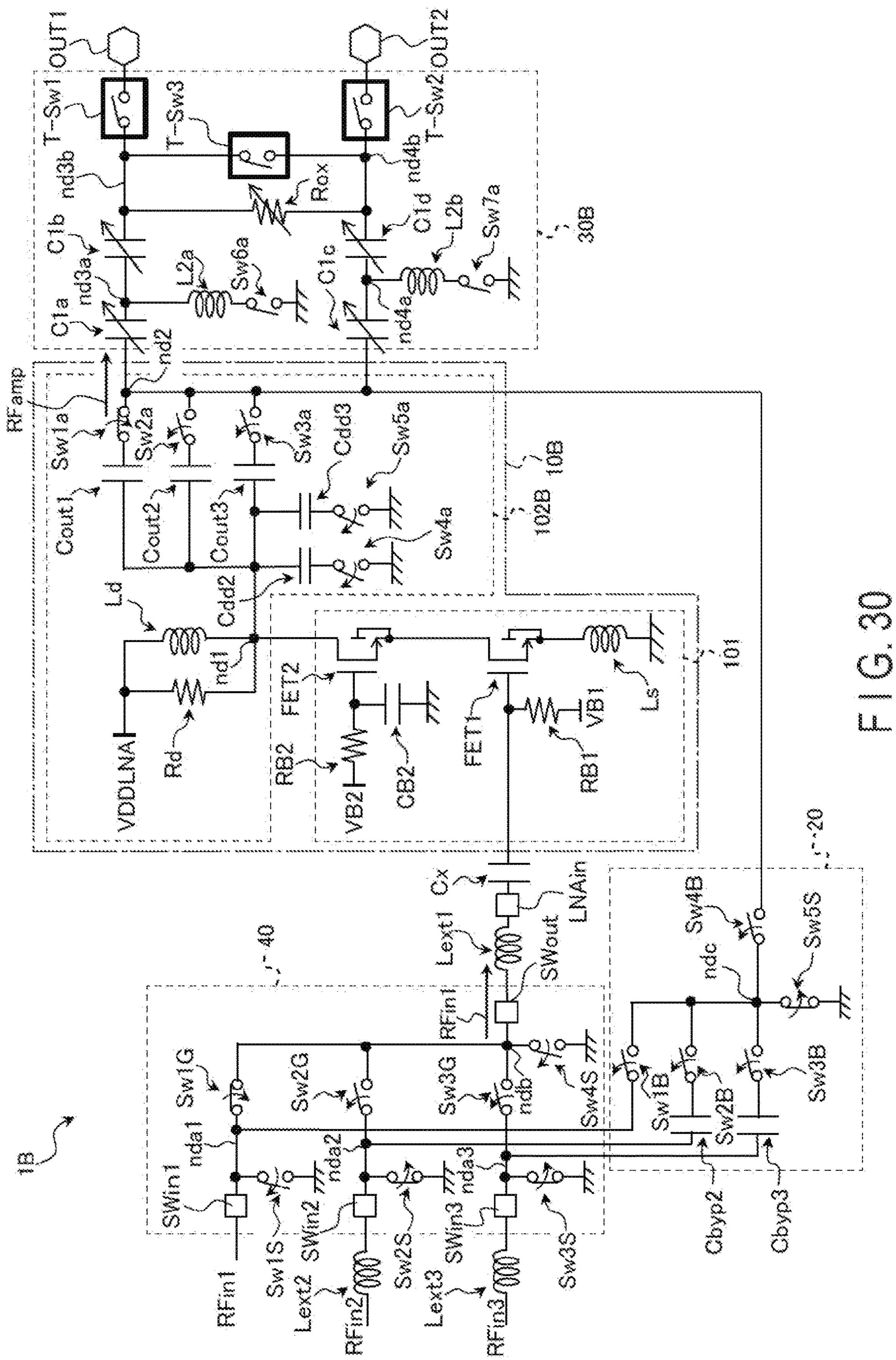

FIG. 30 is a schematic diagram for explaining the operation of each circuit for a frequency band to be received, based on the control of the band select circuit 40 under the amplification mode of the LNA 1B according to the embodiment. FIG. 30 schematically shows the communication path for the signals to reach the node nd2 in the LNA 1B.

As seen from FIGS. 29 and 30, in the amplification mode of the LNA 1B, one of the multiple switches Sw1G, Sw2G, and Sw3G in the band select circuit 40, selected according to the frequency band to be received, turns on.

In the bypass circuit 20, the switches Sw1B, Sw2B, Sw3B, and Sw4B all turn off.

For the example shown in FIG. 30, the description will assume the selection of the signal RFin1 for reception.

In this case, the switch Sw1G turns on, and the switches Sw2G and Sw3G turn off.

The shunt switches Sw2S and Sw3S turn on to deactivate the nodes nda2 and nda3. The nodes nda2 and nda3 are accordingly connected to the ground terminal. The shunt switch Sw5S turns on. The node ndc is connected to the ground terminal.

The shunt switches Sw1S and Sw4S turn off.

In the band select circuit 40, the signal RFin1 travels from the input terminal SWin1 to the output terminal SWout via the on-state switch Sw1G.

The core circuit 101 amplifies the supplied signal RFin1.

When the signal RFin1 is selected, the switch Sw1*a* turns on and the switches Sw2*a* and Sw3*a* turn off in the output matching circuit 102B of the amplifier circuit 10B. This connects the capacitor Cout1 to the nodes nd1 and nd2.

Here, the switches Sw4*a* and Sw5*a* turn off. This electrically separates the capacitors Cdd1 and Cdd2 from the node nd1.

The output matching circuit 102B outputs the amplified signal RFamp from the output node nd2 of the output matching circuit 102B to the splitter circuit 30B via the capacitor Cout1.

The splitter circuit 30B outputs the amplified signal to the subsequent circuitry component according to the selected output mode.

Similarly, when the signal RFin2 is selected, the switches Sw1G, Sw2G, and Sw3G, and the shunt switches Sw1S, Sw2S, Sw3S, and Sw4S are on/off-controlled as shown in FIG. 29 so that the signal RFin2 is supplied from the band select circuit 40 to the amplifier circuit 10B via the on-state switch Sw2G.

When the signal RFin2 is selected, the switches Sw1*a*, Sw2*a*, and Sw4*a* turn on and the switches Sw3*a* and Sw5*a* turn off in the output matching circuit 102B. The capacitors Cout1 and Cout2 are electrically connected to the node nd2. The capacitor Cout3 is electrically separated from the node nd2. The capacitor Cdd2 is electrically connected to the node nd1. The capacitor Cdd3 is electrically separated from the node nd1.

The amplified signal RFamp is output to the splitter circuit 30B from the output matching circuit 102B via the capacitors Cout1 and Cout2.

When the signal RFin3 is selected, the switches Sw1G, Sw2G, and Sw3G, and the shunt switches Sw1S, Sw2S, Sw3S, and Sw4S are on/off-controlled as shown in FIG. 29 so that the signal RFin3 is supplied from the band select circuit 40 to the amplifier circuit 10B via the on-state switch Sw3G.

In this case of selecting the signal RFin3, the switches Sw1*a*, Sw2*a*, Sw3*a*, Sw4*a*, and Sw5*a* turn on in the output matching circuit 102B. The capacitors Cout1, Cout2, and Cout3 are electrically connected to the node nd2. Between the nodes nd1 and nd2, the capacitors Cout1, Cout2, and Cout3 are connected in parallel with one another. The capacitors Cdd2 and Cdd3 are electrically connected to the node nd1.

As such, in the amplification mode, the LNA 1B according to the embodiment amplifies radio-frequency signals of the selected frequency band and sends the amplified signals to the subsequent circuitry component.

<Bypass Mode>

Figure 31:
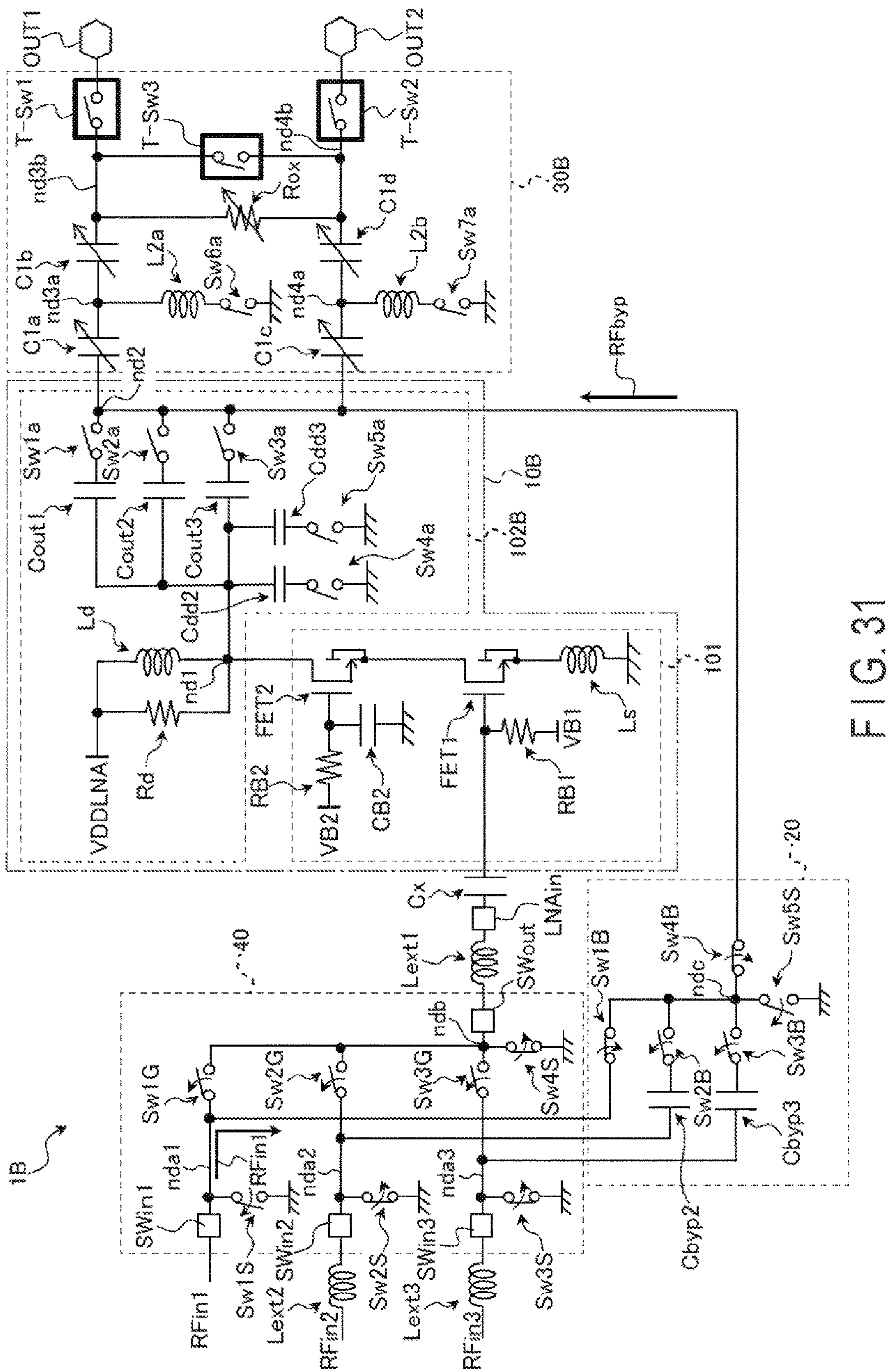

FIG. 31 is a schematic diagram for explaining the operation of each circuit for a frequency band to be received, based on the control of the band select circuit 40 under the bypass mode of the LNA 1B according to the embodiment. FIG. 31 schematically shows the communication path for the signals to reach the node nd2 in the LNA 1B.

As seen from FIGS. 29 and 31, in the bypass mode of the LNA 1B, all the switches Sw1G, Sw2G, and Sw3G in the band select circuit 40 turn off according to the frequency band to be received.

In the bypass circuit 20, the selected switch among the switches Sw1B, Sw2B, and Sw3B turns on.

For the example shown in FIG. 31, the description will assume selecting the signal RFin1 for reception.

In this case, the switch Sw1B turns on, and the switches Sw2B and Sw3B turn off.

The shunt switches Sw2S and Sw3S turn on to deactivate the nodes nda2 and nda3. The nodes nda2 and nda3 are accordingly connected to the ground terminal. The switch Sw4S turns on. This connects the node ndb to the ground terminal.

The shunt switches Sw1S and Sw5S turn off.

The switch Sw4B turns on. Accordingly, the input terminal SWin1 corresponding to the radio-frequency signal RFin1 is connected to the splitter circuit 30B via the bypass circuit 20. The signal RFin1 travels from the input terminal SWin1 to the node nd2 via the on-state switches Sw1B and Sw4B in the bypass circuit 20.

The bypass circuit 20 outputs the supplied radio-frequency signal RF to the splitter circuit 30B (the node nd2) as the radio-frequency signal RFbyp.

The splitter circuit 30B outputs the signal RFbyp from the bypass circuit 20, to the subsequent circuitry component according to the selected output mode.

Note that, as shown in FIG. 29, the switches Sw1*a*, Sw2*a*, and Sw3*a* in the output matching circuit 102B turn off in the bypass mode. The switches Sw4*a* and Sw5*a* are set in an arbitrary state (either the off state or the on state).

When the signal RFin2 is selected, the switches Sw1G, Sw2G, Sw3G, Sw1B, Sw2B, Sw3B, and Sw4B, and the shunt switches Sw1S, Sw2S, Sw3S, Sw4S, and Sw5S are on/off-controlled as shown in FIG. 29 so that the signal RFin2 is supplied from the bypass circuit 20 to the splitter circuit 30B via the on-state switch Sw2B, without passing through the amplifier circuit 10B.

When the signal RFin3 is selected, the switches Sw1G, Sw2G, Sw3G, Sw1B, Sw2B, Sw3B, and Sw4B, and the shunt switches Sw1S, Sw2S, Sw3S, Sw4S, and Sw5S are on/off-controlled as shown in FIG. 29 so that the signal RFin3 is supplied from the bypass circuit 20 to the splitter circuit 30B via the on-state switch Sw3B, without passing through the amplifier circuit 10B.

As such, in the bypass mode of the LNA 1B according to the embodiment, the LNA 1B forwards radio-frequency signals of the selected frequency band to the subsequent circuitry component, without amplifying the signals.

<Single Output Mode>

Figure 32:
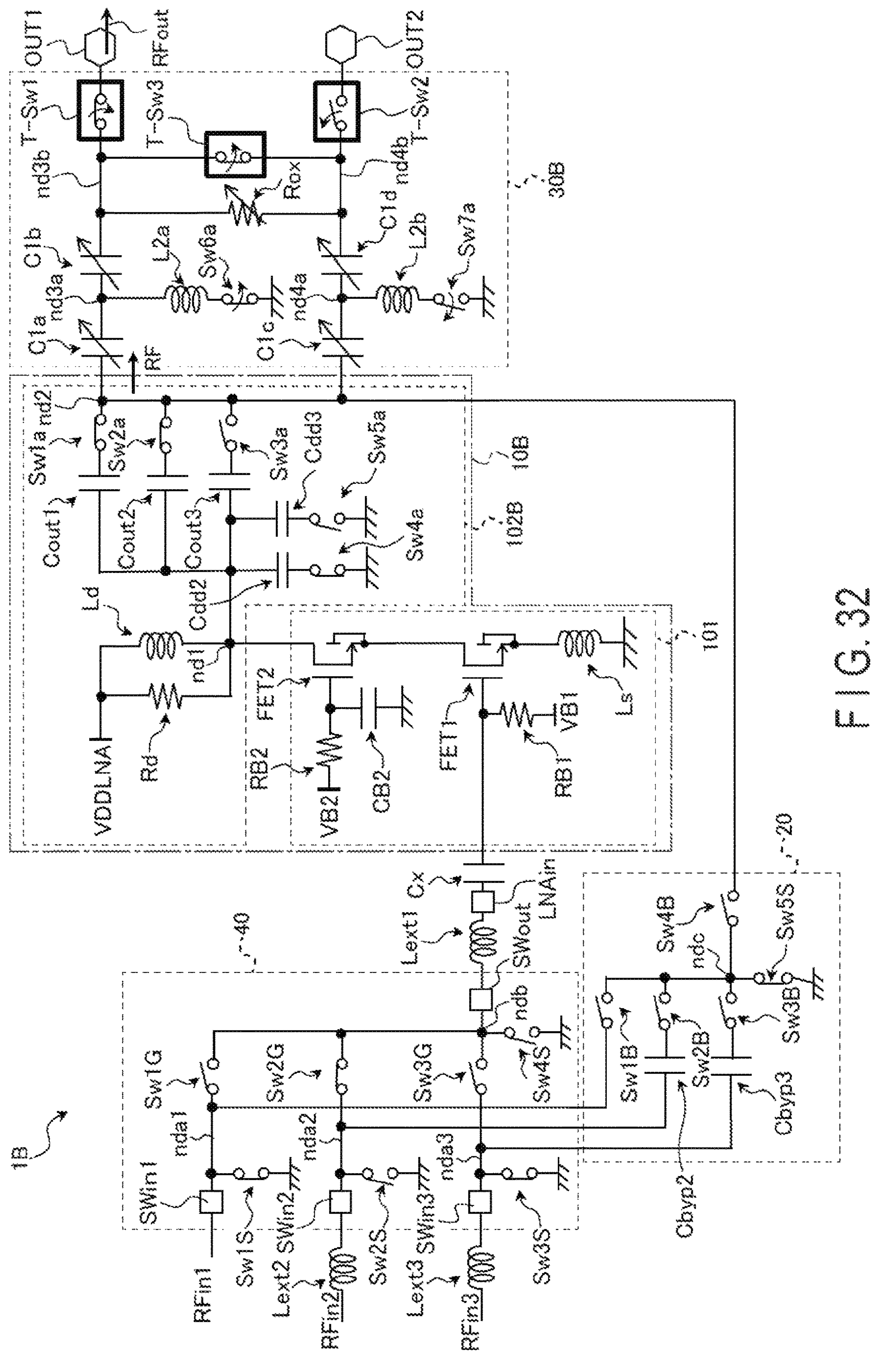

FIG. 32 is a schematic diagram of the LNA 1B according to the embodiment, and shows the communication path for the signal to be transmitted from the node nd2 toward the output terminal in the LNA 1B when operating under the single output mode.

As seen from FIGS. 29 and 32, in the single output mode, one of the T-switches T-Sw1 and T-Sw2 connected to the respective output terminals OUT1 and Out2 turns on.

When the LNA 1B uses the output terminal OUT1 under the single output mode, the T-switch T-Sw1 connected to the output terminal OUT1 turns on. The T-switch T-Sw2 connected to the output terminal OUT2 turns off.

In the single output mode, the T-switch T-Sw3 turns on.

The inductor L2*a* connected to the point of connection between the variable capacitors C1*a* and C1*b* is set in the effective state by the on-state switch Sw6*a*. The inductor L2*b* connected to the point of connection between the variable capacitors C1*c* and C1*d* is set in the ineffective state by the off-state switch Sw7*a*.

The variable capacitors C1*a*, C1*b*, C1*c*, and C1*d* are controlled to have the predetermined capacitance value Cp1.

In this manner, the passive elements in the splitter circuit 30B are controlled for their effective/ineffective states. This causes the splitter circuit 30B to function as a part of the output matching circuit 102B. As a result, the LNA 1B according to the embodiment can secure good output impedance matching.

The signal passing through the node nd4*b* (i.e., the signal that has passed through the variable capacitors C1*c* and C1*d*) is supplied to the node nd3*b* via the resistor Rox and the on-state T-switch T-Sw3. That is, the signal passing through the node nd4*b* is combined with the signal passing through the node nd3*b* (i.e., the signal that has passed through the variable capacitors C1*a* and C1*b*) via the resistor Rox and the on-state T-switch T-Sw3. The signal passing through the node nd4*b* is added to the signal passing through the node nd3*b*.

The signal obtained by this combining within the splitter circuit 30B is output from the selected single output terminal OUT1 as the output signal RFout of the LNA 1B in the single output mode.

In this manner, the radio-frequency signal RF from the amplifier circuit 10B or the bypass circuit 20 is output to the subsequent circuitry component via the output terminal OUT1.

When, different from the case of FIG. 32, the LNA 1B uses the second output terminal OUT2 under the single output mode, the T-switch T-Sw2 connected to the output terminal OUT2 turns on. The T-switch T-Sw1 connected to the output terminal OUT1 turns off.

The inductor L2*a* is set in the ineffective state by the off-state switch Sw6*a*. The inductor L2*b* is set in the effective state by the on-state switch Sw7*a*. The capacitance value of the variable capacitors C1*a*, C1*b*, C1*c*, and C1*d* are controlled to have the predetermined capacitance value Cp1.

The signal passing through the node nd3*b* (i.e., the signal that has passed through the variable capacitors C1*a* and C1*b*) is supplied to the node nd4*b* via the resistor Rox and the on-state T-switch T-Sw3. That is, the signal passing through the node nd3*b* is combined with the signal passing through the node nd4*b* (i.e., the signal that has passed through the variable capacitors C1*c* and C1*d*) via routed through the resistor Rox and the on-state T-switch T-Sw3. The signal passing through the node nd3*b* is added to the signal passing through the node nd4*b*.

The signal obtained by this combining within the splitter circuit 30B is output from the output terminal OUT2 as the output signal of the LNA 1B in the single output mode.

Thus, the radio-frequency signal RFout is forwarded to the subsequent circuitry component from the output terminal OUT2.

As described above, the LNA 1B according to the embodiment is capable of outputting radio-frequency signals to the subsequent circuitry component in the single output mode.

<Split Output Mode>

Figure 33:
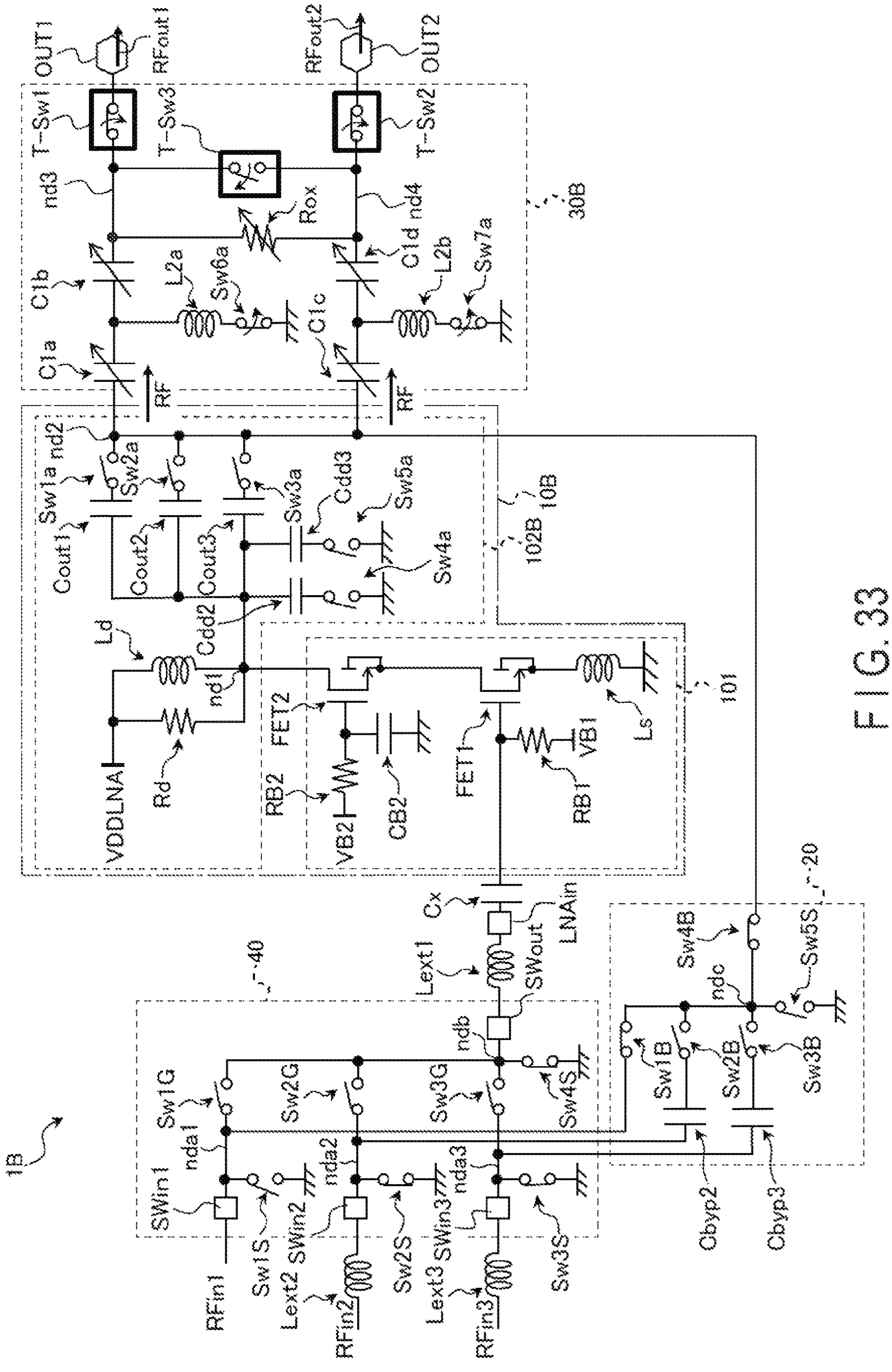

FIG. 33 is a schematic diagram of the LNA 1B according to the embodiment, and shows the communication path for the radio-frequency signal to be transmitted from the node nd2 toward the output terminals in the LNA 1B when operating under the split output mode.

As seen from FIGS. 29 and 33, when the LNA 1B operates under the split output mode, both the two T-switches T-Sw1 and T-Sw2 turn on.

This makes both the output terminals OUT1 and OUT2 electrically connected to the node nd2 via the on-state T-switches T-Sw1 and T-Sw2.

In the split output mode, the T-switch T-Sw3 turns off.

The variable capacitors C1*a*, C1*b*, C1*c*, and C1*d* between the node nd2 and the output terminals OUT1 and OUT2 are controlled to have the predetermined capacitance value Cp1. The inductors L2*a* and L2*b* are both set in the effective state by the on-state switches Sw6*a* and Sw7*a*.

The radio-frequency signal RF from the amplifier circuit 10B or the bypass circuit 20 propagates to the two output terminals OUT1 and OUT2 via the corresponding ones of the variable capacitors C1*a*, C1*b*, C1*c*, and C1*d* and the on-state T-switches T-Sw1 and T-Sw2.

Accordingly, the radio-frequency signals RFout1 and RFout2 are forwarded to the subsequent circuitry component from the two output terminals OUT1 and OUT2, respectively.

As described above, the LNA 1B according to the embodiment is capable of outputting radio-frequency signals to the subsequent circuitry component in the split output mode.

(3c) Characteristics

FIGS. 34 to 46 will be referred to for describing the characteristics of the LNA according to the embodiment.

FIGS. 34 to 46 show simulation results obtained with the LNA 1B of an exemplary configuration according to the embodiment.

(a) of respective FIGS. 34 to 45 are each a graph showing relationships between frequencies and the S parameters of the LNA 1B according to the embodiment. In each graph (a) of FIGS. 34 to 45, frequency characteristics for the S parameters S11 (=S(1,1)), S22 (=S(2,2)), S21 (=S(2,1)), and S23 (=S(2,3)) are shown. In the S parameters, port "1" refers to the active terminal among the multiple input terminals SWin, port "2" refers to the output terminal OUT1 of the LNA 1B, and port "3" refers to the output terminal OUT2 of the LNA 1B.

In each graph (a) of FIGS. 34 to 45, the horizontal axis indicates frequencies (unit: GHz) and the vertical axis indicates values of gain or loss (unit: dB).

(b) of respective FIGS. 34 to 45 are each a graph showing relationships between frequencies and the noise figures of the LNA 1B according to the embodiment.

In each graph (b) of FIGS. 34 to 45, the horizontal axis indicates frequencies (unit: GHz) and the vertical axis indicates noise figures (unit: dB).

In the context of the present embodiment, the first frequency band refers to the frequency band ranging from 859 MHz to 960 MHz, the second frequency band refers to the frequency band ranging from 717 MHz to 821 MHz, and the third frequency band refers to the frequency band ranging from 617 MHz to 652 MHz.

In these simulations, the voltage VDDLNA supplied to the LNA 1B according to the embodiment was set to 1.2V.

Figure 34:
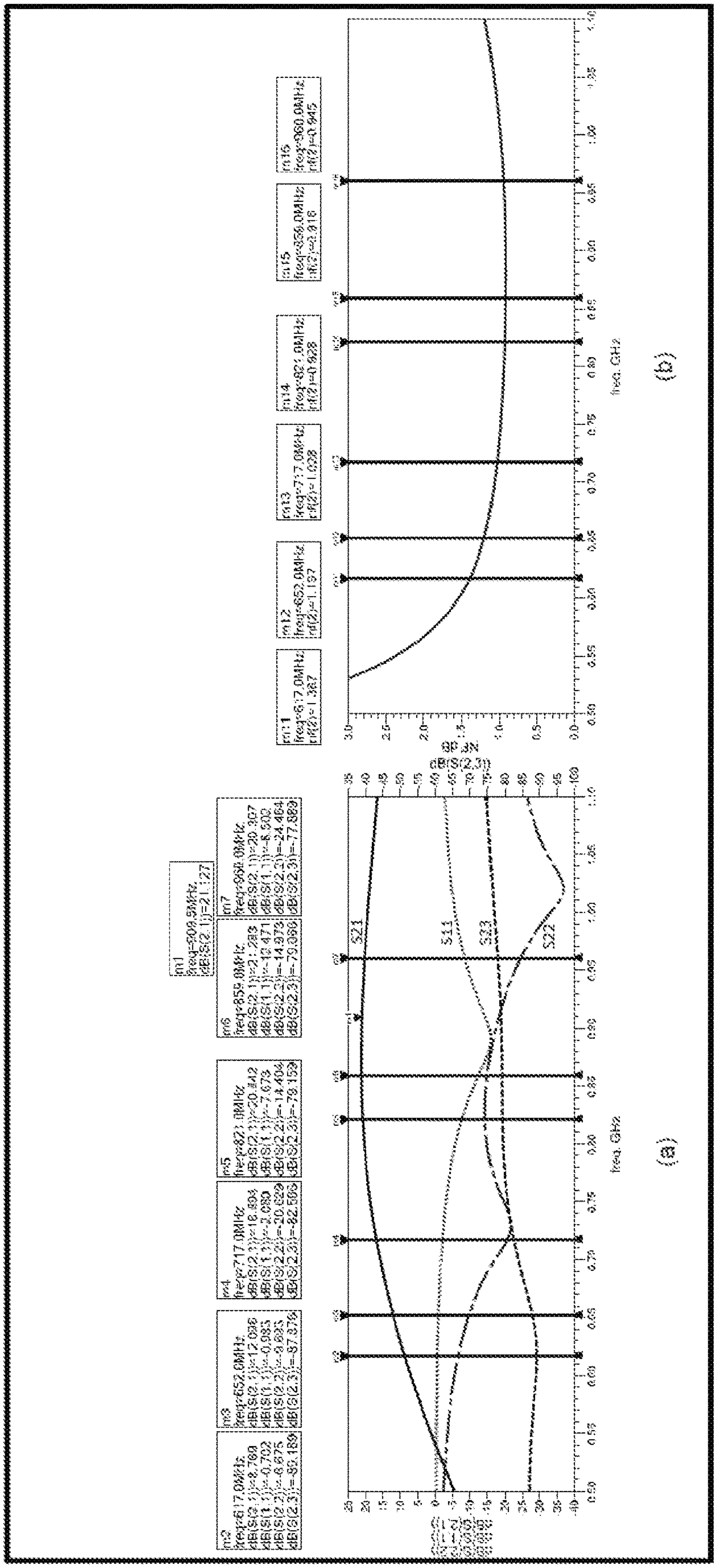

FIG. 34 is for the small-signal characteristics of the LNA 1B according to the embodiment, given in the combination of the amplification mode and the single output mode with the first frequency band.

As shown in (a) of FIG. 34, the band center gain (S21) with the frequency band from "m6" (859 MHz) to "m7" (960 MHz) is 21.127 dB. The return losses (S11) are −8.502 dB or less. The return losses (S22) are −14.973 dB or less. The parameter S23 values are −77.889 dB or less.

As shown in (b) of FIG. 34, the noise figures with the frequency band from "m15" (859 MHz) to "m16" (960 MHz) take values within the range from 0.916 dB to 0.945 dB.

Figure 35:
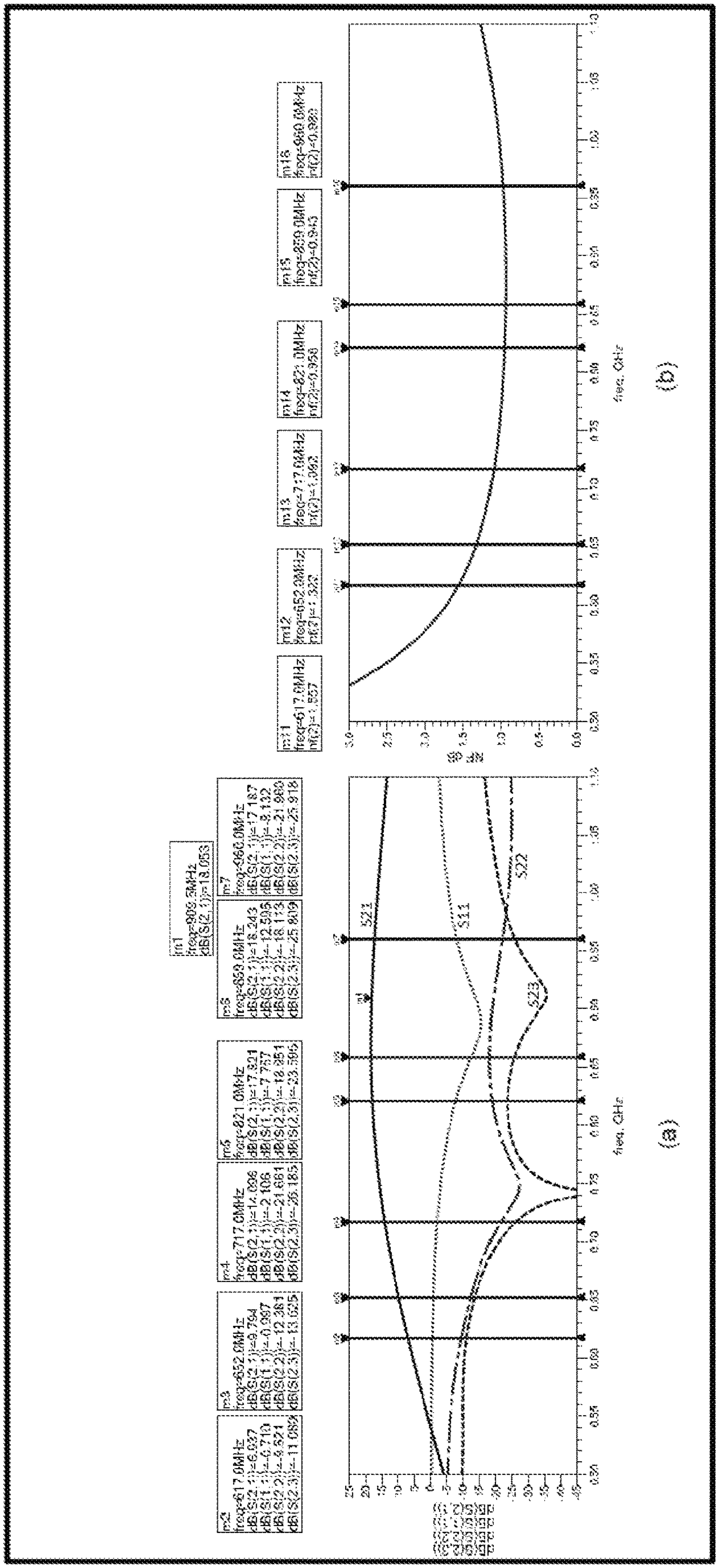

FIG. 35 is for the small-signal characteristics of the LNA 1B according to the embodiment, given in the combination of the amplification mode and the split output mode with the first frequency band.

As shown in (a) of FIG. 35, the band center gain (S21) with the frequency band from "m6" (859 MHz) to "m7" (960 MHz) is 18.053 dB. The return losses (S11) are −8.132 dB or less. The return losses (S22) are 18.113 dB or less. The parameter S23 values are −25.918 dB or less.

As shown in (b) of FIG. 35, the noise figures with the frequency band from "m15" (859 MHz) to "m16" (960 MHz) take values within the range from 0.943 dB to 0.980 dB.

Figure 36:
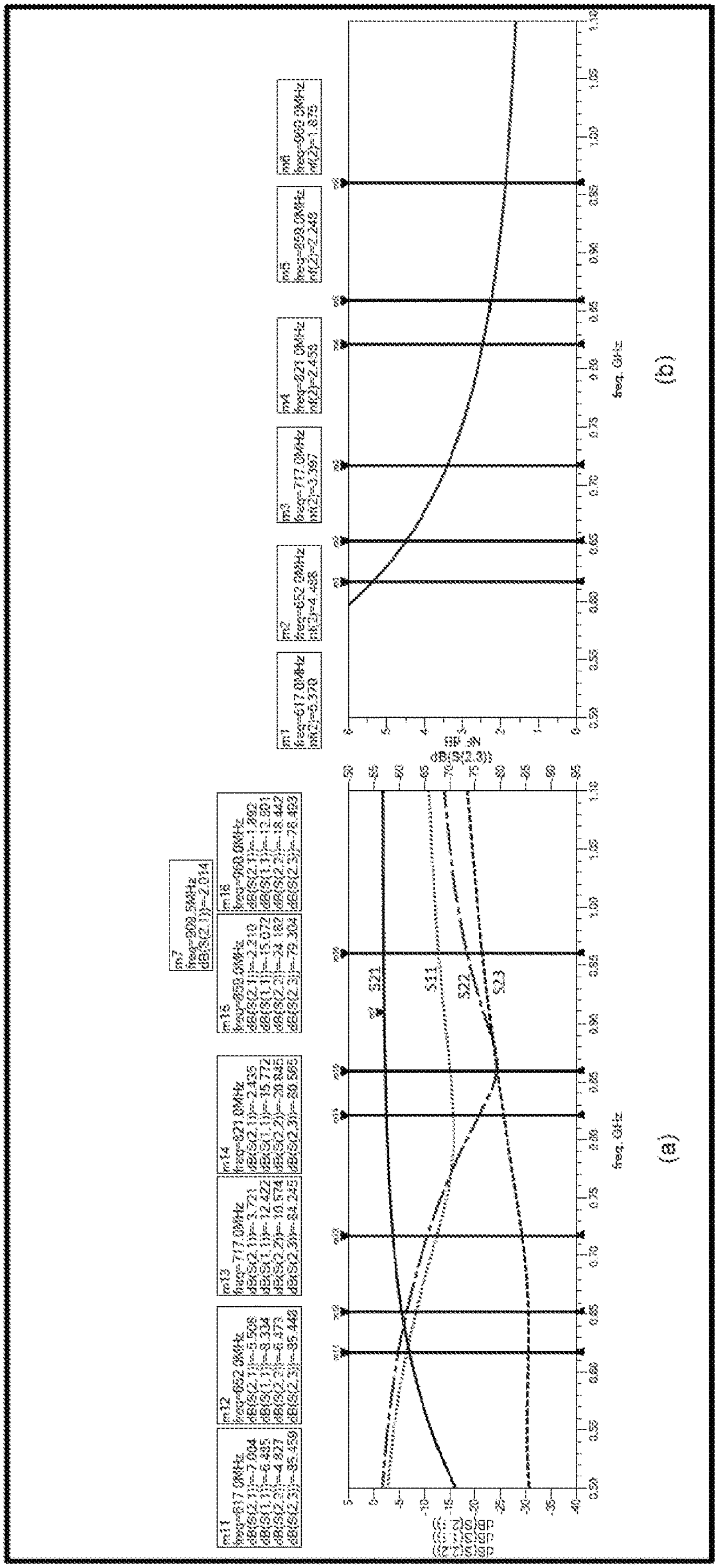

FIG. 36 is for the small-signal characteristics of the LNA 1B according to the embodiment, given in the combination of the bypass mode and the single output mode with the first frequency band.

As shown in (a) of FIG. 36, the band center gain (S21) with the frequency band from "m15" (859 MHz) to "m16" (960 MHz) is −2.014 dB. The return losses (S11) are −12.801 dB or less. The return losses (S22) are −18.442 dB or less. The parameter S23 values are −76.493 dB or less.

As shown in (b) of FIG. 36, the noise figures with the frequency band from "m5" (859 MHz) to "m6" (960 MHz) take values within the range from 2.248 dB to 1.875 dB.

Figure 37:
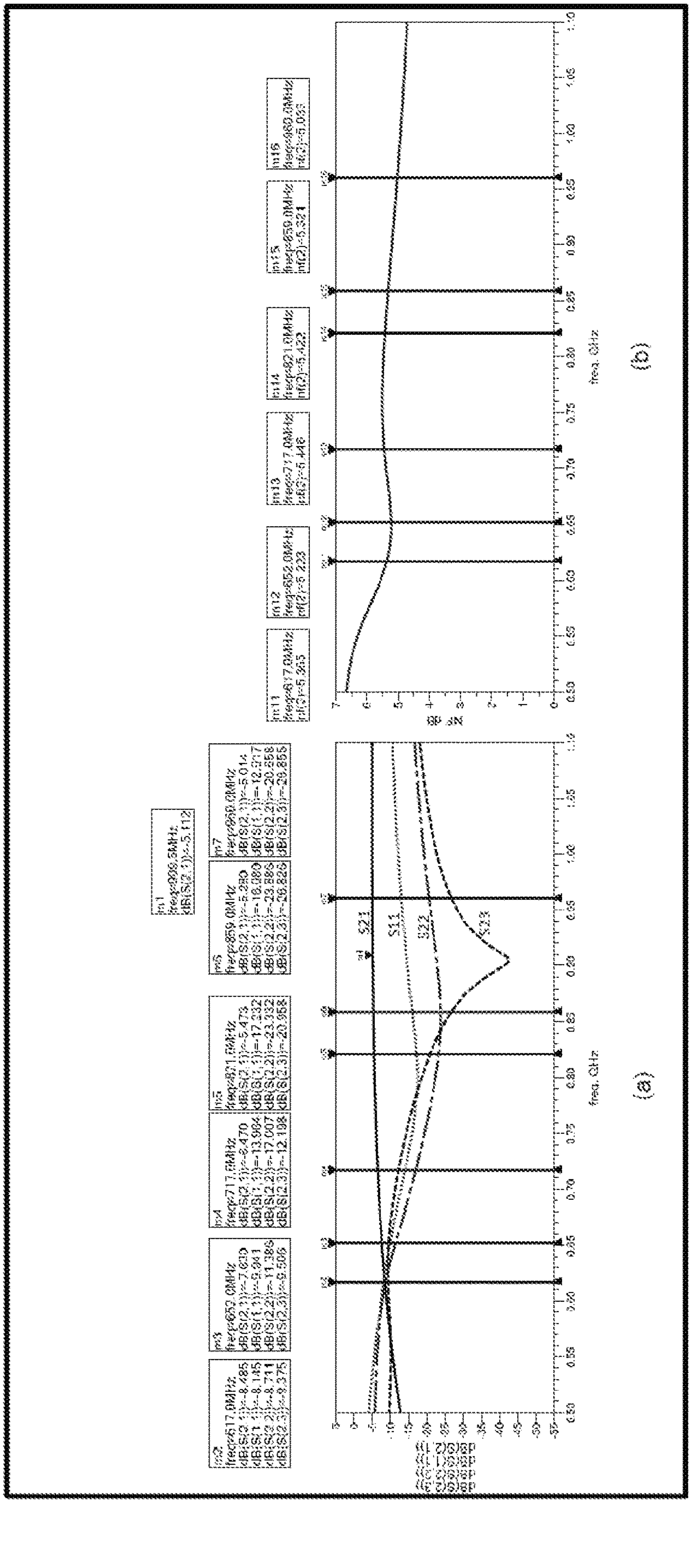

FIG. 37 is for the small-signal characteristics of the LNA 1B according to the embodiment, given in the combination of the bypass mode and the split output mode with the first frequency band.

As shown in (a) of FIG. 37, the band center gain (S21) with the frequency band from "m6" (859 MHz) to "m7" (960 MHz) is −5.112 dB. The return losses (S11) are −12.917 dB or less. Also, the return losses (S22) are −20.658 dB or less. The parameter S23 values are −26.826 dB or less.

As shown in (b) of FIG. 37, the noise figures with the frequency band from "m15" (859 MHz) to "m16" (960 MHz) take values within the range from 5.321 dB to 5.033 dB.

Figure 38:
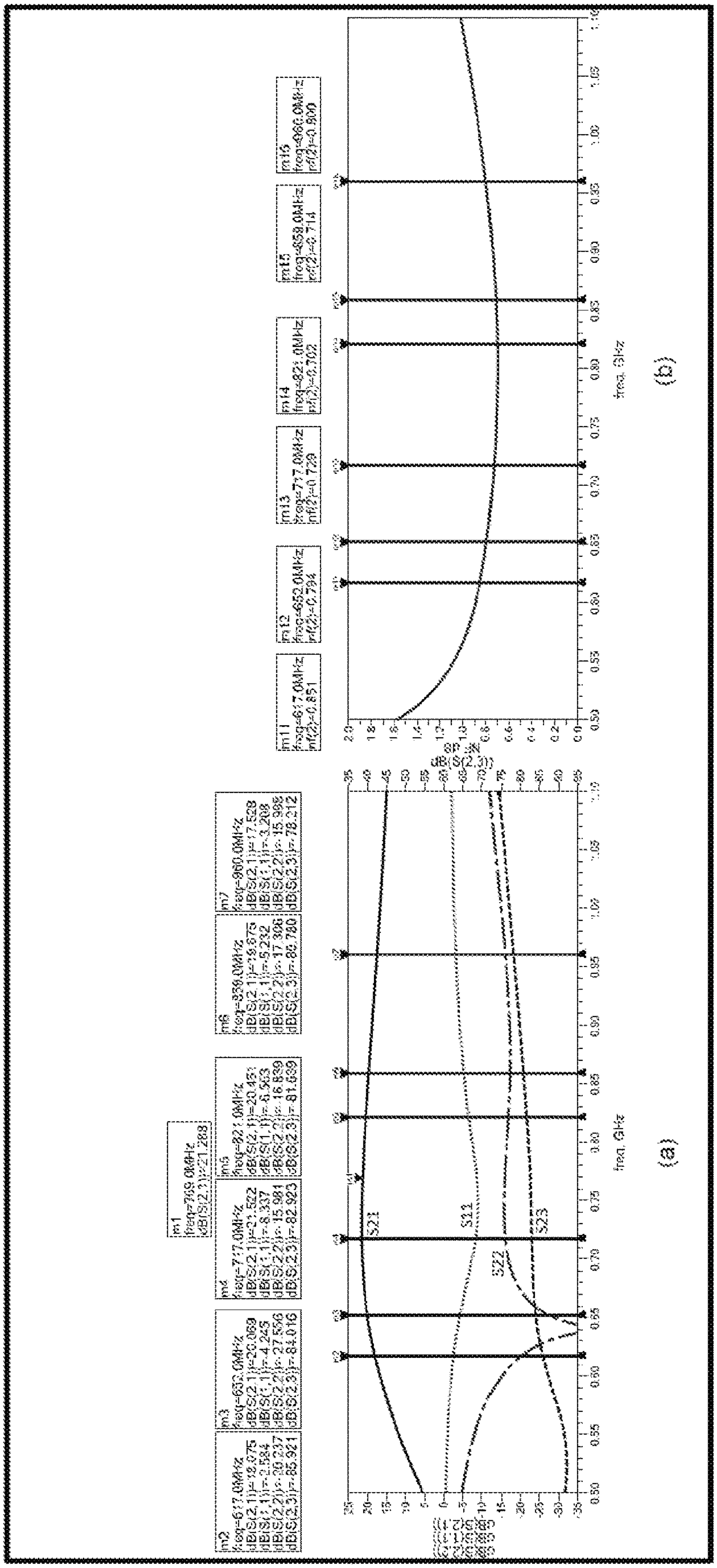

FIG. 38 is for the small-signal characteristics of the LNA 1B according to the embodiment, given in the combination of the amplification mode and the single output mode with the second frequency band.

As shown in (a) of FIG. 38, the band center gain (S21) with the frequency band from "m4" (717 MHz) to "m5" (821 MHz) is 21.288 dB. The return losses (S11) are −6.563 dB or less. The return losses (S22) are −15.981 dB or less. The parameter S23 values are −81.639 dB or less.

As shown in (b) of FIG. 38, the noise figures with the frequency band from "m13" (717 MHz) to "m14" (821 MHz) take values within the range from 0.729 dB to 0.702 dB.

Figure 39:
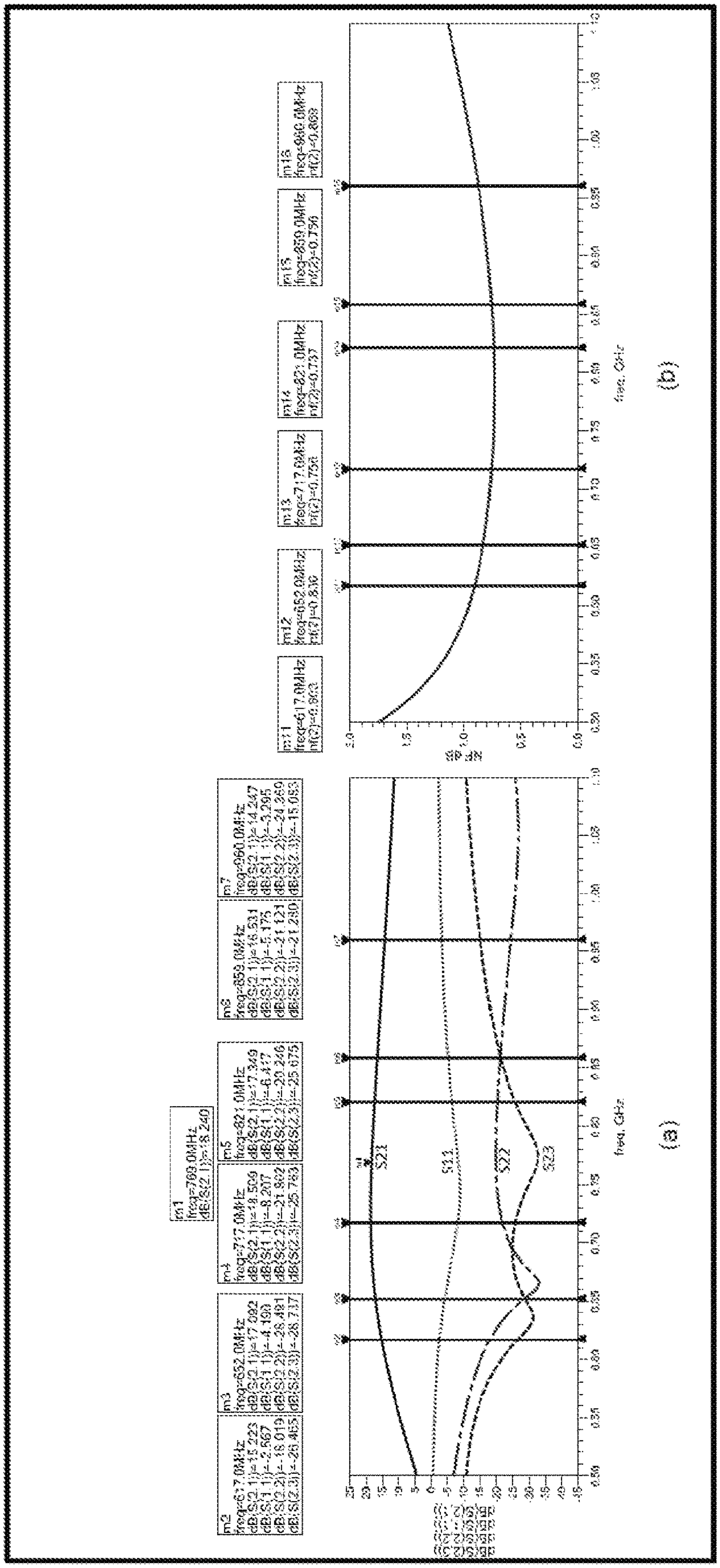

FIG. 39 is for the small-signal characteristics of the LNA 1B according to the embodiment, given in the combination of the amplification mode and the split output mode with the second frequency band.

As shown in (a) of FIG. 39, the band center gain (S21) with the frequency band from "m4" (717 MHz) to "m5" (821 MHz) is 18.240 dB. The return losses (S11) are −6.417 dB or less. The return losses (S22) are −20.242 dB or less. The parameter S23 values are −25.675 dB or less.

As shown in (b) of FIG. 39, the noise figures with the frequency band from "m13" (717 MHz) to "m14" (821 MHz) take values within the range from 0.756 dB to 0.739 dB.

Figure 40:
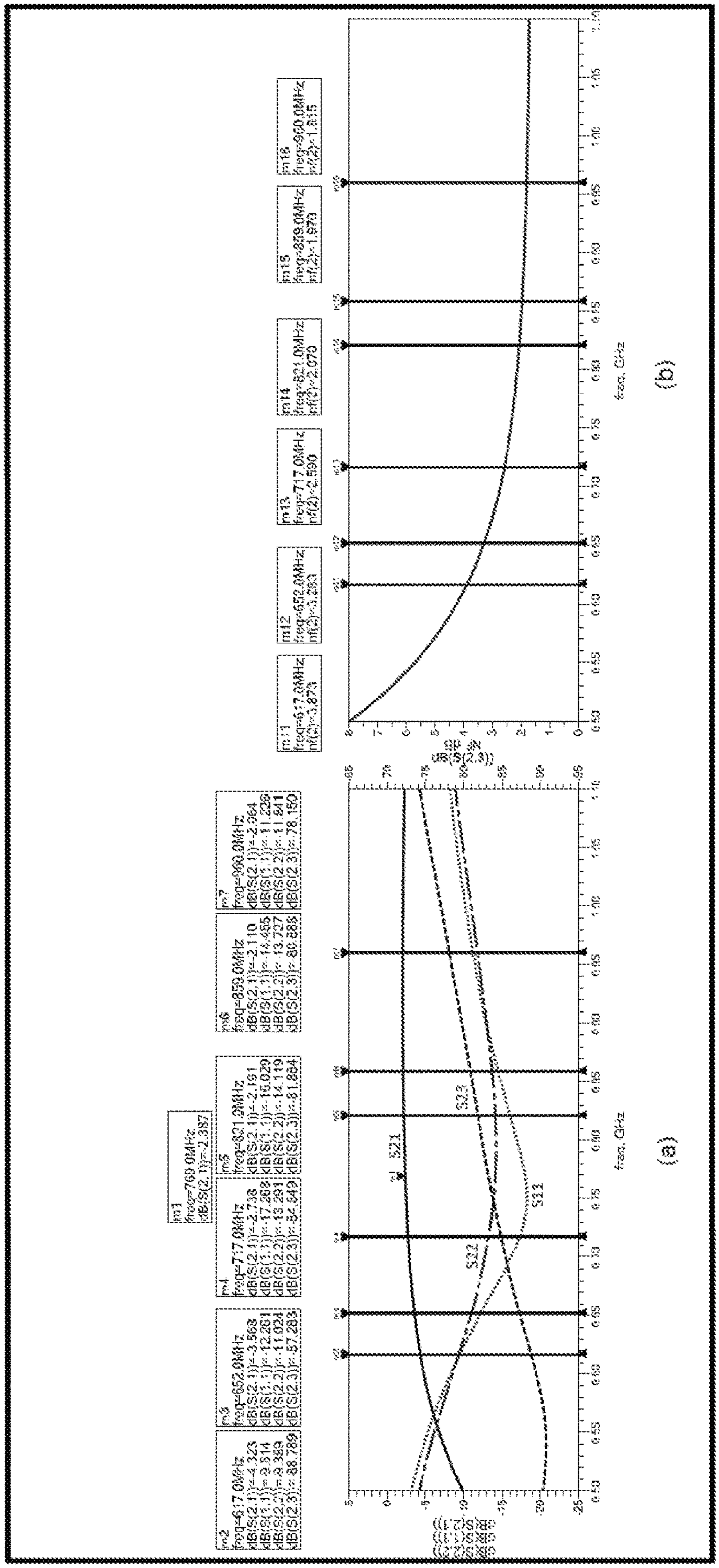

FIG. 40 is for the small-signal characteristics of the LNA 1B according to the embodiment, given in the combination of the bypass mode and the single output mode with the second frequency band.

As shown in (a) of FIG. 40, the band center gain (S21) with the frequency band from "m4" (717 MHz) to "m5" (821 MHz) is −2.387 dB. The return losses (S11) are −16.029 dB or less. The return losses (S22) are −13.291 dB or less. The parameter S23 values are −81.884 dB or less.

As shown in (b) of FIG. 40, the noise figures with the frequency band from "m13" (717 MHz) to "m14" (821 MHz) take values within the range from 2.590 dB to 2.070 dB.

Figure 41:
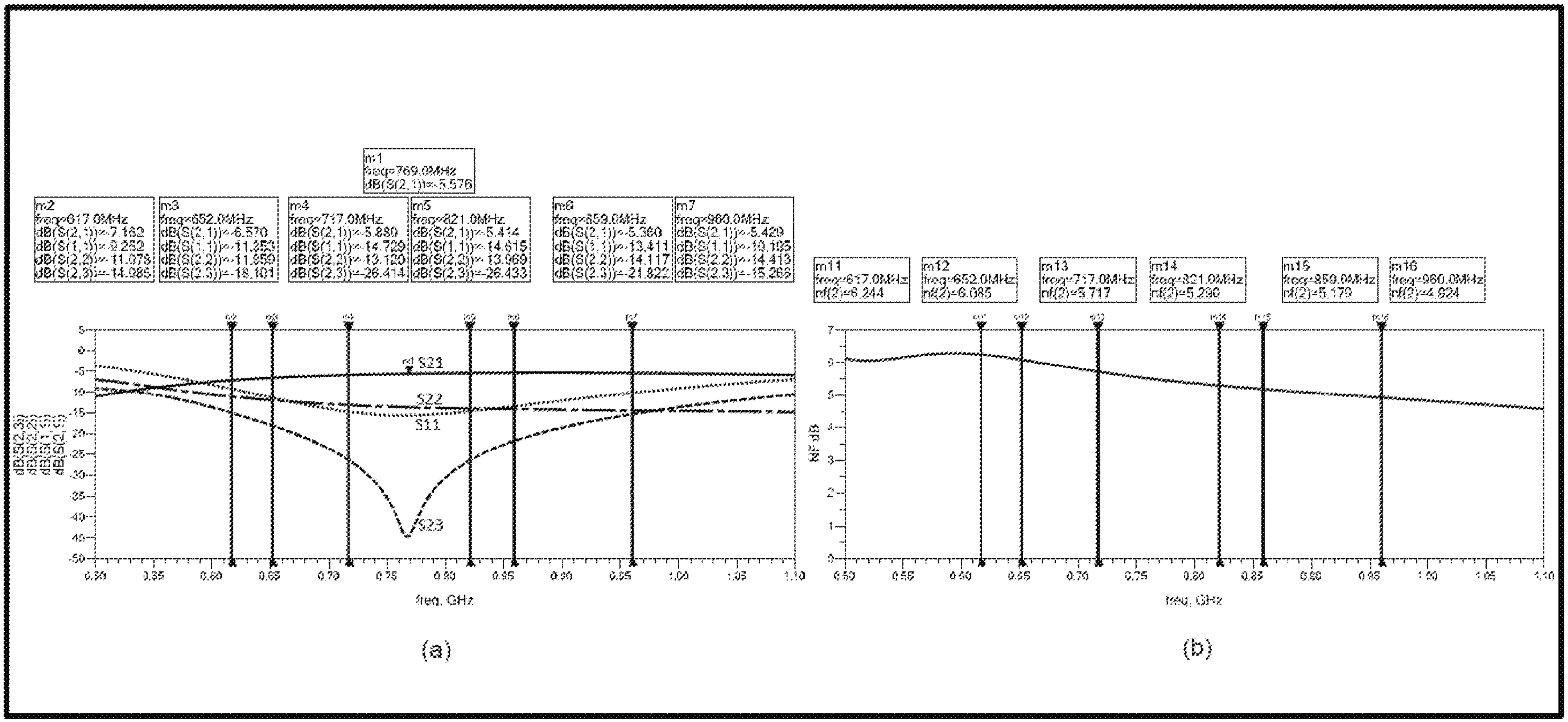

FIG. 41 is for the small-signal characteristics of the LNA 1B according to the embodiment, given in the combination of the bypass mode and the split output mode with the second frequency band.

As shown in (a) of FIG. 41, the band center gain (S21) with the frequency band from "m4" (717 MHz) to "m5" (821 MHz) is −5.576 dB. The return losses (S11) are −14.615 dB or less. The return losses (S22) are −13.12 dB or less. The parameter S23 values are −26.414 dB or less.

As shown in (b) of FIG. 41, the noise figures with the frequency band from "m13" (717 MHz) to "m14" (821 MHz) take values within the range from 5.717 dB to 5.290 dB.

Figure 42:
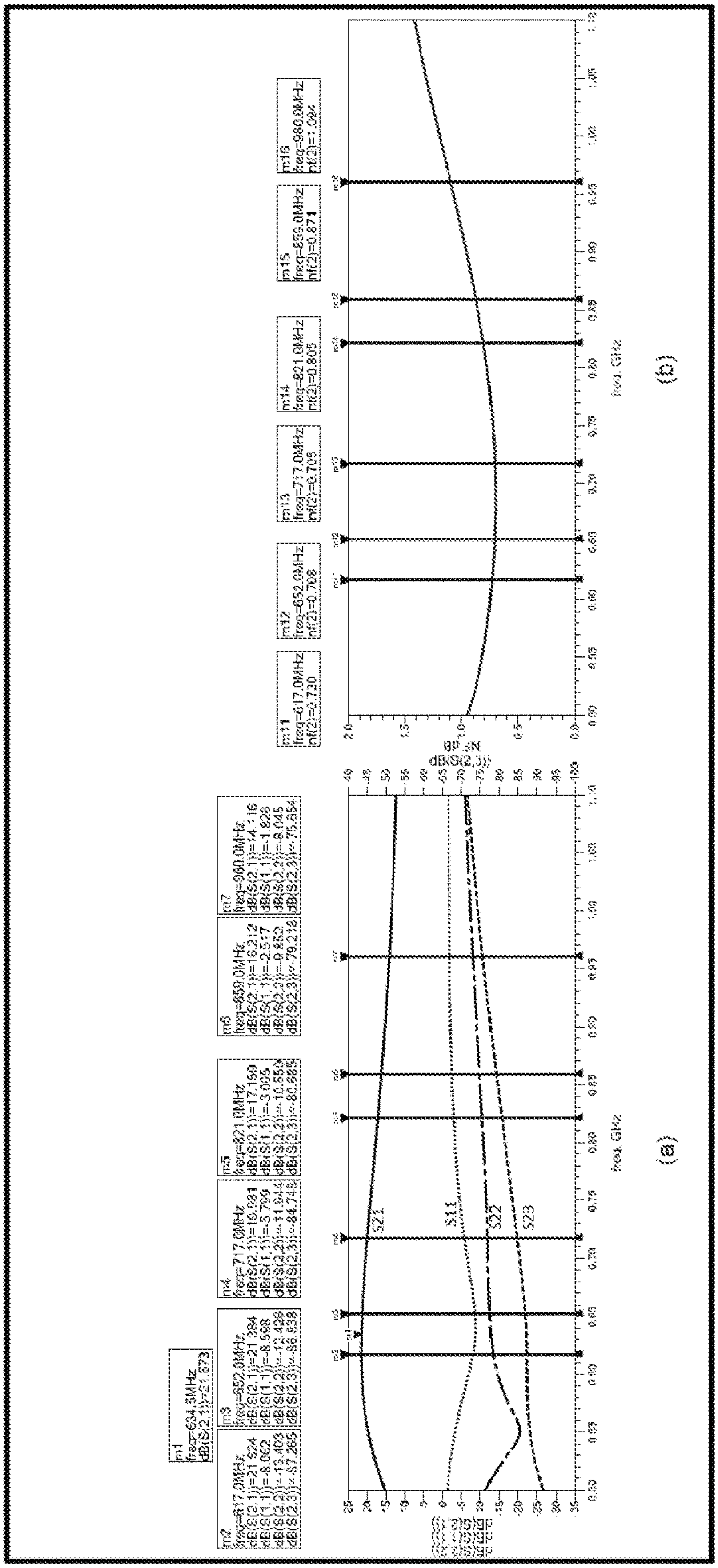

FIG. 42 is for the small-signal characteristics of the LNA 1B according to the embodiment, given in the combination of the amplification mode and the single output mode with the third frequency band.

As shown in (a) of FIG. 42, the band center gain (S21) with the frequency band from "m2" (617 MHz) to "m3" (652 MHz) is 21.573 dB. The return losses (S11) are −8.062 dB or less. The return losses (S22) are −12.426 dB or less. The parameter S23 values are −86.838 dB or less.

As shown in (b) of FIG. 42, the noise figures with the frequency band from "m11" (617 MHz) to "m12" (652 MHz) take values within the range from 0.730 dB to 0.708 dB.

Figure 43:
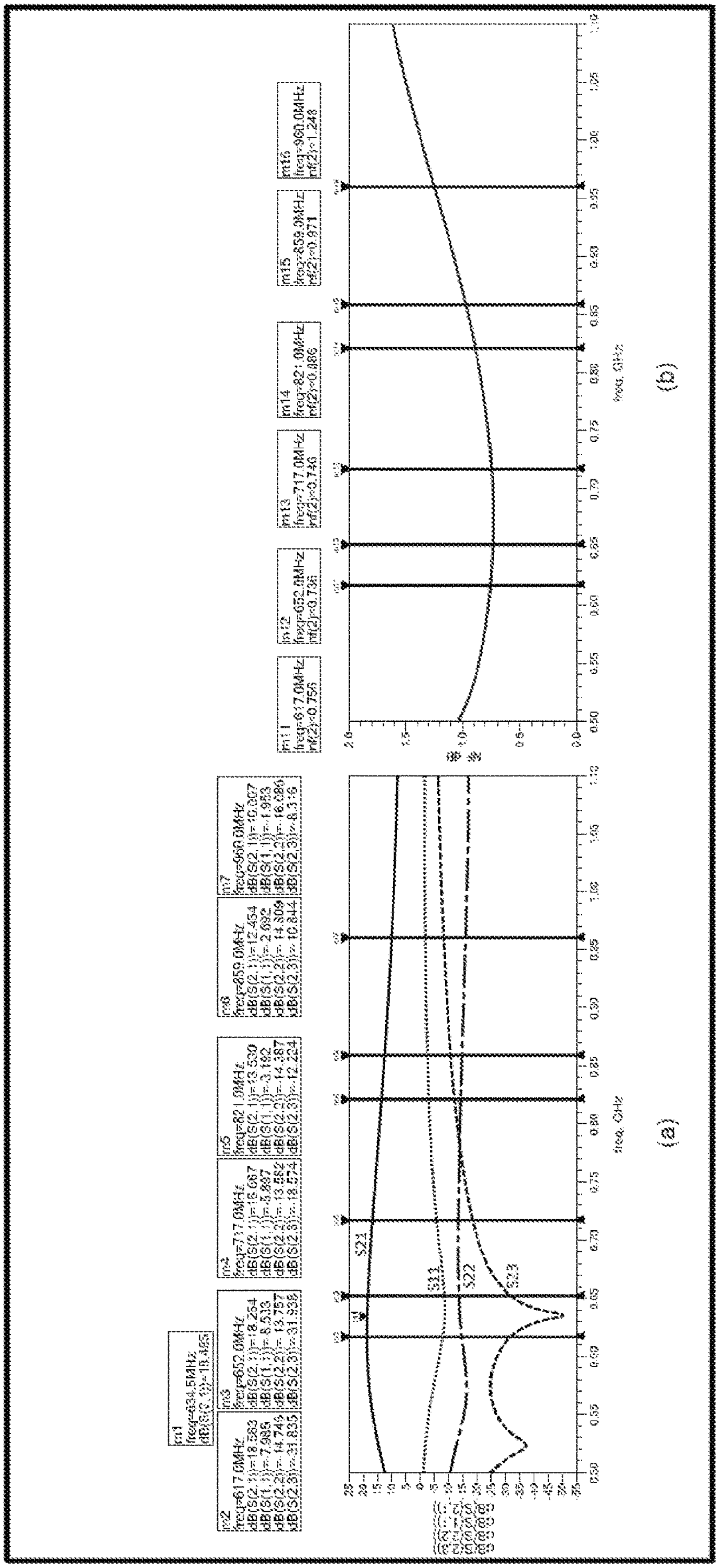

FIG. 43 is for the small-signal characteristics of the LNA 1B according to the embodiment, given in the combination of the amplification mode and the split output mode with the third frequency band.

As shown in FIG. 43(*a*), the band center gain (S21) with the frequency band from "m2" (617 MHz) to "m3" (652 MHz) is 18.485 dB. The return losses (S11) are −7.985 dB or less. The return losses (S22) are −13.757 dB or less. The parameter S23 values are −31.835 dB or less.

As shown in FIG. 43(*b*), the noise figures with the frequency band from "m11" (617 MHz) to "m12" (652 MHz) take values within the range from 0.756 dB to 0.736 dB.

Figure 44:
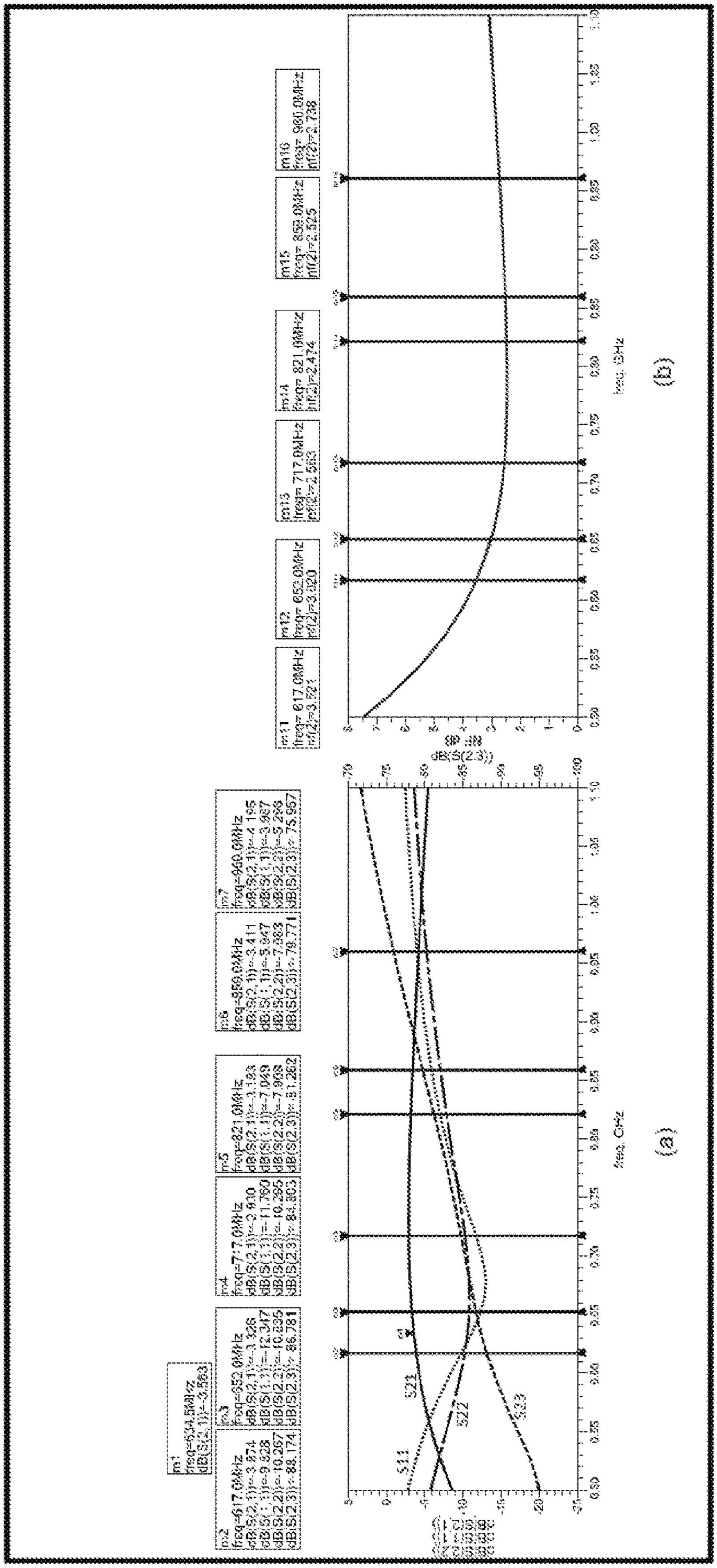

FIG. 44 is for the small-signal characteristics of the LNA 1B according to the embodiment, given in the combination of the bypass mode and the single output mode with the third frequency band.

As shown in (a) of FIG. 44, the band center gain (S21) with the frequency band from "m2" (617 MHz) to "m3" (652 MHz) is −3.563 dB. The return losses (S11) are −9.828 dB or less. The return losses (S22) are −10.267 dB or less. The parameter S23 values are −86.781 dB or less.

As shown in (b) of FIG. 44, the noise figures with the frequency band from "m11" (617 MHz) to "m12" (652 MHz) take values within the range from 3.521 dB to 3.020 dB.

Figure 45:
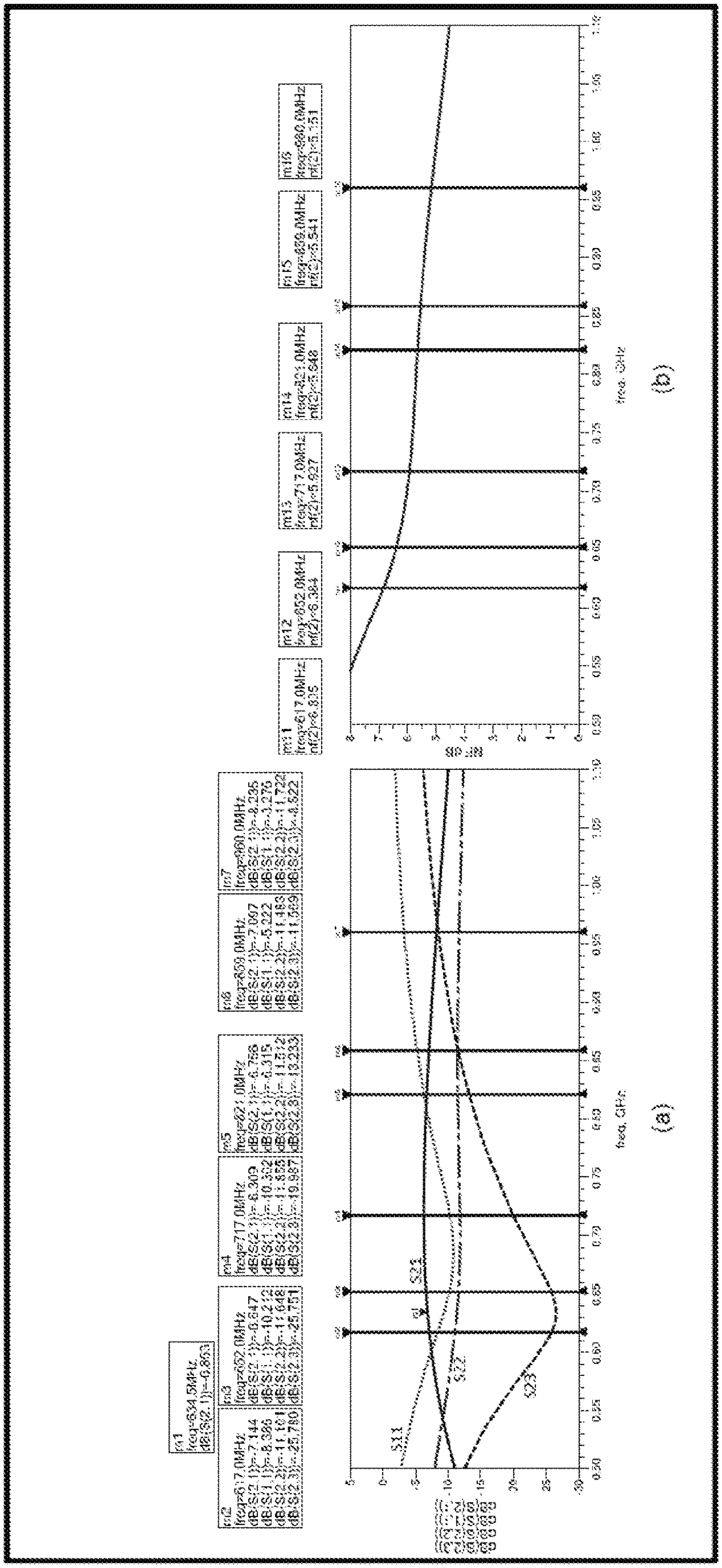

FIG. 45 is for the small-signal characteristics of the LNA 1B according to the embodiment, given in the combination of the bypass mode and the split output mode with the third frequency band.

As shown in (a) of FIG. 45, the band center gain (S21) with the frequency band from "m2" (617 MHz) to "m3" (652 MHz) is −6.863 dB. The return losses (S11) are −8.386 dB or less. The return losses (S22) are −11.101 dB or less. The parameter S23 values are −25.751 dB or less.

As shown in (b) of FIG. 45, the noise figures with the frequency band from "m11" (617 MHz) to "m12" (652 MHz) take values within the range from 6.835 dB to 6.384 dB.

It is understood from FIGS. 34 to 45 that the S parameters and the noise figures each show a profile according to the frequencies of the supplied radio-frequency signals and the operational mode of the LNA 1B.

FIG. 46 lists the simulation results based on FIGS. 34 to 45.

In FIG. 46, the values at the band center are noted for the S parameter "S21". For each of the S parameters "S11", "S22", and "S23" and the noise figure, the worst values within the respective band are noted.

In addition, FIG. 46 mentions the bias current IddLNA for the amplification mode, in the LNA 1B according to the embodiment.

As described with reference to FIGS. 34 to 46, the LNA 1B according to the embodiment allows for substantially the same characteristics as in the foregoing embodiments.

That is, the LNA 1B according to this third embodiment can provide improved characteristics while realizing various modes for operation.

(4) Fourth Embodiment

An LNA according to the fourth embodiment will be described with reference to FIGS. 47 to 55.

(4a) Exemplary Configuration

Figure 47:
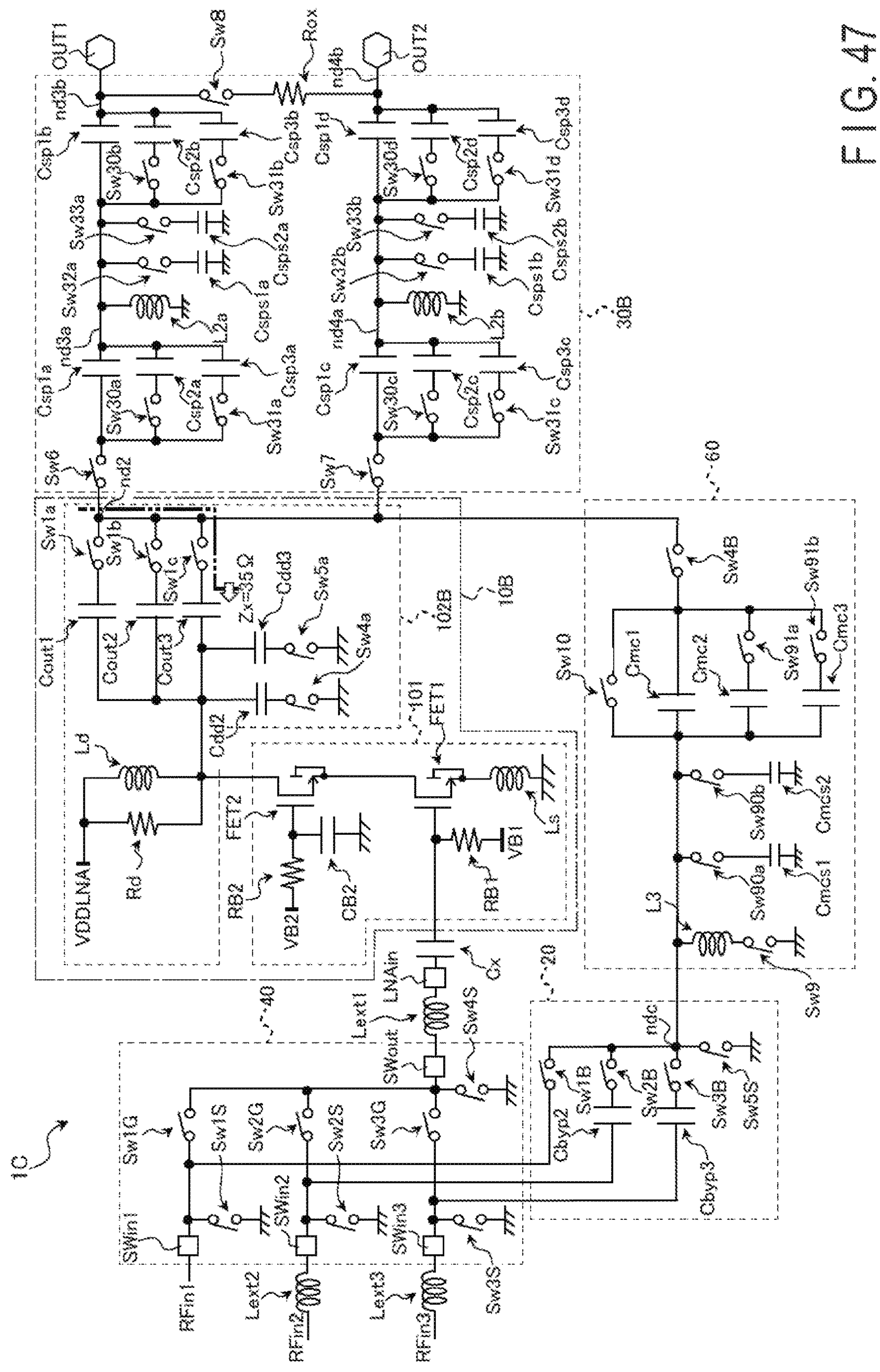
FIG. 47 is a circuit diagram showing an exemplary configuration of an LNA according to a fourth embodiment.

FIG. 47 is a circuit diagram showing an exemplary configuration of an LNA 1C according to the embodiment.

In the present embodiment, the band select circuit 40 and the bypass circuit 20 each have a configuration substantially the same as the configuration explained for the third embodiment (FIG. 28). Thus, for this embodiment, the description of the band select circuit 40 and the bypass circuit 20 will basically be omitted.

Note that the amplifier circuit 10B in this embodiment differs from the amplifier circuit 10B in the third embodiment (FIG. 28) in output impedance of the output matching circuit 102B, while bearing a resemblance in structure.

The third embodiment has assumed the absolute value of the output impedance of the output matching circuit 102B to be generally set to approximately 50Ω. According to this fourth embodiment, the absolute value of the output impedance of the output matching circuit 102B is set to a value smaller than 50Ω, for example, to approximately 35Ω.

As shown in FIG. 47, the LNA 1C according to the embodiment further includes an impedance converter circuit 60.

<Impedance Converter Circuit>

The impedance converter circuit 60 is disposed on the signal communication path from the bypass circuit 20 to the splitter circuit 30B.

The impedance converter circuit 60 is connected between the node ndc of the bypass circuit 20 and the output node nd2 of the amplifier circuit 10B (i.e., the input node of the splitter circuit 30B).

For example, the impedance converter circuit 60 is arranged between the node ndc and the switch Sw4B.

The impedance converter circuit 60 includes an inductor L3, multiple capacitors Cmcs1, Cmcs2, Cmc1, Cmc2, and Cmc3, and multiple switches Sw9, Sw10, Sw90*a*, Sw90*b*, Sw91*a*, Sw91*b*, and Sw4B.

One terminal of the inductor L3 is connected to the node ndc. The other terminal of the inductor L3 is connected to one terminal of the switch Sw9. The other terminal of the switch Sw9 is connected to the ground terminal.

One terminal of the switch Sw90*a* is connected to the node ndc. The other terminal of the switch Sw90*a* is connected to one terminal of the capacitor Cmcs1. The other terminal of the capacitor Cmcs1 is connected to the ground terminal.

The capacitor Cmcs1 is connected in parallel with the inductor L3 between the node ndc and the ground terminal.

One terminal of the switch Sw90*b* is connected to the node ndc. The other terminal of the switch Sw90*b* is connected to one terminal of the capacitor Cmcs2. The other terminal of the capacitor Cmcs2 is connected to the ground terminal.

The capacitor Cmcs2 is connected in parallel with the inductor L3 between the node ndc and the ground terminal.

The two capacitors Cmcs1 and Cmcs2 are themselves connected in parallel with each other between the node ndc and the ground terminal.

With the on/off control of the switches Sw90*a* and Sw90*b*, the capacitors Cmcs1 and Cmcs2 are set in the effective or ineffective state according to the frequency band of signals transmitted from the bypass circuit 20 to the splitter circuit 30B.

Note that, instead of the multiple capacitors Cmcs (Cmcs1 and Cmcs2), there may be only a single capacitor Cmcs connected in parallel with the inductor L3 between the node nds and the ground terminal. Such a design may include only a single switch for the single capacitor.

One terminal of the switch Sw10 is connected to the node ndc. The other terminal of the switch Sw10 is connected to one terminal of the switch Sw4B. The other terminal of the switch Sw4B is connected to the node nd2.

Between the node ndc and the one terminal of the switch Sw4B, the multiple capacitors Cmc1, Cmc2, and Cmc3 are each connected in parallel with the signal path of the switch Sw10.

One terminal of the capacitor Cmc1 is connected to the node ndc. The other terminal of the capacitor Cmc1 is connected to the one terminal of the switch Sw4B.

One terminal of the capacitor Cmc2 is connected to the node ndc. The other terminal of the capacitor Cmc2 is connected to one terminal of the switch Sw91*a*. The other terminal of the switch Sw91*a* is connected to the one terminal of the switch Sw4B.

One terminal of the capacitor Cmc3 is connected to the node ndc. The other terminal of the capacitor Cmc3 is connected to one terminal of the switch Sw91*b*. The other terminal of the switch Sw91*b* is connected to the one terminal of the switch Sw4B.

As such, the impedance converter circuit 60 includes more than one signal path that can be subjected to electrical separation and connection by the corresponding switch Sw91*a* or Sw91*b*, so as to handle the frequency band for reception.

With the on/off control of the switches Sw91*a* and Sw91*b*, the capacitors Cmc2 and Cmc3 are set in the effective or ineffective state according to the frequency band of signals transmitted from the bypass circuit 20 to the splitter circuit 30B.

The impedance converter circuit 60 functions as an impedance converter capable of switching handing frequencies.

The impedance converter circuit 60 is adapted to change the value Zx (for example, the output impedance of the impedance converter circuit 60) of its in-band impedance viewed from the node nd2 (i.e., from the side of the splitter circuit 30B) from a first impedance value Z0 (absolute value) to a second impedance value Z1 (absolute value). The second impedance value Z1 is smaller than the first impedance value Z0.

The first impedance value Z0 (absolute value) is generally set to 50Ω. Accordingly, the second impedance value Z1 (absolute value) is set to, for example, approximately 35Ω.

This will set the in-band impedance of the impedance converter circuit 60, viewed from the node nd2 (i.e., from the side of the splitter circuit 30B), to approximately 35Ω (absolute value).

In exemplary instances, the in-band impedance of the impedance converter circuit 60 viewed from the bypass circuit 20 (e.g., the input impedance) has a value (absolute value) larger than the second impedance value Z1 (e.g., 35Ω).

The impedance converter circuit 60 is set in the effective state under the combination of the bypass mode and the split output mode of the LNA 1C.

In exemplary implementations, the switches Sw9, Sw10, Sw90*a*, Sw90*b*, Sw91*a*, Sw91*b*, and Sw4B may be on/off-controlled by an RFIC circuit, or by the control circuit 990 (or the RFIC 940).

<Splitter Circuit>

The splitter circuit 30B includes multiple inductors L2*a* and L2*b*, multiple capacitors Csp1, Csp2, Csps1, Csps2, etc., a resistor Rox, and multiple switches Sw6, Sw7, Sw8, etc.

The splitter circuit 30B is connected to the output node nd2 of the amplifier circuit 10B via the switches Sw6 and Sw7.

The switch Sw6 is disposed between the first output terminal OUT1 and the node nd2.

One terminal of the switch Sw6 is connected to the node nd2. The other terminal of the switch Sw6 is connected to the node nd3*a* (connection node) via the capacitor Csp1*a*.

One terminal of the capacitor Csp1*a* is thus connected to the other terminal of the switch Sw6. The other terminal of the capacitor Csp1*a* is connected to the node nd3*a*.

Between the other terminal of the switch Sw6 and the node nd3*a*, the multiple capacitors Csp2*a* and Csp3*a* are connected in parallel with the capacitor Csp1*a*.

One terminal of the capacitor Csp2*a* is connected to the one terminal of the capacitor Csp1*a* via the switch Sw30*a*. The other terminal of the capacitor Csp2*a* is connected to the node nd3*a*. One terminal of the switch Sw30*a* is connected to the one terminal of the capacitor Csp1*a*. The other terminal of the switch Sw30*a* is connected to the one terminal of the capacitor Csp2*a*. The serially-connected switch Sw30*a* and capacitor Csp2*a* form a serial connection circuit.

One terminal of the capacitor Csp3*a* is connected to the one terminal of the capacitor Csp1*a* via the switch Sw31*a*. The other terminal of the capacitor Csp3*a* is connected to the node nd3*a*. One terminal of the switch Sw31*a* is connected to the one terminal of the capacitor Csp1*a*. The other terminal of the switch Sw31*a* is connected to the one terminal of the capacitor Csp3*a*. The serially-connected switch Sw31*a* and capacitor Csp3*a* form a serial connection circuit.

A set of the multiple capacitors Csp1*a*, Csp2*a*, and Csp3*a* connected in parallel together forms a variable capacitive circuit (variable capacitor). With the on/off control of the switches Sw30*a* and Sw31*a*, the capacitance value of the variable capacitive circuit including the capacitors Csp1*a*, Csp2*a*, and Csp3*a* varies.

The capacitor Csp1*b* is connected to the capacitor Csp1*a* via the node nd3*a*. One terminal of the capacitor Csp1*b* is connected to the node nd3*a*. The other terminal of the capacitor Csp1*b* is connected to the node nd3*b* (the output terminal OUT1).

Between the nodes nd3*a* and nd3*b*, the multiple capacitors Csp2*b* and Csp3*b* are connected in parallel with the capacitor Csp1*b*.

One terminal of the capacitor Csp2*b* is connected to the node nd3*a* via the switch Sw30*b*. The other terminal of the capacitor Csp2*b* is connected to the node nd3*b* (the output terminal OUT1). One terminal of the switch Sw30*b* is connected to the node nd3*a*. The other terminal of the switch Sw30*b* is connected to the one terminal of the capacitor Csp2*b*.

One terminal of the capacitor Csp3*b* is connected to the node nd3*a* via the switch Sw31*b*. The other terminal of the capacitor Csp3*b* is connected to the node nd3*b* (the output terminal OUT1). One terminal of the switch Sw31*b* is connected to the node nd3*a*. The other terminal of the switch Sw31*b* is connected to the one terminal of the capacitor Csp3*b*.

A set of the multiple capacitors Csp1*b*, Csp2*b*, and Csp3*b* connected in parallel together forms a variable capacitive circuit (variable capacitor). With the on/off control of the switches Sw30*b* and Sw31*b*, the capacitance value of the variable capacitive circuit including the capacitors Csp1*b*, Csp2*b*, and Csp3*b* varies.

The inductor L2*a* and the capacitors Csps1*a* and Csps2*a* are connected to the node nd3*a*.

One terminal of the inductor L2*a* is connected to the node nd3*a*. The other terminal of the inductor L2*a* is connected to the ground terminal. The inductor L2*a* functions as a parallel inductor disposed between the node nd3*a* and the ground terminal.

One terminal of the capacitor Csps1*a* is connected to the node nd3*a* via the switch Sw32*a*. The other terminal of the capacitor Csps1*a* is connected to the ground terminal. One terminal of the switch Sw32*a* is connected to the node nd3*a*. The other terminal of the switch Sw32*a* is connected to the one terminal of the capacitor Csps1*a*.

One terminal of the capacitor Csps2*a* is connected to the node nd3*a* via the switch Sw33*a*. The other terminal of the capacitor Csps2*a* is connected to the ground terminal. One terminal of the switch Sw33*a* is connected to the node nd3*a*. The other terminal of the switch Sw33*a* is connected to the one terminal of the capacitor Csps2*a*.

As such, there are multiple passive elements connected on the signal communication path extending between the amplifier circuit 10B and the output terminal OUT1 via the switch Sw6.

The switch Sw7 is disposed between the second output terminal OUT2 and the node nd2.

One terminal of the switch Sw7 is connected to the node nd2. The other terminal of the switch Sw7 is connected to the node nd4*a* (connection node) via the capacitor Csp1*c*.

One terminal of the capacitor Csp1*c* is thus connected to the other terminal of the switch Sw7. The other terminal of the capacitor Csp1*c* is connected to the node nd4*a*.

Between the other terminal of the switch Sw7 and the node nd4*a*, the multiple capacitors Csp2*c* and Csp3*c* are connected in parallel with the capacitor Csp1*c*.

One terminal of the capacitor Csp2*c* is connected to the one terminal of the capacitor Csp1*c* via the switch Sw30*c*. The other terminal of the capacitor Csp2*c* is connected to the node nd4*a*. One terminal of the switch Sw30*c* is connected to the one terminal of the capacitor Csp1*c*. The other terminal of the switch Sw30*c* is connected to the one terminal of the capacitor Csp2*c*. The serially-connected switch Sw30*c* and capacitor Csp2*c* form a serial connection circuit.

One terminal of the capacitor Csp3*c* is connected to the one terminal of the capacitor Csp1*c* via the switch Sw31*c*. The other terminal of the capacitor Csp3*c* is connected to the node nd4*a*. One terminal of the switch Sw31*c* is connected to the one terminal of the capacitor Csp1*c*. The other terminal of the switch Sw31*c* is connected to the one terminal of the capacitor Csp3*c*. The serially-connected switch Sw31*c* and capacitor Csp3*c* form a serial connection circuit.

A set of the multiple capacitors Csp1*c*, Csp2*c*, and Csp3*c* connected in parallel together form a variable capacitive circuit (variable capacitor). With the on/off control of the switches Sw30*c* and Sw31*c*, the capacitance value of the variable capacitive circuit including the capacitors Csp1*c*, Csp2*c*, and Csp3*c* varies.

The capacitor Csp1*d* is connected to the capacitor Csp1*c* via the node nd4*a*. One terminal of the capacitor Csp1*d* is connected to the node nd4*a*. The other terminal of the capacitor Csp1*d* is connected to the node nd4*b* (the output terminal OUT2).

Between the nodes nd4*a* and nd4*b*, the multiple capacitors Csp2*d* and Csp3*d* are connected in parallel with the capacitor Csp1*d*.

One terminal of the capacitor Csp2*d* is connected to the node nd4*a* via the switch Sw30*d*. The other terminal of the capacitor Csp2*d* is connected to the node nd4*b* (the output terminal OUT2). One terminal of the switch Sw30*d* is connected to the node nd4*a*. The other terminal of the switch Sw30*d* is connected to the one terminal of the capacitor Csp2*d*.

One terminal of the capacitor Csp3*d* is connected to the node nd4*a* via the switch Sw31*d*. The other terminal of the capacitor Csp3*d* is connected to the node nd4*b* (the output terminal OUT2). One terminal of the switch Sw31*d* is connected to the node nd4*a*. The other terminal of the switch Sw31*d* is connected to the one terminal of the capacitor Csp3*d*.

A set of the multiple capacitors Csp1*d*, Csp2*d*, and Csp3*d* connected in parallel together forms a variable capacitive circuit (variable capacitor). With the on/off control of the switches Sw30*d* and Sw31*d*, the capacitance value of the variable capacitive circuit including the capacitors Csp1*d*, Csp2*d*, and Csp3*d* varies.

The inductor L2*b* and the capacitors Csps1*b* and Csps2*b* are connected to the node nd4*a*.

One terminal of the inductor L2*b* is connected to the node nd4*a*. The other terminal of the inductor L2*b* is connected to the ground terminal.

The inductor L2*b* functions as a parallel inductor disposed between the node nd4*a* and the ground terminal. The parallel inductor L2*a* and the parallel inductor L2*b* form a pair which may be called a parallel inductor pair.

One terminal of the capacitor Csps1*b* is connected to the node nd4*a* via the switch Sw32*b*. The other terminal of the capacitor Csps1*b* is connected to the ground terminal. One terminal of the switch Sw32*b* is connected to the node nd4*a*. The other terminal of the switch Sw32*b* is connected to the one terminal of the capacitor Csps1*b*.

One terminal of the capacitor Csps2*b* is connected to the node nd4*a* via the switch Sw33*b*. The other terminal of the capacitor Csps2*b* is connected to the ground terminal. One terminal of the switch Sw33*b* is connected to the node nd4*a*. The other terminal of the switch Sw33*b* is connected to the one terminal of the capacitor Csps2*b*.

As such, multiple passive elements are connected on the signal communication path extending between the amplifier circuit 10B and the output terminal OUT2 via the switch Sw7.

As described above, the splitter circuit 30B includes multiple variable capacitive circuits, and appropriately setting their capacitance values realizes processing capability that can cover wide frequency bands.

The resistor Rox and the switch Sw8 are disposed between the node nd3*b* (the output terminal OUT1) and the node nd4*b* (the output terminal OUT2).

One terminal of the switch Sw8 is connected to the node nd3*b*. The other terminal of the switch Sw8 is connected to one terminal of the resistor Rox. The other terminal of the resistor Rox is connected to the node nd4*b*.

The switch Sw8 turns on in the split output mode of the LNA 1C. This sets the resistor Rox in the effective state.

The switch Sw8 turns off in the single output mode of the LNA 1C. This sets the resistor Rox in the ineffective state.

In the single output mode, one of the two switches Sw6 and Sw7 connected to the node nd2 turns on.

The signals from the amplifier circuit 10B or the bypass circuit 20 are routed through the on-state one of the two switches Sw6 and Sw7 and sent to the subsequent circuitry component via the corresponding output terminal.

In exemplary implementations, the switches Sw6, Sw7, and Sw8 may be on/off-controlled by an RFIC circuit, or by the control circuit 990 (or the RFIC 940).

The splitter circuit 30B, through being subjected to the control for the effective/ineffective states of its passive elements, functions as a part of the impedance converter (impedance converter circuit).

According to the embodiment, for the LNA's split output mode, the absolute value of the input impedance of the splitter circuit 30B has been set to a value smaller than the general value 50Ω, for example, to approximately 35Ω. Therefore, the LNA 1C according to the embodiment can even improve the values of the S parameter "S23" in the split output mode, as compared to the third embodiment.

(4b) Exemplary Operations

Exemplary operations of the LNA according to the embodiment will be described with reference to FIGS. 48 to 54.

FIG. 48 is a diagram for explaining an exemplary operation of the LNA 1C according to the embodiment.

As shown in FIG. 48, the LNA 1C according to the embodiment can realize twelve modes for operation by controlling the on/off states of its switches.

<Amplification Mode>

Figure 49:
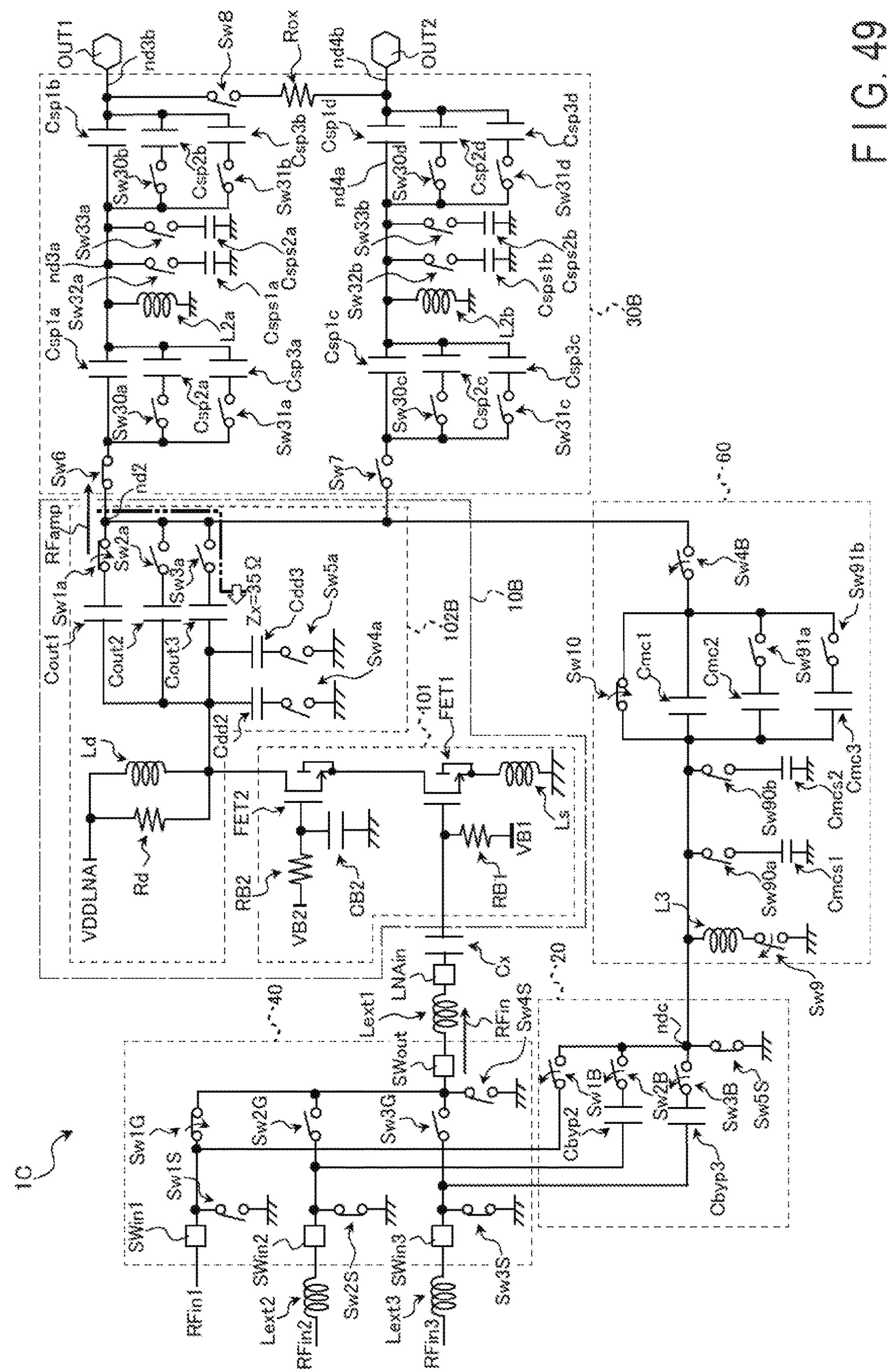

FIG. 49 is a schematic diagram showing an exemplary operation of the LNA 1C according to the embodiment when operating under the amplification mode.

FIG. 49 schematically shows the communication path for the signals to reach the node nd2 in the LNA 1C.

As seen from FIGS. 48 and 49, the switch Sw4B turns off in the amplification mode of the LNA 1C. This causes the bypass circuit 20 and the impedance converter circuit 60 to be electrically separated from the node nd2.

In one example, the switch Sw9 turns off and the switch Sw10 turns on in the impedance converter circuit 60. This sets the inductor L3 and the capacitors Cmc1, Cmc2, and Cmc3 in the ineffective state.

The radio-frequency signal RFin passes through the on-state one of the multiple switches Sw1G, Sw2G, and Sw3G in the band select circuit 40 and is supplied to the core circuit 101 in substantially the same manner as in the third embodiment. The radio-frequency signal is then amplified by the core circuit 101 and transmitted to the node nd2 in the output matching circuit 102B.

The amplified signal RFamp is forwarded from the splitter circuit 30B to the subsequent circuitry component according to the selected output mode.

<Bypass Mode>

Figure 50:
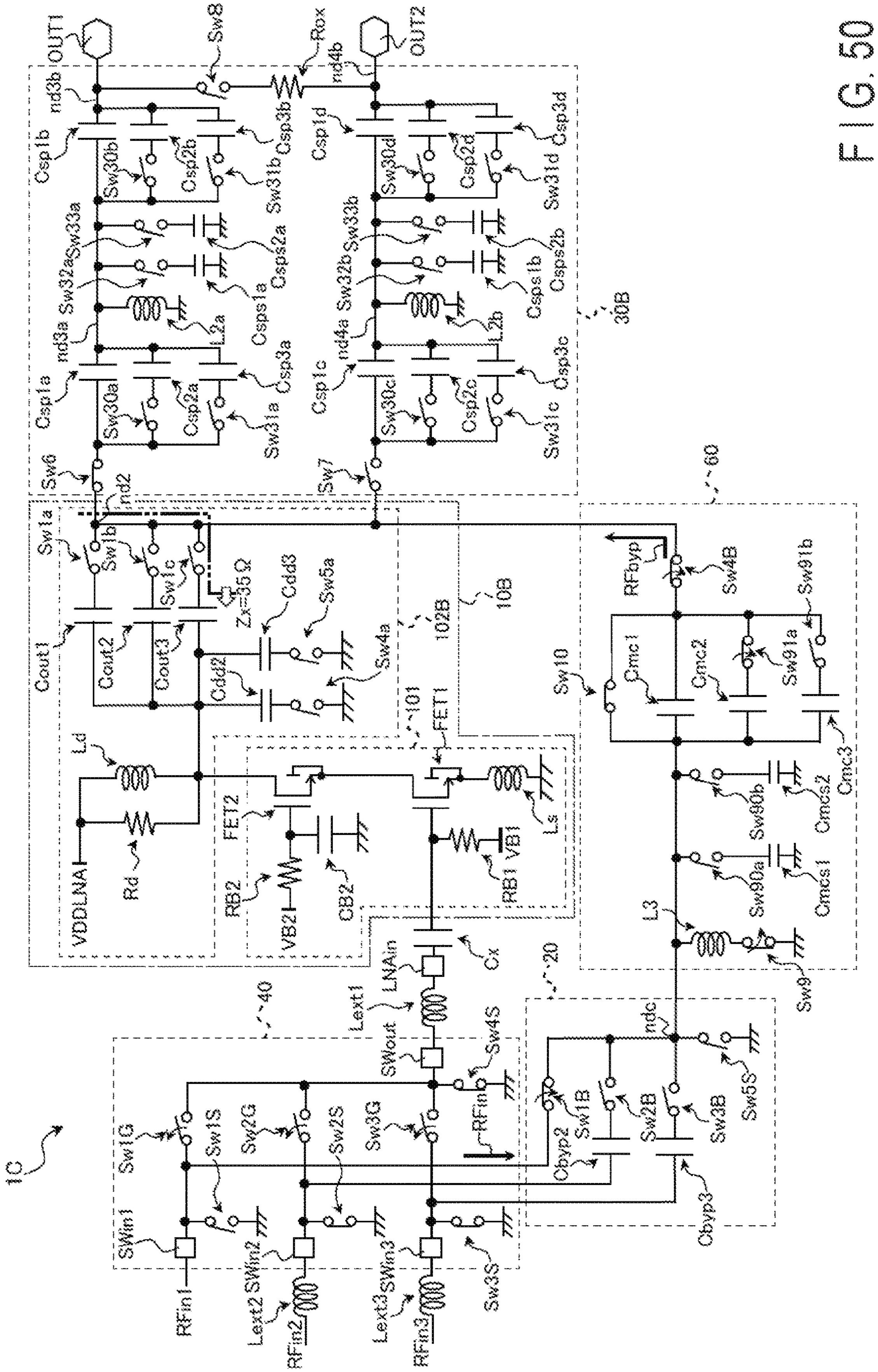

FIG. 50 is a schematic diagram for explaining an exemplary operation of the LNA 1C according to the embodiment when operating under the bypass mode.

FIG. 50 schematically shows the communication path for the signals to reach the node nd2 in the LNA 1C.

As seen from FIGS. 48 and 50, the multiple switches Sw1G, Sw2G, and Sw3G in the band select circuit 40 turn off. This causes the amplifier circuit 10B to be electrically separated from the multiple input terminals SWin1, SWin2, and SWin3.

The radio-frequency signal RFin passes through the on-state one of the multiple switches Sw1B, Sw2B, and Sw3B in the bypass circuit 20 and is supplied to the impedance converter circuit 60 in substantially the same manner as in the third embodiment.

The inductor L3 and the capacitors Cmcs1, Cmcs2, Cmc2, and Cmc3 in the impedance converter circuit 60 are controlled for their effective/ineffective states by the control circuit, according to the supplied radio-frequency signal.

In the combination of the bypass mode and the single output mode, the switch Sw9 turns off and the switch Sw10 turns on. This sets the inductor L3 and the capacitors Cmc1, Cmc2, and Cmc3 in the ineffective state.

In the combination of the bypass mode and the split output mode, the switch Sw9 turns on and the switch Sw10 turns off. This sets the inductor L3 and the capacitor Cmc1 in the effective state.

The example shown in FIG. 50 assumes that reception with the input terminal SWin1 is selected, and accordingly the switch Sw1B turns on.

FIG. 51 shows, for the bypass mode of the LNA 1C according to the embodiment, the controlled states of the capacitors in the impedance converter circuit 60.

When, for example, a signal RF1 of the first frequency band (e.g., from 859 MHz to 960 MHz) is supplied to the impedance converter circuit 60, the switches Sw90*a* and Sw90*b* turn off as in the example shown in FIG. 50. This sets both the capacitors Cmcs1 and Cmcs2 in the ineffective state.

Here, the switch Sw91*a* turns on, and the switch Sw91*b* turns off. This sets the capacitor Cmc2 in the effective state and the capacitor Cmc3 in the ineffective state.

When, for example, a signal RF2 of the second frequency band (e.g., from 717 MHz to 821 MHz) is supplied to the impedance converter circuit 60, the switch Sw90*a* turns on and the switch Sw90*b* turns off. This sets the capacitor Cmcs1 in the effective state and the capacitor Cmcs2 in the ineffective state.

Here, the switches Sw91*a* and Sw91*b* turn off. This sets both the capacitors Cmc2 and Cmc3 in the ineffective state.

When, for example, a signal RF3 of the third frequency band (e.g., from 617 MHz to 652 MHz) is supplied to the impedance converter circuit 60, the switches Sw90*a* and Sw90*b* turn on. This sets both the capacitors Cmcs1 and Cmcs2 in the effective state.

Here, the switches Sw91*a* and Sw91*b* turn on. This sets both the capacitors Cmc2 and Cmc3 in the effective state.

In this manner, according to the selected frequency band of the radio-frequency signals, the combined capacitance attributable to the multiple capacitors Cmcs1, Cmcs2, Cmc1, Cmc2, and Cmc3 is changed.

Therefore, in the bypass mode, the absolute value of the output impedance of the impedance converter circuit 60, viewed from the node nd2, is set to a value (e.g., approximately 35Ω) smaller than a given value (e.g., 50Ω).

The signal from the impedance converter circuit 60 is output to the node nd2 via the on-state switch Sw4B.

The signal RFbyp in the bypass mode is forwarded from the splitter circuit 30B to the subsequent circuitry component according to the selected output mode.

<Single Output Mode>

Figure 52:
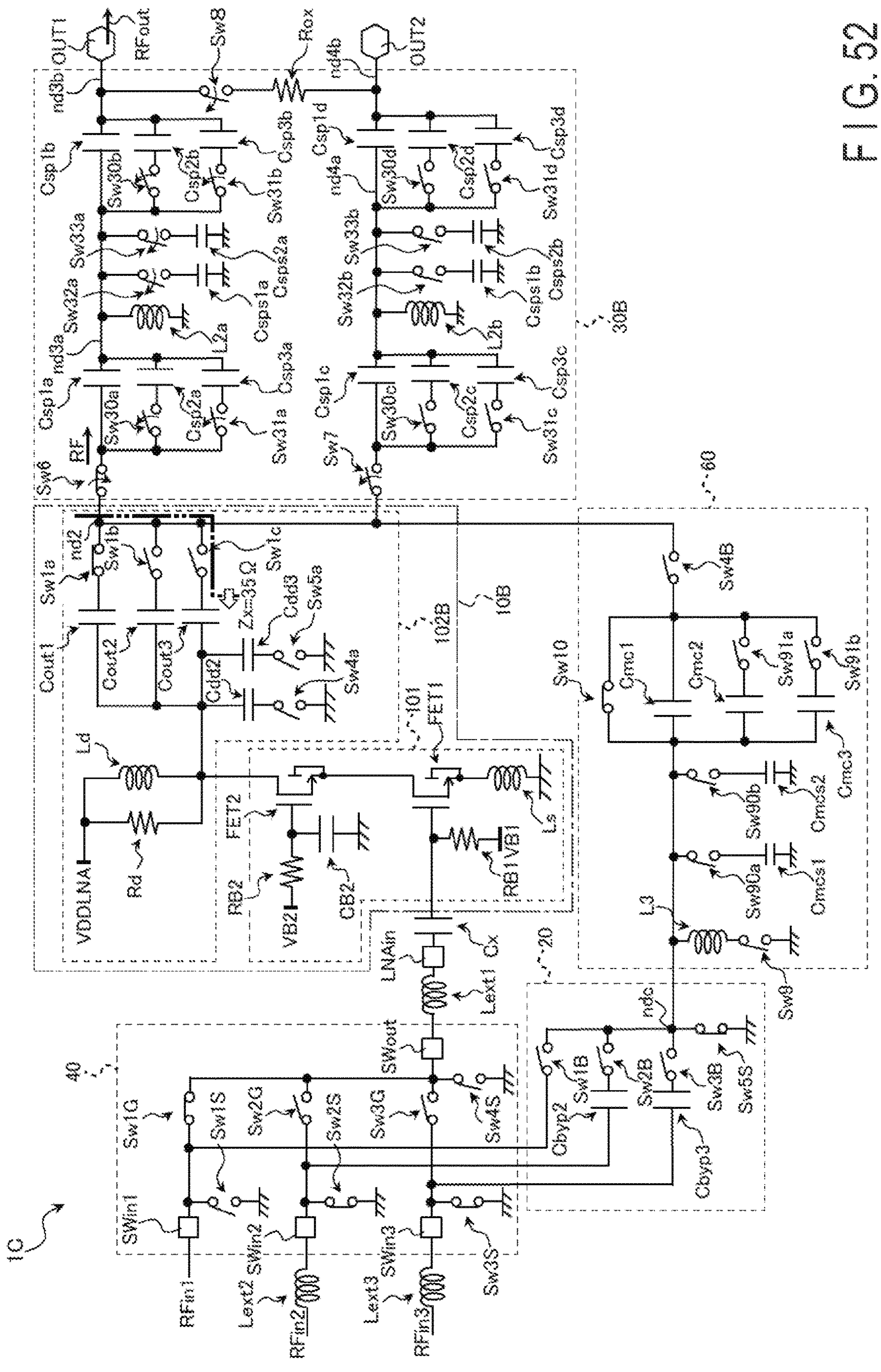

FIG. 52 is a schematic diagram for explaining an exemplary operation of the LNA 1C according to the embodiment when operating under the single output mode.

FIG. 52 schematically shows the communication path for the signals to be transmitted from the node nd2 toward the output terminal in the LNA 1C.

As seen from FIGS. 48 and 52, in the single output mode, one of the two switches Sw6 and Sw7 connected to the node nd2 in the output matching circuit 102B turns on.

In the example shown in FIG. 52, the switch Sw6 turns on, and the switch Sw7 turns off.

This causes the output terminal OUT1 to be electrically connected to the node nd2 via the on-state switch Sw6.

The switch Sw8 turns off. This sets the resistor Rox in the ineffective state for the single output mode. The output terminal OUT1 is electrically separated from the output terminal OUT2.

The signal from the node nd2 travels to the output terminal OUT1 via the capacitors Csp1*a* and Csp1*b* on the nodes nd3*a* and nd3*b*.

The passive elements connected to the nodes nd3*a* and nd3*b* are controlled for their effective/ineffective states according to the selected frequency band of the input signal.

FIG. 53 shows the control of the variable capacitance in the splitter circuit 30B of the LNA 1C according to the embodiment.

When the signal RF1 of the first frequency band (e.g., from 859 MHz to 960 MHz) is selected, the switches Sw30 (Sw30*a*, Sw30*b*, Sw30*c*, and Sw30*d*) and the switches Sw31 (Sw31*a*, Sw31*b*, Sw31*c*, and Sw31*d*) turn off as can be seen from FIG. 53. This sets the capacitors Csp2 (Csp2*a*, Csp2*b*, Csp2*c*, and Csp2*d*) and the capacitors Csp3 (Csp3*a*, Csp3*b*, Csp3*c*, and Csp3*d*) as the series capacitors in the ineffective state.

Here, the switches Sw32 (Sw32*a* and Sw32*b*) and the switches Sw33 (Sw33*a* and Sw33*b*) turn off.

This sets the capacitors Csps1 (Cspc1*a* and Csps1*b*) and the capacitors Csps2 (Cspc2*a* and Csps2*b*) in the ineffective state.

When the signal RF2 of the second frequency band (e.g., from 717 MHz to 821 MHz) is selected, the switches Sw30 turn on and the switches Sw31 turn off (cf., for example, FIG. 48).

In series capacitors, this sets the capacitors Csp2 in the effective state and the capacitors Csp3 in the ineffective state.

Here, the switches Sw32 turn on, and the switches Sw33 turn off. This sets the capacitors Cspc1 in the effective state and the capacitors Csps2 in the ineffective state.

When the signal RF3 of the third frequency band (e.g., from 617 MHz to 652 MHz) is selected, the switches Sw30 and the switches Sw31 turn on.

This sets the series capacitors Csp2 and the series capacitors Csp3 in the effective state.

Here, the switches Sw32 and the switches Sw33 turn on. This sets the capacitors Csps1 and the capacitors Csps2 in the effective state.

In this manner, the value of the variable capacitance in the splitter circuit 30B is changed according to the frequency band of the signal traveling within the splitter circuit 30B (i.e., the output signal of the LNA 1C).

The signal RFout from the node nd2 travels to the output terminal OUT1 via the on-state switch Sw6 and the nodes nd3*a* and nd3*b*.

When the single output mode with the output terminal OUT2 is selected, the switch Sw7 turns on and the switch Sw6 turns off. The capacitors connected to the nodes nd4*a* and nd4*b* are controlled for their effective/ineffective states according to the frequency band of the signal traveling within the splitter circuit 30B as shown FIG. 53.

The signal RFout from the node nd2 travels to the output terminal OUT2 via the on-state switch Sw7 and the nodes nd4*a* and nd4*b*.

With the LNA 1C according to the embodiment as described above, the radio-frequency signals are thus forwarded to the subsequent circuitry component from the splitter circuit 30B in the single output mode.

According to the present embodiment, the splitter circuit 30B in the single output mode functions as an impedance converter (a part of the impedance converter circuit).

<Split Output Mode>

Figure 54:
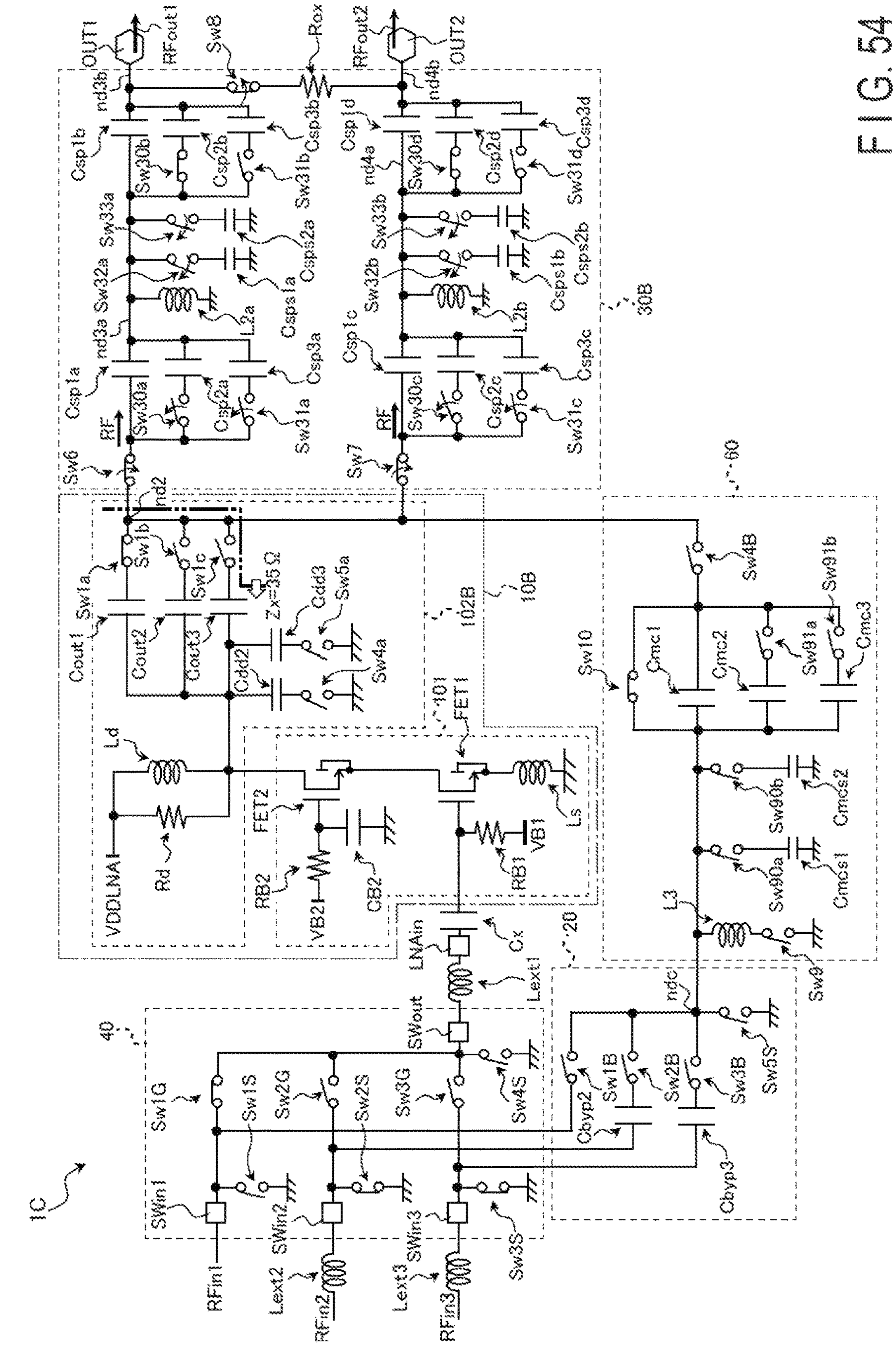

FIG. 54 is a schematic diagram for explaining the split output mode of the LNA 1C according to the embodiment.

FIG. 54 schematically shows the communication path for the signals to be transmitted from the node nd2 toward the output terminals in the LNA 1C.

As seen from FIGS. 48 and 54, in the split output mode, both the switches Sw6 and Sw7 connected to the node nd2 turn on.

This makes both the output terminals OUT1 and OUT2 electrically connected to the node nd2.

The switch Sw8 turns on. This sets the resistor Rox in the effective state. The output terminal OUT1 is electrically connected to the output terminal OUT2 via the on-state switch Sw8 and the resistor Rox.

Similar to the case of the single output mode, in the split output mode, the capacitors Csp2, Csp3, Csps1, and Csps2 connected to the nodes nd3*a*, nd3*b*, nd4*a*, and nd4*b* are controlled for their effective/ineffective states according to the selected frequency band, as shown in FIG. 53.

Note that, when the LNA 1C operates under the combination of the amplification mode and the split output mode, the switch Sw4B in the impedance converter circuit 60 turns off. Further, the switch Sw9 turns off and the switch Sw10 turns on. Accordingly, the impedance converter circuit 60 does not cast a negative influence on the characteristics of the LNA 1C.

When the LNA 1C operates under the combination of the bypass mode and the split output mode, the switch Sw9 turns on and the switch Sw10 turns off in the impedance converter circuit 60. Accordingly, the impedance converter circuit 60 changes the impedance value, for example, from 50Ω to 35Ω.

(4c) Characteristics

FIG. 55 will be referred to for describing the characteristics of the LNA according to the embodiment.

FIG. 55 is a list of the simulation results for the small-signal characteristics of the LNA 1C according to the embodiment.

In FIG. 55, the values at the band center are noted for the S parameter "S21". For each of the noise figure NF and the S parameters "S11", "S22", and "S23", the worst values within the band are noted.

As in the foregoing embodiments, the values of the noise figure NF and the S parameters "S11", "S22", "S21", and "S23" in FIG. 55 are given for each frequency band and combination of the modes for operation. In the S parameters, port "1" refers to the active terminal among the multiple input terminals SWin, port "2" refers to the output terminal OUT1 of the LNA 1C, and port "3" refers to the output terminal OUT2 of the LNA 1C.

In the context of the present embodiment, the first frequency band refers to the frequency band ranging from 859 MHz to 960 MHz, the second frequency band refers to the frequency band ranging from 717 MHz to 821 MHz, and the third frequency band refers to the frequency band ranging from 617 MHz to 652 MHz.

In these simulations, the voltage VDDLNA supplied to the LNA 1C according to the embodiment was set to 1.2V.

As understood from FIG. 55, the LNA 1C according to the embodiment provides substantially the same characteristics with the respective parameters as in the foregoing embodiments.

In the present embodiment, the "S23" parameter may take the worst value when the LNA 1C operates under the split output mode. The worst value of the "S23" parameter in the embodiment is −29.1 dB.

As such, even taking the worst value of the "S23" parameter into consideration, the "S23" parameter values of the LNA 1C according to the embodiment can secure a sufficient margin from the generally required, standard "S23" parameter value (e.g., −25 dB).

Therefore, the LNA 1C according to the embodiment can provide improved characteristics while realizing various modes for operation.

(5) Fifth Embodiment

An LNA according to the fifth embodiment will be described with reference to FIGS. 56 to 61.

(5a) Exemplary Configuration

Figure 56:
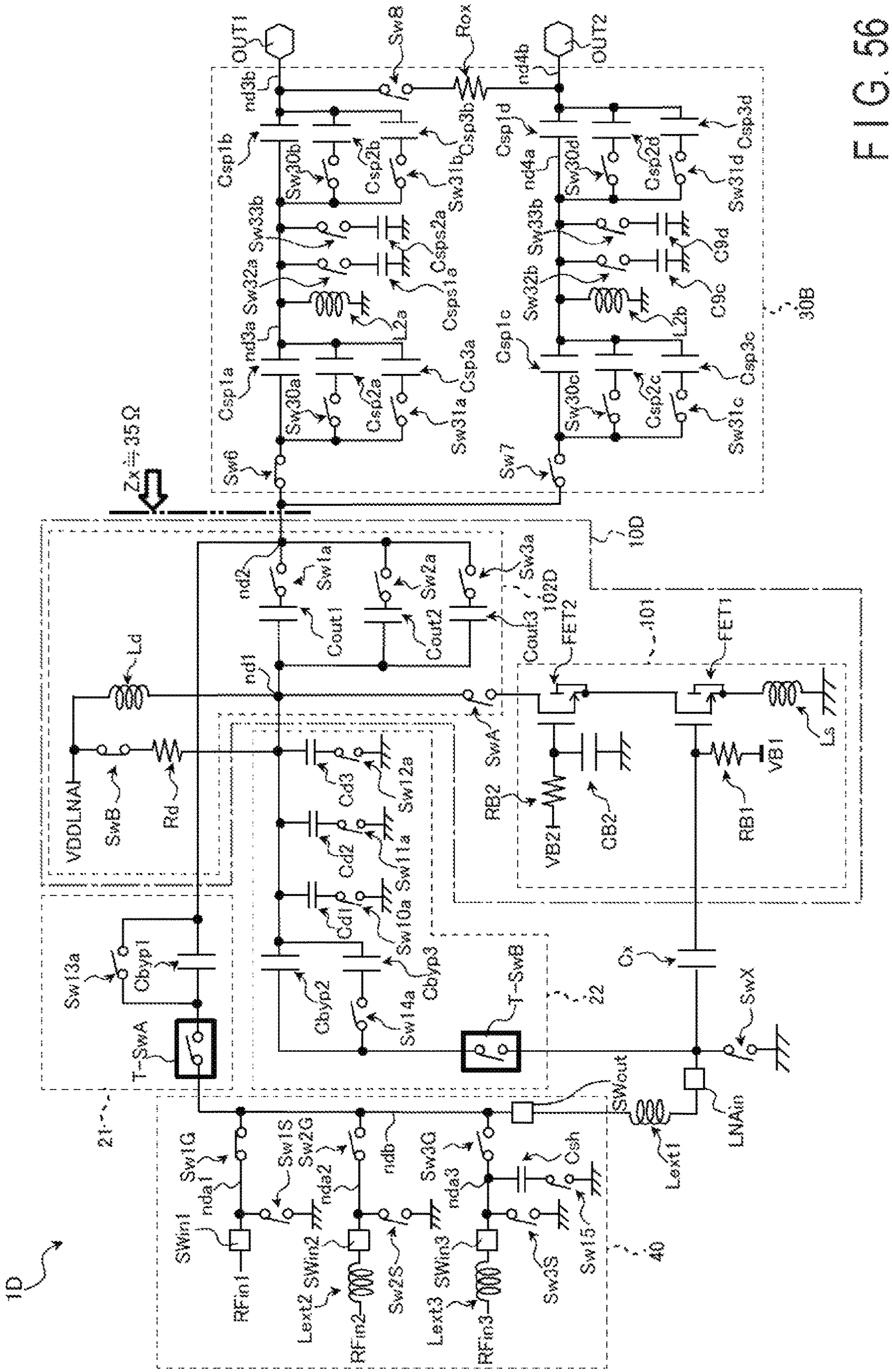
FIG. 56 is a circuit diagram showing an exemplary configuration of an LNA according to a fifth embodiment.

FIG. 56 is a circuit diagram showing an exemplary configuration of an LNA 1D according to the embodiment.

As shown in FIG. 56, the LNA 1D according to the embodiment has two bypass circuits 21 and 22.

<Amplifier Circuit>

The LNA 1D includes its amplifier circuit 10D, in which a switch SwA is disposed between the output node of the core circuit 101 (i.e., the drain of the transistor FET2) and the node nd1 of the output matching circuit 102D. One terminal of the switch SwA is connected to the drain of the transistor FET2. The other terminal of the switch SwA is connected to the node nd1.

The electrical connection between the core circuit 101 and the output matching circuit 102D is controlled by turning on/off the switch SwA.

A switch SwB is disposed between the voltage terminal VDDLNA and the resistor Rd (load resistance). One terminal of the switch SwB is connected to the voltage terminal VDDLNA. The other terminal of the switch SwB is connected to the node nd1 via the resistor Rd.

With the on/off control of the switch SwB, the resistor Rd is set in the effective or ineffective state.

<Band Select Circuit>

The band select circuit 40 includes multiple input terminals SWin1, SWin2, and SWin3, multiple input terminals SWin1, SWin2, and SWin3 are connected to a node ndb via the respective, corresponding switches Sw1G, Sw2G, and Sw3G.

The output terminal SWout of the band select circuit 40 is connected to the node ndb.

In an exemplary configuration, a capacitor Csh is connected to a node nda3 connected with the input terminal SWin3. One terminal of the capacitor Csh is connected to the node nda3. The other terminal of the capacitor Csh is connected to a switch Sw15. The other terminal of the switch Sw15 is connected to the ground terminal.

With the on/off control of the switch Sw15, the capacitor Csh is set in the effective or ineffective state.

<First Bypass Circuit>

The first bypass circuit 21 is disposed between the node ndb (the output terminal SWout) of the band select circuit 40 and the output node nd2 of the output matching circuit 102D.

The first bypass circuit 21 includes a capacitor Cbyp1, a T-switch T-SwA, and a switch Sw13*a*.

One terminal of the T-switch T-SwA is connected to the node ndb of the band select circuit 40 (that is, to the output terminal SWout and the switches Sw1G, Sw2G, and Sw3G). The other terminal of the T-switch T-SwA is connected to the node nd2 via the capacitor Cbyp1.

One terminal of the capacitor Cbyp1 is connected to the other terminal of the T-switch T-SwA. The other terminal of the capacitor Cbyp1 is connected to the node nd2.

One terminal of the switch Sw13*a* is connected to the other terminal of the T-switch T-SwA and the one terminal of the capacitor Cbyp1. The other terminal of the switch Sw13*a* is connected to the other terminal of the capacitor Cbyp1. On the signal communication path between the T-switch T-SwA and the node nd2, the switch Sw13*a* is connected in parallel with the capacitor Cbyp1.

As such, the first bypass circuit 21 is connected between the node ndb of the band select circuit 40 and the output node nd2 of the output matching circuit 102D.

According to the embodiment, the first bypass circuit 21 operates when the LNA 1D is under the single output mode. The bypass circuit 21 functions as a path for the radio-frequency signal RFin in the combination of the bypass mode and the single output mode of the LNA 1D.

For example, the switches Sw13*a* and T-SwA may be on/off-controlled by an RFIC circuit, or by the control circuit 990 (or the RFIC 940).

<Second Bypass Circuit>

The second bypass circuit 22 is disposed between the input terminal of the amplifier circuit 10D (the output-side node of the inductor Lext1) and the node nd1 of the output matching circuit 102D.

The second bypass circuit 22 includes a T-switch T-SwB, multiple capacitors Cd1, Cd2, Cd3, Cbyp2, and Cbyp3, and multiple switches Sw10*a*, Sw11*a*, Sw12*a*, and Sw14*a*.

One terminal of the T-switch T-SwB is connected to the terminal LNAin. The other terminal of the T-switch T-SwB is connected to the input node nd1 of the output matching circuit 102D via the capacitor Cbyp2.

One terminal of the capacitor Cbyp2 is connected to the other terminal of the T-switch T-SwB. The other terminal of the capacitor Cbyp2 is connected to the node nd1.

The switch Sw14*a* and the capacitor Cbyp3 are disposed between the T-switch T-SwB and the node nd1. One terminal of the switch Sw14*a* is connected to the other terminal of the T-switch T-SwB. The other terminal of the switch Sw14*a* is connected to one terminal of the capacitor Cbyp3. The other terminal of the capacitor Cbyp3 is connected to the node nd1.

When the switch Sw14*a* is on state, the capacitor Cbyp3 is connected in parallel with the capacitor Cbyp2 between the T-switch T-SwB and the node nd1. The capacitor Cbyp3 is set in the effective state by the on-state switch Sw14*a*.

The multiple capacitors Cd1, Cd2, and Cd3 are each connected to the communication path between the T-switch T-SwB and the node nd1.

One terminal of the capacitor Cd1 is connected to the node nd1. The other terminal of the capacitor Cd1 is connected to one terminal of the switch Sw10*a*. The other terminal of the switch Sw10*a* is connected to the ground terminal.

One terminal of the capacitor Cd2 is connected to the node nd1. The other terminal of the capacitor Cd2 is connected to one terminal of the switch Sw11*a*. The other terminal of the switch Sw11*a* is connected to the ground terminal.

One terminal of the capacitor Cd3 is connected to the node nd1. The other terminal of the capacitor Cd3 is connected to one terminal of the switch Sw12*a*. The other terminal of the switch Sw12*a* is connected to the ground terminal.

It should be noted that the size of a capacitor (an area on a chip) is smaller than the size of an inductor. Accordingly, adjusting each parameter and impedance for the communication path by the capacitors Cd1, Cd2, and Cd3 can keep the chip size from becoming large.

In an exemplary configuration, a switch SwX as a shunt switch is connected to the one terminal of the T-switch T-SwB and the input terminal LNAin.

According to the embodiment, the second bypass circuit 22 operates when the LNA 1D is under the split output mode. The bypass circuit 22 functions as a path for the radio-frequency signal in the combination of the bypass mode and the split output mode of the LNA 1D.

For example, the switches Sw10*a*, Sw11*a*, Sw12*a*, Sw14*a*, and T-SwB may be on/off-controlled by an RFIC circuit, or by the control circuit 990 (or the RFIC 940).

<Splitter Circuit>

The splitter circuit 30B is, similar to the foregoing example (e.g., exemplary configuration shown in FIG. 47), disposed between the node nd2 of the output matching circuit 102D and the output terminals OUT1 and OUT2.

The splitter circuit 30B is connected to the node nd2 of the output matching circuit 102D via the switches Sw6 and Sw7.

As described for the foregoing example, the multiple capacitors Csp1*a*, . . . , Csp3*a*, Csp1*b*, . . . , Csp3*b*, Csp1*c*, . . . , Csp3*c*, Csp1*d*, . . . , Csp3*d*, Csps1*a*, Csps2*a*, Csps1*b*, and Csps2*b* in the splitter circuit 30B function as variable capacitive circuits by controlling the capacitors for their effective or ineffective states according to the operational mode of the LNA 1D.

The splitter circuit 30B, as in the foregoing example, functions as an impedance converter.

Therefore, the output impedance (absolute value) of the output matching circuit 102D, viewed from the node nd2, is set to an impedance value (e.g., approximately 35Ω) smaller than a given impedance value (e.g., 50Ω).

(5b) Exemplary Operations

Exemplary operations of the LNA according to the embodiment will be described with reference to FIGS. 57 to 60.

FIG. 57 lists the on/off state of each switch element in the LNA 1D for each operational mode.

<Amplification Mode>

Figure 58:
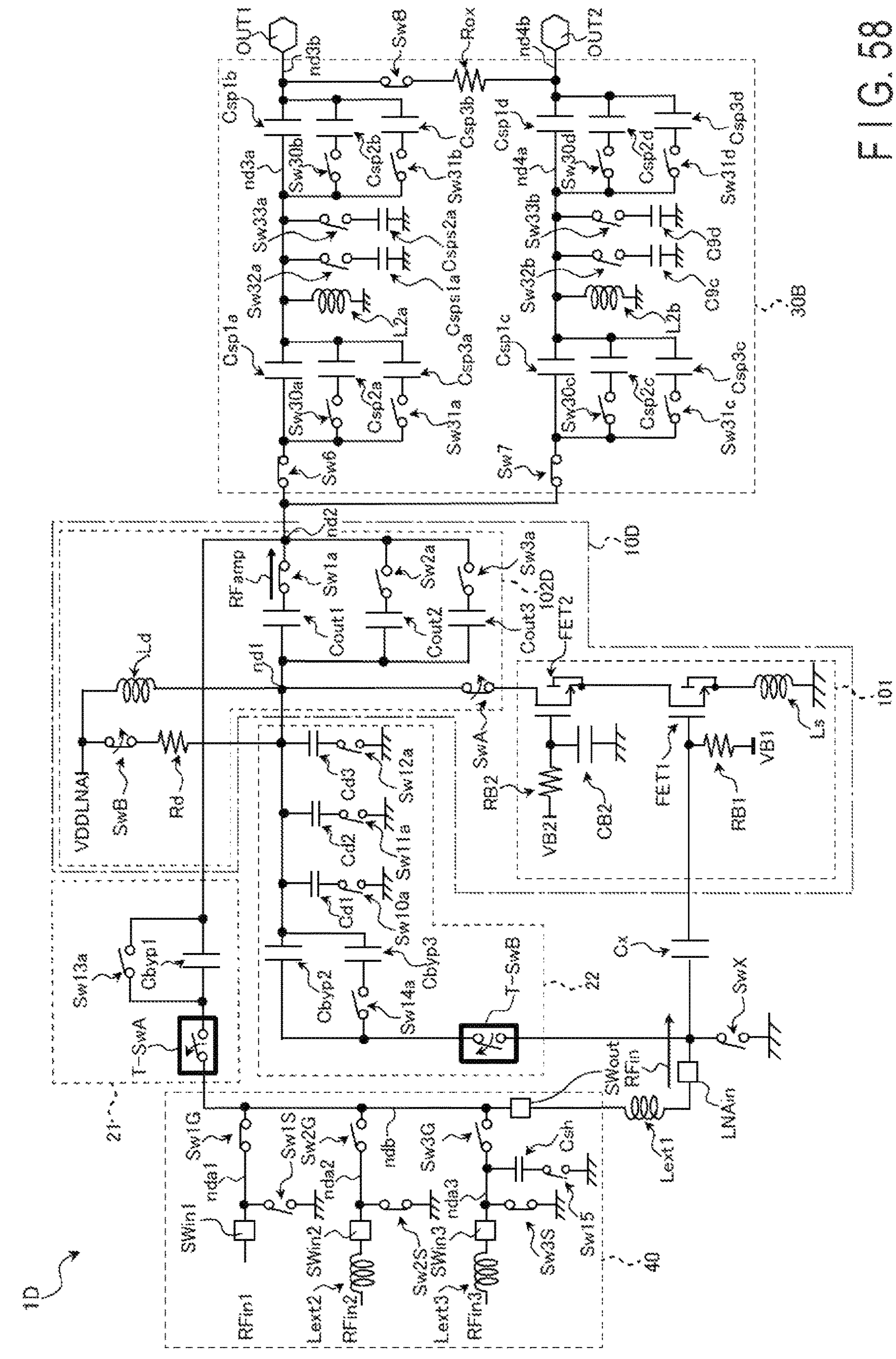

FIGS. 57 and 58 will be referred to for explaining an exemplary operation of the LNA 1D according to the embodiment when operating under the amplification mode.

FIG. 58 schematically shows the communication path for the signals to reach the node nd2 in the LNA 1D.

FIG. 58 is a schematic diagram showing how the LNA 1D according to the embodiment operates under the amplification mode.

As seen from FIGS. 57 and 58, the T-switches T-SwA and T-SwB turn off in the amplification mode. This causes the bypass circuits 21 and 22 to be electrically separated from the band select circuit 40.

As in the foregoing example, one of the switches Sw1G, Sw2G, and Sw3G in the band select circuit 40 turns on according to the radio-frequency signal RFin to be received. This allows the radio-frequency signal RFin to be supplied to the amplifier circuit 10D from the band select circuit 40 via the on-state switch.

In the amplifier circuit 10D, the switches SwA and SwB turn on.

The core circuit 101 is connected to the input node nd1 of the output matching circuit 102D via the on-state switch SwA.

The resistor Rd is set in the effective state by the on-state switch SwB.

Accordingly, the signal amplified by the core circuit 101 travels to the output matching circuit 102D.

Note that the capacitors in the second bypass circuit 22 may be set in the effective state according to the frequency band of the received signal.

When, for example, the frequency band of the received signal is the first frequency band (e.g., from 859 MHz to 960 MHz), the switches Sw10*a*, Sw11*a*, and Sw12*a* turn off. Here, the capacitors Cd1, Cd2, and Cd3 are set in the ineffective state.

For example, when the frequency band of the received signal is the second frequency band (e.g., from 717 MHz to 821 MHz), the switch Sw10*a* turns on and the switches Sw11*a* and Sw12*a* turn off. Here, the capacitor Cd1 is set in the effective state, while the capacitors Cd2 and Cd3 are set in the ineffective state. The capacitance value of the capacitor Cd1, which has been set in the effective state, can influence the impedance value of the output matching circuit 102D.

For example, when the frequency band of the received signal is the third frequency band (e.g., from 617 MHz to 652 MHz), the switches Sw10*a* and Sw11*a* turn on and the switch Sw12*a* turns off. Here, the capacitors Cd1 and Cd2 are set in the effective state, while the capacitor Cd3 is set in the ineffective state. The capacitance values of the capacitors Cd1 and Cd2, which have been set in the effective state, can influence the impedance value of the output matching circuit 102D.

The LNA 1D can carry out each output mode in combination with the amplification mode, in substantially the same manner as in the foregoing examples (e.g., as shown in FIG. 48).

When the LNA 1D operating under the amplification mode is to output the radio-frequency signal in the single output mode, one of the switches Sw6 and Sw7 in the splitter circuit 30B turns on according to the selected one of the output terminals OUT1 and OUT2. In the single output mode, the switch Sw8 turns off. This sets the resistor Rox in the ineffective state. The multiple capacitors connected to the corresponding output terminal OUT are set in the effective or ineffective state according to the frequency band of the received signal.

In this manner, when the LNA 1D operating under the amplification mode is outputting the signal in the single output mode, the output signal of the LNA 1D is output from the selected one of the output terminals OUT to the subsequent circuitry component.

When the LNA 1D operating under the amplification mode is to output the radio-frequency signals in the split output mode, both the switches Sw6 and Sw7 in the splitter circuit 30B turn on. In the split output mode, the switch Sw8 turns on. This sets the resistor Rox in the effective state. The multiple capacitors connected to the corresponding output terminal OUT are set in the effective or ineffective state according to the frequency band of the received signal.

In this manner, when the LNA 1D operating under the amplification mode is outputting the signal in the split output mode, the output signal of the LNA 1D is output from the two output terminals OUT1 and OUT2 to the subsequent circuitry component.

<Single Output Mode in Combination with Bypass Mode>

Figure 59:
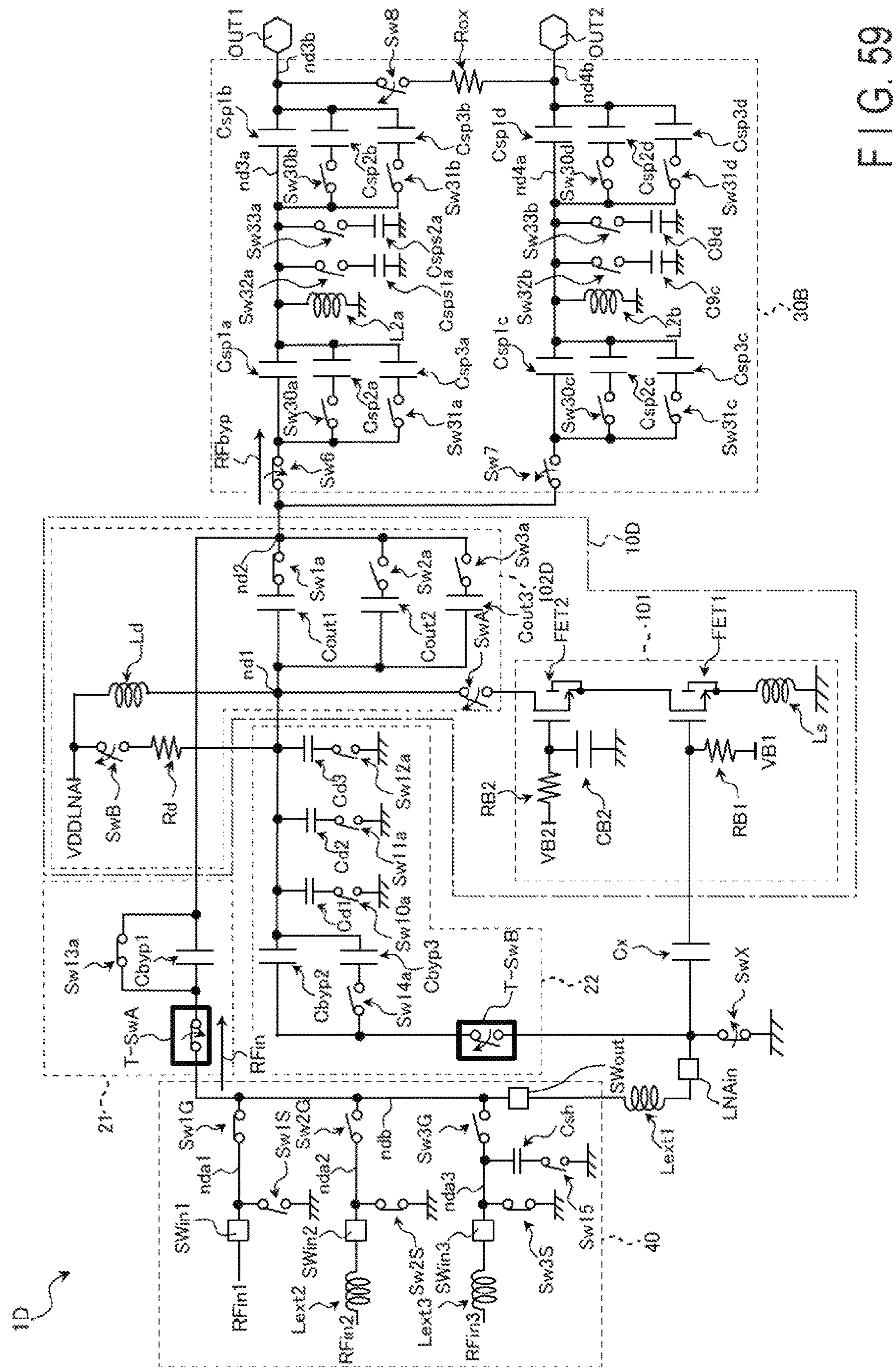

FIGS. 57 and 59 will be referred to for explaining an exemplary operation of the LNA 1D according to the embodiment when operating under the bypass mode.

FIG. 59 is a schematic diagram showing how the LNA 1D according to the embodiment operates in the combination of the bypass mode and the single output mode.

FIG. 59 schematically shows the communication path for the signals to be transmitted from the node nd2 toward the output terminal in the LNA 1D.

As seen from FIGS. 57 and 59, the radio-frequency signal RFin for reception is supplied from the input terminal SWin to the node ndb via the on-state switch controlled according to the signal RFin, in a similar manner to the case of the amplification mode.

In the bypass mode, the switches SwA and SwB in the amplifier circuit 10D turn off. With the off-state switch SwA, the core circuit 101 is electrically separated from the node nd1 in the output matching circuit 102D. The off-state switch SwB sets the resistor Rd in the ineffective state.

There may be the instances where the capacitive component, the inductive component, and the resistive component included in the core circuit 101 influence the node ndb via the terminal LNAin.

When the LNA 1D operates in the combination of the bypass mode and the single output mode, the T-switch T-SwA turns on and the T-switch T-SwB turns off.

The second bypass circuit 22 is electrically separated from the band select circuit 40. In the combination of the bypass mode and the single output mode, the switches Sw10*a*, Sw11*a*, Sw12*a*, and Sw14*a* in the second bypass circuit 22 turn off.

The switch SwX turns on in the combination of the bypass mode and the single output mode. The external inductor Lext1 is thereby shunted. For example, the shunted external inductor Lext1 contributes, via the bypass circuit 21, to the conversion of the impedance value viewed from the node nd2 (e.g., from 50Ω to 35Ω) in the bypass mode.

The first bypass circuit 21 is electrically connected to the node ndb of the band select circuit 40 via the on-state T-switch T-SwA.

The radio-frequency signal RFin from the band select circuit 40 travels to the node nd2 via the capacitor Cbyp1 or the switch Sw13*a*.

In the first bypass circuit 21, the switch Sw13*a* turns on or off according to the frequency band of the received radio-frequency signal.

When, for example, the frequency band of the received signal is the first frequency band (e.g., from 859 MHz to 960 MHz), the switch Sw13*a* turns on. When the frequency band of the received signal is, for example, the second frequency band (e.g., from 717 MHz to 821 MHz) or the third frequency band (e.g., from 617 MHz to 652 MHz), the switch Sw13*a* turns off.

The switches Sw1*a*, Sw2*a*, and Sw3*a* turn on or off according to the frequency band of the received radio-frequency signal.

For example, when the frequency band of the received signal is the first frequency band (e.g., from 859 MHz to 960 MHz), the switch Sw1*a* turns on and the switches Sw2*a* and Sw3*a* turn off. The capacitor Cout1 is thus electrically connected to the node nd2. In an exemplary operation, the capacitance value of the effective-state capacitor Cout1 can influence the impedance value of the node nd2.

When the frequency band of the received signal is, for example, the second frequency band (e.g., from 717 MHz to 821 MHz), the switches Sw1*a* and Sw2*a* turn on and the switch Sw3*a* turns off. Accordingly, the capacitors Cout1 and Cout2 are electrically connected to the node nd2. In an exemplary operation, the capacitance values of the effective-state capacitors Cout1 and Cout2 can influence the impedance value of the node nd2.

When the frequency band of the received signal is, for example, the third frequency band (e.g., from 617 MHz to 652 MHz), the switches Sw1*a*, Sw2*a*, and Sw3*a* turn on. The capacitors Cout1, Cout2, and Cout3 are electrically connected to the node nd2. In an exemplary operation, the capacitance values of the effective-state capacitors Cout1, Cout2, and Cout3 can influence the impedance value of the node nd2.

When the LNA 1D operating under the bypass mode is to output the radio-frequency signal to the subsequent circuitry component in the single output mode, one of the switches Sw6 and Sw7 turns on according to the output terminal OUT for use in the signal outputting operation, as in the foregoing examples.

The multiple capacitors Csp1, Csp2, Csp3, Csps1, and Csps2, connected between the on-state switch and the output terminal OUT, are independently set in the effective or ineffective state according to the frequency band of the received signal, as in the foregoing examples.

In the single output mode, when the frequency band of the signal received by the band select circuit 40 is, for example, the third frequency band (e.g., from 617 MHz to 652 MHz), the switch Sw15 turns on. This sets the capacitor Csh in the effective state.

When the frequency band of the received signal is the first frequency band (e.g., from 859 MHz to 960 MHz) or the second frequency band (e.g., from 717 MHz to 821 MHz), the switch Sw15 turns off and the capacitor Csh is set in the ineffective state.

As described above, the LNA 1D according to the embodiment is capable of outputting radio-frequency signals to the subsequent circuitry component from one of the output terminals OUT in the combination of the bypass mode and the single output mode.

<Split Output Mode in Combination with Bypass Mode>

Figure 60:
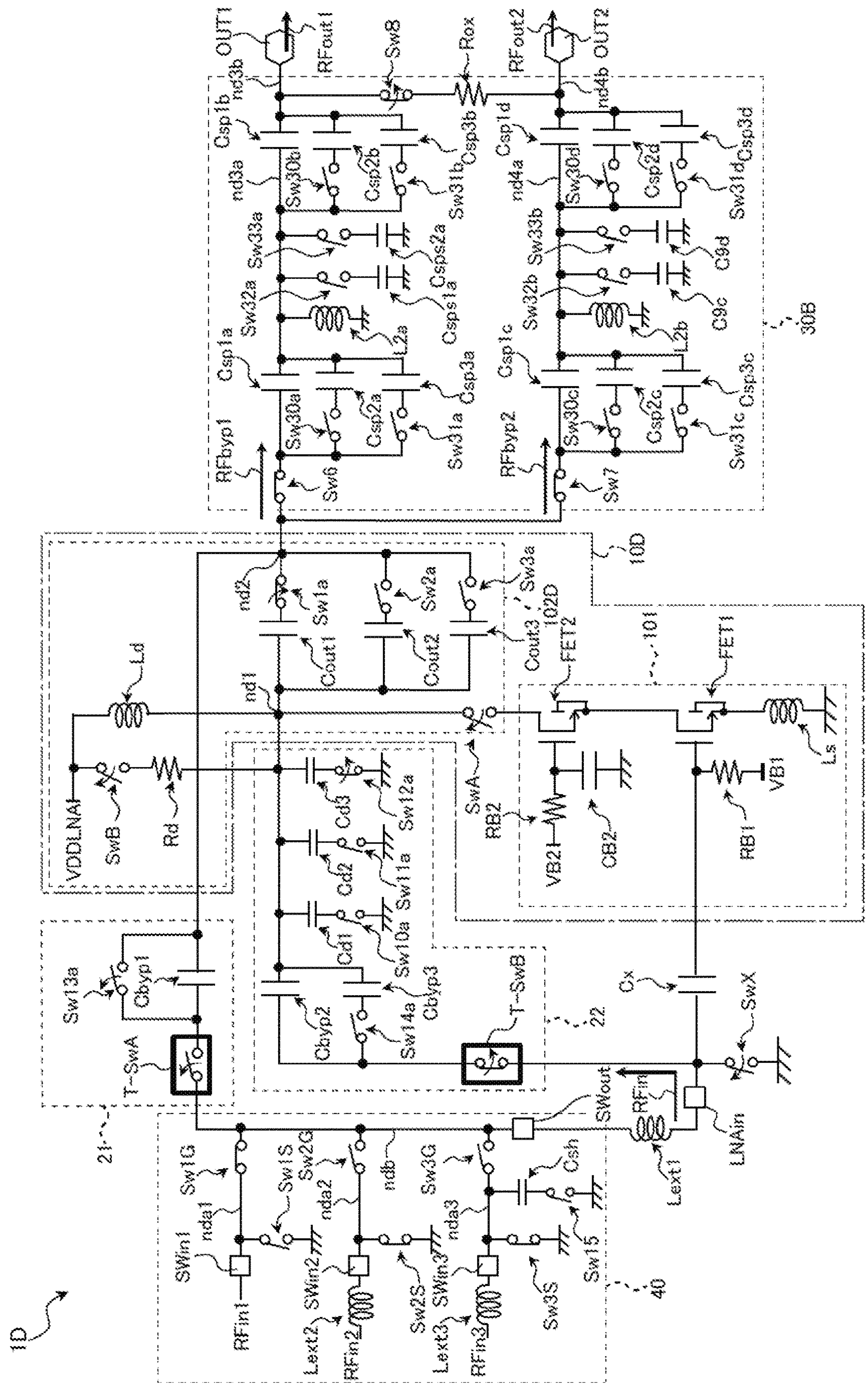

FIGS. 57 and 60 will be referred to for explaining an exemplary operation of the LNA 1D according to the embodiment when operating under the bypass mode.

FIG. 60 is a schematic diagram showing how the LNA 1D according to the embodiment operates in the combination of the bypass mode and the split output mode.

As seen from FIGS. 57 and 60, the radio-frequency signal RFin for reception is supplied from the input terminal SWin to the node ndb via the on-state switch controlled according to the signal RFin.

In the bypass mode of this instance, similar to the example shown in FIG. 59, the off-state switch SwA electrically separates the core circuit 101 from the node nd1 in the output matching circuit 102D. The off-state switch SwB sets the resistor Rd in the ineffective state.

When the LNA 1D operates in the combination of the bypass mode and the split output mode, the T-switch T-SwA turns off and the T-switch T-SwB turns on.

The first bypass circuit 21 is electrically separated from the band select circuit 40. The switch Sw13*a* in the first bypass circuit 21 turns off.

The second bypass circuit 22 is electrically connected to the node ndb of the band select circuit 40 via the on-state T-switch T-SwB.

The radio-frequency signal RFin from the band select circuit 40 is fed into the second bypass circuit 22.

When, for example, the frequency band of the radio-frequency signal RFin is the first frequency band (e.g., from 859 MHz to 960 MHz), the switch Sw14*a* turns off.

The radio-frequency signal RFin in this case travels to the node nd1 via the capacitor Cbyp2.

When the frequency band of the radio-frequency signal is, for example, the second frequency band (e.g., from 717 MHz to 821 MHz) or the third frequency band (e.g., from 617 MHz to 652 MHz), the switch Sw14*a* turns on.

The radio-frequency signal RFin in this case travels to the node nd1 via the two capacitors Cbyp2 and Cbyp3 connected in parallel with each other.

In the second bypass circuit 22 with the multiple switches Sw10*a*, Sw11*a*, and Sw12*a*, the switches Sw10*a* and Sw11*a* turn off and the switch Sw12*a* turns on. This sets the capacitor Cd3 in the effective state in the combination of the bypass mode and the split output mode of the LNA 1D. The capacitors Cd1 and Cd2 at this time are set in the ineffective state.

The second bypass circuit 22 outputs the radio-frequency signal to the node nd1 of the output matching circuit 102D.

When the LNA 1D operates in the combination of the bypass mode and the split output mode, the switches Sw1*a*, Sw2*a*, and Sw3*a* in the output matching circuit 102D turn on or off according to the frequency band of the received radio-frequency signal.

For example, when the frequency band of the received signal is the first frequency band (e.g., from 859 MHz to 960 MHz), the switch Sw1*a* turns on and the switches Sw2*a* and Sw3*a* turn off. The signal from the second bypass circuit 22 in this case is output to the node nd2 via the capacitor Cout1.

When the frequency band of the received signal is, for example, the second frequency band (e.g., from 717 MHz to 821 MHz), the switches Sw1*a* and Sw2*a* turn on and the switch Sw3*a* turns off. The signal from the second bypass circuit 22 in this case is output to the node nd2 via the capacitors Cout1 and Cout2 connected in parallel with each other.

When the frequency band of the received signal is, for example, the third frequency band (e.g., from 617 MHz to 652 MHz), the switches Sw1*a*, Sw2*a*, and Sw3*a* turn on. The signal from the second bypass circuit 22 in this case is output to the node nd2 via the capacitors Cout1, Cout2, Cout3 connected in parallel with one another.

As such, the radio-frequency signal RFin is routed through the communication path in the second bypass circuit 22, based on the effective- or ineffective-state setting of the capacitors on the communication path as above, and supplied to the node nd2 of the output matching circuit 102D.

In the split output mode, both the switches Sw6 and Sw7 turn on.

The multiple capacitors connected between the on-state switches and the output terminals OUT are set in the effective or ineffective state according to the frequency band of the received signal. For example, the capacitor Csp1 is always in the effective state, irrespective of the frequency band of the signal.

More specifically, the multiple capacitors Csp1, Csp2, Csp3, Csps1, and Csps2, connected between the on-state switches Sw6 and Sw7 and the output terminals OUT1 and OUT2, are independently set in the effective or ineffective state according to the frequency band of the received signal, as in the foregoing examples.

The resistor Rox is set in the effective state by the on-state switch Sw8.

As described above, the LNA 1D according to the embodiment is capable of outputting radio-frequency signals to the subsequent circuitry component from the two output terminals OUT1 and OUT2 in the combination of the bypass mode and the split output mode.

(5c) Characteristics

FIG. 61 will be referred to for describing the characteristics of the LNA according to the embodiment.

FIG. 61 shows the simulation results for the small-signal characteristics of the LNA 1D according to the embodiment.

In FIG. 61, the values at the band center are noted for the S parameter "S21". For each of the noise figure NF and the S parameters "S11", "S22", and "S23", the worst values within the band are noted.

As in the foregoing embodiments, the values of the noise figure NF and the S parameters "S11", "S22", "S21", and "S23" in FIG. 61 are given for each frequency band and combination of the modes for operation. In the S parameters, port "1" refers to the active terminal among the multiple input terminals SWin, port "2" refers to the output terminal OUT1 of the LNA 1D, and port "3" refers to the output terminal OUT2 of the LNA 1D.

In the context of the present embodiment, the first frequency band refers to the frequency band ranging from 859 MHz to 960 MHz, the second frequency band refers to the frequency band ranging from 717 MHz to 821 MHz, and the third frequency band refers to the frequency band ranging from 617 MHz to 652 MHz.

In these simulations, the voltage VDDLNA supplied to the LNA 1D according to the embodiment was set to 1.2V.

As understood from FIG. 61, the LNA 1D according to the embodiment provides substantially the same characteristics with the respective parameters as in the foregoing embodiments.

In the present embodiment, the "S23" parameter may take the worst value when the LNA 1D operates under the split output mode. In one example, the worst value of the "S23" parameter in the embodiment is −27.7 dB.

As such, even taking the worst value of the "S23" parameter into consideration, the "S23" parameter values of the LNA 1D according to the embodiment can secure a sufficient margin from the generally required, standard "S23" parameter value (e.g., −25 dB).

That is, the LNA 1D according to the fifth embodiment can provide improved characteristics while realizing various modes for operation.

(6) Sixth Embodiment

An LNA according to the sixth embodiment will be described with reference to FIGS. 62 to 72.

(6a) Exemplary Configuration

Figure 62:
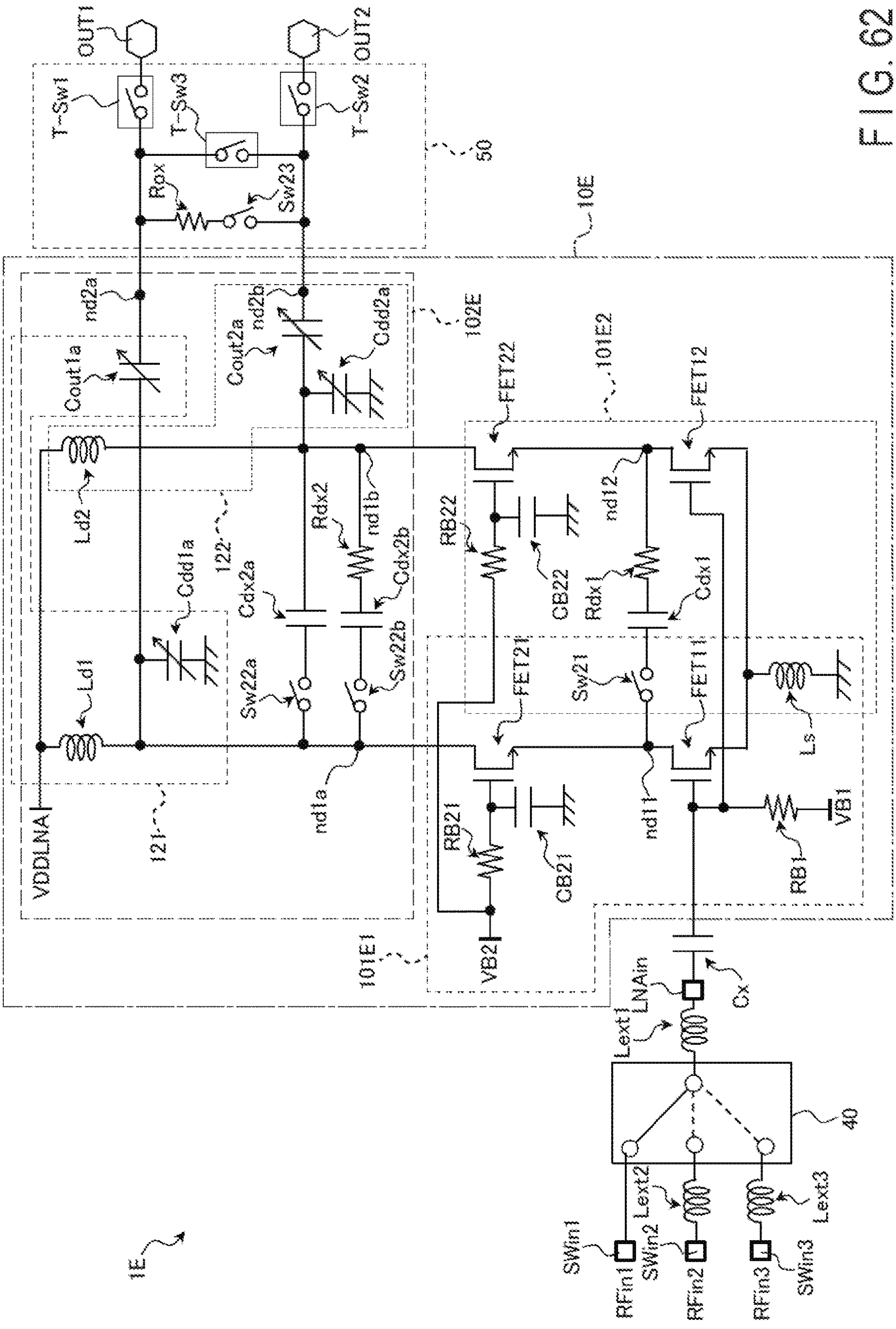
FIG. 62 is a circuit diagram showing an exemplary configuration of an LNA according to a sixth embodiment.

FIG. 62 is a circuit diagram showing an exemplary configuration of an LNA 1E according to the embodiment.

The LNA 1E according to the embodiment is, for example, an LNA for low bands.

The LNA 1E according to the embodiment includes its amplifier circuit 10E, band select circuit 40, and output combiner circuit 50.

<Band Select Circuit>

The band select circuit 40 includes, as in the foregoing embodiments, multiple input terminals SWin1, SWin2, and SWin3. The multiple input terminals SWin1, SWin2, and SWin3 each correspond to one of the multiple frequency bands.

The band select circuit 40 has a function of selecting a frequency band of radio-frequency signals to be received, from multiple frequency bands supplied to the respective input terminals.

The band select circuit 40 is therefore capable of selecting and receiving one of radio-frequency signals of multiple frequency bands, as in the foregoing embodiments.

<Amplifier Circuit>

According to the embodiment, the cascode connection amplifier circuit 10E includes two core circuits 101E1 and 101E2 (cascode connection parts).

The first core circuit 101E1 includes transistors FET11 and FET21.

One terminal of the current path of the transistor FET11 (the source of the transistor FET11) is connected to one terminal of an inductor Ls. The other terminal of the current path of the transistor FET11 (the drain of the transistor FET11) is connected to a node nd11. The control terminal of the transistor FET11 (the gate of the transistor FET11) is connected to the input terminal LNAin via a capacitor Cx.

One terminal of the current path of the transistor FET21 (the source of the transistor FET21) is connected to the node nd11. The other terminal of the current path of the transistor FET21 (the drain of the transistor FET21) is connected to a node nd1*a* of the output matching circuit 102E.

The second core circuit 101E2 includes transistors FET12 and FET22.

One terminal of the current path of the transistor FET12 (the source of the transistor FET12) is connected to the one terminal of the inductor Ls. The other terminal of the current path of the transistor FET12 (the drain of the transistor FET12) is connected to a node nd12. The control terminal of the transistor FET12 (the gate of the transistor FET12) is connected to the input terminal LNAin of the LNA1E via the capacitor Cx.

One terminal of the current path of the transistor FET22 (the source of the transistor FET22) is connected to the node nd12. The other terminal of the current path of the transistor FET22 (the drain of the transistor FET22) is connected to a node nd1*b* of the output matching circuit 102E.

The gate of the transistor FET11 and the gate of the transistor FET12 are connected to a voltage terminal VB1 via a resistor RB1.

Thus, one terminal of the resistor RB1 is connected to the gate of the transistor FET11 and the gate of the transistor FET12. The other terminal of the resistor RB1 is connected to the voltage terminal VB1.

A gate of the transistor FET21 is connected to a voltage terminal VB2 via a resistor RB21.

One terminal of the resistor RB21 is connected to the gate of the transistor FET21. The other terminal of the resistor RB21 is connected to the voltage terminal VB2.

A gate of the transistor FET22 is connected to the voltage terminal VB2 via a resistor RB22.

One terminal of the resistor RB22 is connected to the gate of the transistor FET22. The other terminal of the resistor RB22 is connected to the voltage terminal VB2 and the other terminal of the resistor RB21.

A capacitor CB21 is connected to the gate of the transistor FET21. One terminal of the capacitor CB21 is connected to the gate of the transistor FET21 and the one terminal of the resistor RB21. The other terminal of the capacitor CB21 is connected to the ground terminal.

A capacitor CB22 is connected to the gate of the transistor FET22. One terminal of the capacitor CB22 is connected to the gate of the transistor FET22 and the one terminal of the resistor RB22. The other terminal of the capacitor CB22 is connected to the ground terminal.

According to the embodiment, one terminal of the inductor Ls provides common connections to the sources of the two transistors FET11 and FET12. The other terminal of the inductor Ls is connected to the ground terminal.

As such, the two core circuits 101E1 and 101E2 in this embodiment share the inductor Ls for source degeneration. The two core circuits 101E1 and 101E2 form a pair for the inductor Ls.

A capacitor Cdx1, a resistor Rdx1, and a switch Sw21 are connected between the node nd11 and the node nd12 (that is, between the drain of the transistor FET11 and the drain of the transistor FET12).

One terminal of the switch Sw21 is connected to the node nd11 (the drain of the transistor FET11). The other terminal of the switch Sw21 is connected to one terminal of the capacitor Cdx1. The other terminal of the capacitor Cdx1 is connected to one terminal of the resistor Rdx1. The other terminal of the resistor Rdx1 is connected to the node nd12 (the drain of the transistor FET12).

When the switch Sw21 is on, the drain of the transistor FET11 is connected to the drain of the transistor FET12 and the source of the transistor FET22 via the on-state switch Sw21, the capacitor Cdx1, and the resistor Rdx1.

When the switch Sw21 is off, the capacitor Cdx1 and the resistor Rdx1 are electrically separated from the node nd11. This sets the capacitor Cdx1 and the resistor Rdx1 in the ineffective state for the connection between the drain of the transistor FET11 and the drain of the transistor FET12.

Note that one of the capacitor Cdx1 and the resistor Rdx1 may be not disposed at the path between the nodes nd11 and nd12.

The output matching circuit 102E is connected to the core circuits 101E1 and 101E2 via its input nodes nd1*a* and nd1*b*, respectively.

The output matching circuit 102E includes multiple capacitors Cdx2*a* and Cdx2*b*, multiple variable capacitors Cdd1*a*, Cdd2*a*, Cout1*a*, and Cout2*a*, a resistor Rdx2, multiple inductors Ld1 and Ld2, and multiple switches Sw22*a* and Sw22*b*.

The capacitor Cdx2*a* and the switch Sw22*a* are connected between the node nd1*a* and the node nd1*b*.

One terminal of the switch Sw22*a* is connected to the node nd1*a* (the drain of the transistor FET21). The other terminal of the switch Sw22*a* is connected to one terminal of the capacitor Cdx2*a*. The other terminal of the capacitor Cdx2*a* is connected to the node nd1*b*.

When the switch Sw22*a* is on, the drain of the transistor FET21 is connected to the drain of the transistor FET22 via the on-state switch Sw22*a* and the capacitor Cdx2*a*.

When the switch Sw22*a* is off, the capacitor Cdx2*a* is electrically separated from the node nd1*a*. This sets the capacitor Cdx2*a* in the ineffective state for the connection between the drain of the transistor FET21 and the drain of the transistor FET22.

In addition to the capacitor Cdx2*a*, a resistor Rdx3 may be further provided between the nodes nd1*a* and nd1*b*.

The capacitor Cdx2*b*, the resistor Rdx2, and the switch Sw22*b* are connected between the node nd1*a* and the node nd1*b* (that is, between the drain of the transistor FET21 and the drain of the transistor FET22).

One terminal of the switch Sw22*b* is connected to the node nd1*a* (the drain of the transistor FET21). The other terminal of the switch Sw22*b* is connected to one terminal of the capacitor Cdx2*b*. The other terminal of the capacitor Cdx2*b* is connected to one terminal of the resistor Rdx2. The other terminal of the resistor Rdx2 is connected to the node nd1*b* (the drain of the transistor FET22).

When the switch Sw22*b* is on, the drain of the transistor FET21 is connected to the drain of the transistor FET22 via the on-state switch Sw22*b*, the capacitor Cdx2*b*, and the resistor Rdx2.

When the switch Sw22*b* is off, the capacitor Cdx2*b* and the resistor Rdx2 are electrically separated from the node nd1*a*. This sets the capacitor Cdx2*b* and the resistor Rdx2 in the ineffective state for the connection between the drain of the transistor FET21 and the drain of the transistor FET22.

Note that one of the capacitor Cdx2*b* and the resistor Rdx2 may be not disposed at the path between the nodes nd1*a* and nd1*b*.

Between the nodes nd1*a* and nd1*b*, the communication path having the switch Sw22*b*, the capacitor Cdx2*b*, and the resistor Rdx2 is connected in parallel with the communication path having the switch Sw22*a* and the capacitor Cdx2*a*.

For example, the output matching circuit 102E includes a first matching circuit 121 and a second matching circuit 122. The first matching circuit 121 is an output matching circuit provided for the first core circuit 101E1. The first matching circuit 121 includes the inductor Ld1 and the variable capacitors Cdd1*a* and Cout1*a*. The second matching circuit 122 is an output matching circuit provided for the second core circuit 101E2. The second matching circuit 122 includes the inductor Ld2 and the variable capacitors Cdd2*a* and Cout2*a*.

In the output matching circuit 102E, the inductor Ld1 and the variable capacitors Cdd1*a* and Cout1*a* are connected to the communication path between the node nd1*a* and a node nd2*a*.

One terminal of the inductor Ld1 is connected to the node nd1*a*. The other terminal of the inductor Ld1 is connected to the voltage terminal VDDLNA.

One terminal of the variable capacitor Cdd1*a* is connected to the node nd1*a*. The other terminal of the capacitor Cdd1*a* is connected to the ground terminal.

One terminal of the variable capacitor Cout1*a* is connected to the node nd1*a*. The other terminal of the variable capacitor Cout1*a* is connected to the node nd2*a*. The node nd2*a* is connected to an output terminal OUT1 of the LNA 1E, via a T-switch T-Sw1.

In the output matching circuit 102E, the inductor Ld2 and the variable capacitors Cdd2*a* and Cout2*a* are connected to the communication path between the node nd1*b* and a node nd2*b*.

One terminal of the inductor Ld2 is connected to the node nd1*b*. The other terminal of the inductor Ld2 is connected to the voltage terminal VDDLNA.

One terminal of the variable capacitor Cdd2*a* is connected to the node nd1*b*. The other terminal of the capacitor Cdd2*a* is connected to the ground terminal.

One terminal of the variable capacitor Cout2*a* is connected to the node nd1*b*. The other terminal of the variable capacitor Cout2*a* is connected to the node nd2*b*. The node nd2*b* is connected to an output terminal OUT2 of the LNA 1E according to the embodiment, via a T-switch T-Sw2.

In an exemplary configuration, the value of inductance of the inductor Ld1 is the same as the value of inductance of the inductor Ld2.

Also, the capacitance value of the variable capacitors Cout1*a* may be the same as that of capacitance value of the variable capacitors Cout2*a*.

The variable capacitors Cdd1*a* and Cdd2*a* may be controlled so that they have the same capacitance value.

For example, the switches Sw21, Sw22*a*, and Sw22*b* may be on/off-controlled by an RFIC circuit, or by the control circuit 990 (or the RFIC 940).

<Output Combiner Circuit>

The output combiner circuit 50 is adapted for the switchover between the single output mode and the split output mode.

The output combiner circuit 50 includes multiple T-switches T-Sw1, T-Sw2, and T-Sw3, a resistor Rox, and a switch Sw23.

One terminal of the T-switch T-Sw1 is connected to the node nd2*a*. The other terminal of the T-switch T-Sw1 is connected to the output terminal OUT1 of the LNA 1E.

One terminal of the T-switch T-Sw2 is connected to the node nd2*b*. The other terminal of the T-switch T-Sw2 is connected to the output terminal OUT2 of the LNA 1E.

The output terminal OUT1 of the LNA 1E is connected to the node nd2*a* via the T-switch T-Sw1. The output terminal OUT2 of the LNA 1E is connected to the node nd2*b* via the T-switch T-Sw2.

The resistor Rox and the switch Sw23 are connected between the node nd2*a* and the node nd2*b*. One terminal of the resistor Rox is connected to the node nd2*a*. The other terminal of the resistor Rox is connected to one terminal of the switch Sw23. The other terminal of the switch Sw23 is connected to the node nd2*b*.

The T-switch T-Sw3 is connected between the node nd2*a* and the node nd2*b*. One terminal of the T-switch T-Sw3 is connected to the node nd2*a*. The other terminal of the T-switch T-Sw3 is connected to the node nd2*b*. Between the nodes nd2*a* and nd2*b*, the T-switch T-Sw3 is connected in parallel with the resistor Rox and the switch Sw23.

In exemplary implementations, the switches Sw23, T-Sw1, T-Sw2, and T-Sw3 may be on/off-controlled by an RFIC circuit, or by the control circuit 990 (or the RFIC 940).

According to the present embodiment, the serial connection circuit including the capacitor Cdx1 and the resistor Rdx1, the serial connection circuit including the capacitor Cdx2*b* and the resistor Rdx2, the capacitor Cdx2*a*, and the resistor Rox are provided to improve the values of the S parameter S23 and the noise figure NF of the LNA 1E in the split output mode.

As one example, the switches Sw21, Sw22*a*, and Sw22*b* in the amplifier circuit 10E are controlled to place the passive elements Cdx1, Cdx2*a*, Cdx2*b*, Rdx1, Rdx2, and Rox in the effective or ineffective state so that the values of the S parameter S23 and the noise figure NF will be optimized.

As described above, in the LNA 1E according to the embodiment, configurations (connection conditions) for the output matching circuit 102E in the amplifier circuit 10E is variable, according to the selected frequency band and the adopted mode for operation. That is, according to the selected frequency band and the adopted mode for operation, suitable communication paths for the signals are changed within the amplifier circuit 10E.

Therefore, the LNA 1E according to the embodiment can provide improved operational characteristics.

(6b) Exemplary Operations

Exemplary operations of the LNA according to the embodiment will be described with reference to FIGS. 63 to 65.

FIG. 63 is a diagram for explaining the control of the switch elements and the passive elements in the LNA 1E according to the embodiment.

(a) of FIG. 63 is for explaining the on/off states of the switch elements in the LNA 1E according to the embodiment, for each mode for operation.

(b) of FIG. 63 shows the control of the variable capacitors in the LNA 1E according to the embodiment.

As shown in FIG. 63, the LNA 1E according to the embodiment can realize multiple modes by controlling the on/off states of the switches in its circuits, as in the foregoing embodiments.

<Single Output Mode>

Figure 64:
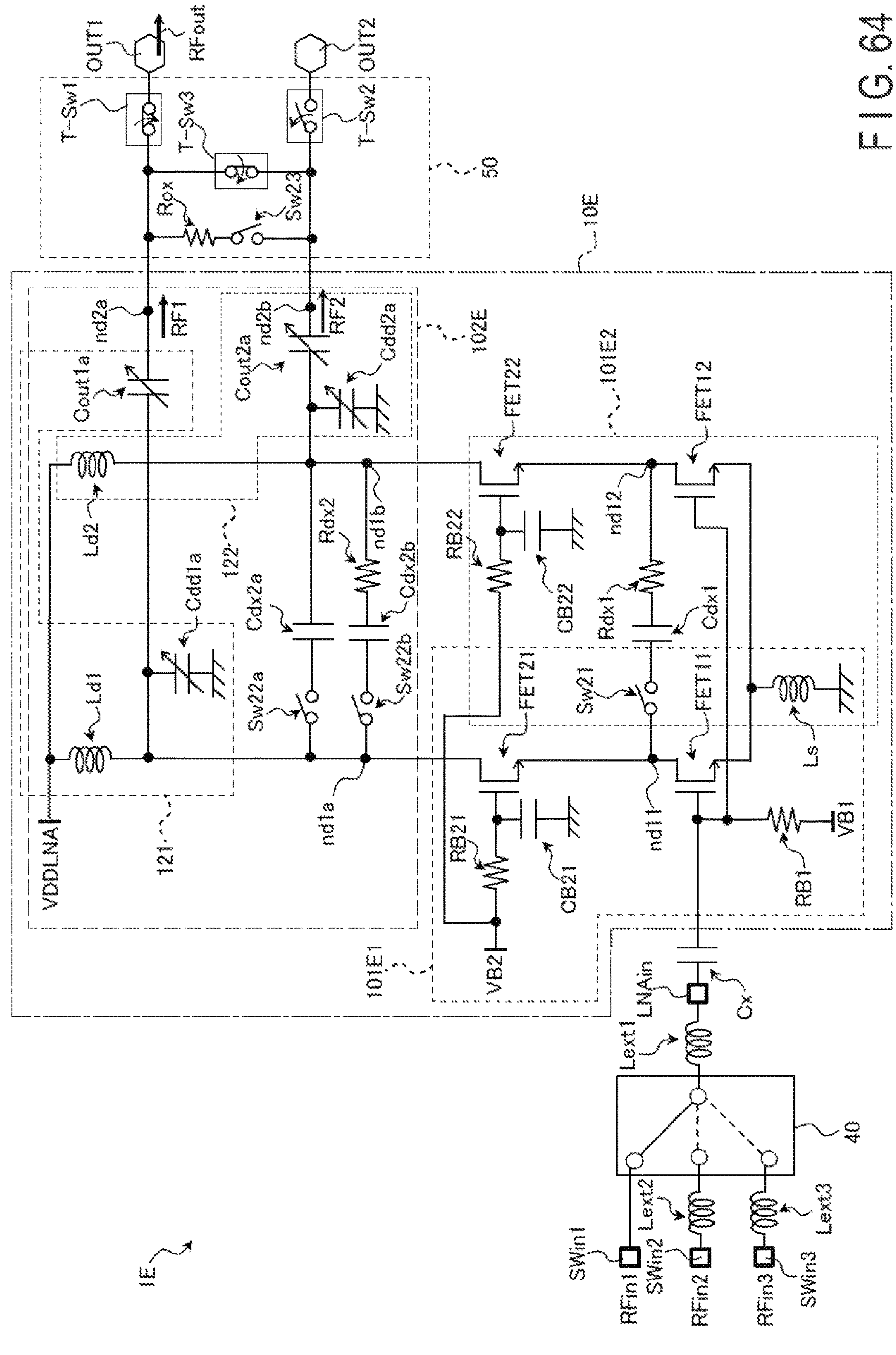

FIGS. 63 and 64 will be referred to for explaining an exemplary operation of the LNA 1E according to the embodiment when operating under the single output mode.

FIG. 64 is a schematic diagram for describing the exemplary operation of the LNA 1E in the single output mode.

According to the embodiment, the LNA 1E uses either one of the two output terminals OUT1 and OUT2 for signal outputting operations from the LNA 1E in the single output mode, as in the foregoing embodiments.

In an exemplary instance where the LNA 1E uses the first output terminal OUT1 for outputting radio-frequency signals in the single output mode as shown in FIG. 63(*a*) and FIG. 64, the T-switch T-Sw1 connected to the output terminal OUT1 turns on and the T-switch T-Sw2 connected to the output terminal OUT2 turns off.

In the single output mode, the T-switch T-Sw3 turns on, irrespective of the selection of the output terminals OUT. The node nd2*b* is electrically connected to the output terminal OUT1 via the on-state T-switch T-Sw3.

The signal obtained by this combining is output from the output terminal OUT1, as the output signal RFout of the LNA 1E, to the subsequent circuitry component.

In the single output mode, the switches Sw21, Sw22*a*, Sw22*b*, and Sw23 in the amplifier circuit 10E may be in the any state, i.e., they are either in the on state or the off state irrespective of the selection of the output terminals OUT.

As shown in (b) of FIG. 63, the variable capacitors Cdd1*a* and Cdd2*a* as well as the variable capacitors Cout1*a* and Cout2*a* in the single output mode are controlled to have the values of capacitance according to the frequency band selected by the band select circuit 40. Thus, the magnitude of the impedance of the amplifier circuit 10E (for example, the input impedance of the amplifier circuit for the band select circuit 40 and/or the output impedance of the amplifier circuit for the output combiner circuit 50) is controlled according to the selected frequency band.

When, on the other hand, the LNA 1E uses the second output terminal OUT2 for outputting radio-frequency signals in the single output mode, the T-switch T-Sw1 connected to the output terminal OUT1 turns off and the T-switch T-Sw2 connected to the output terminal OUT2 turns on.

The T-switch T-Sw3 turns on. The node nd2*b* is electrically connected to the node nd2*a* via the on-state T-switch T-Sw3. This causes the signal passing through the node nd2*b* to be combined with the signal passing through the node nd2*a*.

The signal obtained by this combining is output from the output terminal OUT2, as the output signal RFout of the LNA 1E, to the subsequent circuitry component.

In this manner, the LNA 1E according to the embodiment operates under the single output mode.

<Split Output Mode>

Figure 65:
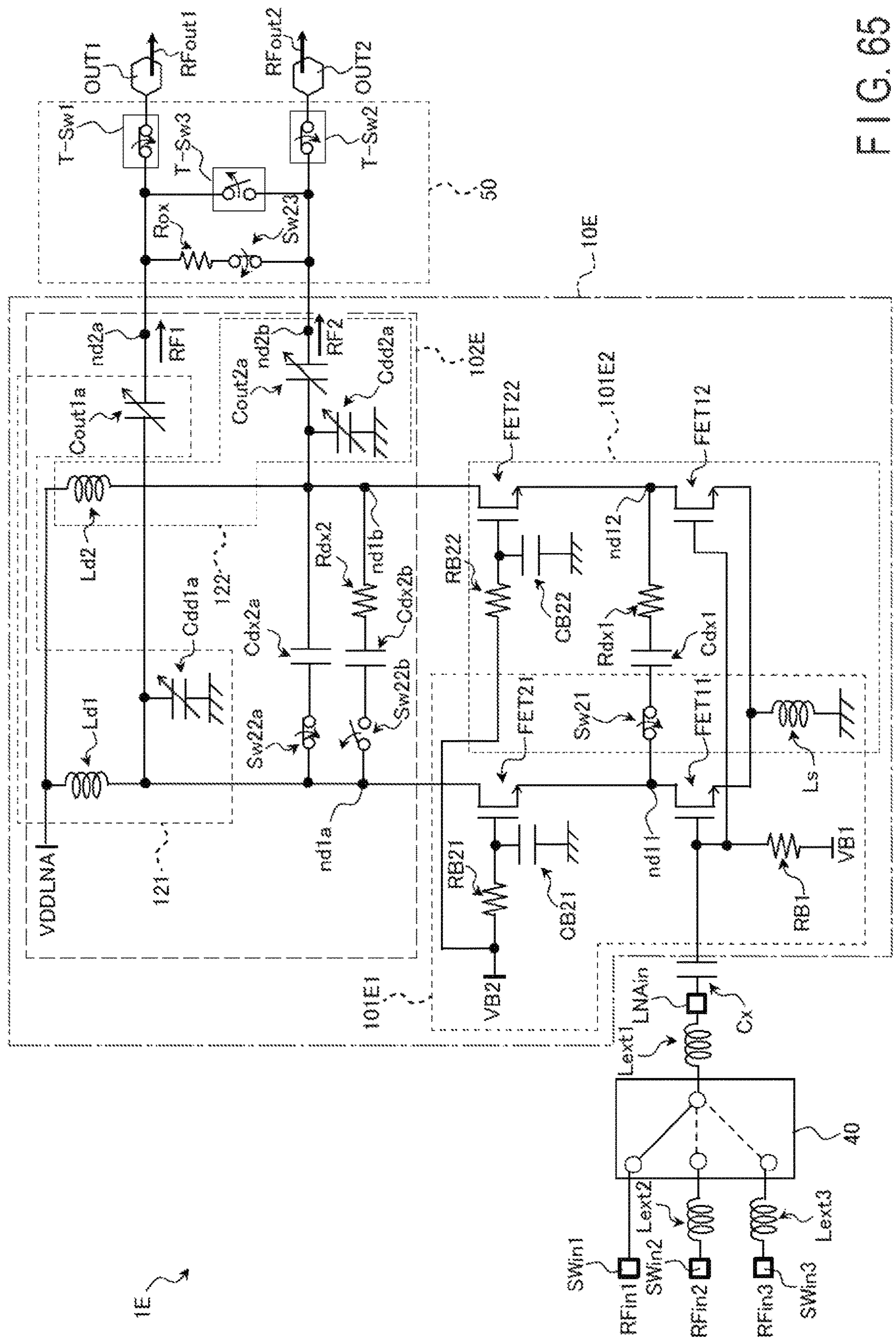

FIGS. 63 and 65 will be referred to for explaining an exemplary operation of the LNA 1E according to the embodiment when operating under the split output mode.

FIG. 65 is a schematic diagram for describing the exemplary operation of the LNA 1E in the split output mode.

According to the embodiment, the LNA 1E uses both the output terminals OUT1 and OUT2 for signal outputting operations in the split output mode, as in the foregoing embodiments.

For example, under the split output mode as shown in (a) of FIG. 63 and FIG. 65, both the T-switches T-Sw1 and T-Sw2 turn on. The T-switch T-Sw3 turns off.

Accordingly, the LNA 1E is placed in the condition where the radio-frequency signals can be output from its two output terminals for the split output mode.

According to the embodiment, in the split output mode, the on/off states of the switches Sw21, Sw22*a*, and Sw22*b* in the amplifier circuit 10E, and the switch Sw23 in the output combiner circuit 50 are controlled according to the frequency band selected by the band select circuit 40.

When, for example, the first frequency band (e.g., from 859 MHz to 960 MHz) is selected, the switches Sw21, Sw22*a*, and Sw23 turn on as shown in (a) of FIG. 63.

This sets the capacitors Cdx1 and Cdx2*a* and the resistor Rdx1, which are in the amplifier circuit 10E, in the effective state. The resistor Rox in the output combiner circuit 50 is set in the effective state.

The switch Sw22*b* turns off. Accordingly, the capacitor Cdx2*b* and the resistor Rdx2 in the amplifier circuit 10E are set in the ineffective state.

As such, upon selection of the first frequency band, the communication path between the nodes nd11 and nd12 via the capacitor Cdx1 and the resistor Rdx1, the communication path between the nodes nd1*a* and nd1*b* via the capacitor Cdx2*a*, and the communication path between the nodes nd2*a* and nd2*b* via the resistor Rox are formed.

Note that FIG. 65 refers to the condition of the LNA 1E where the first frequency band is selected.

When the second frequency band (e.g., from 717 MHz to 821 MHz) is selected, the switches Sw21, Sw22*a*, and Sw23 turn on and the switch Sw22*b* turns off as in the case of selecting the first frequency band.

Thus, upon selection of the second frequency band, the multiple communication paths are formed between the nodes of the respective sets as in the case of selecting the first frequency band.

When the third frequency band (e.g., from 617 MHz to 652 MHz) is selected, the switch Sw22*b* turns on. This sets the capacitor Cdx2*b* and the resistor Rdx2 in the effective state.

The switches Sw21, Sw22*a*, and Sw23 turn off. This sets the capacitors Cdx1 and Cdx2*a* and the resistors Rdx1 and Rox in the ineffective state.

As such, upon selection of the third frequency band, the communication path between the nodes nd1*a* and nd1*b* via the capacitor Cdx2*b* and the resistor Rdx2 is formed.

The radio-frequency signals of the selected frequency band thus travel from the input terminal LNAin to the output terminals OUT through the formed communication paths.

As shown in (b) of FIG. 63, the variable capacitors Cdd1*a* and Cdd2*a* and the variable capacitors Cout1*a* and Cout2*a* in the split output mode are controlled to have the values of capacitance according to the frequency band selected by the band select circuit 40. Thus, the magnitude of the impedance of the amplifier circuit 10E (for example, the input impedance of the amplifier circuit for the band select circuit 40 and/or the output impedance of the amplifier circuit for the output combiner circuit 50) is controlled according to the selected frequency band.

The signals that have been transmitted to the output combiner circuit 50 are output via the two output terminals OUT1 and OUT2 to the subsequent circuitry component.

In this manner, the LNA 1E according to the embodiment operates under the split output mode.

(6c) Characteristics

FIGS. 66 to 72 will be referred to for describing the characteristics of the LNA according to the embodiment.

FIGS. 66 to 71 show simulation results obtained with the LNA 1E of an exemplary configuration according to the embodiment.

(a) of respective FIGS. 66 to 71 are each a graph showing relationships between frequencies and the S parameters of the LNA 1E according to the embodiment. In each graph (a) of FIGS. 66 to 71, frequency characteristics for the S parameters S11 (=S(1,1)), S22 (=S(2,2)), S21 (=S(2,1)), and S23 (=S(2,3)) are shown. In the S parameters, port "1" refers to the active terminal among the multiple input terminals SWin, port "2" refers to the output terminal OUT1 of the LNA 1E, and port "3" refers to the output terminal OUT2 of the LNA 1E.

In each graph (a) of FIGS. 66 to 71, the horizontal axis indicates frequencies (unit: GHz) and the vertical axis indicates values of gain or loss (unit: dB).

(b) of respective FIGS. 66 to 71 are each a graph showing relationships between frequencies and the noise figures of the LNA 1E according to the embodiment.

In each graph (b) of FIGS. 66 to 71, the horizontal axis indicates frequencies (unit: GHz) and the vertical axis indicates noise figures (unit: dB).

In the context of the present embodiment, the first frequency band refers to the frequency band ranging from 859 MHz to 960 MHz, the second frequency band refers to the frequency band ranging from 717 MHz to 821 MHz, and the third frequency band refers to the frequency band ranging from 617 MHz to 652 MHz.

In these simulations, the voltage VDDLNA supplied to the LNA 1E according to the embodiment was set to 1.2V.

Figure 66:
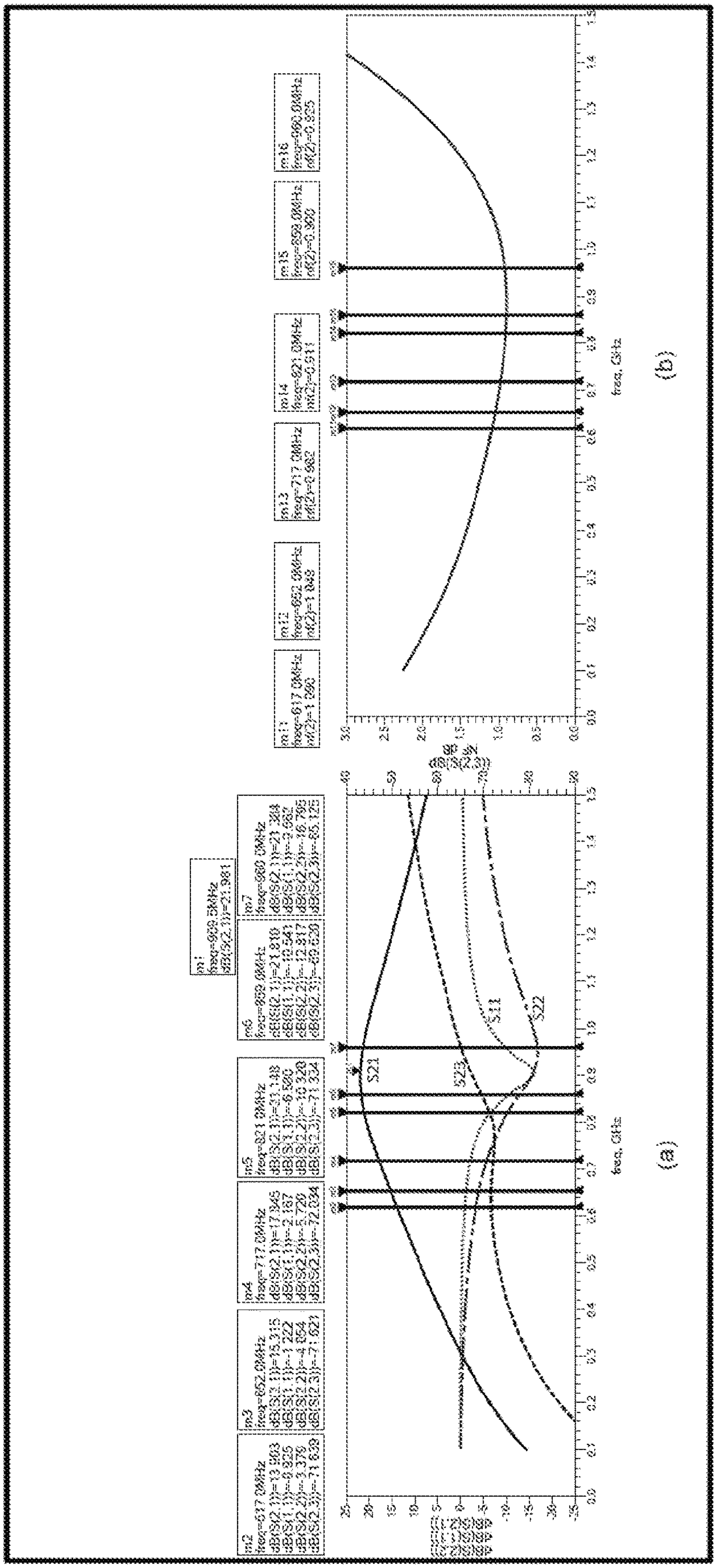

FIG. 66 is for the small-signal characteristics of the LNA 1E according to the embodiment, given in the single output mode with the first frequency band.

As shown in (a) of FIG. 66, the band center gain (S21) with the frequency band from "m6" (859 MHz) to "m7" (960 MHz) is 21.981 dB. The return losses (S11) are −9.662 dB or less. The return losses (S22) are −12.817 dB or less. The parameter S23 values are −65.125 dB or less.

As shown in (b) of FIG. 66, the noise figures with the frequency band from "m15" (859 MHz) to "m16" (960 MHz) vary within the range from 0.900 dB to 0.925 dB.

Figure 67:
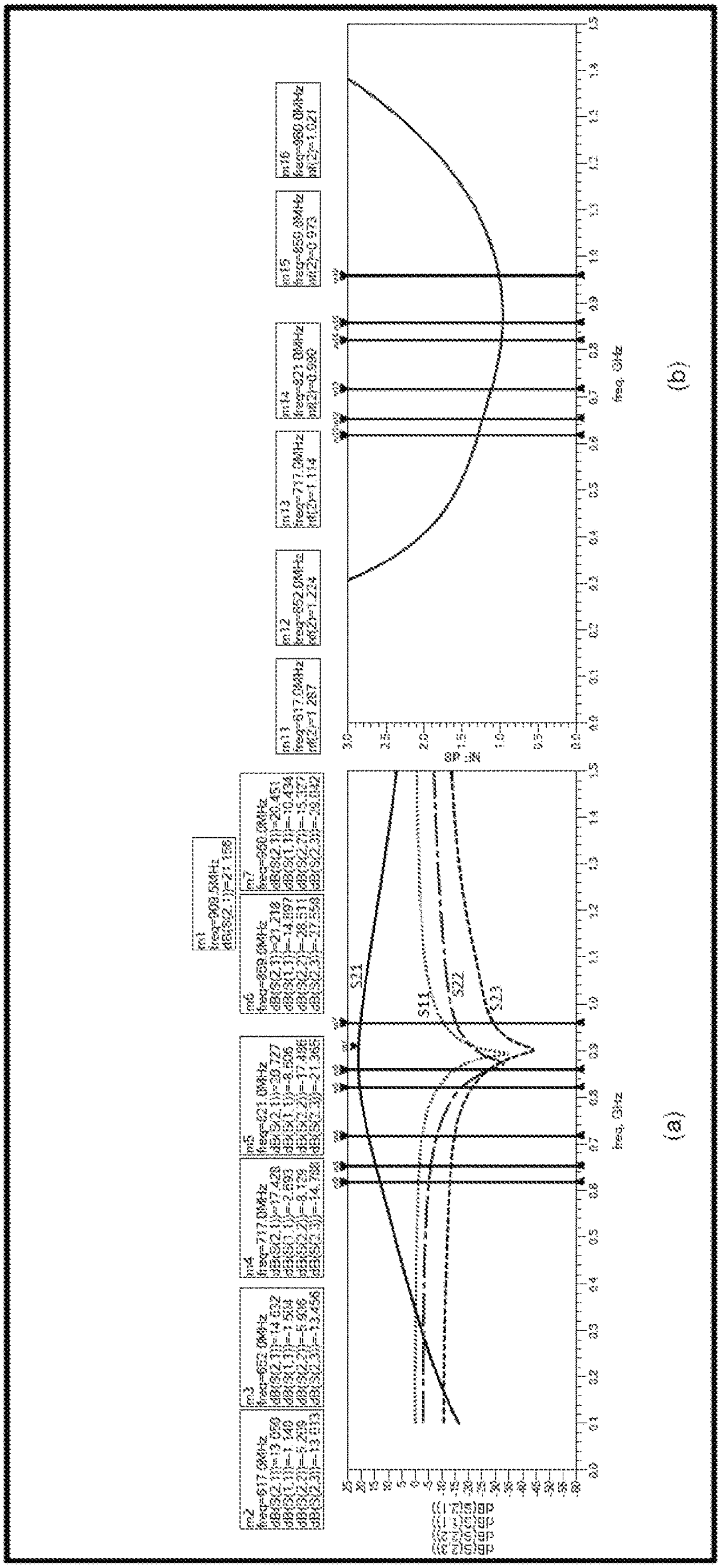

FIG. 67 is for the small-signal characteristics of the LNA 1E according to the embodiment, given in the split output mode with the first frequency band.

As shown in (a) of FIG. 67, the band center gain (S21) with the frequency band from "m6" (859 MHz) to "m7" (960 MHz) is 21.156 dB. The return losses (S11) are −10.434 dB or less. The return losses (S22) are −15.327 dB or less. The parameter S23 values are −27.558 dB or less.

As shown in (b) of FIG. 67, the noise figures with the frequency band from "m15" (859 MHz) to "m16" (960 MHz) vary within the range from 0.973 dB to 1.021 dB.

Figure 68:
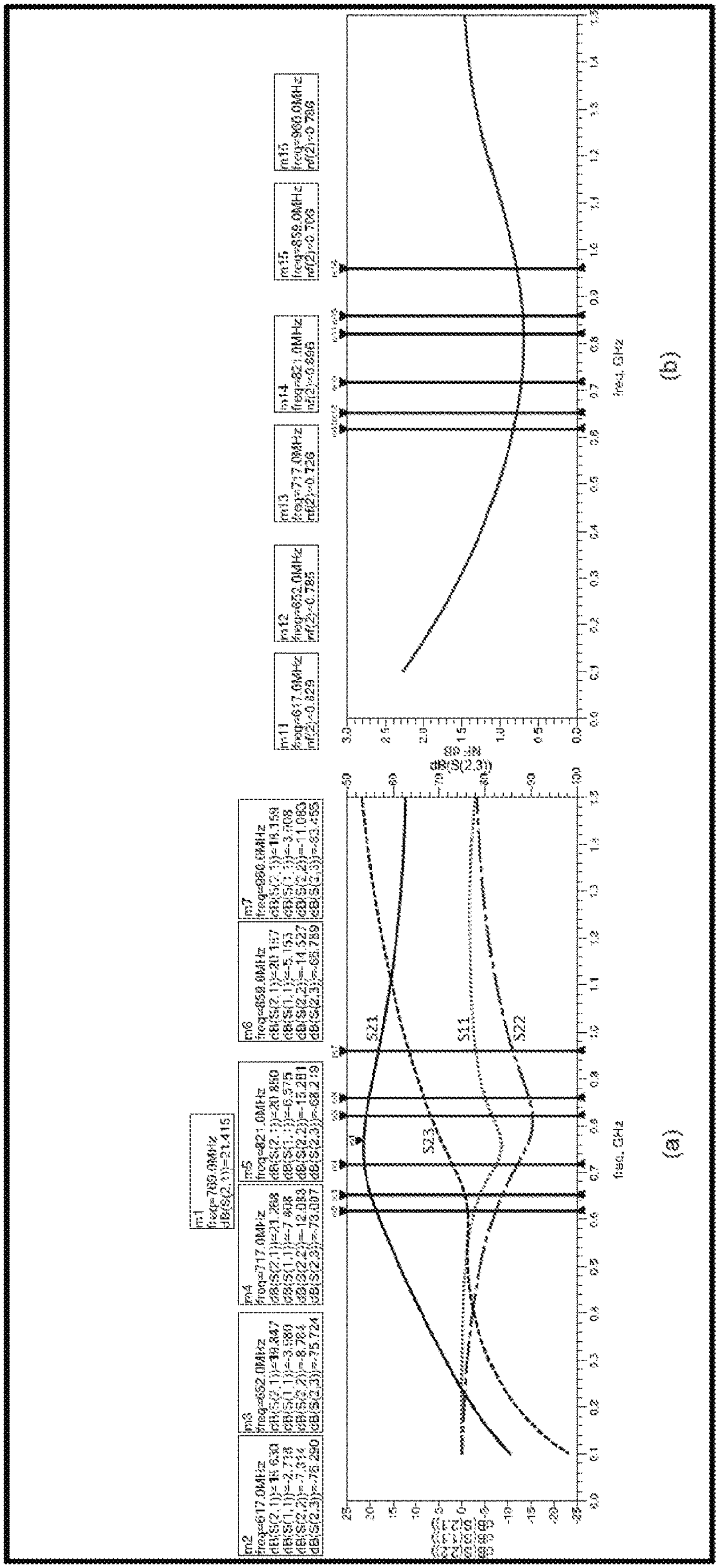

FIG. 68 is for the small-signal characteristics of the LNA 1E according to the embodiment, given in the single output mode with the second frequency band.

As shown in (a) of FIG. 68, the band center gain (S21) with the frequency band from "m4" (717 MHz) to "m5" (821 MHz) is 21.415 dB. The return losses (S11) are −6.575 dB or less. The return losses (S22) are −12.083 dB or less. The parameter S23 values are −68.219 dB or less.

As shown in (b) of FIG. 68, the noise figures with the frequency band from "m13" (717 MHz) to "m14" (821 MHz) vary within the range from 0.726 dB to 0.696 dB.

Figure 69:
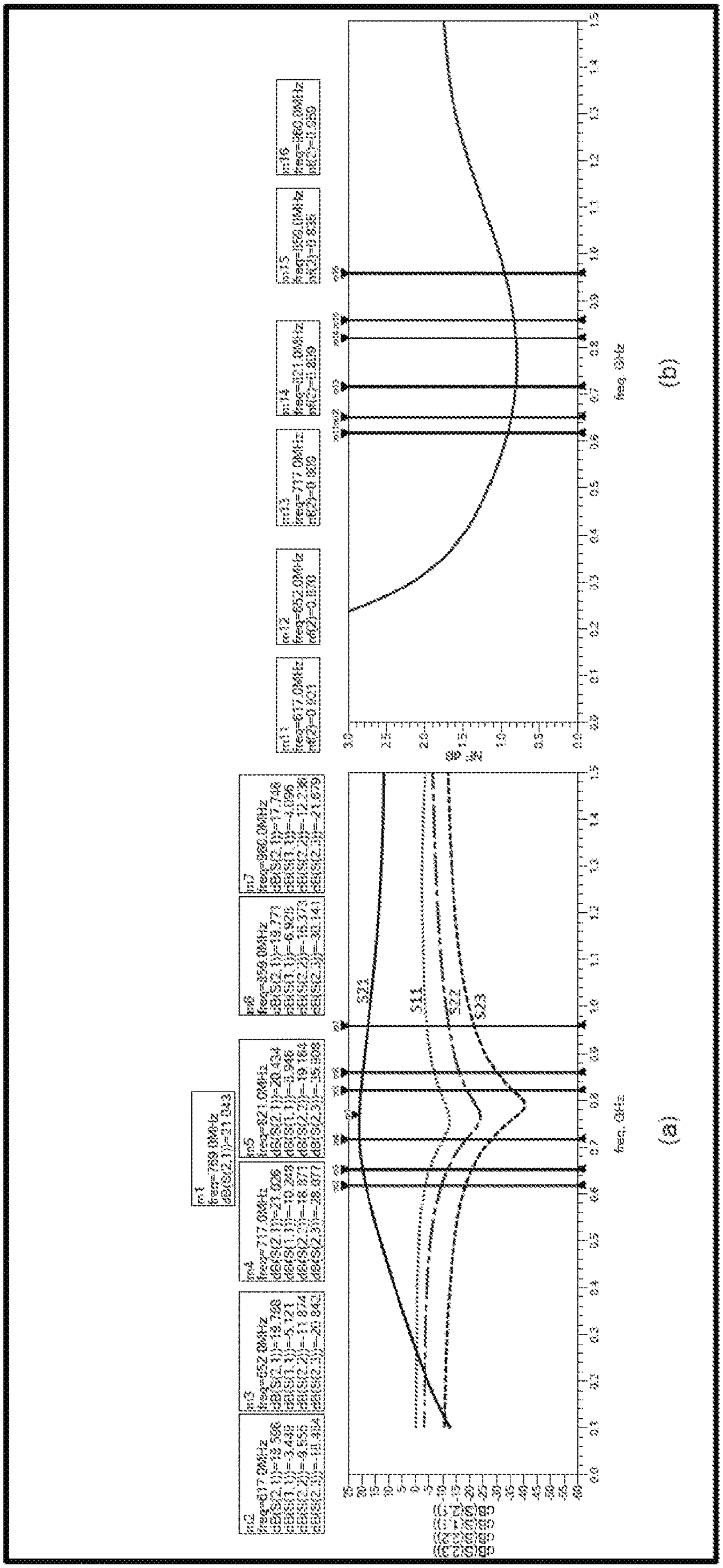

FIG. 69 is for the small-signal characteristics of the LNA 1E according to the embodiment, given in the split output mode with the second frequency band.

As shown in (a) of FIG. 69, the band center gain (S21) with the frequency band from "m4" (717 MHz) to "m5" (821 MHz) is 21.043 dB. The return losses (S11) are −8.946 dB or less. The return losses (S22) are −18.871 dB or less. The parameter S23 values are −28.077 dB or less.

As shown in (b) of FIG. 69, the noise figures with the frequency band from "m13" (717 MHz) to "m14" (821 MHz) are approximately 0.81 dB.

Figure 70:
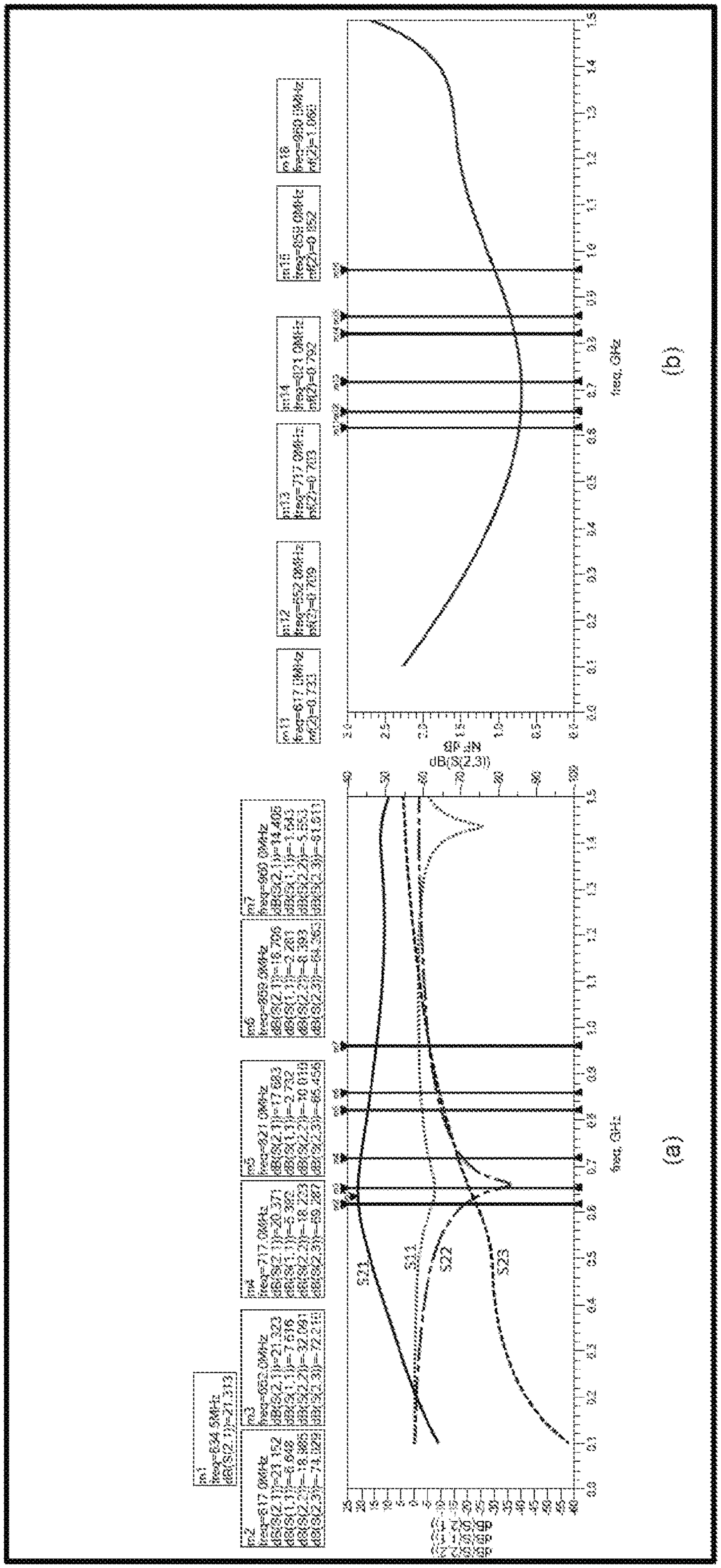

FIG. 70 is for the small-signal characteristics of the LNA 1E according to the embodiment, given in the single output mode with the third frequency band.

As shown in (a) of FIG. 70, the band center gain (S21) with the frequency band from "m2" (617 MHz) to "m3" (652 MHz) is 21.313 dB. The return losses (S11) are −6.648 dB or less. The return losses (S22) are −18.985 dB or less. The parameter S23 values are −72.21 dB or less.

As shown in (b) of FIG. 70, the noise figures with the frequency band from "m11" (617 MHz) to "m12" (652 MHz) vary within the range from 0.733 dB to 0.709 dB.

Figure 71:
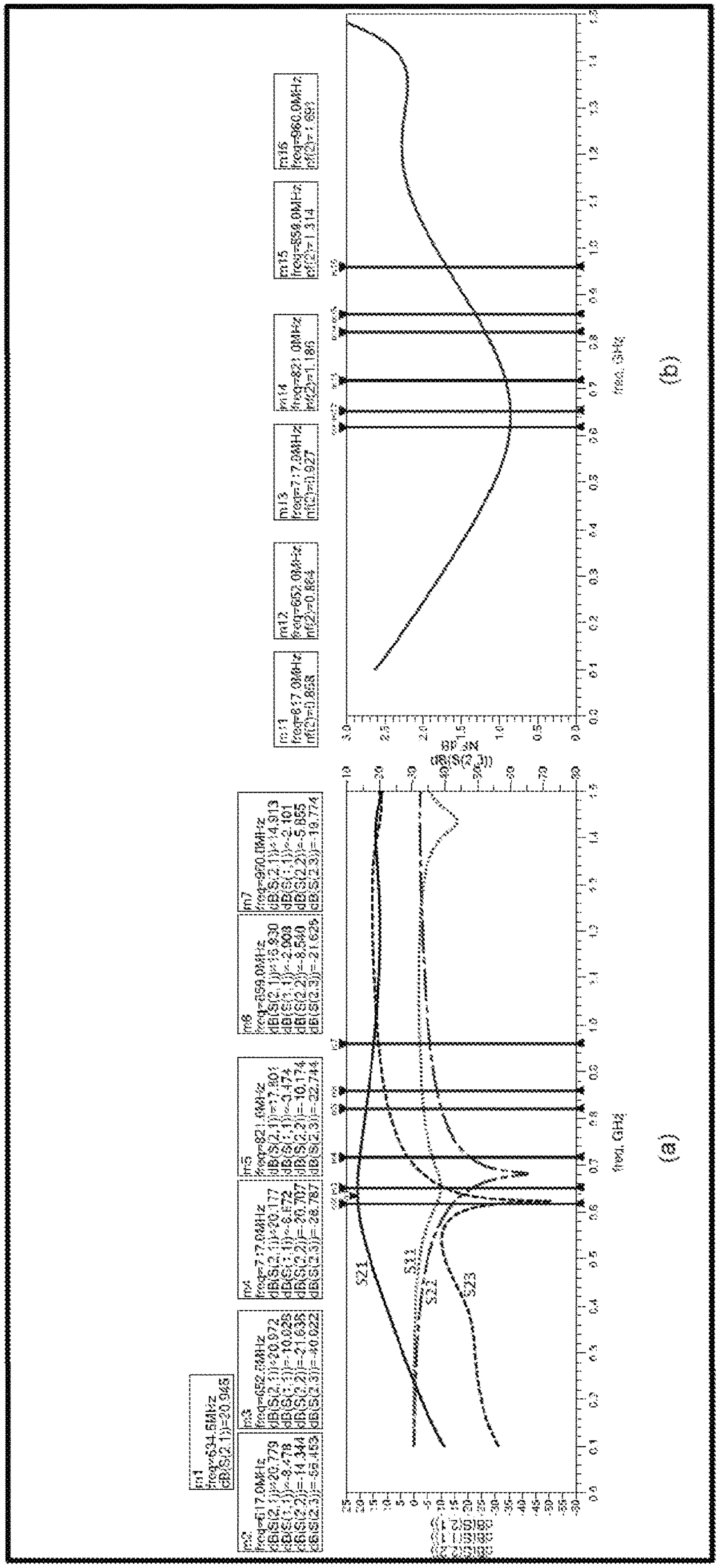

FIG. 71 is for the small-signal characteristics of the LNA 1E according to the embodiment, given in the split output mode with the third frequency band.

As shown in (a) of FIG. 71, the band center gain (S21) with the frequency band from "m2" (617 MHz) to "m3" (652 MHz) is 20.945 dB. The return losses (S11) are −8.478 dB or less. The return losses (S22) are −14.344 dB or less. The parameter S23 values are −40.022 dB or less.

As shown in (b) of FIG. 71, the noise figures with the frequency band from "m11" (617 MHz) to "m12" (652 MHz) are approximately 0.86 dB.

It is understood from FIGS. 66 to 71 that the S parameters and the noise figures each show a profile according to the frequencies of the supplied radio-frequency signals and the mode for operation of the LNA 1E.

FIG. 72 is a list of the simulation results for the small-signal characteristics of the LNA 1E according to the embodiment.

In FIG. 72, the values at the band center are noted for the S parameter "S21". For each of the noise figure NF and the S parameters "S11", "S22", and "S23", the worst values within the band are noted.

In the present embodiment, the "S23" parameter may take the worst value when the LNA 1E operates under the split output mode. In one example, the worst value of the "S23" parameter in the embodiment is −27.6 dB.

As such, even taking the worst value of the "S23" parameter into consideration, the "S23" parameter values of the LNA 1E according to the embodiment can secure a sufficient margin from the generally required, standard "S23" parameter value (e.g., −25 dB).

That is, the LNA 1E according to the sixth embodiment can provide improved characteristics while realizing various modes for operation.

(7) Seventh Embodiment

An LNA according to the seventh embodiment will be described with reference to FIGS. 73 to 91.

(7a) Exemplary Configuration

Figure 73:
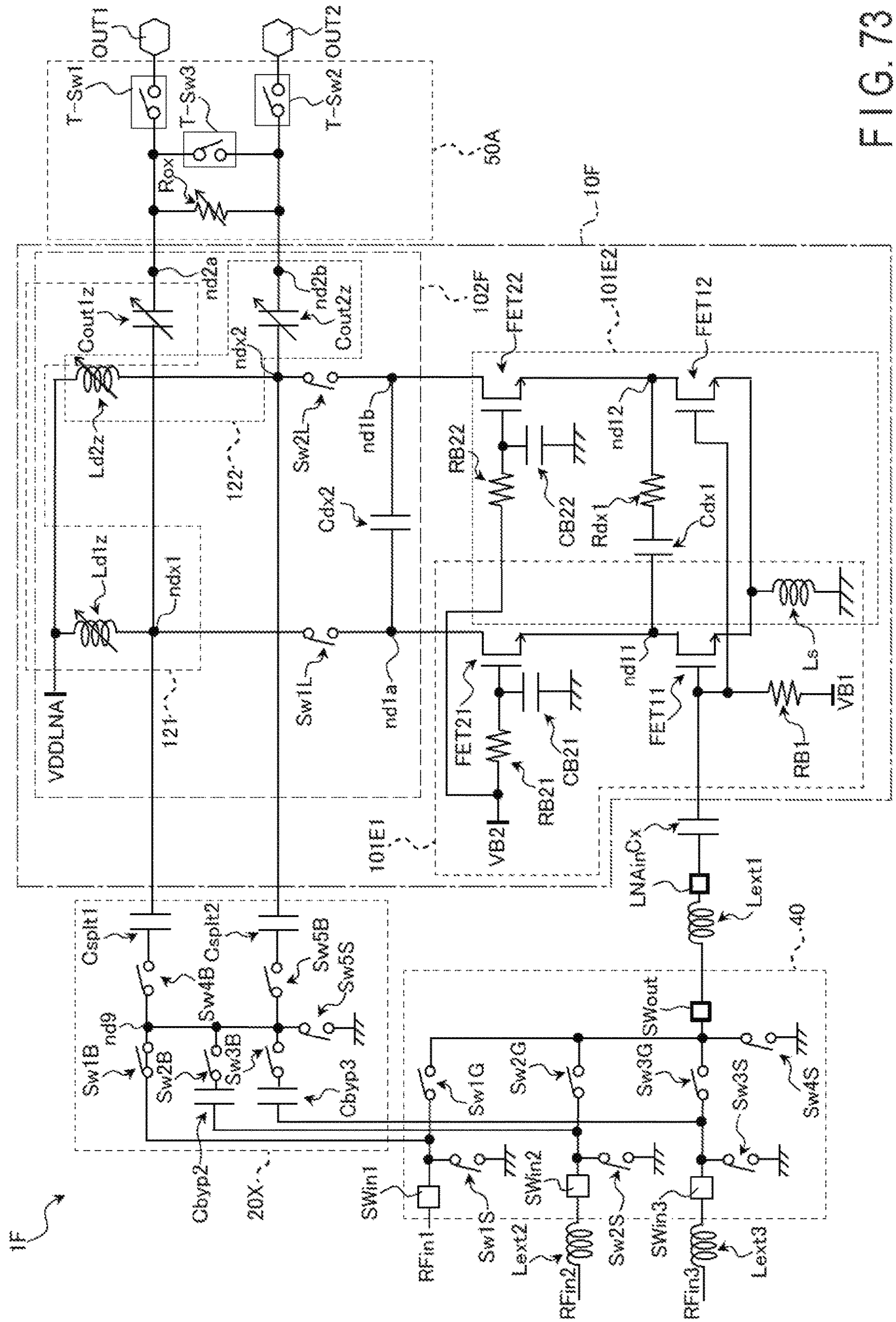
FIG. 73 is a circuit diagram showing an exemplary configuration of an LNA according to a seventh embodiment.

FIG. 73 is a circuit diagram showing an exemplary configuration of an LNA 1F according to the embodiment.

The present embodiment differs from the sixth embodiment in that the LNA 1F further includes a bypass circuit for the bypass mode. This enables the LNA 1F according to the embodiment to operate under the bypass mode.

<Amplifier Circuit>

As shown in FIG. 73, a cascode connection amplifier circuit 10F includes, as in the sixth embodiment (cf. FIG. 62), the two core circuits 101E1 and 101E2.

The two core circuits 101E1 and 101E2 are connected to the common inductor Ls for source degeneration. Note that the capacitor Cx and the inductor Lext1 (and the inductor Ls) function as an input matching circuit for the two core circuits 101E1 and 101E2.

In the core circuit 101E1, the transistor FET11 and the transistor FET21 are connected in series between the inductor Ls and the node nd1*a*.

In the core circuit 101E2, the transistor FET12 and the transistor FET22 are connected in series between the inductor Ls and the node nd1*b*.

According to the present embodiment, the capacitor Cdx1 and the resistor Rdx1 are connected in series between the node nd11 and the node nd12, without a switch element.

Due to this, the capacitor Cdx1 and the resistor Rdx1 are always in the effective state, irrespective of the operational modes of the LNA 1F.

The capacitor Cdx1 and the resistor Rdx1 as such improve the characteristics of the LNA 1F according to the embodiment when operating under the split output mode.

The output matching circuit 102F includes variable inductors Ld1*z* and Ld2*z*, a capacitor Cdx2, variable capacitors Cout1*z* and Cout2*z*, and switches Sw1L and Sw2L.

One terminal of the variable inductor Ld1*z* is connected to the voltage terminal VDDLNA. The other terminal of the variable inductor Ld1*z* is connected to a node ndx1.

One terminal of the variable inductor Ld2*z* is connected to the voltage terminal VDDLNA. The other terminal of the variable inductor Ld2*z* is connected to a node ndx2.

One terminal of the variable capacitor Cout1*z* is connected to the node ndx1. The other terminal of the variable capacitor Cout1*z* is connected to the node nd2*a*.

One terminal of the variable capacitor Cout2*z* is connected to the node ndx2. The other terminal of the variable capacitor Cour2*z* is connected to the node nd2*b*.

One terminal of the switch Sw1L is connected to the node ndx1. The other terminal of the switch Sw1L is connected to the node nd1*a*.

One terminal of the switch Sw2L is connected to the node ndx2. The other terminal of the switch Sw2L is connected to the node nd1*b*.

According to the embodiment, the capacitor Cdx2 is connected between the node nd1*a* and the node nd1*b*, without a switch element. One terminal of the capacitor Cdx2 is connected to the node nd1*a*. The other terminal of the capacitor Cdx2 is connected to the node nd1*b*. Due to this, the capacitor Cdx2 is always in the effective state, irrespective of the operational modes of the LNA 1F.

The capacitor Cdx2 as such improves the characteristics of the LNA 1F according to the embodiment when operating under the split output mode.

The variable inductors Ld1*z* and Ld2*z* function as parallel variable inductors. The variable capacitors Cout1*z* and Cout2*z* function as series variable capacitors.

In one example, the variable inductors Ld1*z* and Ld2*z* are controlled so that the variable inductors Ld1*z* and Ld2*z* have the same inductance value. The variable capacitors Cout1*z* and Cout2*z* may be controlled so that they have the same capacitance value.

It is additionally noted that, instead of employing variable inductors to parallel inductors connected to the voltage terminal VDDLNA, parallel variable capacitors may be provided in the output matching circuit 102F in a manner similar to the fourth embodiment (cf. FIG. 47).

<Band Select Circuit>

The band select circuit 40 has a circuit configuration substantially the same as those of the band select circuits in the foregoing embodiments.

The band select circuit 40 includes the multiple input terminals SWin1, SWin2, and SWin3. The multiple input terminals SWin1, SWin2, and SWin3 are adapted to receive respective radio-frequency signals RFin1, RFin2, and RFin3 of frequency bands differing from one another.

The input terminals SWin1, SWin2, and SWin3 are each connected to the output terminal SWout via the corresponding one of the multiple switches Sw1G, Sw2G, and Sw3G.

When the LNA 1F according to the embodiment operates under the amplification mode, the radio-frequency signals are sent to the output terminal SWout via the switch turned on in accordance with the selected frequency band, i.e., one of the switches Sw1G, Sw2G, and Sw3G.

<Bypass Circuit>

The bypass circuit 20X of the LNA 1F according to the embodiment is arranged between the band select circuit 40 and the internal nodes ndx1 and ndx2 of the output matching circuit 102F.

The bypass circuit 20X includes multiple capacitors Cbyp2, Cbyp3, Csplt1, and Csplt2, and multiple switches Sw1B, Sw2B, Sw3B, Sw4B, Sw5B, and Sw5S.

One terminal of the switch Sw1B is connected to the first input terminal SWin1 of the band select circuit 40. The other terminal of the switch Sw1B is connected to a node nd9.

One terminal of the capacitor Cbyp2 is connected to the second input terminal SWin2 of the band select circuit 40. The other terminal of the capacitor Cbyp2 is connected to one terminal of the switch Sw2B. The other terminal of the switch Sw2B is connected to the node nd9.

With the capacitor Cbyp2, the influence of the external inductor Lext2 can be mitigated by the series resonance effect.

One terminal of the capacitor Cbyp3 is connected to the third input terminal SWin3 of the band select circuit 40. The other terminal of the capacitor Cbyp3 is connected to one terminal of the switch Sw3B. The other terminal of the switch Sw3B is connected to the node nd9.

With the capacitor Cbyp3, the influence of the external inductor Lext3 can be mitigated by the series resonance effect.

For example, the switches Sw1B, Sw2B, and Sw3B each function as an input node (together as an input node set) of the bypass circuit 20X. In concordance with the radio-frequency signals to be received, one of the switches Sw1B, Sw2B, and Sw3B functions as an effective input node.

One terminal of the switch Sw5S is connected to the node nd9. The other terminal of the switch Sw5S is connected to the ground terminal. The switch Sw5S functions as a shunt switch. The switch Sw5S turns on when the bypass circuit 20X is not active. The switch Sw5S thus connects the node nd9 in the non-active state to the ground terminal.

The capacitor Csplt1 and the switch Sw4B are connected in series between the node ndx1 and the node nd9.

One terminal of the switch Sw4B is connected to the node nd9. The other terminal of the switch Sw4B is connected to one terminal of the capacitor Csplt1. The other terminal of the capacitor Csplt1 is connected to the node ndx1. For example, the other terminal of the switch Sw4B functions as a first output node of the bypass circuit 20X.

The capacitor Csplt2 and the switch Sw5B are connected in series between the node ndx2 and the node nd9. In one example, the capacitance value of the capacitor Csplt2 is the same as that of the capacitor Csplt1.

One terminal of the switch Sw5B is connected to the node nd9. The other terminal of the switch Sw5B is connected to one terminal of the capacitor Csplt2. The other terminal of the capacitor Csplt2 is connected to the node ndx2. In an exemplary configuration, the other terminal of the switch Sw5B functions as a second output node of the bypass circuit 20X.

When the LNA 1F according to the embodiment operates under the bypass mode, one of the multiple switches Sw1B, Sw2B, and Sw3B turns on based on the selected frequency band. Accordingly, the bypass route including the on-state switch in the bypass circuit 20X is placed in the effective state. The formed bypass route extends from the corresponding input terminal SWin of the band select circuit 40 to the output combiner circuit 50A.

Under the bypass mode, the radio-frequency signals are sent to the output combiner circuit 50A via the switch turned on in accordance with the selected frequency band: one of the switches Sw1B, Sw2B, and Sw3B.

In exemplary implementations, the switches Sw1B, Sw2B, Sw3B, Sw4B, Sw5B, and Sw5S may be on/off-controlled by an RFIC circuit, or by the control circuit 990 (or the RFIC 940).

<Output Combiner Circuit>

The output combiner circuit 50A includes, as in the sixth embodiment, three T-switches T-Sw1, T-Sw2, and T-Sw3.

According to the embodiment, a variable resistor Rox is connected between the nodes nd2*a* and nd2*b* without an intervening switch element.

The variable resistor Rox improves the characteristics of the LNA 1F according to the embodiment when operating under the split output mode.

Yet, a switch element may be provided between the variable resistor Rox and the node nd2*a* for controlling the effective/ineffective state of the variable resistor Rox.

(7b) Exemplary Operations

Exemplary operations of the LNA according to the embodiment will be described with reference to FIGS. 74 to 78.

FIG. 74 is a diagram for explaining an exemplary operation of the LNA 1F according to the embodiment.

As shown in FIG. 74, the LNA 1F according to the embodiment can realize twelve modes for operation by controlling the on/off states of its switches.

<Amplification Mode>

Figure 75:
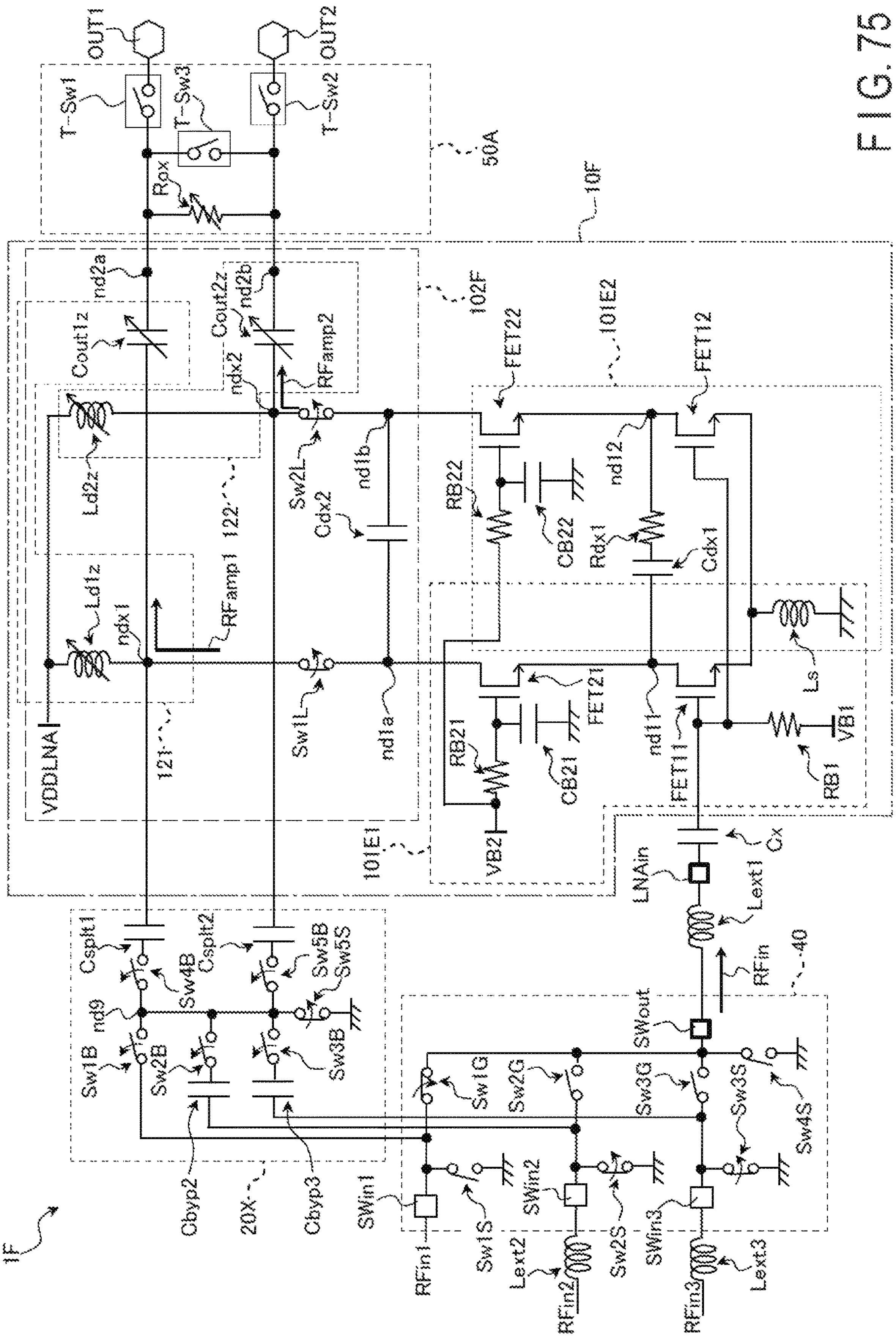

FIGS. 74 and 75 will be referred to for explaining an exemplary operation of the LNA 1F according to the embodiment when operating under the amplification mode.

FIG. 75 schematically shows the communication paths for the signals to reach the respective nodes nd2*a* and nd2*b* in the LNA 1F.

In amplification mode of the LNA 1F, the switches Sw1B, Sw2B, Sw3B, Sw4B, and Sw5B in the bypass circuit 20X turn off. The shunt switch Sw5S turns on.

This causes the bypass circuit 20X to be electrically separated from the amplifier circuit 10F. Thus, the bypass circuit 20X is set in the ineffective state in the amplification mode. Here, the input nodes of the bypass circuit 20X (nodes including the on-state switch among the respective switches Sw1B, Sw2B, and Sw3B) are in the state of having no conduction with the nodes connected with the switches Sw4B and Sw5B (e.g., the nodes ndx1 and ndx2).

In the band select circuit 40, one of the multiple switches Sw1G, Sw2G, and Sw3G turns on according to the selected frequency band. The shunt switch Sw4S turns off. Among the other multiple shunt switches Sw1S, Sw2S, and Sw3S in the band select circuit 40, the one connected to the signal path traveling the signals of the selected frequency band turns off and the ones connected to the signal paths for the signals of non-selected frequency bands turn on.

One of the multiple input terminals SWin is electrically connected to the input terminal LNAin of the amplifier circuit 10F via the on-state switch Sw1G, Sw2G, or Sw3G.

This allows for the radio-frequency signal RFin to be supplied to the core circuits 101E1 and 101E2 of the amplifier circuit 10F.

In the amplification mode, both the switches Sw1L and Sw2L in the amplifier circuit 10F turn on.

The core circuits 101E1 and 101E2 each amplify the supplied radio-frequency signal RFin.

The amplified signal RFamp1 is sent to the node nd2*a* via the on-state switch Sw1L and the variable capacitor Cout1*z*. The amplified signal RFamp2 is sent to the node nd2*b* via the on-state switch Sw2L and the variable capacitor Cout2*z*.

Note that, as shown in FIG. 74 for example, the inductance values of the variable inductors Ld1*z* and Ld2*z* and the capacitance values of the variable capacitors Cout1z and Cout2z for the amplification mode are set as appropriate according to the selected frequency band.

In this manner, the LNA 1F according to the embodiment operates under the amplification mode.

<Bypass Mode>

Figure 76:
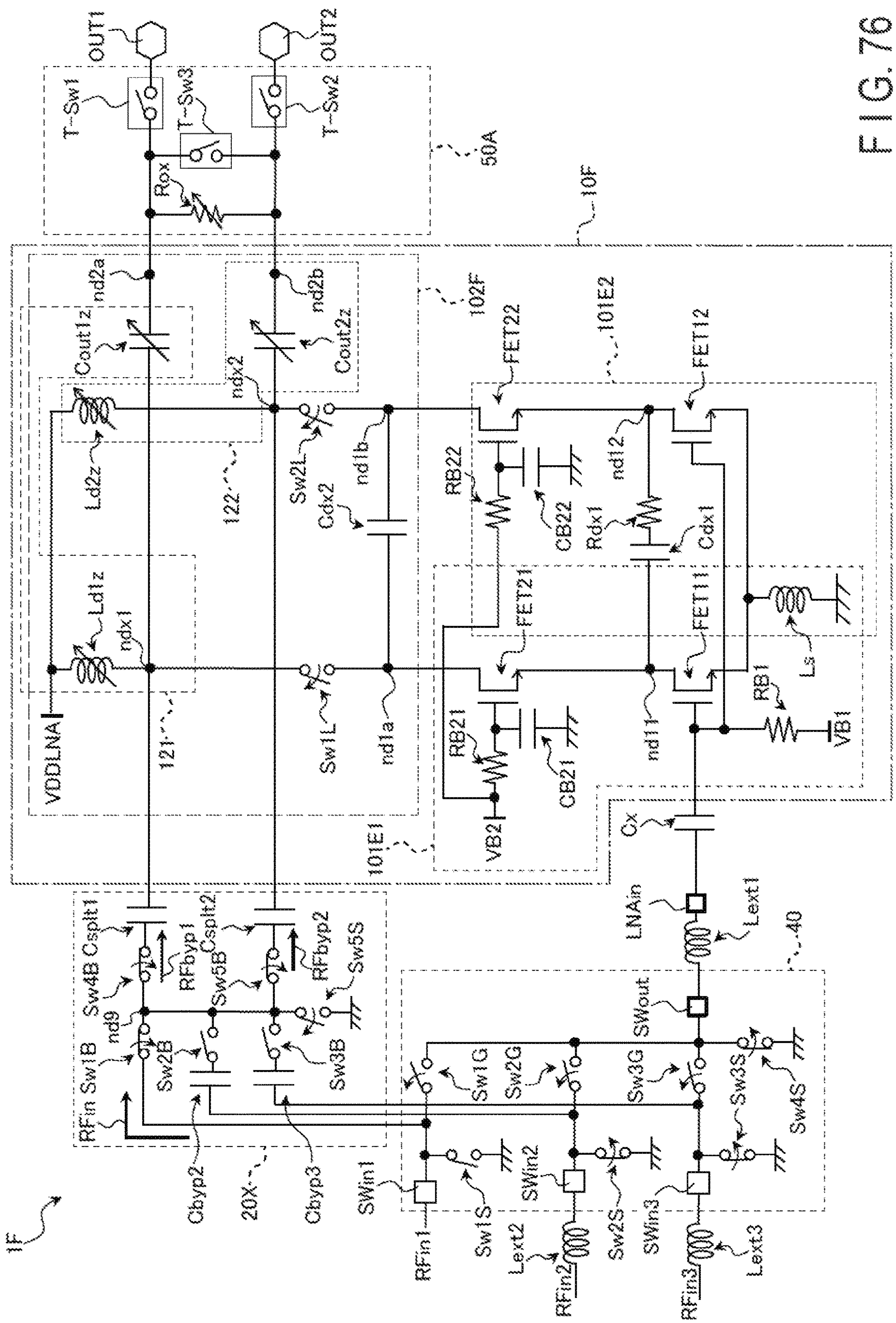

FIGS. 74 and 76 will be referred to for explaining an exemplary operation of the LNA 1F according to the embodiment when operating under the bypass mode.

FIG. 76 schematically shows the communication paths for the signals to reach the respective nodes nd2a and nd2b in the LNA 1F.

In the bypass mode, the switches Sw1L and Sw2L turn off. This causes the core circuits 101E1 and 101E2 to be electrically separated from the nodes ndx1 and ndx2.

In the band select circuit 40, the switches Sw1G, Sw2G, and Sw3G turn off.

The on/off states of the multiple shunt switches Sw1S, Sw2S, and Sw3S are controlled according to the selected frequency band. The shunt switch Sw4S turns on.

In the bypass mode, one of the multiple switches Sw1B, Sw2B, and Sw3B turns on according to the selected frequency band. This causes the subject input terminal SWin to be electrically connected to the node nd9 via the on-state switch (and the corresponding capacitor Cbyp).

The switches Sw4B and Sw5B turn on. This causes the node nd9 to be electrically connected to the node nd1x and nd2x via the on-state switch Sw4B and Sw5B and the capacitor Csplt1 and Csplt2.

In the bypass circuit 20X, the radio-frequency signal RFin reaches the node nd9 via the on-state switch (and, if applicable, the corresponding capacitor Cbyp).

The radio-frequency signal RFin that has reached the node nd9 then travels to the nodes nd2a and nd2b through the respective routes including the corresponding ones of the on-state switches Sw4B and Sw5B and the capacitors Csplt1, Csplt2, Cout1z, and Cout2z.

For the operation in combination with the split output mode (described later), for example, the flow of the radio-frequency signal RFin that has reached the node nd9 branches into the side of the switch Sw4B (the side where the nodes ndx1 and nd2a are arranged) and the side of the switch Sw5B (the side where the nodes ndx2 and nd2b are arranged).

Here, in an exemplary operation, the capacitance values of the capacitors Csplt1 and Csplt2 (series capacitors), the inductance values of the variable inductors Ld1z and Ld2z (parallel inductors), the capacitance values of the variable capacitors Cout1z and Cout2z (serial capacitors), and the resistance value of the variable resistor Rox (which is in the output combiner circuit 50A) are set as shown in FIG. 74, so that the capacitors, the variable inductors, the variable capacitors, and the resistor can provide a splitter function.

As described above, the bypass circuit 20X is set in the effective state in the bypass mode of the LNA 1F according to the embodiment. In this case, the input node (the node including the on-state one of the switches Sw1B, Sw2B, and Sw3B) in the bypass circuit 20X is placed in the state of permitting conduction with the nodes ndx1 and ndx2 via the on-state switches Sw4B and Sw5B. The radio-frequency signal RFin is thus sent to the output combiner circuit 50A from the bypass circuit 20X via such conductive-state nodes.

In this manner, the LNA 1F according to the embodiment operates under the bypass mode.

<Single Output Mode>

Figure 77:
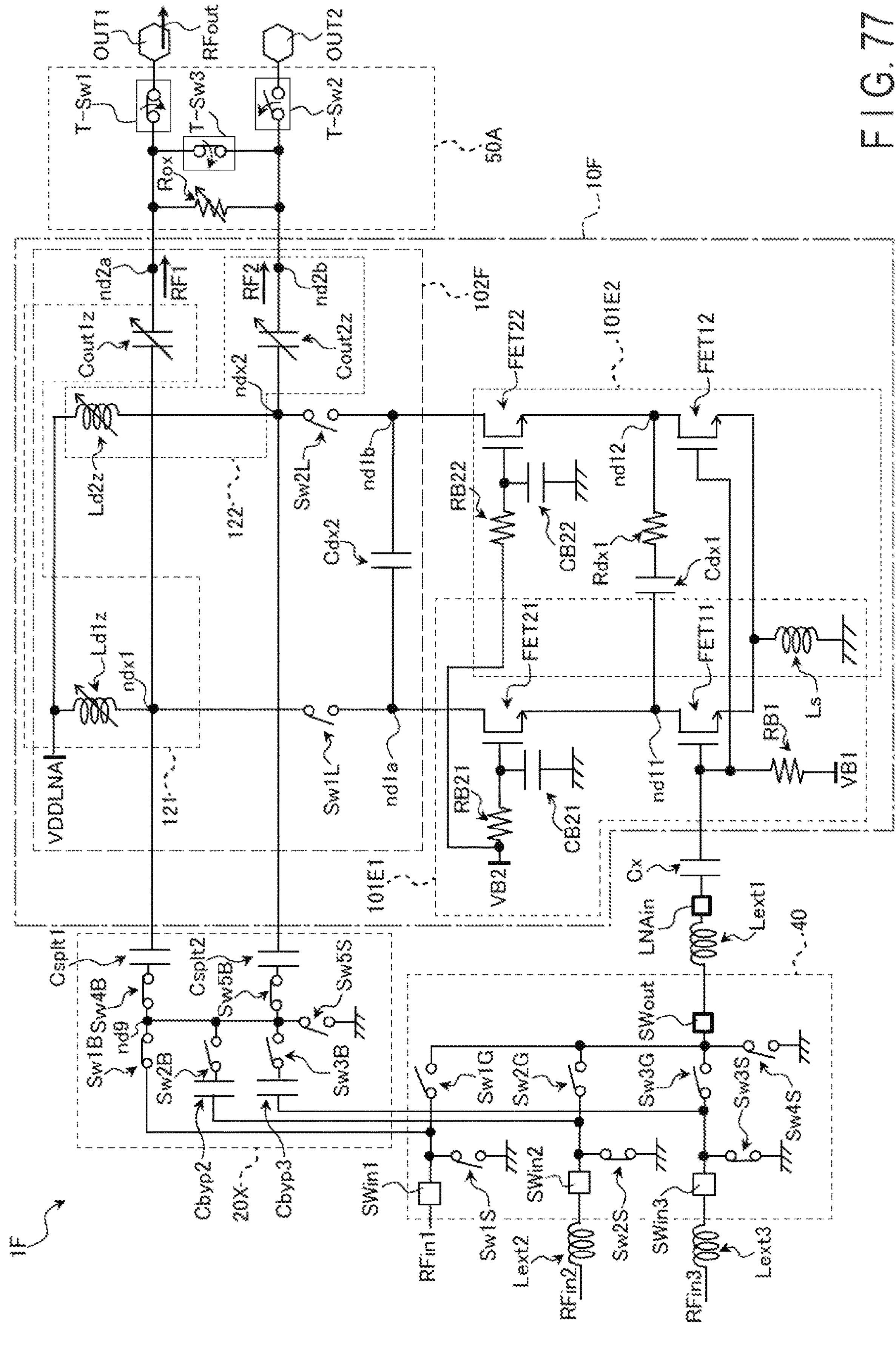

FIGS. 74 and 77 will be referred to for explaining an exemplary operation of the LNA 1F according to the embodiment when operating under the single output mode.

FIG. 77 schematically shows the communication paths for the signals to be transmitted from the nodes nd2a and nd2b toward the output terminal in the LNA 1F.

As shown in FIG. 77, when the LNA 1F according to the embodiment operates under the single output mode, either one of the T-switches T-Sw1 and T-Sw2 in the output combiner circuit 50A turns on according to the selected output terminal (the output terminal OUT1 in this example), as in the sixth embodiment. Thus, the LNA 1F according to the embodiment is placed in the state where the LNA can output signals using the selected one of the two output terminals OUT1 and OUT2.

The radio-frequency signals RF1 and RF2 are transmitted to the respective nodes nd2a and nd2b under the amplification mode or the bypass mode as described above.

The T-switch T-Sw3 turns on. Here, the effective-state variable resistor Rox is located between the two nodes nd2a and nd2b. Accordingly, the signal RF1 on the node nd2a is combined with the signal RF2 coming from the node nd2b side.

The combined signal is forwarded as the output signal RFout of the LNA 1F to the subsequent circuitry component from the selected one of the two output terminals OUT1 and OUT2 via the on-state T-switch.

In this manner, the LNA 1F according to the embodiment operates under the single output mode.

<Split Output Mode>

Figure 78:
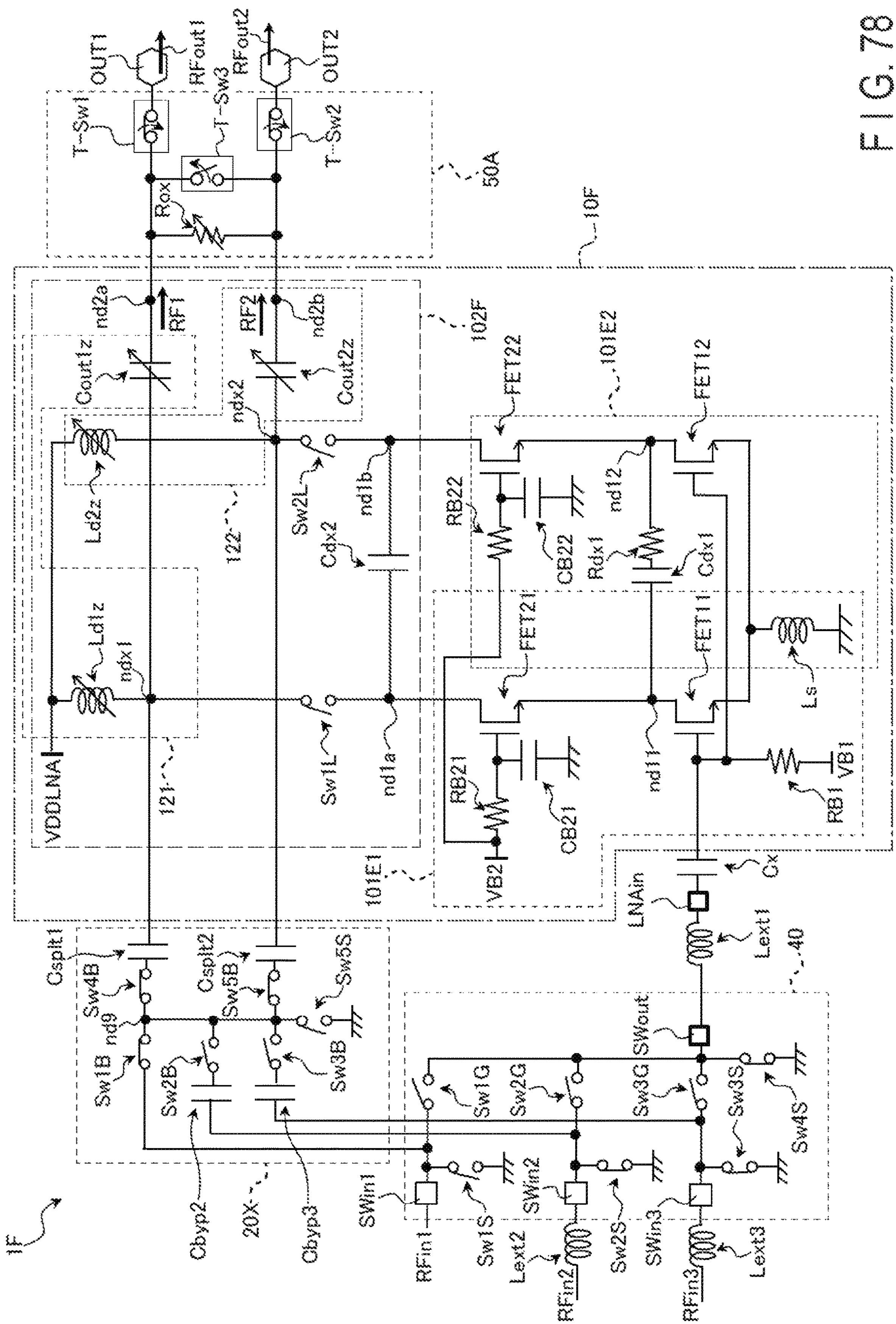

FIGS. 74 and 78 will be referred to for explaining an exemplary operation of the LNA 1F according to the embodiment when operating under the split output mode.

FIG. 78 schematically shows the communication paths for the signals to be transmitted from the nodes nd2a and nd2b toward the output terminals in the LNA 1F.

As shown in FIG. 78, when the LNA 1F according to the embodiment operates under the split output mode, both the T-switches T-Sw1 and T-Sw2 in the output combiner circuit 50A turn on as in the sixth embodiment. Thus, the LNA 1F according to the embodiment is placed in the state where the LNA can output signals using both the two output terminals OUT1 and OUT2.

In the split output mode, the T-switch T-Sw3 turns off.

Suppose that the signals RF1 and RF2 are transmitted to the respective nodes nd2a and nd2b under the amplification mode or the bypass mode of the LNA 1F.

When the LNA 1F operates under the bypass mode, the radio-frequency signal RFin that has reached the node nd9 branches into the side of the switch Sw4B and the side of the switch Sw5B.

Here, in an exemplary operation, the capacitance values of the capacitors Csplt1 and Csplt2 (series capacitors), the inductance values of the variable inductors Ld1z and Ld2z (parallel inductors), the capacitance values of the variable capacitors Cout1z and Cout2z (serial capacitors), and the resistance value of the variable resistor Rox (which is in the output combiner circuit 50A) are set as shown in FIG. 74, so that the capacitors, the variable inductors, the variable capacitors, and the resistor can provide a splitter function.

The signals transmitted to the nodes nd2a and nd2b are forwarded as the output signals RFout1 and RFout2 of the LNA 1F to the subsequent circuitry component from the respective two output terminals OUT1 and OUT2 via the respective on-state T-switches T-Sw1 and T-Sw2.

In this manner, the LNA 1F according to the embodiment operates under the split output mode.

(7c) Characteristics

FIGS. 79 to 91 will be referred to for describing the characteristics of the LNA according to the embodiment.

FIGS. 79 to 90 show simulation results obtained with the LNA 1F of an exemplary configuration according to the embodiment.

(a) of respective FIGS. 79 to 90 are each a graph showing relationships between frequencies and the S parameters of the LNA 1F according to the embodiment. In each graph (a) of FIGS. 79 to 90, frequency characteristics for the S parameters S11 (=S(1,1)), S22 (=S(2,2)), S21 (=S(2,1)), and S23 (=S(2,3)) are shown. In the S parameters, port "1" refers to the active terminal among the multiple input terminals SWin, port "2" refers to the output terminal OUT1 of the LNA 1F, and port "3" refers to the output terminal OUT2 of the LNA 1F.

In each graph (a) of FIGS. 79 to 90, the horizontal axis indicates frequencies (unit: GHz) and the vertical axis indicates values of gain or loss (unit: dB).

(b) of respective FIGS. 79 to 90 are each a graph showing relationships between frequencies and the noise figures of the LNA 1F according to the embodiment.

In each graph (b) of FIGS. 79 to 90, the horizontal axis indicates frequencies (unit: GHz) and the vertical axis indicates noise figures (unit: dB).

In the context of the present embodiment, the first frequency band refers to the frequency band ranging from 859 MHz to 960 MHz, the second frequency band refers to the frequency band ranging from 717 MHz to 821 MHz, and the third frequency band refers to the frequency band ranging from 617 MHz to 652 MHz.

In these simulations, the voltage VDDLNA supplied to the LNA 1D according to the embodiment was set to 1.2V.

Figure 79:
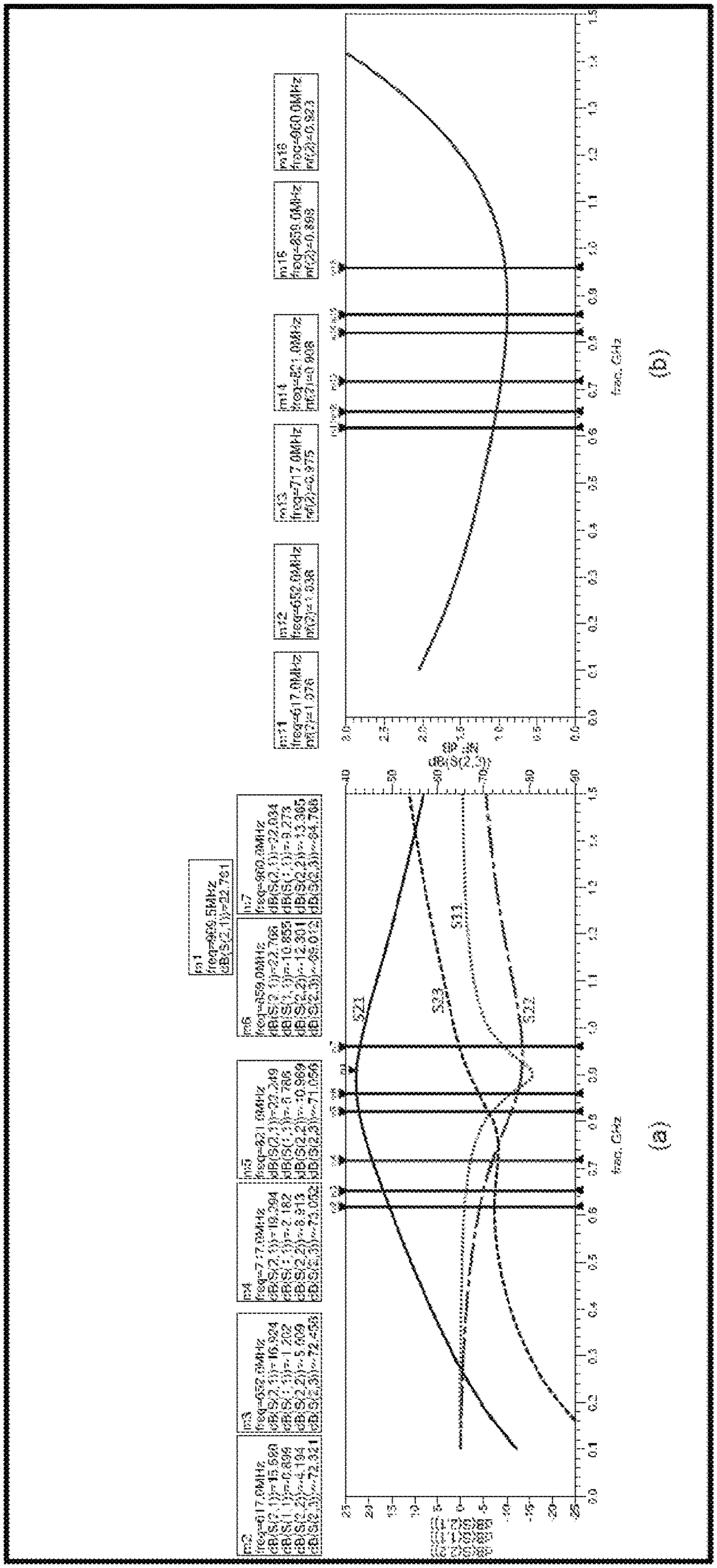

FIG. 79 is for the small-signal characteristics of the LNA 1F according to the embodiment, given in the combination of the amplification mode and the single output mode with the first frequency band.

As shown in (a) of FIG. 79, the band center gain (S21) with the frequency band from "m6" (859 MHz) to "m7" (960 MHz) is 22.761 dB. The return losses (S11) are −9.273 dB or less. The return losses (S22) are −12.301 dB or less. The parameter S23 values are −64.768 dB or less.

As shown in (b) of FIG. 79, the noise figures with the frequency band from "m15" (859 MHz) to "m16" (960 MHz) vary within the range from 0.898 dB to 0.923 dB.

Figure 80:
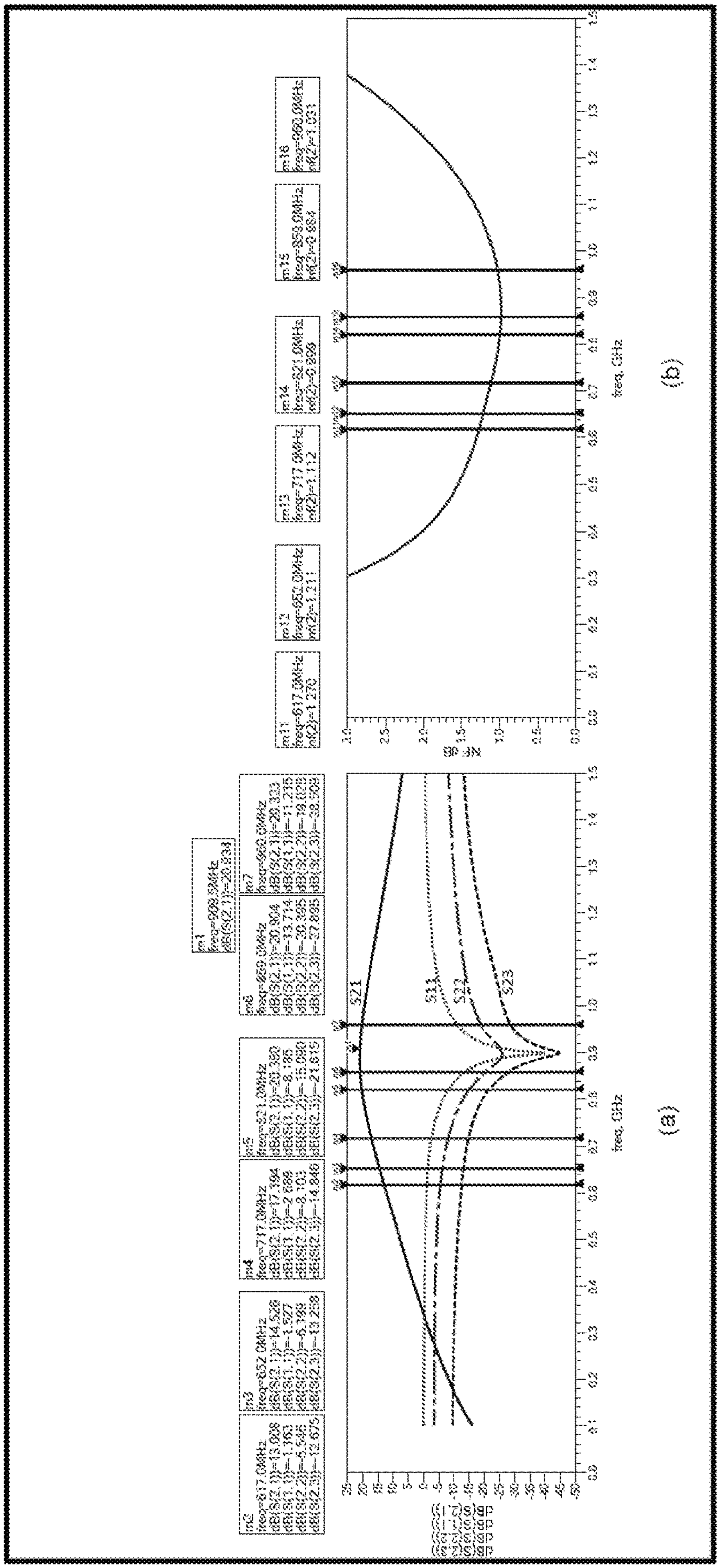

FIG. 80 is for the small-signal characteristics of the LNA 1F according to the embodiment, given in the combination of the amplification mode and the split output mode with the first frequency band.

As shown in (a) of FIG. 80, the band center gain (S21) with the frequency band from "m6" (859 MHz) to "m7" (960 MHz) is 20.934 dB. The return losses (S11) are −11.215 dB or less. The return losses (S22) are −19.028 dB or less. The parameter S23 values are −27.895 dB or less.

As shown in (b) of FIG. 80, the noise figures with the frequency band from "m15" (859 MHz) to "m16" (960 MHz) vary within the range from 0.984 dB to 1.031 dB.

FIG. 81 is for the small-signal characteristics of the LNA 1F according to the embodiment, given in the combination of the bypass mode and the single output mode with the first frequency band.

As shown in (a) of FIG. 81, the band center gain (S21) with the frequency band from "m6" (859 MHz) to "m7" (960 MHz) is −2.163 dB. The return losses (S11) are −12.773 dB or less. The return losses (S22) are −17.016 dB or less. The parameter S23 values are −64.682 dB or less.

As shown in (b) of FIG. 81, the noise figures with the frequency band from "m15" (859 MHz) to "m16" (960 MHz) vary within the range from 2.291 dB to 1.999 dB.

Figure 82:
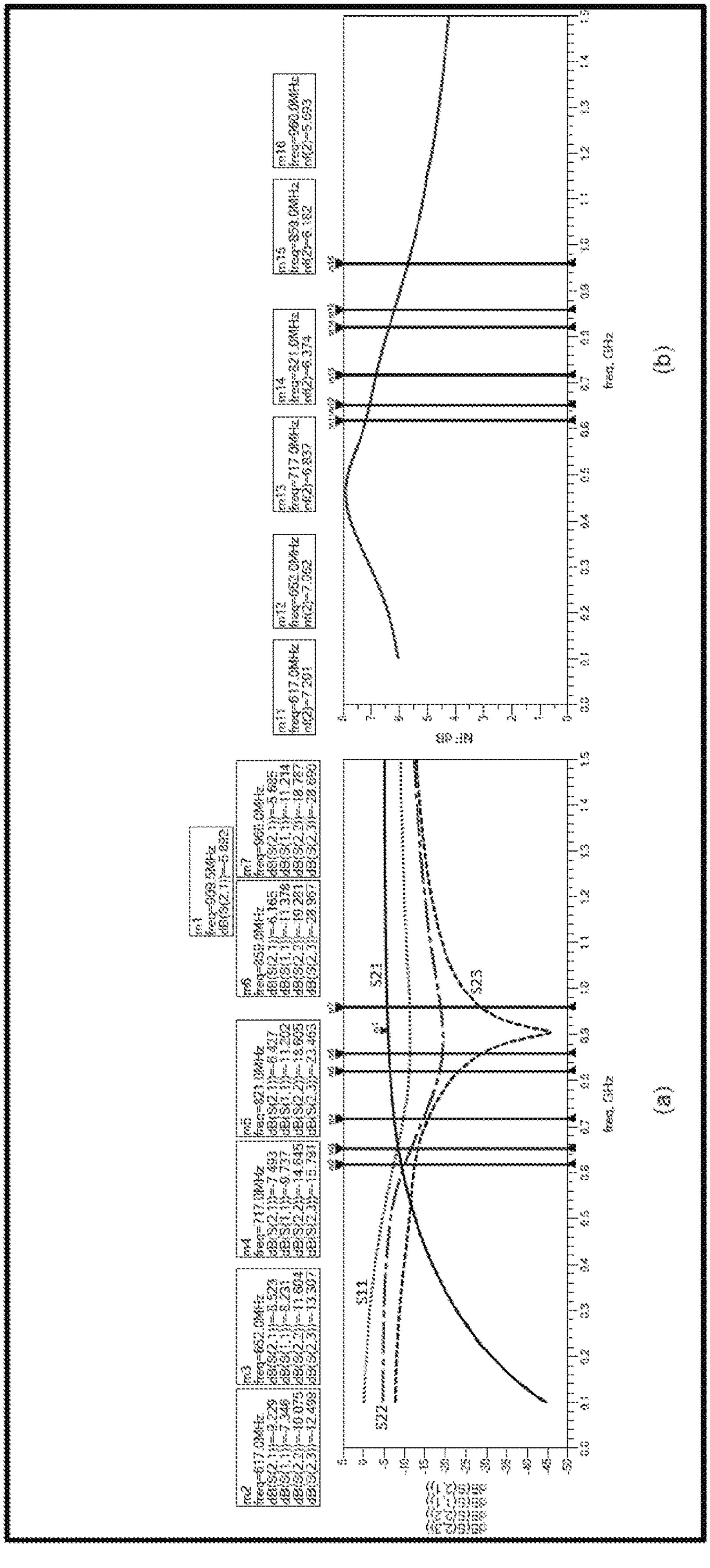

FIG. 82 is for the small-signal characteristics of the LNA 1F according to the embodiment, given in the combination of the bypass mode and the split output mode with the first frequency band.

As shown in (a) of FIG. 82, the band center gain (S21) with the frequency band from "m6" (859 MHz) to "m7" (960 MHz) is −5.892 dB. The return losses (S11) are −11.214 dB or less. The return losses (S22) are −18.787 dB or less. The parameter S23 values are −28.690 dB or less.

As shown in (b) of FIG. 82, the noise figures with the frequency band from "m15" (859 MHz) to "m16" (960 MHz) vary within the range from 6.182 dB to 5.693 dB.

Figure 83:
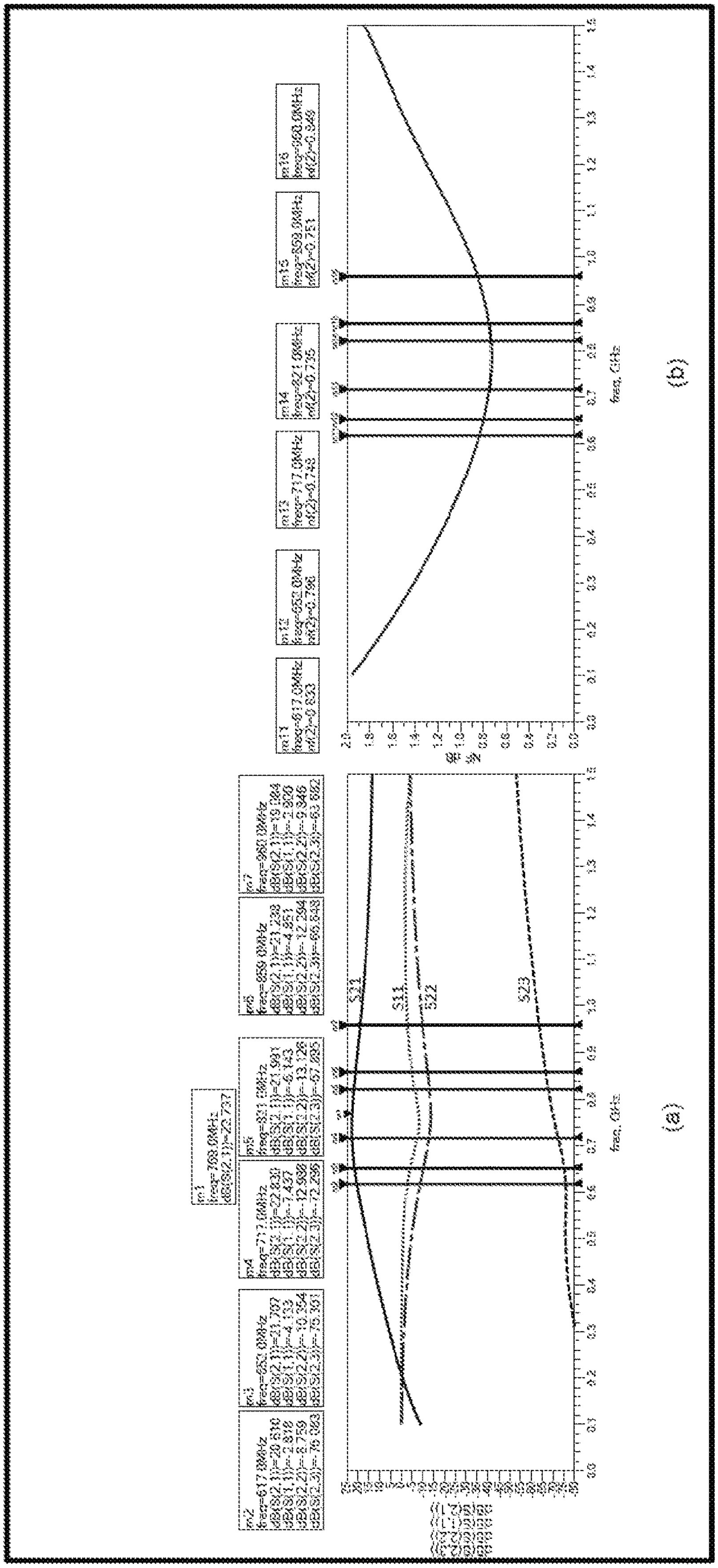

FIG. 83 is for the small-signal characteristics of the LNA 1F according to the embodiment, given in the combination of the amplification mode and the single output mode with the second frequency band.

As shown in (a) of FIG. 83, the band center gain (S21) with the frequency band from "m4" (717 MHz) to "m5" (821 MHz) is 22.737 dB. The return losses (S11) are −6.143 dB or less. The return losses (S22) are −12.088 dB or less. The parameter S23 values are −67.895 dB or less.

As shown in (b) of FIG. 83, the noise figures with the frequency band from "m13" (717 MHz) to "m14" (821 MHz) vary within the range from 0.748 dB to 0.735 dB.

Figure 84:
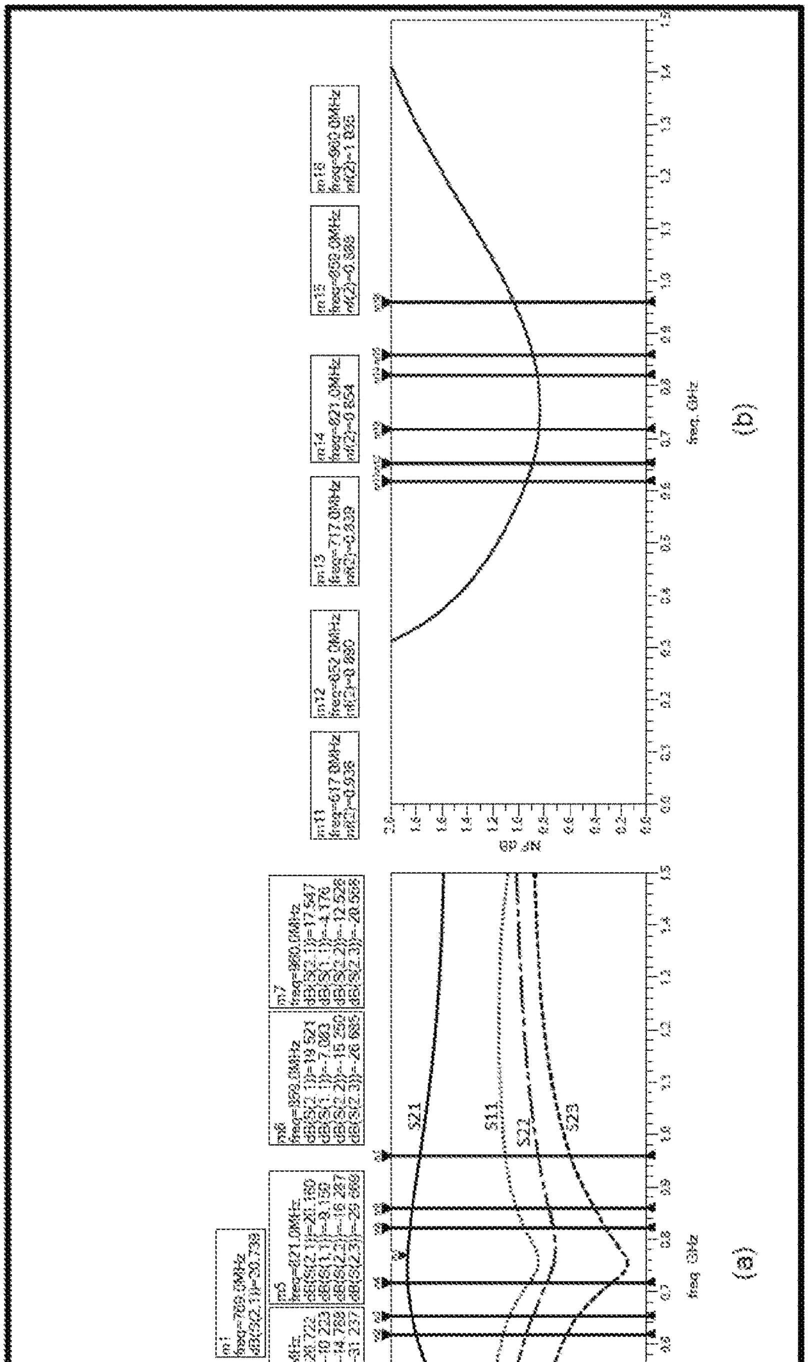

FIG. 84 is for the small-signal characteristics of the LNA 1F according to the embodiment, given in the combination of the amplification mode and the split output mode with the second frequency band.

As shown in (a) of FIG. 84, the band center gain (S21) with the frequency band from "m4" (717 MHz) to "m5" (821 MHz) is 20.739 dB. The return losses (S11) are −9.15 dB or less. The return losses (S22) are −14.788 dB or less. The parameter S23 values are −29.669 dB or less.

As shown in (b) of FIG. 84, the noise figures with the frequency band from "m13" (717 MHz) to "m14" (821 MHz) vary within the range from 0.839 dB to 0.854 dB.

Figure 85:
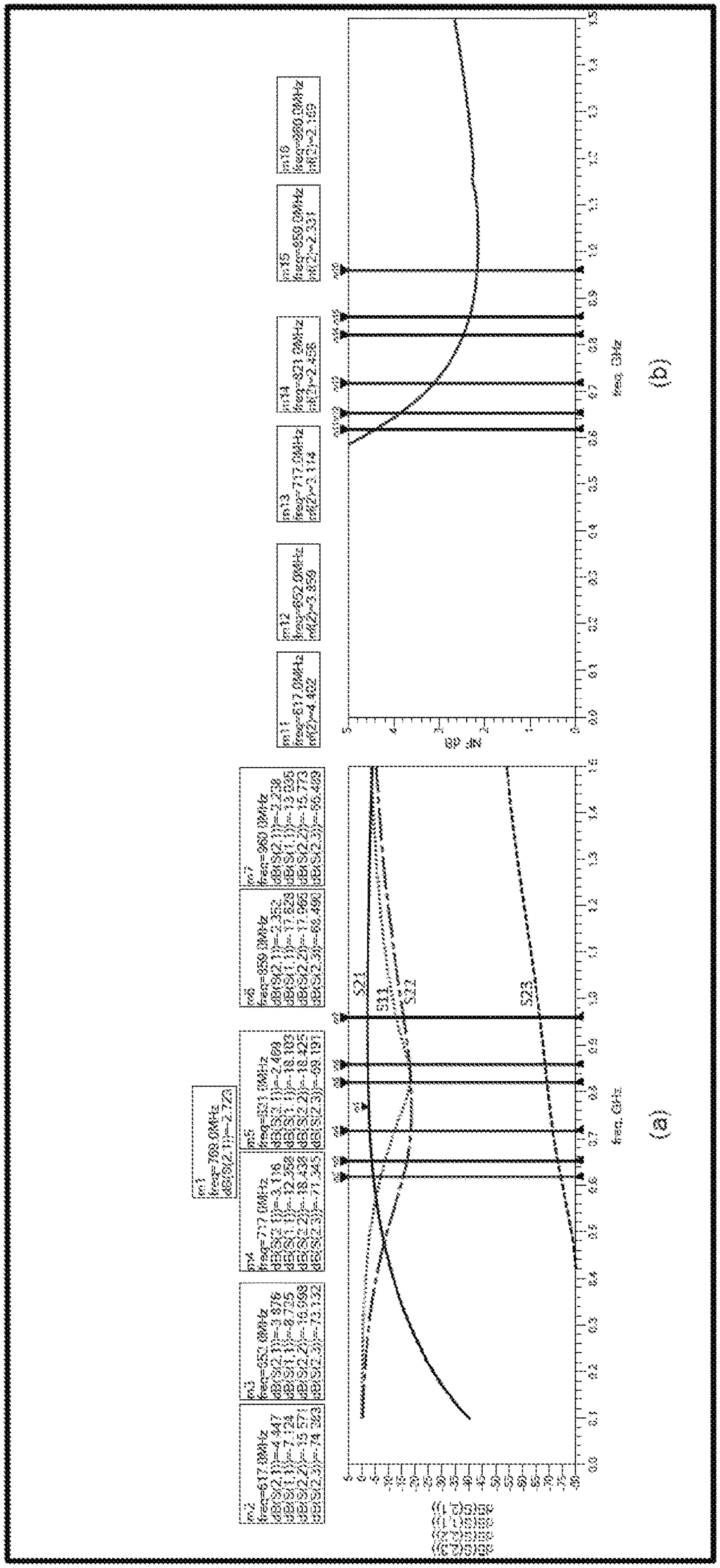

FIG. 85 is for the small-signal characteristics of the LNA 1F according to the embodiment, given in the combination of the bypass mode and the single output mode with the second frequency band.

As shown in (a) of FIG. 85, the band center gain (S21) with the frequency band from "m4" (717 MHz) to "m5" (821 MHz) is −2.723 dB. The return losses (S11) are −12.358 dB or less. The return losses (S22) are −18.425 dB or less. The parameter S23 values are −69.191 dB or less.

As shown in (b) of FIG. 85, the noise figures with the frequency band from "m13" (717 MHz) to "m14" (821 MHz) vary within the range from 3.114 dB to 2.458 dB.

Figure 86:
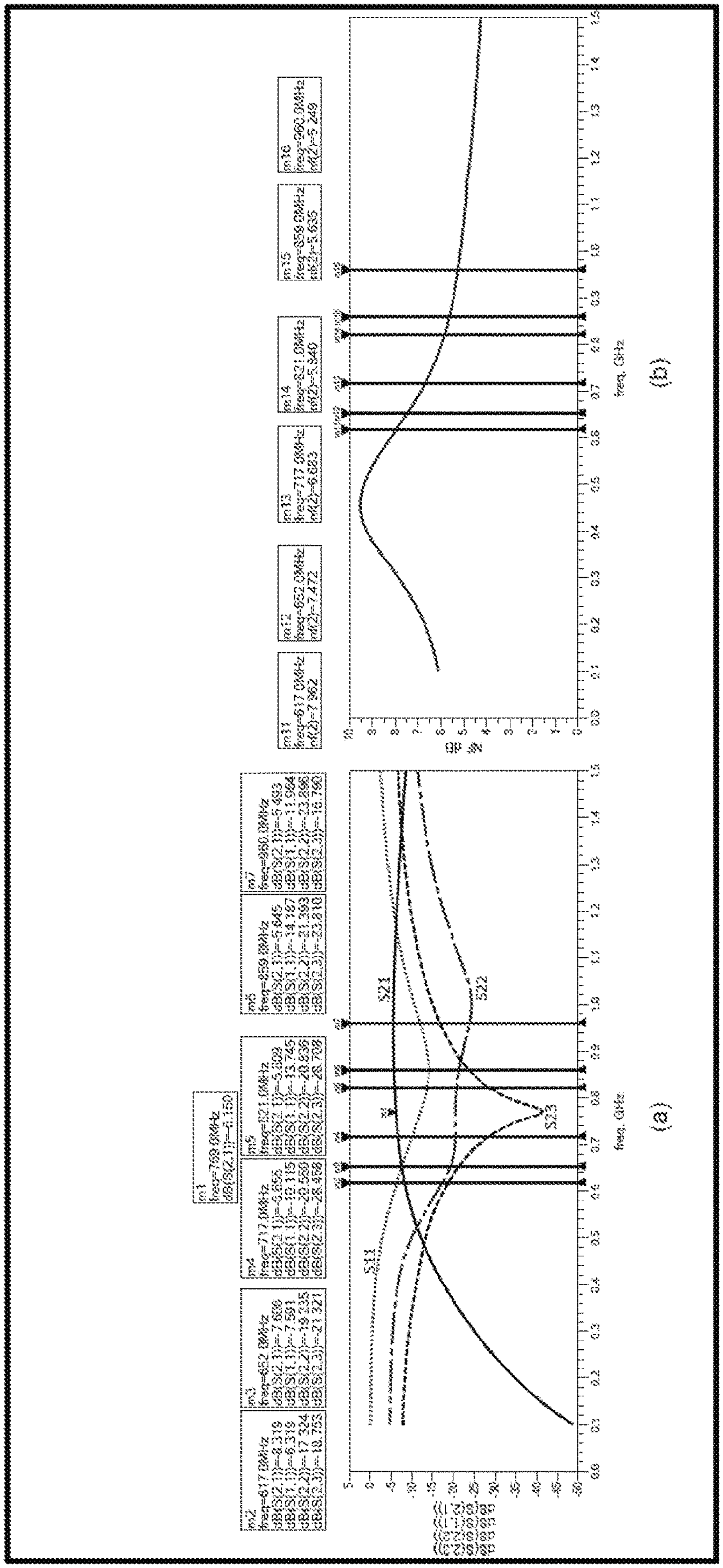

FIG. 86 is for the small-signal characteristics of the LNA 1F according to the embodiment, given in the combination of the bypass mode and the split output mode with the second frequency band.

As shown in (a) of FIG. 86, the band center gain (S21) with the frequency band from "m4" (717 MHz) to "m5" (821 MHz) is −6.15 dB. The return losses (S11) are −10.115 dB or less. The return losses (S22) are −20.55 dB or less. The parameter S23 values are −28.458 dB or less.

As shown in (b) of FIG. 86, the noise figures with the frequency band from "m13" (717 MHz) to "m14" (821 MHz) vary within the range from 6.683 dB to 5.840 dB.

Figure 87:
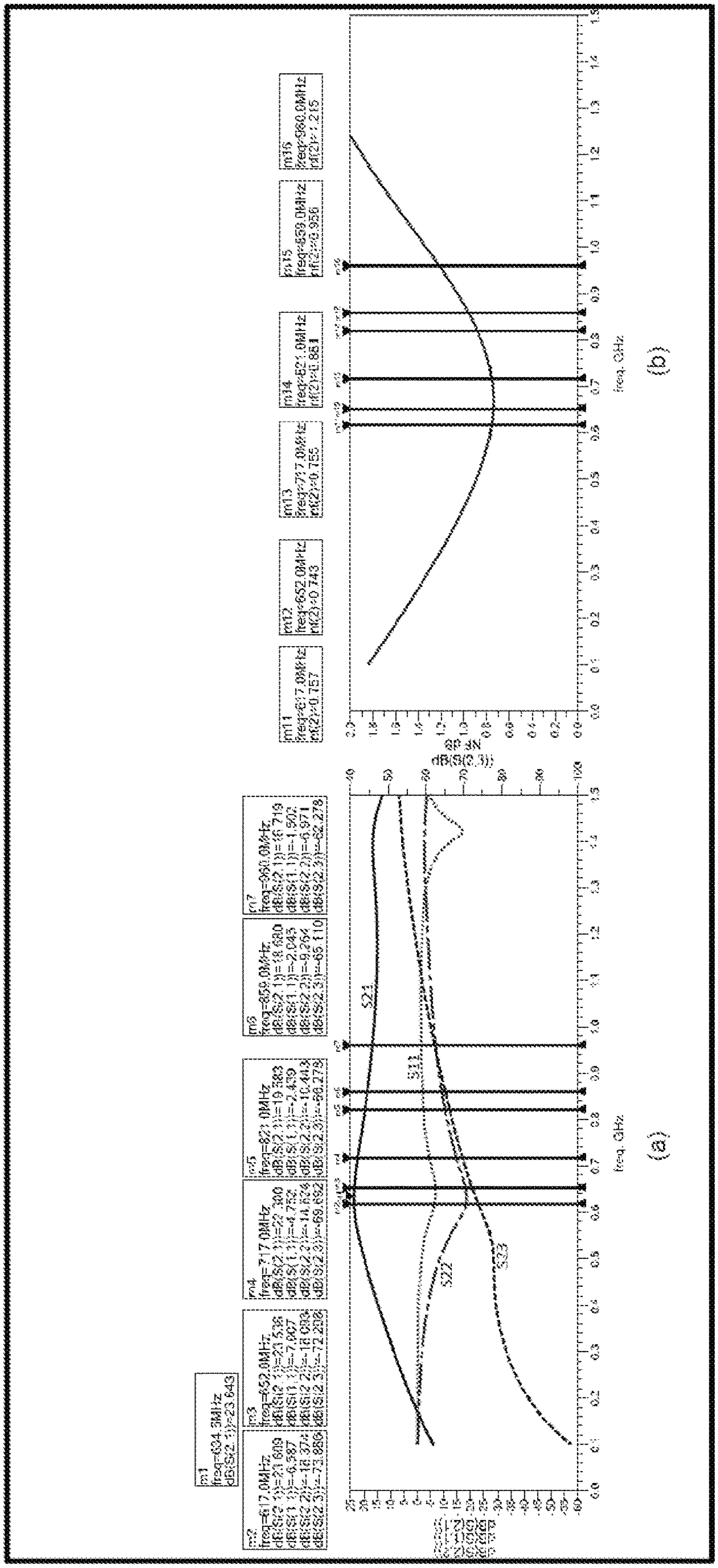

FIG. 87 is for the small-signal characteristics of the LNA 1F according to the embodiment, given in the combination of the amplification mode and the single output mode with the third frequency band.

As shown in (a) of FIG. 87, the band center gain (S21) with the frequency band from "m2" (617 MHz) to "m3" (652 MHz) is 23.643 dB. The return losses (S11) are −6.587 dB or less. Also, the return losses (S22) are −18.093 dB or less. The parameter S23 values are −72.208 dB or less.

As shown in (b) of FIG. 87, the noise figures with the frequency band from "m11" (617 MHz) to "m12" (652 MHz) vary within the range from 0.757 dB to 0.743 dB.

Figure 88:
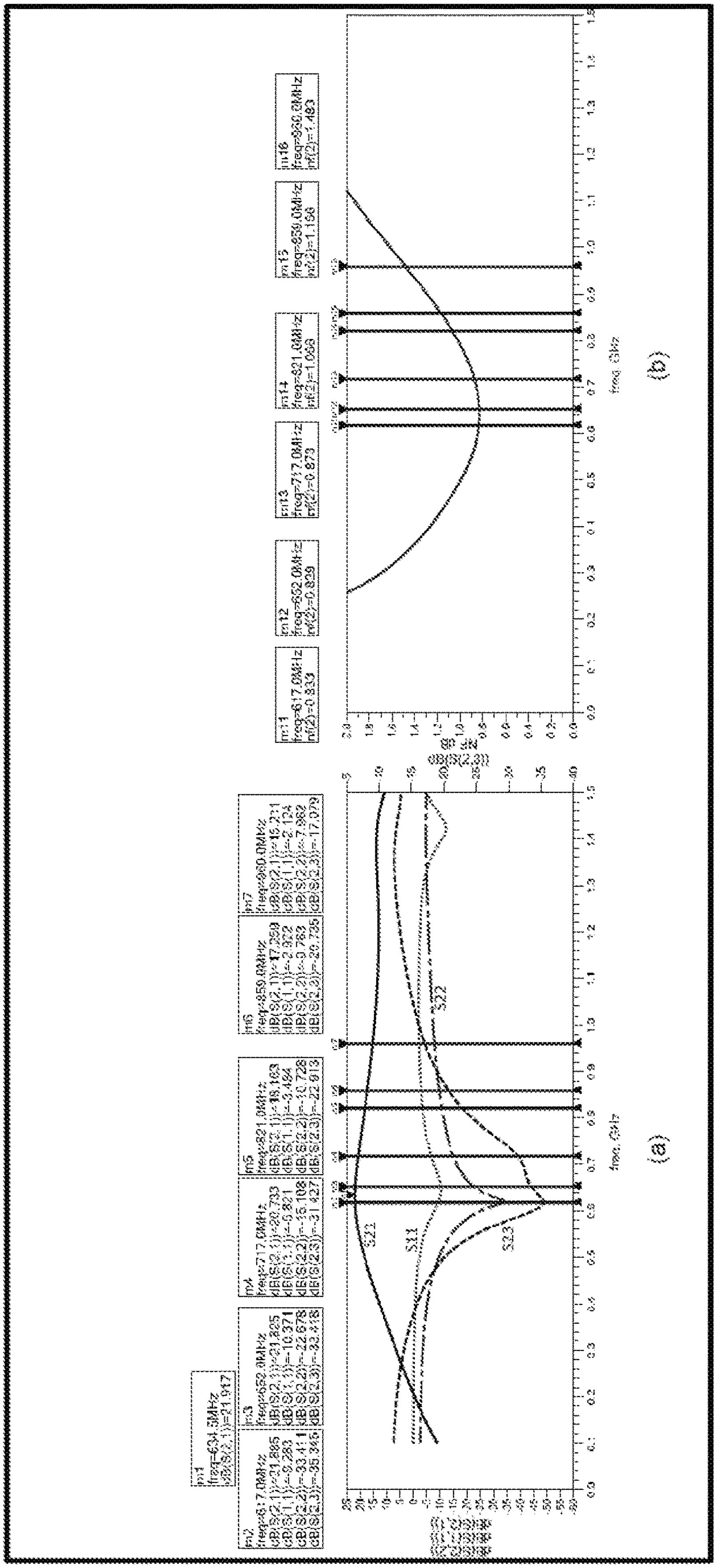

FIG. 88 is for the small-signal characteristics of the LNA 1F according to the embodiment, given in the combination of the amplification mode and the split output mode with the third frequency band.

As shown in (a) of FIG. 88, the band center gain (S21) with the frequency band from "m2" (617 MHz) to "m3" (652 MHz) is 21.917 dB. The return losses (S11) are −9.283 dB or less. The return losses (S22) are −22.678 dB or less. The parameter S23 values are −33.418 dB or less.

As shown in (b) of FIG. 88, the noise figures with the frequency band from "m11" (617 MHz) to "m12" (652 MHz) are approximately 0.83 dB.

Figure 89:
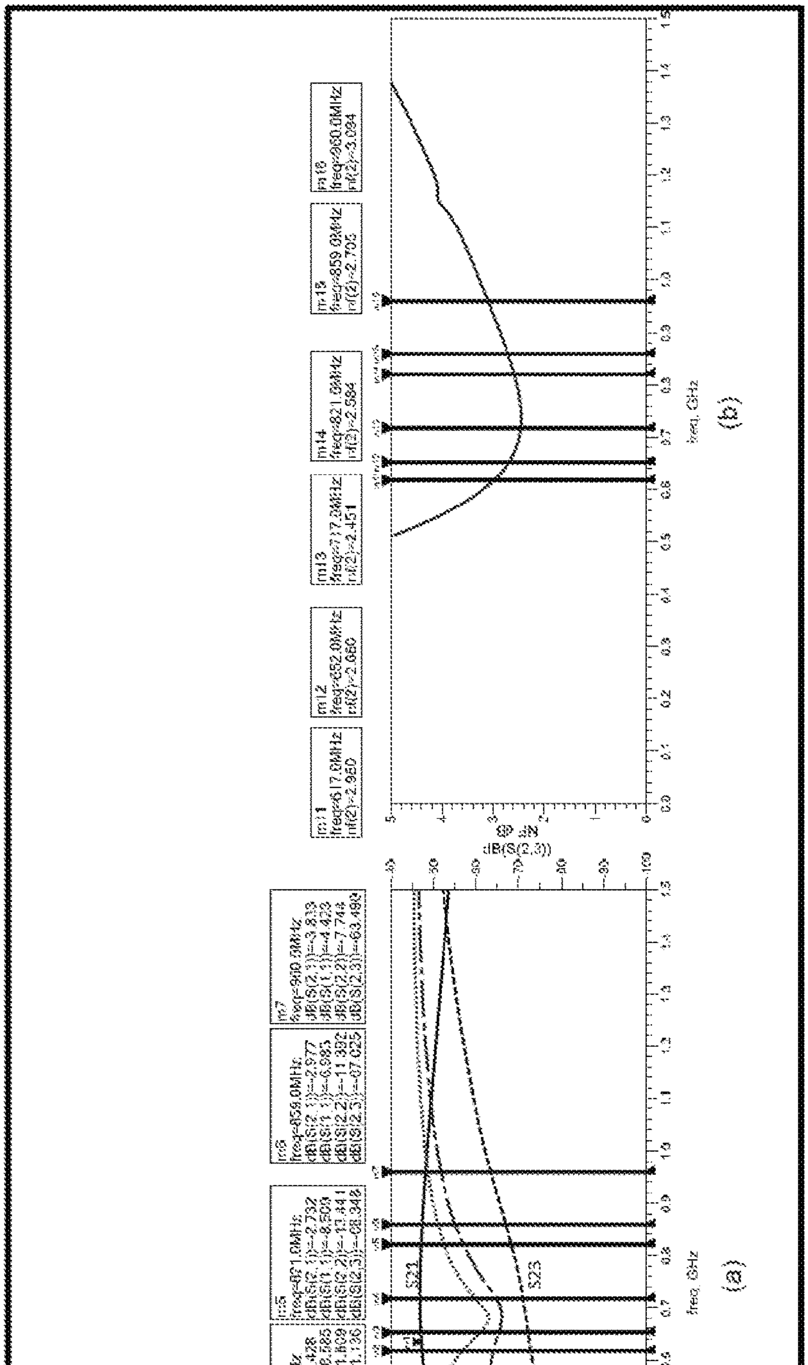

FIG. 89 is for the small-signal characteristics of the LNA 1F according to the embodiment, given in the combination of the bypass mode and the single output mode with the third frequency band.

As shown in (a) of FIG. 89, the band center gain (S21) with the frequency band from "m2" (617 MHz) to "m3" (652 MHz) is −2.784 dB. The return losses (S11) are −13.244 dB or less. The return losses (S22) are −21.067 dB or less. The parameter S23 values are −72.254 dB or less.

As shown in (b) of FIG. 89, the noise figures with the frequency band from "m11" (617 MHz) to "m12" (652 MHz) vary within the range from 2.98 dB to 2.68 dB.

Figure 90:
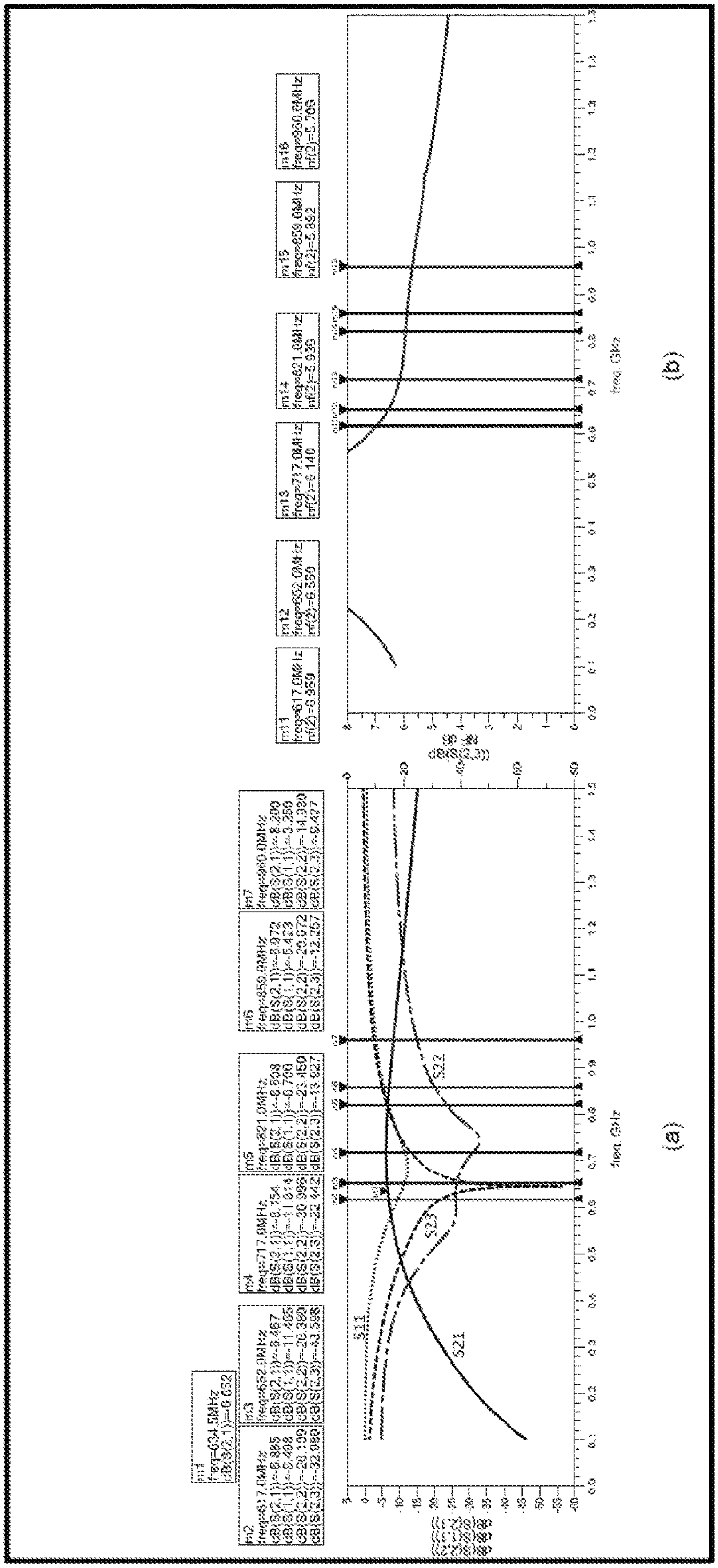

FIG. 90 is for the small-signal characteristics of the LNA 1F according to the embodiment, given in the combination of the bypass mode and the split output mode with the third frequency band.

As shown in (a) of FIG. 90, the band center gain (S21) with the frequency band from "m2" (617 MHz) to "m3" (652 MHz) is −6.652 dB. The return losses (S11) are −9.498 dB or less. The return losses (S22) are −26.109 dB or less. The parameter S23 values are −32.98 dB or less.

As shown in (b) of FIG. 90, the noise figures with the frequency band from "m11" (617 MHz) to "m12" (652 MHz) vary within the range from 6.959 dB to 6.550 dB.

It is understood from FIGS. 79 to 90 that the S parameters and the noise figures each show a profile according to the frequencies of the supplied radio-frequency signals and the mode for operation of the LNA 1F.

FIG. 91 is a list of the simulation results for the small-signal characteristics of the LNA 1F according to the embodiment.

In FIG. 91, the values at the band center are noted for the S parameter "S21". For each of the S parameters "S11", "S22", and "S23" and the noise figure, the worst values within the respective band are noted.

In the present embodiment, the "S23" parameter may take the worst value when the LNA 1F operates under the split output mode. In one example, the worst value of the "S23" parameter in the embodiment is −27.9 dB.

As such, even taking the worst value of the "S23" parameter into consideration, the "S23" parameter values of the LNA 1F according to the embodiment can secure a sufficient margin from the generally required, standard "S23" parameter value (e.g., −25 dB).

That is, the LNA 1F according to the seventh embodiment can provide improved characteristics while realizing various modes for operation.

(8) Others

The foregoing embodiments have assumed that their respective LNAs (semiconductor circuits) are applied to wireless communication systems.

However, the LNAs according to the embodiments may be applied to devices other than wireless communication systems.

Configurations, etc. of the LNAs according to a multiple of the foregoing embodiments may be discretionarily combined.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor circuit comprising:

an input terminal to which a signal is supplied;

an input matching circuit connected to the input terminal;

a first circuit including a first transistor and a second transistor which are arranged in cascode connection;

a second circuit including a third transistor and a fourth transistor which are arranged in cascode connection;

a first output matching circuit connected to the first circuit;

a second output matching circuit connected to the second circuit;

a first passive circuit connected to a drain of the first transistor and a drain of the third transistor, and comprising at least one first passive element;

a second passive circuit connected to a drain of the second transistor and a drain of the fourth transistor, and comprising at least one second passive element;

a third passive circuit connected between a first output node of the first output matching circuit and a second output node of the second output matching circuit, and including at least one third passive element;

a first switch circuit connected between a first output terminal and the first output matching circuit;

a second switch circuit connected between a second output terminal and the second output matching circuit; and a third switch circuit connected between the first output node of the first output matching circuit and the second output node of the second output matching circuit, wherein a source of the first transistor and a source of the third transistor are connected to an inductor, a gate of the first transistor and a gate of the third transistor are connected to a first node to which the signal is supplied from the input terminal, the first node is connected to the input terminal via the input matching circuit, a source of the second transistor is connected to the drain of the first transistor, a source of the fourth transistor is connected to the drain of the third transistor, the drain of the second transistor is connected to a second node, the drain of the fourth transistor is connected to a third node, a gate of the second transistor and a gate of the fourth transistor are connected to a voltage terminal, the first output matching circuit is connected between the second node and the fourth node, the second output matching circuit is connected between the third node and the fifth node, the fourth node is connected to the fifth node via the third passive circuit, the first switch circuit is connected between the fourth node and the first output terminal, the second switch circuit is connected between the fifth node and the second output terminal, and the third switch circuit is connected between the fourth node and the fifth node.

2. The semiconductor circuit according to claim 1, wherein the first circuit and the second circuit output the signal, which is supplied to each of the gate of the first transistor and the gate of the third transistor from the input terminal, to the first output matching circuit and the second output matching circuit, and wherein, in a first output mode to perform an output operation using one of the first output terminal and the second output terminal, one of the first switch circuit and the second switch circuit is in a conductive state, and the third switch circuit is in a conductive state, and in a second output mode to perform an output operation using the first output terminal and the second output terminal, the first switch circuit and the second switch circuit are both in a conductive state, and the third switch circuit is in a non-conductive state.

3. The semiconductor circuit according to claim 1, further comprising:

a bypass circuit including an input node connected to the input terminal, a sixth node connected to the first output matching circuit, and a seventh node connected to the second output matching circuit;

a first capacitor connected between the second node and the sixth node; and a second capacitor connected between the third node and the seventh node, wherein when the bypass circuit is in an effective state, a connection of the input node, the sixth node and the seventh node is a conductive state, and when the bypass circuit is in an ineffective state, a connection of the input node, the sixth node, and the seventh node are in a non-conductive state.

4. The semiconductor circuit according to claim 1, further comprising a select circuit configured to select a signal of a frequency band from signals of multiple frequency bands, and to output the selected signal, wherein output impedance of the first passive circuit, the second passive circuit, and the third passive circuit is converted according to the frequency band of the selected signal.

* * * * *